United States Patent
Bizjak

(10) Patent No.: US 6,778,966 B2
(45) Date of Patent: Aug. 17, 2004

(54) SEGMENTED MAPPING CONVERTER SYSTEM AND METHOD

(75) Inventor: Karl M. Bizjak, Mountain View, CA (US)

(73) Assignee: Syfx, Orinda, CA (US)

( * ) Notice: Subject to any disclaimer, the term of this patent is extended or adjusted under 35 U.S.C. 154(b) by 515 days.

(21) Appl. No.: 09/726,700

(22) Filed: Nov. 29, 2000

(65) Prior Publication Data

US 2003/0055635 A1 Mar. 20, 2003

Related U.S. Application Data

(60) Provisional application No. 60/236,397, filed on Sep. 28, 2000, and provisional application No. 60/167,944, filed on Nov. 29, 1999.

(51) Int. Cl.$^7$ ............................................. G10L 19/02
(52) U.S. Cl. ...................................... 704/500; 704/225
(58) Field of Search ................... 379/390.03; 381/94.2, 381/106, 500; 704/225, 226

(56) References Cited

U.S. PATENT DOCUMENTS

| | | | | |
|---|---|---|---|---|
| 4,887,299 A | * | 12/1989 | Cummins et al. | 381/68.4 |
| 5,027,410 A | * | 6/1991 | Williamson et al. | 381/320 |
| 5,515,432 A | * | 5/1996 | Rasmusson | 379/388 |
| 5,526,419 A | * | 6/1996 | Allen et al. | 379/387 |
| 5,615,270 A | * | 3/1997 | Miller et al. | 381/57 |
| 6,088,461 A | * | 7/2000 | Lin et al. | 381/104 |
| 6,104,822 A | * | 8/2000 | Melanson et al. | 381/320 |
| 6,360,203 B1 | * | 3/2002 | Prince | 704/270 |

* cited by examiner

*Primary Examiner*—Daniel Abebe
(74) *Attorney, Agent, or Firm*—James E. Eakin

(57) ABSTRACT

Partitioned signal processing systems and methods featuring substantial flexibility and cost effective implementations is presented. The architecture of the systems and methods of the present invention can be divided into a plurality of modules having manual and automatic methods. The modules can be implemented by both analog and digital designs, can be designed together or dispersed across a network, and can be dynamically reconfigured via software. These modules include a user interface, an input signal processor, an adaptive compander, a volume control and pre-mixer, an output signal processor, a noise extractor, a transform engine, a statistical analysis engine, and a calibrator/annunciator. The manual methods include methods to establish dynamic range mapping. The automatic methods include methods to establish dynamic range mapping, a method to maintain dynamic range mapping, a method to adjust dynamic range mapping in the presence of noise, and a method for intelligent volume control.

16 Claims, 152 Drawing Sheets

1 Band/Channel + Volume Control

3 Band/Channel + PreMix / Volume Control

SEGMENTED MAPPING CONVERTER SYSTEM AND METHOD

RELATED APPLICATION

This application is related to Provisional U.S. Patent Application No. 60/167,944, filed Nov. 29, 1999, and Provisional U.S. Patent Application No. 60/236,397, filed Sep. 28, 2000, entitled PARTITIONED SIGNAL PROCESSING SYSTEM WITH AUTOMATIC NOISE COMPENSATION AND METHOD, and having the same inventors as the present application.

FIELD OF THE INVENTION

This invention relates to the art of distributed signal processing systems that may include companders, noise compensators, and methods of controlling systems that include companders, volume controls and noise compensators.

BACKGROUND OF THE INVENTION

Existing audio signal processing systems suffer from a variety of limitations. Some of the limitations are imposed by the transmission or storage medium or other technological deficiencies; other limitations are the result of environmental issues. Regardless of the reason, the result is the same: the listener receives a less than optimal listening experience.

For example, the amplification necessary to hear the quietest portions of an audio signal may result in maximum amplitudes that are undesirably loud. Conversely, amplitudes allowing loud portions of an audio signal to be heard at a comfortable level, may result in not being able to hear quiet portions of the signal. Enabling the entire signal to be comfortably heard at all times by the listener requires that the input source dynamic range of the signal be transformed into the dynamic range of the listener's environment and ability. Companders are sometimes used to correct the problem of inadequate dynamic range transformation. In many situations, the dynamic amplitude range of a signal exceeds the capabilities of its transmission channel, receiver, or restrictions of its environment. These limitations make it desirable to compress the dynamic amplitude range of the signal to allow all portions of the signal to be discerned.

Shown in FIG. 1A is a representative embodiment of a prior art compander, which receives an input signal in both a power estimator circuit and gain multiplier. The typical prior art power estimator provides a linear output to a gain calculate circuit. A control signal may also be provided to the power estimator circuit, typically to modify the attack or release characteristics of the estimator, and the gain calculate circuit, typically to change the amount of compression or expansion. The output of the gain calculate circuit is then combined in the gain multiplier with the input signal to provide a companded signal, taken as an output. A typical power estimator is implemented as a peak detector, for example as shown in FIG. 1B. In FIG. 1B, the input signal is provided to a diode. The output of the diode is tied to ground through an RC circuit, with the output taken at the node connecting the diode, resistor and capacitor. The capacitor charges up to the peak input voltage level and is gradually reduced over time by the resistor. Alternatively, an integrator circuit, also know as a low pass filter, may be used as a power estimator, as shown in FIG. 1C, where the input signal is provided to a conventional RC integrator. Peak detectors and low pass filters suffer from increasing low frequency distortion as the signal frequency approaches the corner frequency of the circuits. Lowering the corner frequency to decrease the low frequency distortion increases the transient response time leading to overamplification and signal clipping and underamplification. Dividing the total bandwidth into multiple frequency bands and using multiple companders can reduce distortion and transient response time but at the cost of the extra processing for the additional companders. A typical prior art stereo compander is shown in FIG. 1D, with left and right input channels each supplied to a multiplier and multiplier value, typically a value of ½. The multiplier outputs are then added and supplied to a pair of conventional, prior art companders. The multipliers and adder form an input signal mixer and is used to maintain relative spatial information in the two channels. The right and left channel input signals are also supplied to the respective companders, with the output of the respective companders being available as the output signal. The input signal mixing typically results in additional distortion since the adjacent channel signal is partly controlling the compander gain. It also typically results in one channel being under-amplified and the other channel being over-amplified which can result in clipping distortion.

Broadcast or recording restrictions or other technological limitations often mandate that the maximum amplitude range of a signal be restricted, and as a result signals are compressed to remain within those restrictions and limitations. After such a signal has been received or recovered, it is often desirable to expand its amplitude range to restore the original dynamic amplitude range. Thus a compressor and expander pair can be used to cancel out low frequency distortion, but do not and cannot function as a standalone compressor or expander.

Referring to FIG. 1E, a prior art compander pair may be better appreciated, where an input signal is provided to a first compander for purposes of compressing the input signal. The compressed signal, which includes some distortion, is then recorded on a suitable media, or otherwise managed. The compressed signal, with distortion, is thereafter provided a second compander in the pair. The second compander expands the compressed signal, and removes the distortion, resulting in restoration of the input signal, which is then provided as the system output signal.

One common limitation of prior art audio signal processing systems is that it is often difficult for a listener to comfortably hear all portions of an audio signal due to environmental audio noise. In such circumstances, when the amplification is sufficient that the louder portions can be discerned easily, the quiet (or low amplitude) portions of the signal are masked by the environmental noise. Environmental noise is transient and often unpredictable in nature, which makes manual adjustment to compensate for it particularly difficult. If the user manually increases the volume for times when the signal cannot be heard due to loud transient noise, the volume will be too loud once when the noise has subsided or the audio signal becomes greater in amplitude.

This problem occurs in many situations, usually (though not always) involving outdoors or mobile environments such as a car stereo, a cellular telephone used in public places, a portable radio used during a public sporting event, or home theater systems. There are also devices such as alarms, door bells, and phone ringers, that cannot be heard at times when there is much environmental noise, or must be set uncomfortably loud in order that the listener is assured of hearing them.

There have been many attempts at solutions to the problem of inadequate noise compensation, a representative embodiment of a prior art solution being shown in FIG. 2. The environmental noise signal is calculated as the difference between the environmental input (noise plus speaker output) detected by a microphone and a representation of the signal output by the speaker (a.k.a. reference). This environmental noise signal is then provided to a power estimator, typically an integrator or lowpass filter to smooth the signal. The power estimator output is provided to a gain calculate circuit to calculate a gain value to increase the output level of the input signal, typically in a linear manner. This type of prior art solutions provides no means of calibration of the circuitry to the acoustic environment making their proper operation unpredictable. They also do not satisfactorily address problems with variations in the audio source such as long silent pauses in the audio signal, uncontrolled positive feedback known as gain chase, room acoustic resonances that appear as false noise, or allow changing the minimum signal to noise ratio of the system. Further, they have an inadequate response to noise in that some respond too quickly, reacting to phone ringers and short bursts of speech, while others have too long and inaccurate a response. Prior art solutions also do not allow the user to select the signal or noise priority so that if the noise is speech, the signal source will be reduced instead of increased.

Further, when sound is to be heard in multiple locations, each location has a different environmental requirement. The signal necessary to provide adequate sound in one location, often results in sounds that are either too loud or quiet in other areas. This problem is typically solved by the use of redundant equipment, for example one prior art audio system per room.

It is also desirable to have methods to allow a user to perform a number of signal adjustments, e.g. calibration, changing compression or expansion factors, changing the minimum signal to noise ratio, channel balancing and equalization, in order to obtain optimal sound for a given environment. It is even more desirable to have these adjustments done automatically since most users lack the knowledge and understanding of how to perform correct and optimal adjustments to their equipment. Prior art solutions have no automatic adjustments and require manual adjustments with little or no explanation. Several techniques have been developed to address some of these problems.

Blackmer U.S. Pat. No. 3,789,143 (1974) discloses a compander that performs a logarithmic transformation of a signal, proportioned to the root mean square of two 90-degree phase separated signals. While this technique will work for any particular frequency, it is not able to maintain a 90-degree separation over all frequencies.

Beard U.S. Pat. No. 4,169,219 (1979) teaches the use of an analog, low-pass-filter delay-buffer in implementing a compressor-expansion pair, for recording a compressed signal that subsequently would be expanded upon being played. It is unsuitable for standalone use due to significant distortion of low frequency signals.

Bethards U.S. Pat. No. 4,216,427 (1980) instructs in the use of an adaptive audio compressor using analog techniques for restricting subsequent RF signal modulation. Changes in gain occur continuously, resulting in significant distortion of low frequency signals.

Orban U.S. Pat. No. 4,249,042 (1981) shows the use of a multi-frequency band compressor that controls the gain in each band by means of measuring the power in a master band. It has no mechanism to avoid amplifying the noise floor, and no dynamic input signal mapping.

Schroder U.S. Pat. No. 4,306,202 (1981) discloses a discrete compressor and expander, implemented using analog techniques. The compressor and expander modes, selected by analog switches, are intended to be used only in combination with each other. The compressor cannot be used in standalone operation because of distortion of low frequency signals.

Bloy U.S. Pat. No. 4,368,435 (1983) shows the use of a narrow band compander with a combination of a fast and slow attack circuit. By dividing the input into multiple narrow frequency bands, they attempt to minimize signal distortion. This technique provides unacceptable distortion of wide band audio signals.

Unagami et al. U.S. Pat. No. 4,482,973 et al. (1984) is not a compander per se, but instead teaches the use of two AGC (automatic gain control) circuits. Its algorithm does permit its implementation in a DSP and it performs a signal limiting function. The fixed delay causes both synchronization and low frequency response problems.

Stikvoort U.S. Pat. No. 4,562,591 (1985) discloses the use of a peak detector with a non-linear amplifier to provide a compander. Its use of a low-pass filter results in high distortion at low frequencies, and its overall design causes undesirable signal clipping.

Rosback U.S. Pat. No. 4,641,361 (1987) instructs in the use of an analog, multi-frequency band, automatic gain circuit that makes use of a peak clipper to reduce overall gain. Gain is changed continuously, resulting in distortion at low frequencies.

Bloy et al. U.S. Pat. No. 4,853,963 (1989) shows the use of a DSP to process narrow band signals. Its algorithm causes high levels of distortion on wide band signals.

Jorgensen U.S. Pat. No. 4,859,964 (1989) teaches the continual upward and downward adjustment of an automatic gain control to keep an input signal within certain limits. This technique undesirably amplifies the signal noise floor. It does not disclose the algorithms used in the microprocessor.

Thomas U.S. Pat. No. 4,947,133 (1990) instructs in the use of a compressor that uses a fixed signal delay line. After a signal zero crossing occurs, the compressor performs various signal smoothing, gain, sample and hold and compression functions. It performs no signal expansion and is implemented using a combination of analog and digital circuitry.

Akagiri et al. U.S. Pat. No. 4,972,164 (1990) teaches the specific design of a curvilinear compander. It is a complex design that uses both analog and digital circuitry. Its curvilinear algorithm minimizes distortions and abrupt transitions of the companded signal over its entire input range.

Orban U.S. Pat. No. 5,444,788 (1995) shows the use of an analog compander. Its use of diodes in a non-linear low-pass filter causes temperature stability problems and distorted low frequency response.

Werrbach U.S. Pat. No. 5,463,695 (1995) instructs in the use of analog tracking filters to implement a compressor. It performs non-linear compression that compresses transient peaks more than average signals. The average compression is fixed and it does not perform any dynamic range mapping.

Frey et al. U.S. Pat. No. 5,631,968 (1997) discloses an analog design with a variable compression ratio controlled by the time-averaged audio signal and various breakpoints. Low, selected and high compression ratios are used depending on the time-averaged signal. Changes in gain are made continuously, resulting in inherent signal distortion.

U.S. Pat. No. 4,322,579 to Kleis et al. (1982) discloses detecting the environmental noise level. It starts compressing the signal when a certain threshold is reached. The use of a band-pass and high-pass filter results in a substantial reduction in signal fidelity.

U.S. Pat. No. 4,553,257 to Mori et al. (1985) describes an open loop automatic volume control device. It is a single channel, analog circuit that does not alter the signal if the noise is below a given threshold. It performs some amount of variable compression as a function of signal and environmental noise above a given threshold. The primary disadvantage of this invention is that it suffers from positive feedback between the speaker and microphone, making it only useful for headphone applications. It provides no limit on the maximum volume produced.

U.S. Pat. No. 4,628,526 to Germer (1986) teaches using the rate of change of ambient noise and signal, to determine how the signal should be adjusted. If the noise is increasing faster than the signal, it increases the signal amplification, if the signal is increasing faster than the noise, it decreases the signal amplification. It has the desirable feature of not needing user calibration. It has the disadvantage that it always amplifies the signal, when compressing the signal would provide superior comfort to the user. It also requires additional circuitry to address the problem of dealing with silent portions of the audio signal.

U.S. Pat. No. 4,868,881 to Zwicker et al. (1989) shows using a microphone to detect noise. A multi-band equalizer is used to process the noise and audio signals, and the resultant composite signal is amplified and fed back into the noise compensator circuit. The difficulty with this patent is that it requires that the microphone only detect noise, and thus places it in a vehicle engine compartment, when in fact, wind noise is often the dominant source of environmental noise, resulting in the circuit not solving the stated problem.

U.S. Pat. No. 4,882,762 to Waldhaner (1989) teaches the use of a programmable multi-band compression system for hearing aids. It provides different amounts of fixed compression for multiple frequency bands, compensating for hearing loss that is both audio amplitude and frequency dependent. This patent addresses the issue of compressing a signal to compensate for hearing loss. It does not provide variable, automatic compensation of the signal in the presence of environmental noise, since it has no way to detect or distinguish this noise.

U.S. Pat. No. 4,891,837 to Walker et al. (1990) discloses the compression or expansion of a signal for use in a speakerphone. The amount of signal transformation is a function of the ambient noise. The primary source of noise addressed by this invention is the signal received by the microphone from the speakerphone's speaker during a duplex conversation. The invention assumes that the user will speak louder in a room with high ambient noise, and compensates accordingly.

In U.S. Pat. No. 4,953,221 to Holly et al. (1990) shows how positive feedback problems can be avoided by converting noise and audio signals to DC levels and subtracting them from each other. The disadvantage of this technique is that a sample and hold circuit must be used to avoid a noise problem whenever the audio input signal goes silent.

U.S. Pat. No. 5,107,539 to Kato et al. (1992) discloses the means for adjusting the surround or effect sound in a vehicle as environmental noise is sensed. It amplifies, as a function of the sensed noise, the signal and the effect transformation of the signal, using unique level control circuits for each signal. This circuit has several disadvantages, long silent pauses in the audio signal will result in undesirably loud amplification, and it does no compression of the signal, resulting in situations where the audio signal becomes too loud.

U.S. Pat. No. 5,172,358 to Kimura (1992) shows the usage of a digital signal processor to boost low and high frequencies depending on the average amount of sound pressure. No means are provided to calibrate the actual sound pressure with the levels inside the circuit. The controller is the means for controlling the device, yet no algorithms are disclosed for implementing it. There is no mechanism disclosed for handling signals that rapidly increase or decrease.

U.S. Pat. Nos. 5,434,922 and 5,615,270 to Miller et al. (1995/1997) teaches the use of adaptive algorithms with a digital signal processor to determine the amount of noise and dynamically compensate for it. Adaptive and least means square algorithms are computationally intensive and in certain situations can add undesirable amounts of distortion to a signal. The instruction is unclear as how signal processing is performed; FIG. 9 of this patent implies that the invention only performs fixed, 2:1 compression; how to set the minimum limit in item 62; or how to set the compression parameters in the gain calculator shown in item 60. Attack and release are fixed. Usage is made of prior art buffers to perform filter delay compensation. No provision is made to squelch inherent signal source noise. Compression occurs even when there is no environmental noise.

U.S. Pat. No. 5,450,494 to Okubo et al. (1995) shows the use of adaptive filters with a digital signal processor to determine the amount of noise and dynamically compensate for it. Their invention makes use of a fast Fourier transform which is computationally expensive, to determine the coefficients for the adaptive filters. It assumes that noise has a fixed frequency spectrum, dominant in lower frequencies and attenuated at higher frequencies. It teaches the theory of sound pressure and noise.

U.S. Pat. No. 5,509,081 to Kuusama (1996) teaches the use of selective amplification of various frequency bands in order to mask unwanted noise. No signal companding is performed, resulting in circumstances where certain noise-dominant frequency bands are amplified painfully loud. The main distinctive feature is the use of a delay line that is ineffective due to room reverberation and variations caused by changing microphone position. This method works for fixed delays, but does not function well in situations where there is considerable phase delay, signal dispersion or echoes. It provides no instruction on how to calibrate the circuitry.

U.S. Pat. No. 5,530,761 to d'Alayer de Costemore d'Arc (1996) teaches the use of a mathematical algorithm for automatically adjusting sound volume. It performs no signal companding and does not appear to have addressed considerations such as avoidance of gain chase and calibration.

U.S. Pat. No. 5,550,922 to Becker (1996) discloses the use of an analog compressor. It attempts to avoid a gain chase problem by matching the output signal to exceed the environmental noise by a small margin. It provides the means to reduce the gain during signals below a particular threshold. It provides no information on how to measure noise, set the volume or perform calibration.

U.S. Pat. No. 5,666,426 to Helms (1997) discloses the use of a digital signal processing algorithm to provide automatic volume control by maintaining a constant signal to noise ratio. The system calibrates itself by sensing the ambient sound level shortly after being powered on. No signal companding is performed, resulting in circumstances where the output volume is unacceptably loud. It provides instruction on a volume control and calibration, but requires the room to be quiet when calibrating. It does not address normal mode resonances due to room acoustics providing incorrect calibration.

U.S. Pat. No. 4,558,460 to Tanaka, et al. (1985) describes a motor vehicle speed sensor used to increase the output of an amplifier. This will not work in a non-automotive setting since the noise compensation is dependent on vehicle speed and not environmental noise.

As will be appreciated from the foregoing discussion, the prior art companders suffer from a number of disadvantages. All produce high levels of signal distortion at low frequencies. Using multiple frequency band compander techniques to reduce distortion requires significant additional processing requirements. Many rely upon a compressor and expander pair to cancel out low frequency distortion, and do not and cannot function as a standalone compressor or expander. Many of the companders are implemented using analog designs that do not address considerations necessary for the use of digital signal processors, or take advantage of their capabilities. Some use multiple channel compander designs with input signal mixing that result in inter-channel modulation distortion and output clipping. Most compander designs use fixed attack and release times or use a plurality of fixed attack and release time-constant filters, that can result in additional signal distortion or limited operating range. Further, prior art noise compensators suffer from gain chase problems, inadequate and inaccurate response to noise, a lack of signal or noise priority choice, and no means to vary the output signal to noise ratio. Prior art systems typically require redundant equipment and do not provide automatic adjustments.

In summary, existing inventions are ineffective due to inherent design limitations.

SUMMARY OF THE INVENTION

The partitioned signal processing system and method of the present invention substantially overcomes each of the aforementioned limitations of the prior art. Because of the substantial flexibility of the system and method of the present invention, cost effective implementations may be envisioned which range from alarms, ringers and phones, to car stereos and home entertainment systems, to recording studios and theaters, and to applications distributed across a network. In addition, the system and method are capable of use in other non-audio signal processing applications. A feature of many implementations of the invention is that substantially arbitrary, dynamic, and flexible processing throughout an environment becomes possible. The architecture of the present invention permits both digital and analog implementations, and also permits partitioning of both hardware and software. Moreover, modules can be concentrated locally, or dispersed across a network which may include communications links. In at least some embodiments it may be desirable to permit reconfiguration of the modules; this can be accomplished either through software such as dynamic switching or packet routing, or through hardware such as crossbar switches or remote controls.

The architecture of the present invention can be divided into a plurality of modules, which may also be characterized by the processing they provide, including the following:

User Interface—The user interface provides a means for the outside world to interact and control the partitioned signal processing system. Inputs can be from traditional keyboards and remote controls or via remote links to offsite facilities such as customer service centers for remote diagnostics or internet websites. Outputs from the system include the remote links and displays to show information to the user regarding the system, its configuration, control, and status. Implementation of the displays can range from discrete LEDs, to bar graphs, to bit mapped displays. Outputs to the system include Operation, Set-up, and Configuration commands. Operation commands include the typical volume control, input source selection, tone controls, station, disk and track selection. Also included are preference controls such as noise sensitivity, noise reaction time, and noise compensation priority. The noise compensation may be set to give priority to the audio signal over the environment (noise compensation), such as might occur while a family is watching a video, or to cause the audio signal to be secondary to the environment (signal muting), such as during a conversation. Set-up commands typically include calibrate (balance) the system to allow noise compensation, and set minimum and maximum volume levels to enable dynamic range mapping. Configuration commands allow a multitude of different system module configurations to be implemented out of a system's resources which may be increased or decreased over time. This function need not be provided if a fixed module implementation will always be used. Various configurations can be implemented in a variety of manners, ranging from dynamic software module selection, to crossbar switches, to assignment of packet routing, to usage of remote controls to select module function. Further, the statistical analysis engines may be used either to initiate automatically certain commands and actions, or to provide information to assist an operator in optimizing system operation. An annunciator may be used in some embodiments to provide synthesized spoken advice to the user, advising them of a necessary or suggested action for a particular procedure.

Input Signal Preprocessor—The input signal preprocessor allows a multitude of input signals to be multiplexed, synchronization of asynchronous events and data, and other signal processing such as analog to digital data conversion, bandsplit filtering and equalization, and input level adjusting to be performed. The input level adjust function adjusts the peak input signal (largest amplitude input signal) supplied by the selected source to the 0-dB level (largest amplitude signal) allowed by subsequent processing modules and allows for optimum compander operation. Bandsplit filtering and equalization allows dividing a signal into a multitude of frequency bands, and then performing equalization on each frequency band as required and allows for multiband signal processing.

Adaptive Dynamic Compander—The Adaptive Dynamic Compander allows extremely low signal distortion, wide bandwidth, dynamic range mapping by matching the input source dynamic range to the listener's dynamic range by either compressing or expanding an input signal. Extremely low distortion is provided by the half-wave signal processor which causes changes in gain only at zero crossings to minimize signal distortion. The half-wave signal processor may also include an optional synchronizer to insure that the calculated gain is used on the correct half-cycle, leading to improved transient response, a variable attack and release feature (also used in other modules) to dynamically modify the compander response time to varying input levels, a post-power estimator mixer that allows multiple companders to be used in multiple channel/band configurations, without altering relative spatial information or causing signal distortion, and a gain calculator for determining the amount of instantaneous gain by which a signal should be multiplied to be correctly companded. Many audio signals consist of a plurality of channels used to provide stereo or theater sound reproduction. When companding audio signals, it is desirable to preserve the relative amplitudes of the channels to each other, to preserve spatial location information. Using a post-power estimator mixer in each compander or in a centralized power estimator mixer, allows uniform changes to be made on all channels, preserving spatial signal intensity information, and minimizing inter-channel/band distortions and clipping. The gain calculator may include a look-ahead output clip detector for minimizing output signal clipping distortion for signals changing faster than the reaction time of the adaptive dynamic compander. Alternatively, a soft clip function may be used for minimizing output signal clipping distortion.

Central Post Power Estimator Mixer—Use of a Central Post Power Estimator Mixer reduces processing requirements and allows multiple companders to be used in multiple channel/band configurations without altering relative spatial information or causing signal distortion or clipping.

Volume Control and Pre-Mixer—The Volume Control and Pre-Mixer selects either input signals or a calibration signal to be output and allows the user to make fine adjustments of the output signal amplitude. A pre-mix function allows a multitude of input signals, typically multiple frequency bands or channels, to be combined into a given volume control.

Output Signal Processor—The Output Signal Processor is used to generate multiple band outputs for speaker equalization and multi-amplification implementations, performs data conversion on the signal to be converted into sound and generates reference signals used in noise compensation. Bandsplit filtering, equalization, signal mixing, soft clip functions, and amplification may also be performed. Analog and digital outputs may be produced.

Noise Extractor—The Noise Extractor of the present invention typically comprises a loop processor and a noise processor, and may be implemented in any of a plurality of configurations, including closed loop, open loop, or a combination of both open and closed loops also referred to as a leakage loop. The loop processor compares the estimated power of the signals detected by the environmental sensors, typically microphones or other sensors, with the reference power estimates of the output signal processor (signals prior to speaker amplification), and produces a noise signal indicating the level of environmental noise. Various optimizations may be provided for each configuration, including acoustic loop balancing for calibrating the system and negative feedback loops which are used to eliminate the "gain chase" runaway volume increase problem by compensating for inaccurate calibration and changes in the listening environment, e.g. people and objects moving in the room, curtains being opened or closed, room resonances and other perturbations. The environmental noise signal is further processed by the noise processor. The noise processor may provide corrections to the environmental noise signal caused by the negative loops, a sensitivity control for setting or modifying the output signal relative to the environmental noise level, and/or a variable attack and release processor to provide a selective response feature for permitting accurate and quick response to noise sources having a duration which exceeds a predetermined threshold while at the same time ignoring transient or short duration environmental noise. The processed environmental noise signals may then be used by the other modules, particularly the transform engines, to form positive loops that will increase or decrease the output signal relative to the environmental noise depending on if noise compensation or signal muting mode is active.

Transform Engine—The Transform Engine processes user controls, statistics engine outputs, and the environmental noise signals, and provides the control signals necessary for the proper operations of the system. The primary function of the transform engine controller is to transform the user control signals, statistics engine outputs, and the environmental noise signals into the control signals necessary for proper operation of each module. It continually determines how much the compander should expand or compress the input signal and the output level of volume control modules.

Statistical Analysis Engine—The Statistical Analysis Engines allow for dynamically monitoring a multitude of signals, and allowing both automatic and manual control, optimization, and modification of operating parameters of the modules within the system based upon this information. The statistical analysis module is composed of a plurality of histogram generators, which create a histogram of a particular signal, and statistical analyzers to inspect the histograms and produce flags and data that may be used by other modules to perform automatically certain actions, or to provide information to assist an operator in optimizing system operation.

Calibrator/Annunciator—A calibrator produces signals for use in setting, adjusting and calibrating the system. Typical uses include setting the minimum and maximum volume levels, environmental noise compensation loop balancing calibration and output signal equalization. Calibration signals are typically produced by white or pink noise generators, random number generators, arbitrary waveform generators, Fourier synthesis, amplitude, frequency, and phase modulators, and analog waveform generators. An annunciator may be included in some embodiments to provide spoken advice to the user, advising them of a necessary or suggested action for a particular procedure or informing the user of the status of the system. This information can be implemented by means of voice synthesizers, voice compression, or other prior art techniques.

The methods of the present invention can be divided into manual and automatic methods, which may also be characterized by the processing they provide, including the following:

Manual Methods to Establish Dynamic Range Mapping—Methods using the previously described modules to set the compander kneepoints, companding ratio, and system gain by manually setting the maximum, minimum, and/or typical listening levels of a partitioned signal processing system are disclosed. These levels are used to determine the listening output dynamic range and establish dynamic range mapping from the source input dynamic range to the listening output dynamic range.

Automatic Methods to Establish Dynamic Range Mapping—Methods using the previously described modules to establish the maximum and minimum listening levels and resulting listening output dynamic range of a partitioned signal processing system from a default set of compander kneepoints, companding ratios, system gain, levels and thresholds are disclosed.

Automatic Method to Maintain Dynamic Range Mapping—A method using the previously described modules to maintain the minimum listening level of a partitioned signal processing system by modifying compander kneepoints, companding ratios, and system gain while the user modifies the volume control setting is disclosed.

Automatic Method to Adjust Dynamic Range Mapping in the Presence of Noise—A method using the previously described modules to adjust the minimum listening level and/or volume control levels of a partitioned signal processing system by modifying compander kneepoints, companding ratios, and/or system gain to compensate for environmental noise is disclosed.

"Intelligent Volume Control" Automatic Method—A method using the previously described modules to respond to user control adjustments, typically the volume control, in the absence or presence of environmental noise, to appropriately adjust the maximum and minimum listening levels by modifying compander kneepoints companding ratios, system gain, and noise sensitivity of a partitioned signal processing system is disclosed. This method allows for one simple user control to modify the dynamic range mapping of the system to provide optimal listening in any acoustic environment.

The foregoing features of the invention, including additional process, system, apparatus and method aspects, may be better appreciated from the following Detailed Description of the Invention, taken together with the attached Figures.

THE FIGURES

FIGS. 42A–D show Volume Control Configurations.

Figure 43A:
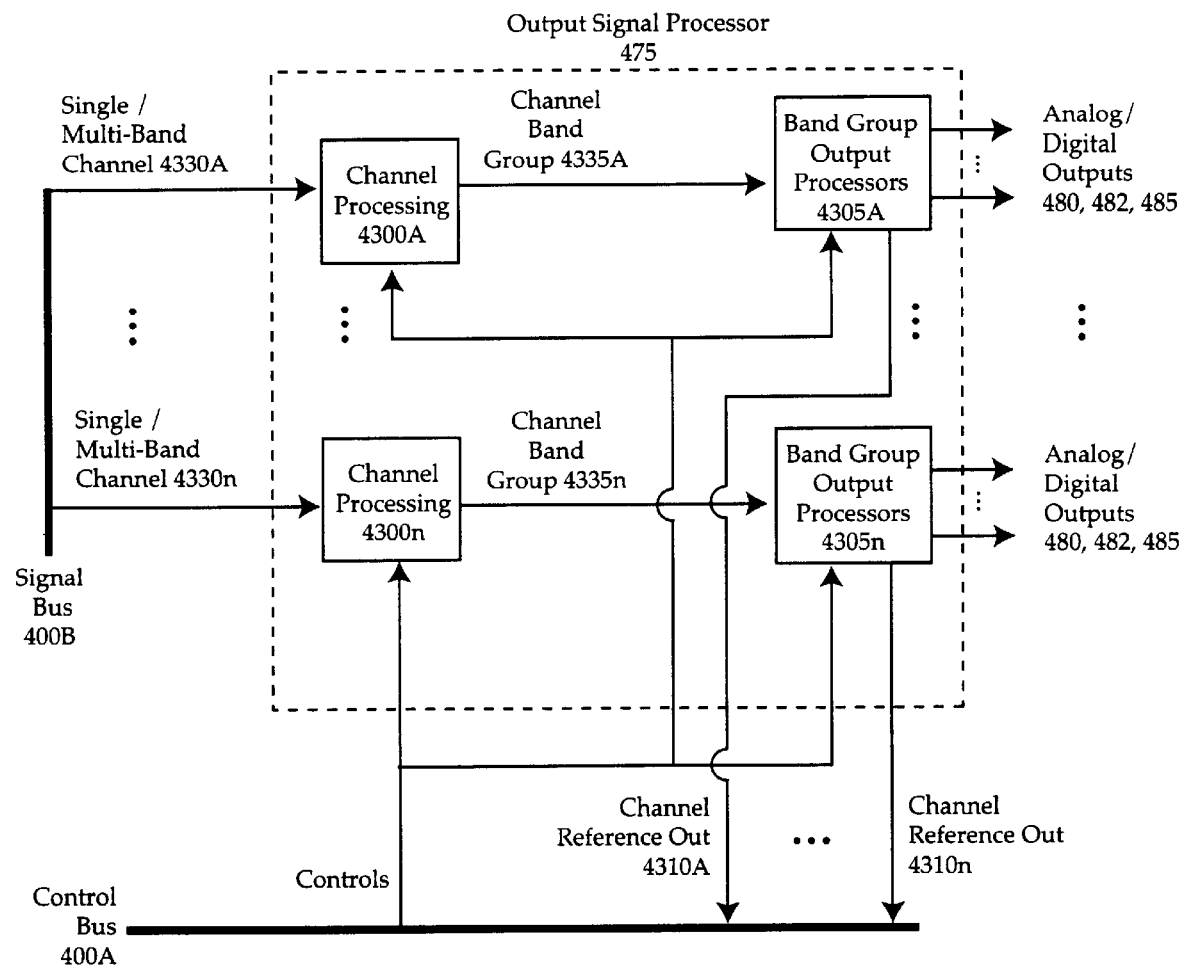

FIG. 43A shows an Output Signal Processing Block Diagram.

Figure 43B:
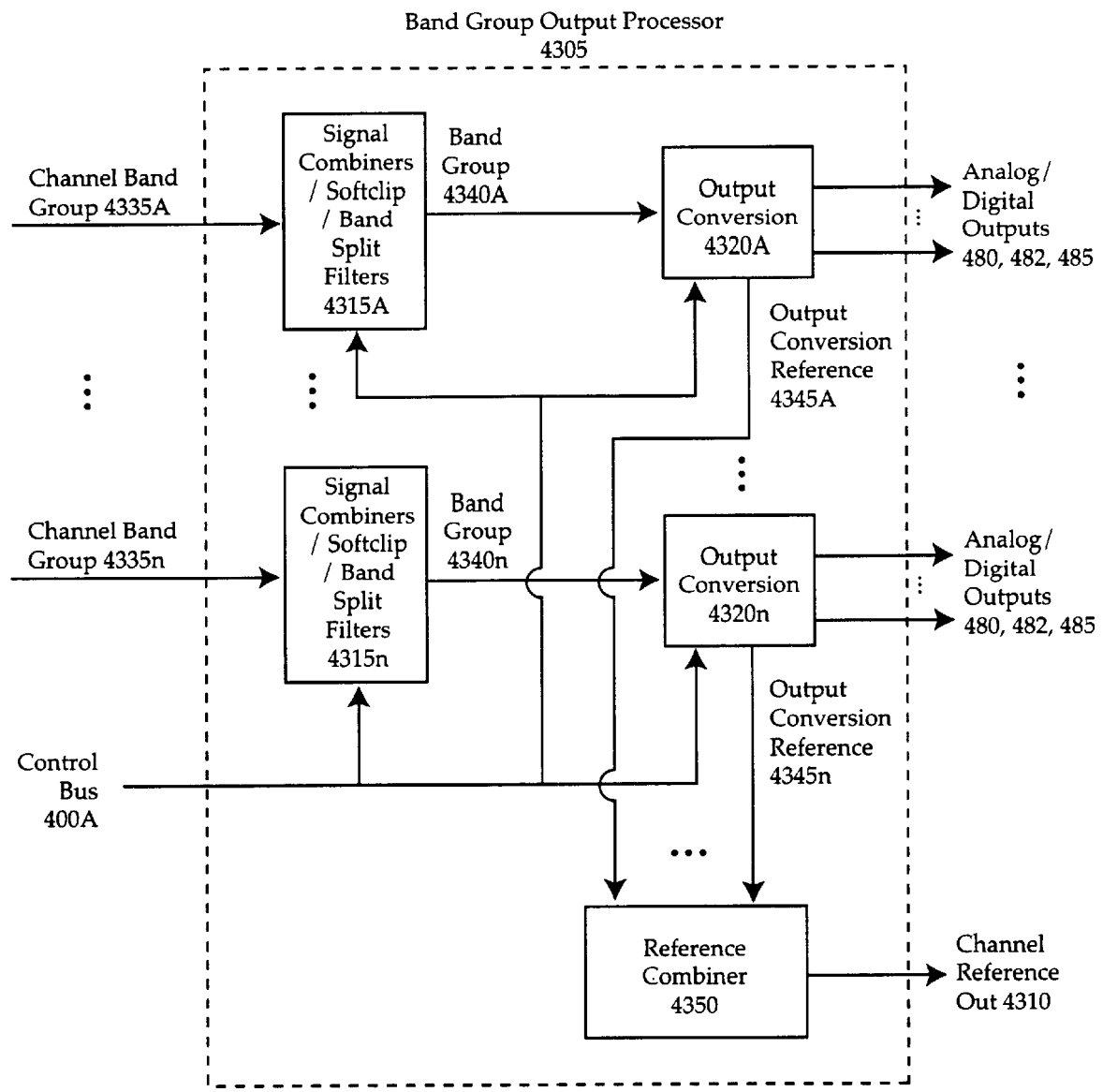

FIG. 43B shows a Band Group Output Processors Block Diagram.

Figure 44:
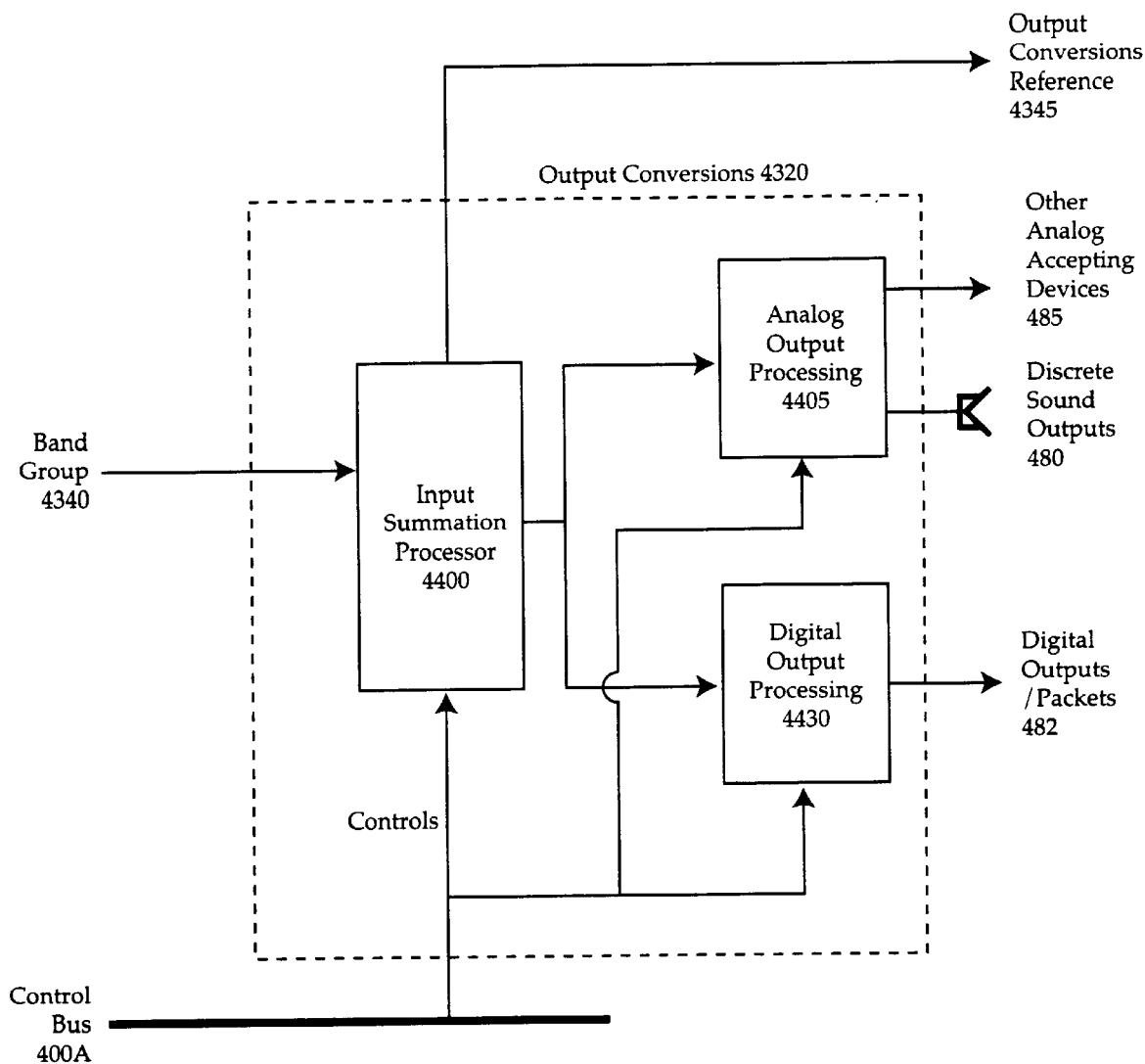

FIG. 44 shows an Output Conversions Block Diagram.

FIGS. 45A–G show Channel/Band Group Processing Configurations. Group Processing Configurations FIG. 46 shows a Volume Control Block flow diagram.

Figure 47:
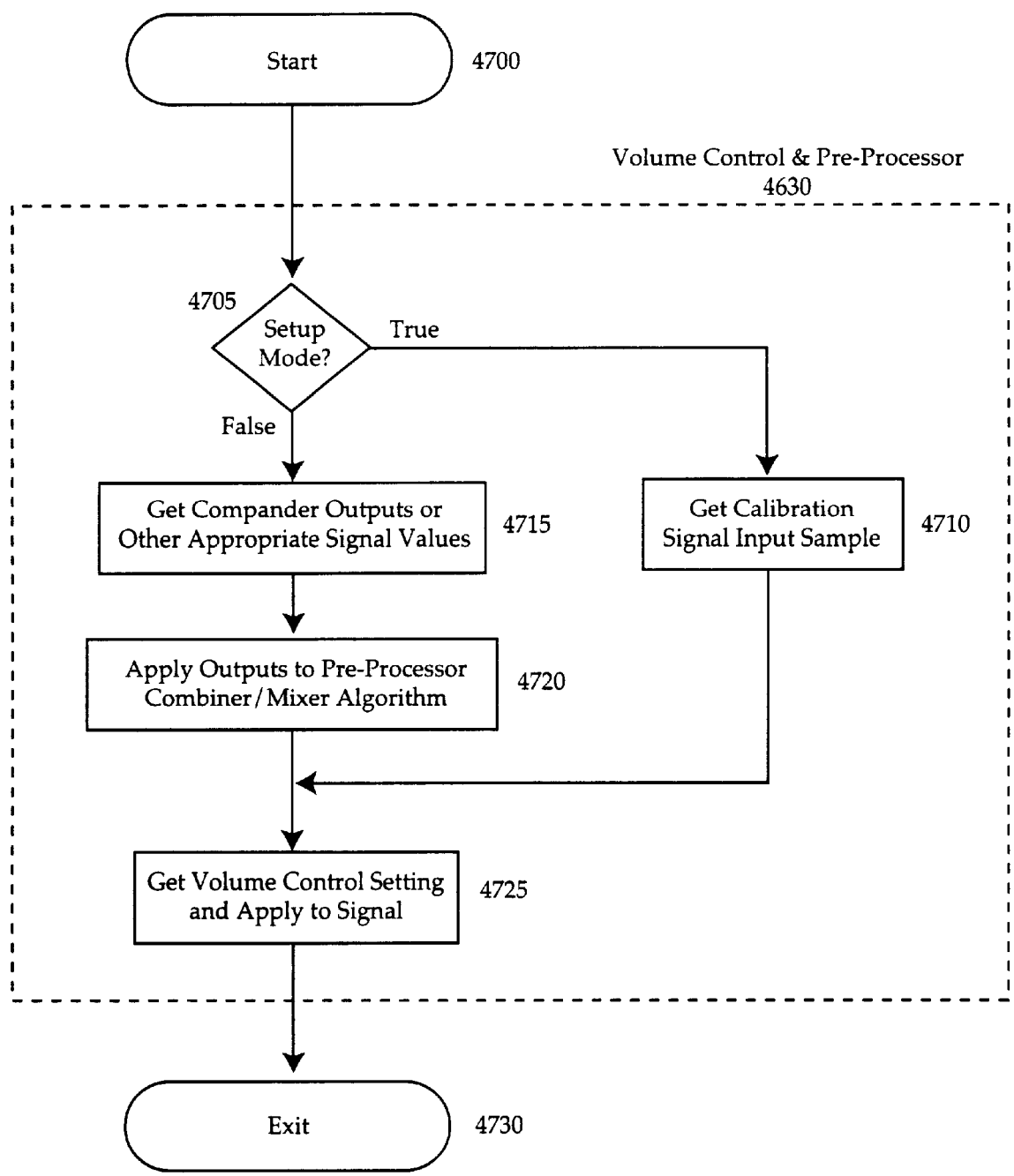

FIG. 47 shows a Volume Control and Pre-Processor flow diagram.

Figure 48:
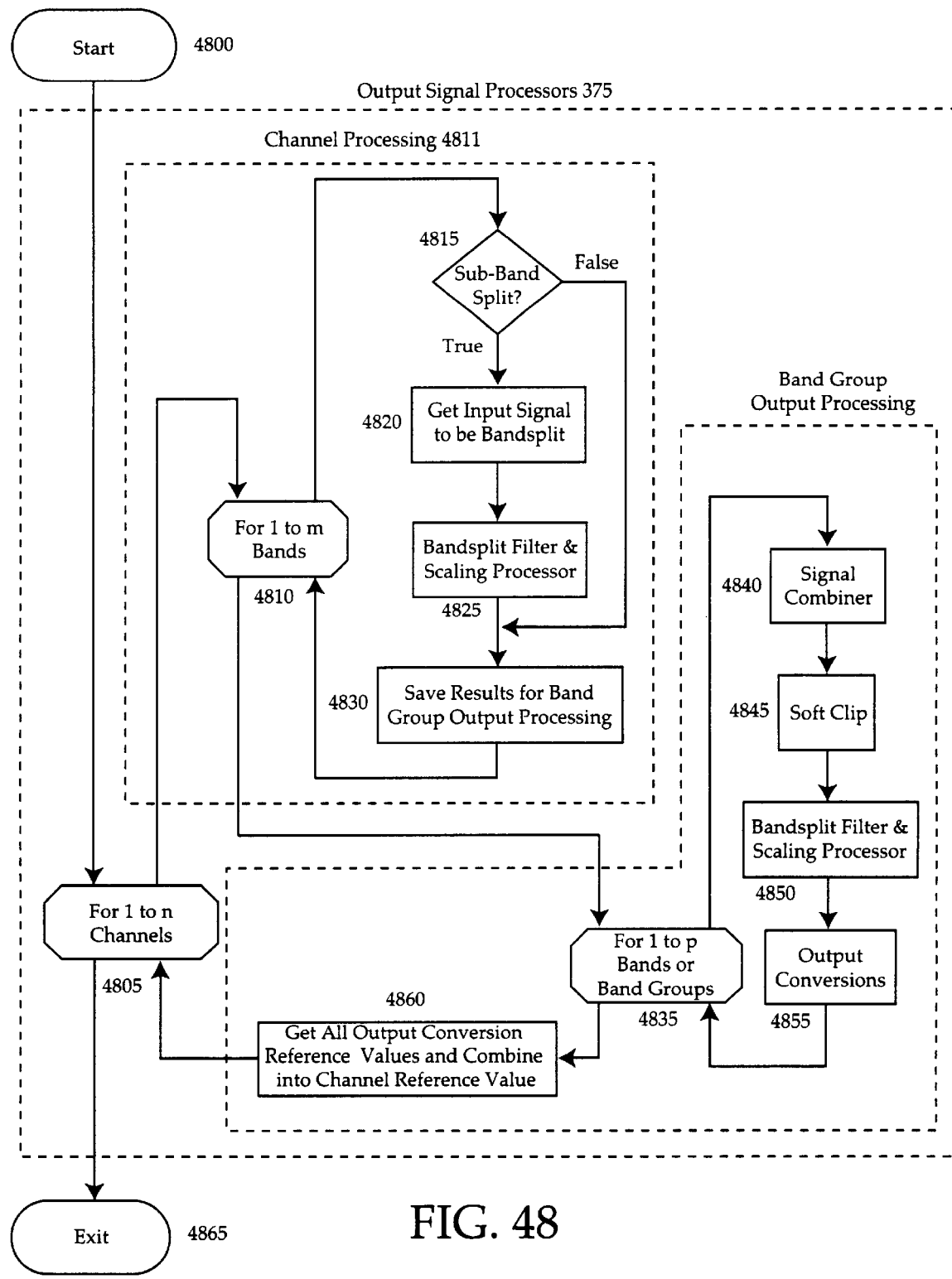

FIG. 48 shows an Output Signal Processors flow diagram.

Figure 49:
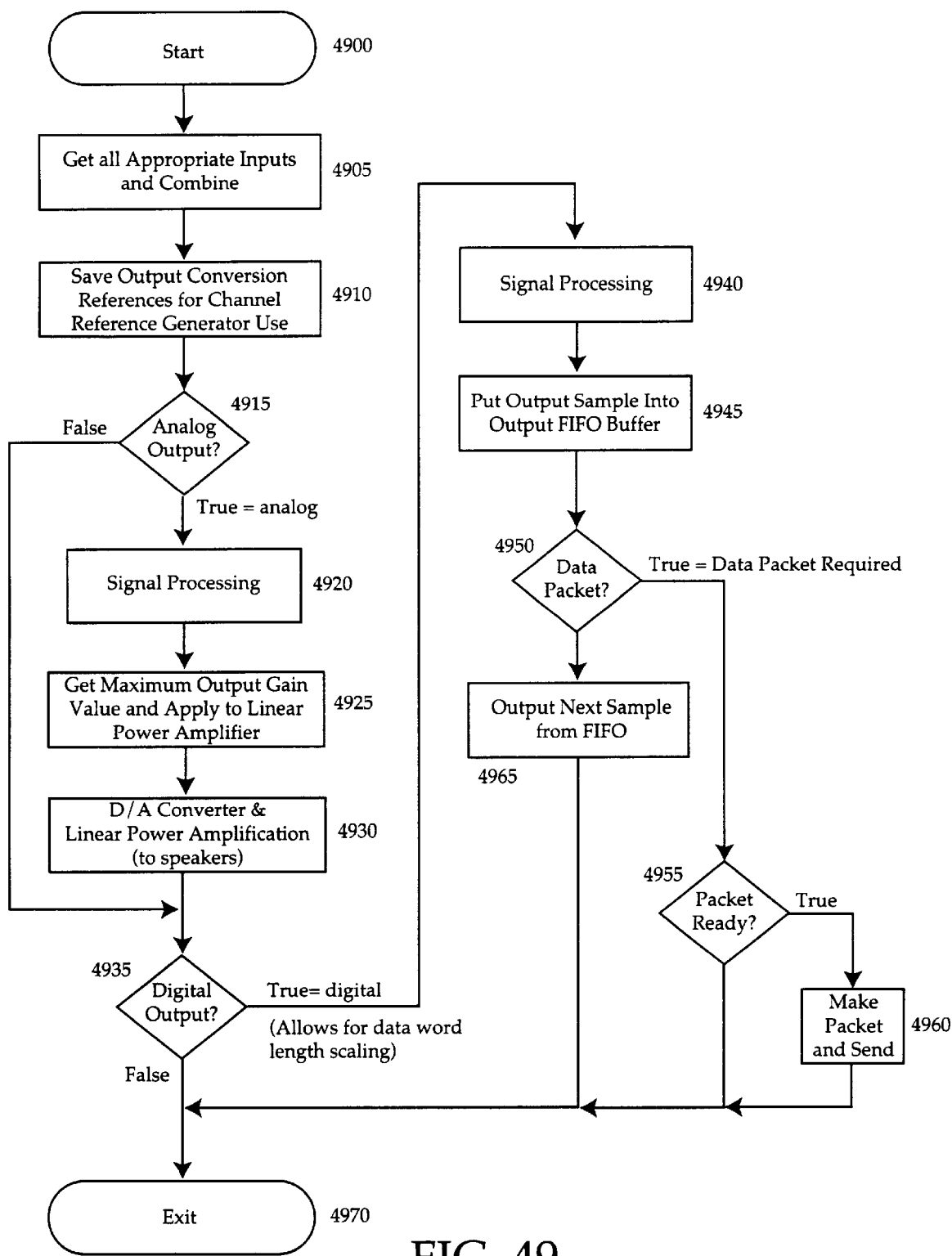

FIG. 49 shows an Output Conversions flow diagram.

Figure 50:
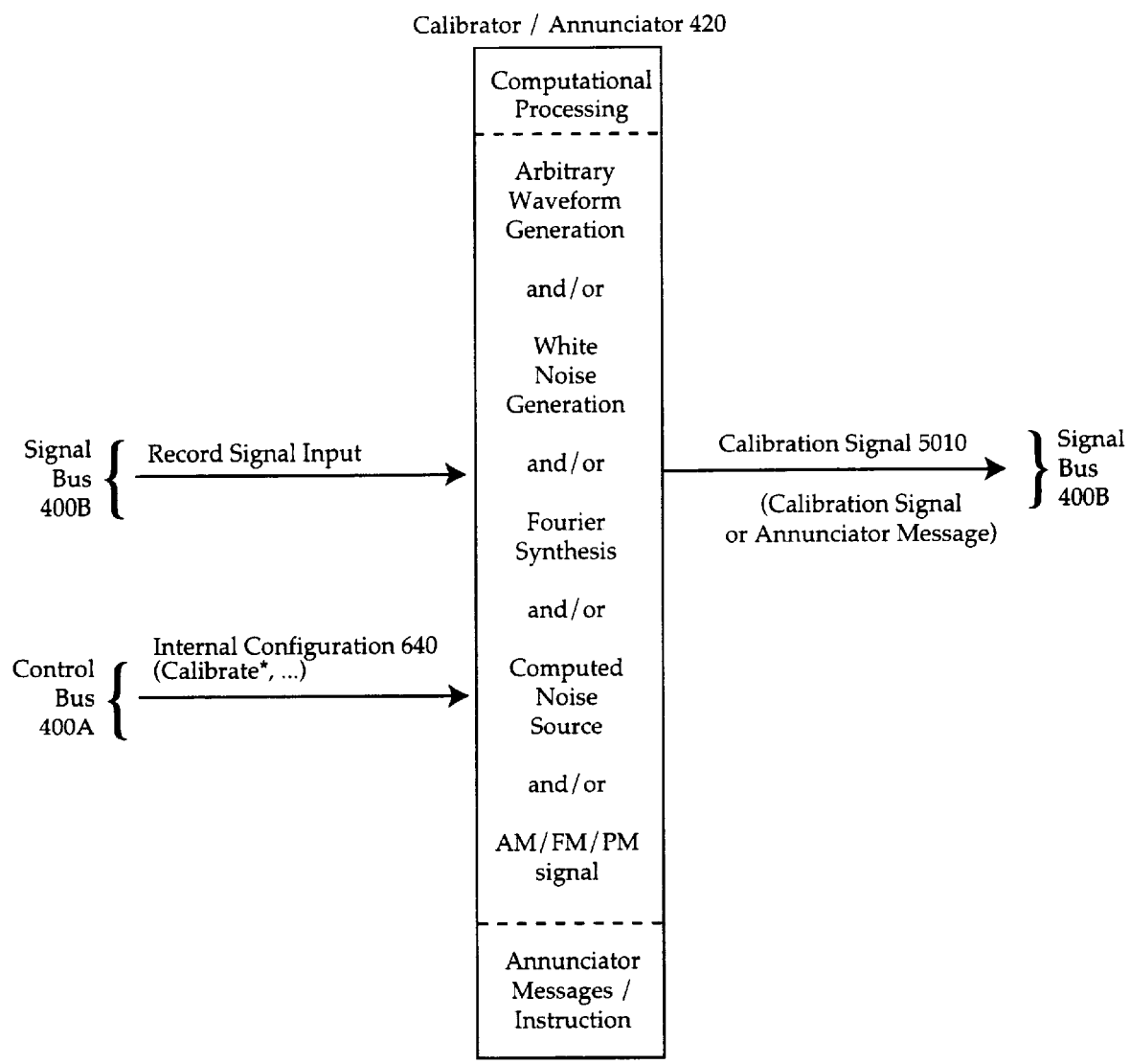

FIG. 50 shows a Calibrator/Annunciator block diagram.

Figure 51:
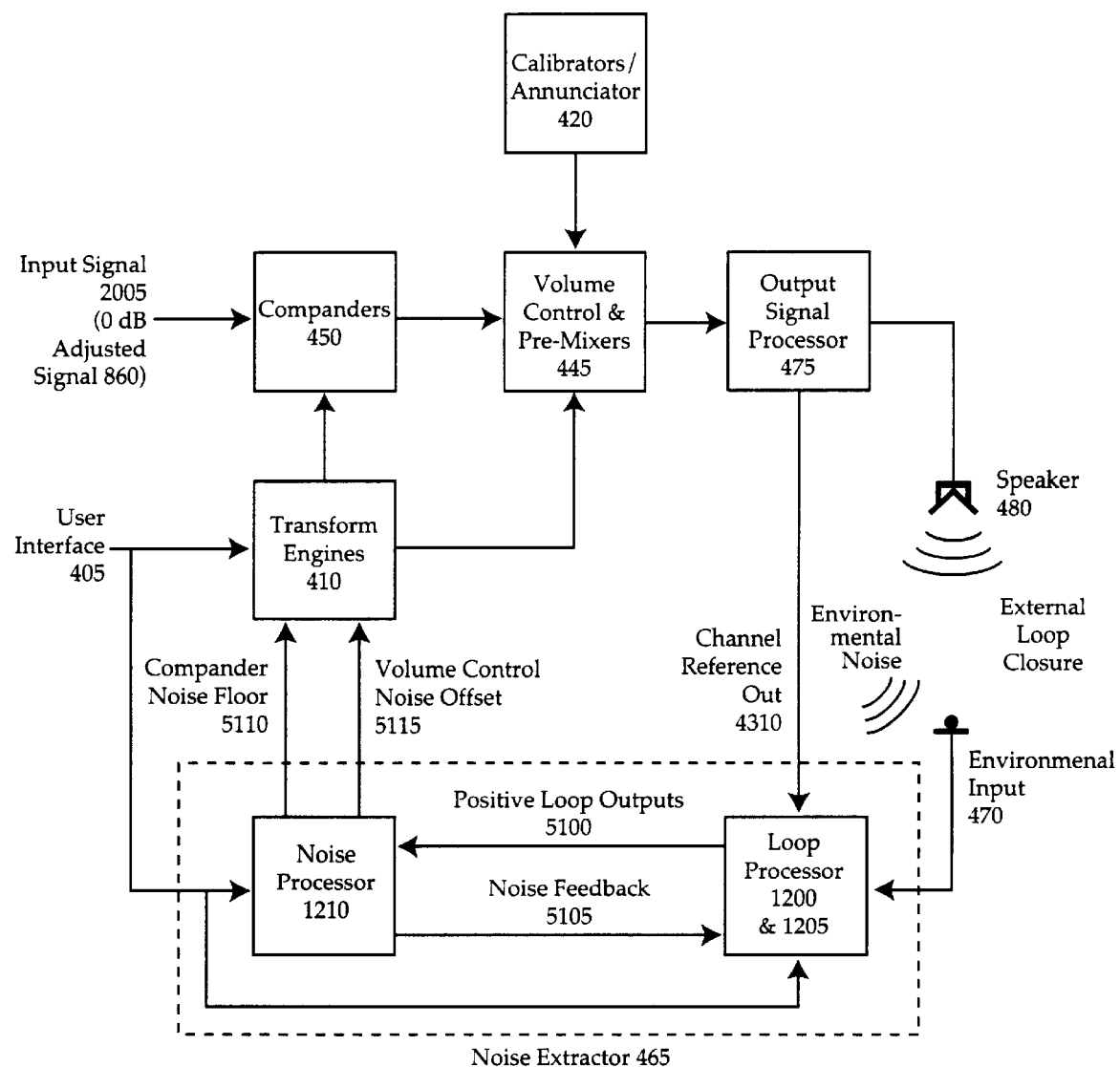

FIG. 51 shows a Conceptual Noise Compensation Loop.

Figure 52A:
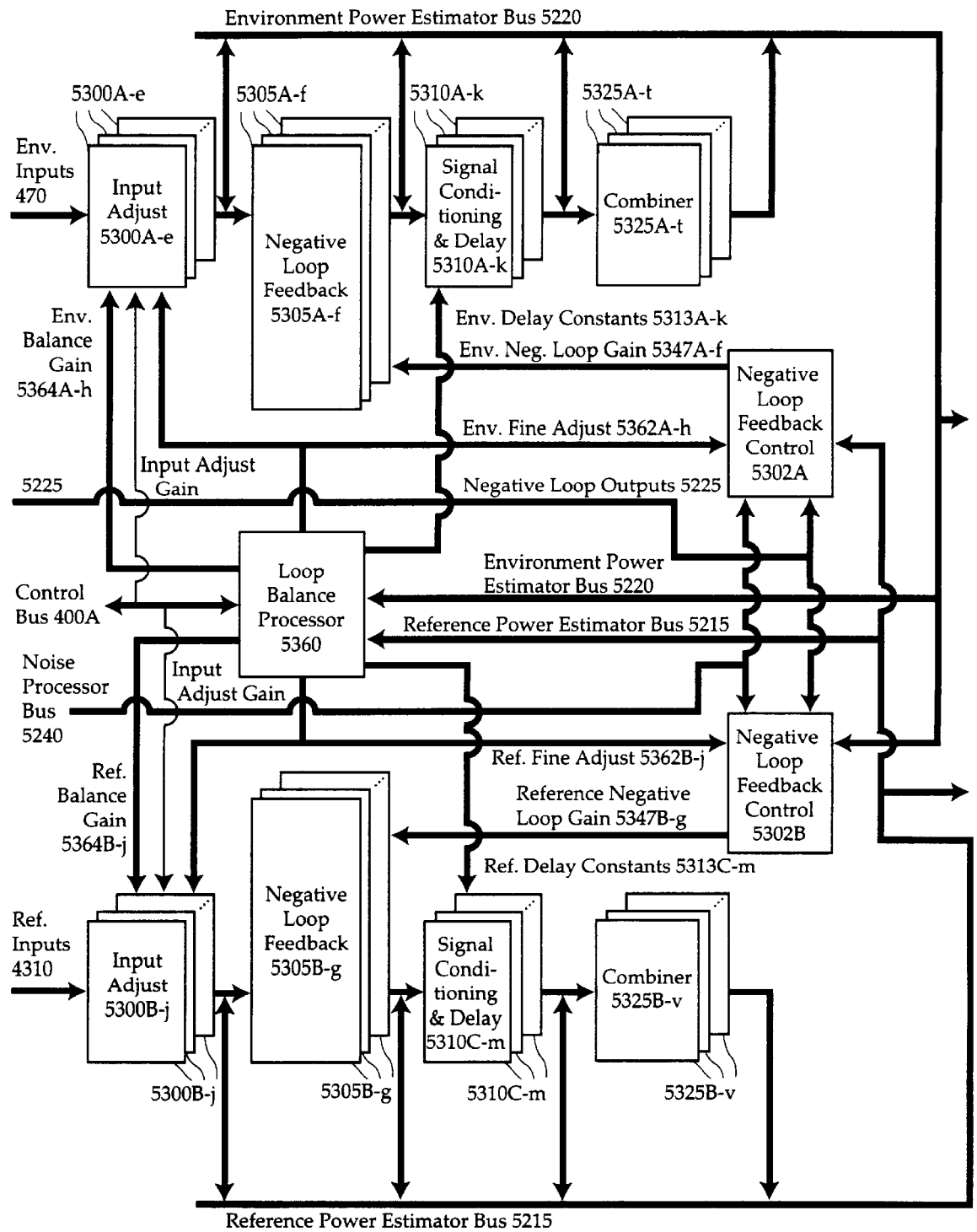

FIG. 52A shows the Loop Processor Block Diagram.

Figure 52B:
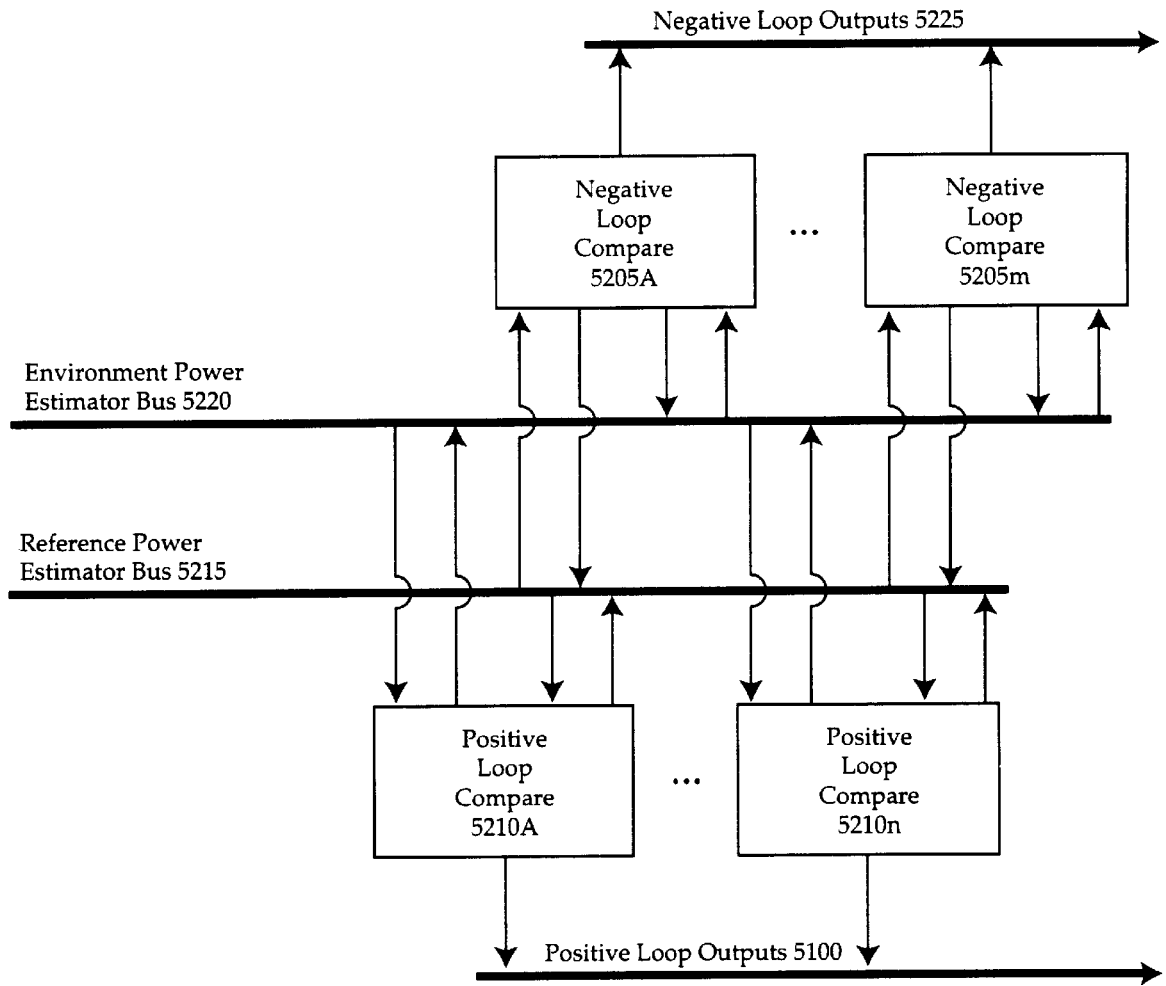

FIG. 52B shows the Positive and Negative Loop Comparisons Block Diagram.

Figure 52C:
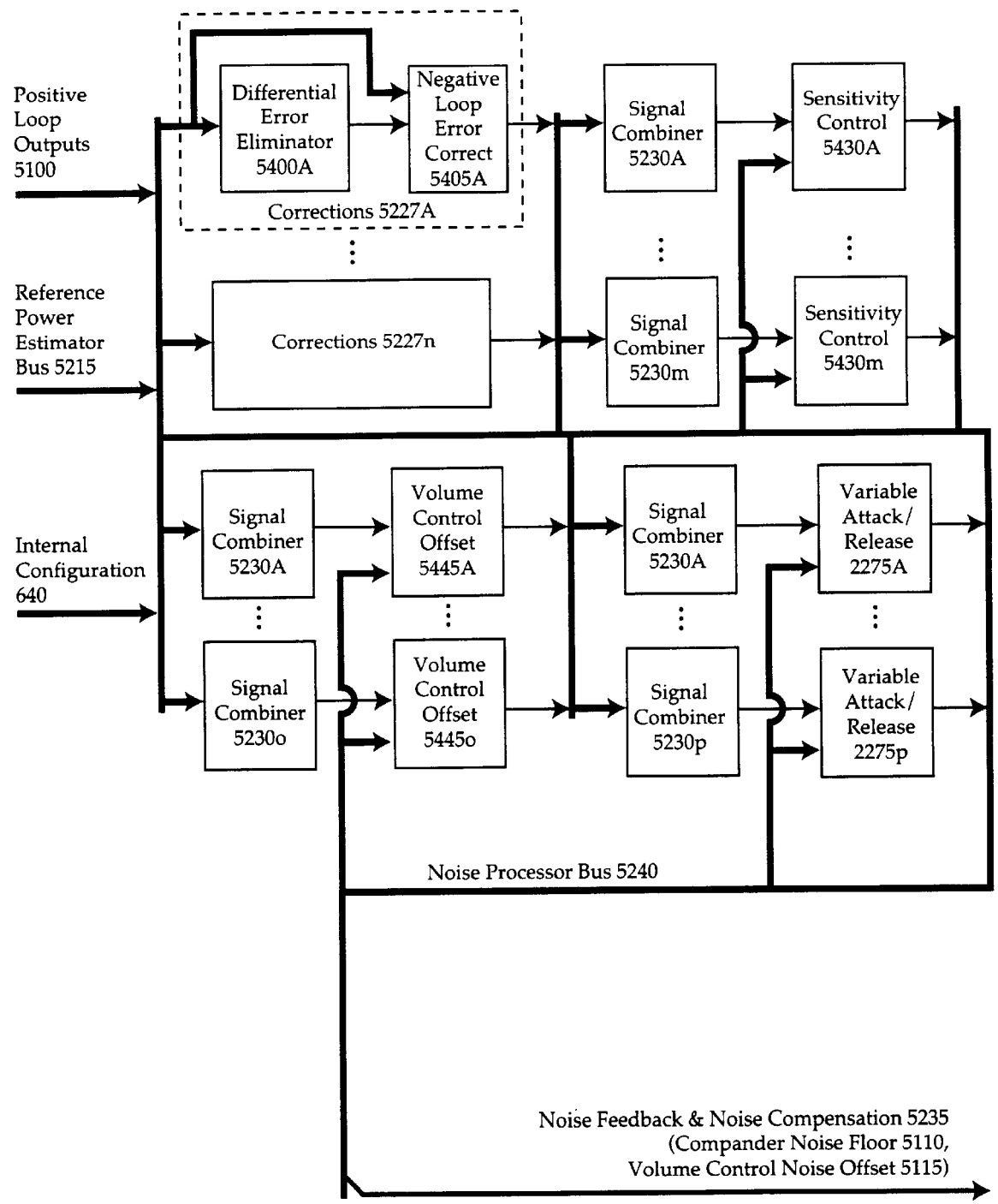

FIG. 52C shows the Noise Processor Block Diagram.

Figure 53A:
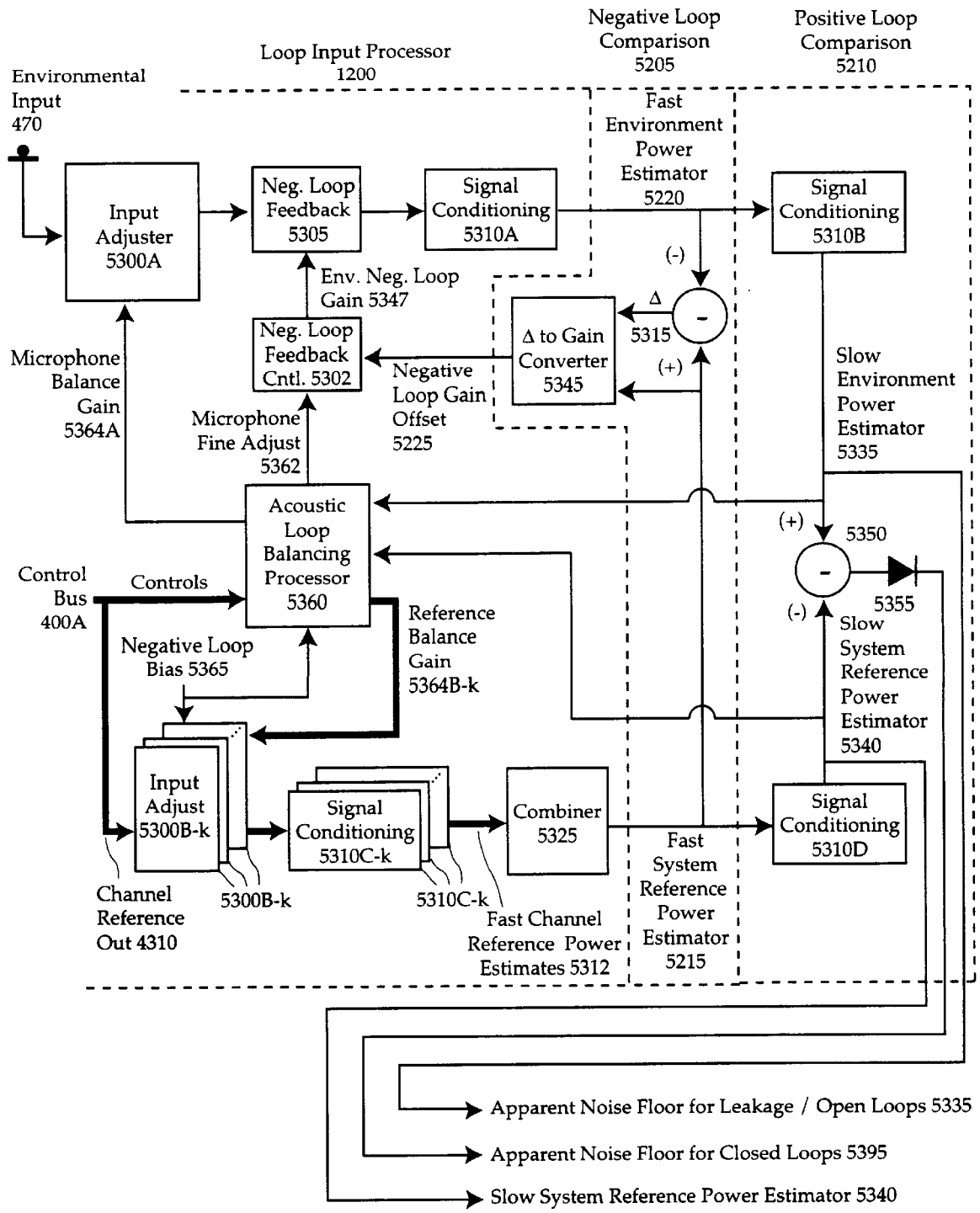

FIG. 53A shows an Example of Single Negative and Positive Loop.

Figure 53B:
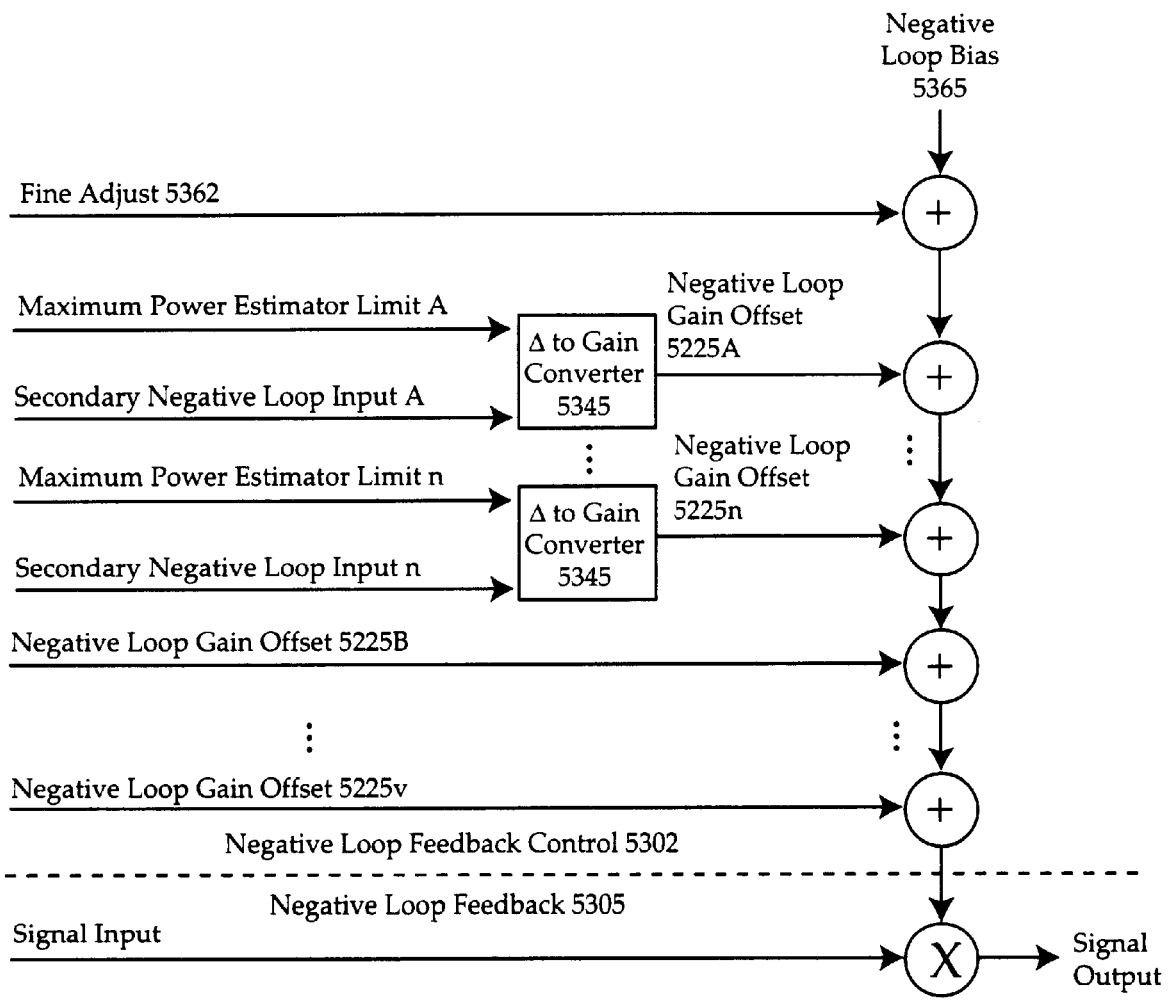

FIG. 53B shows an Example of a Sum of Offsets Negative Loop Feedback.

Figure 53C:
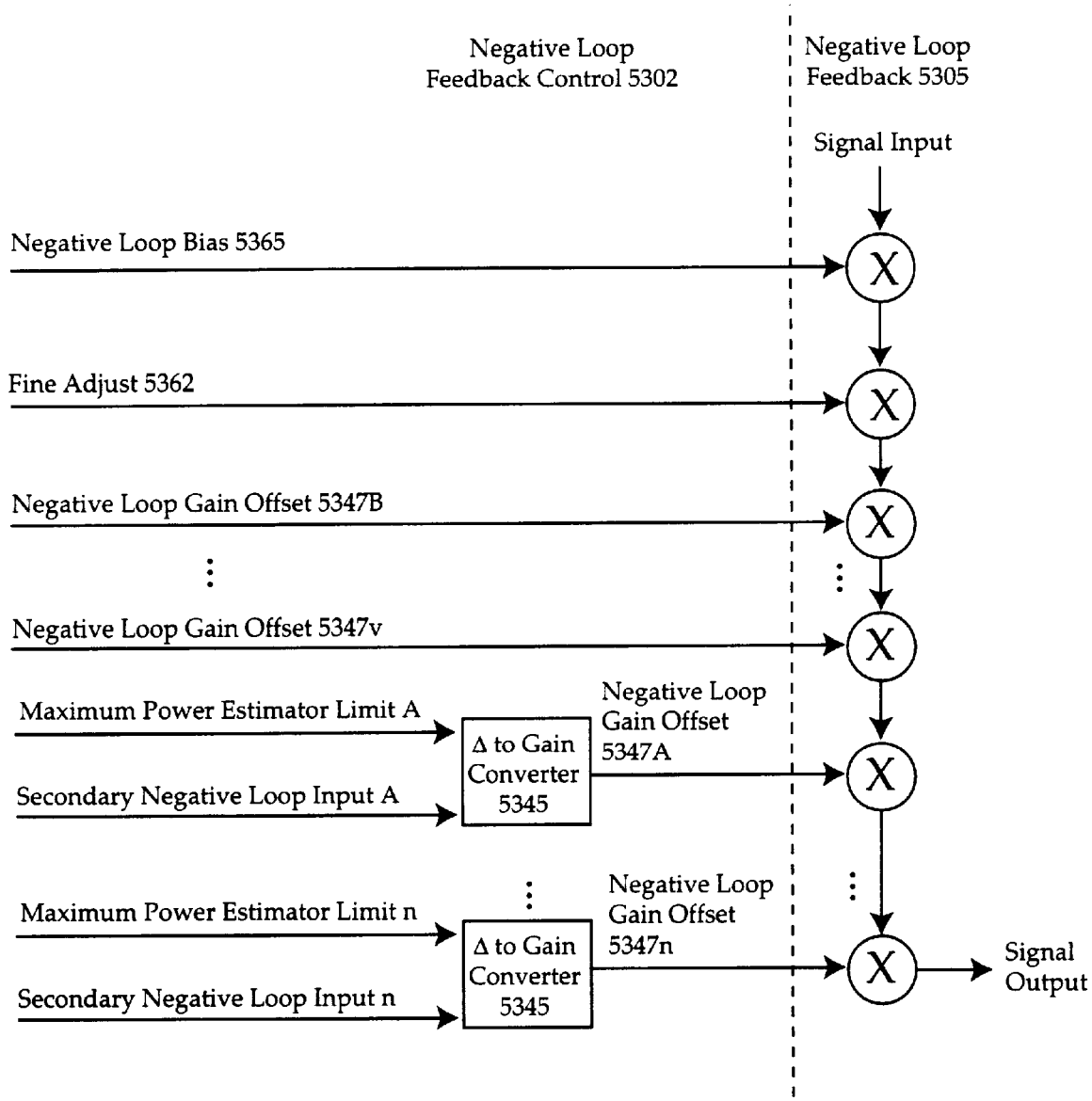

FIG. 53C shows an Example of a Product Chain Negative Loop Feedback.

Figure 53D:
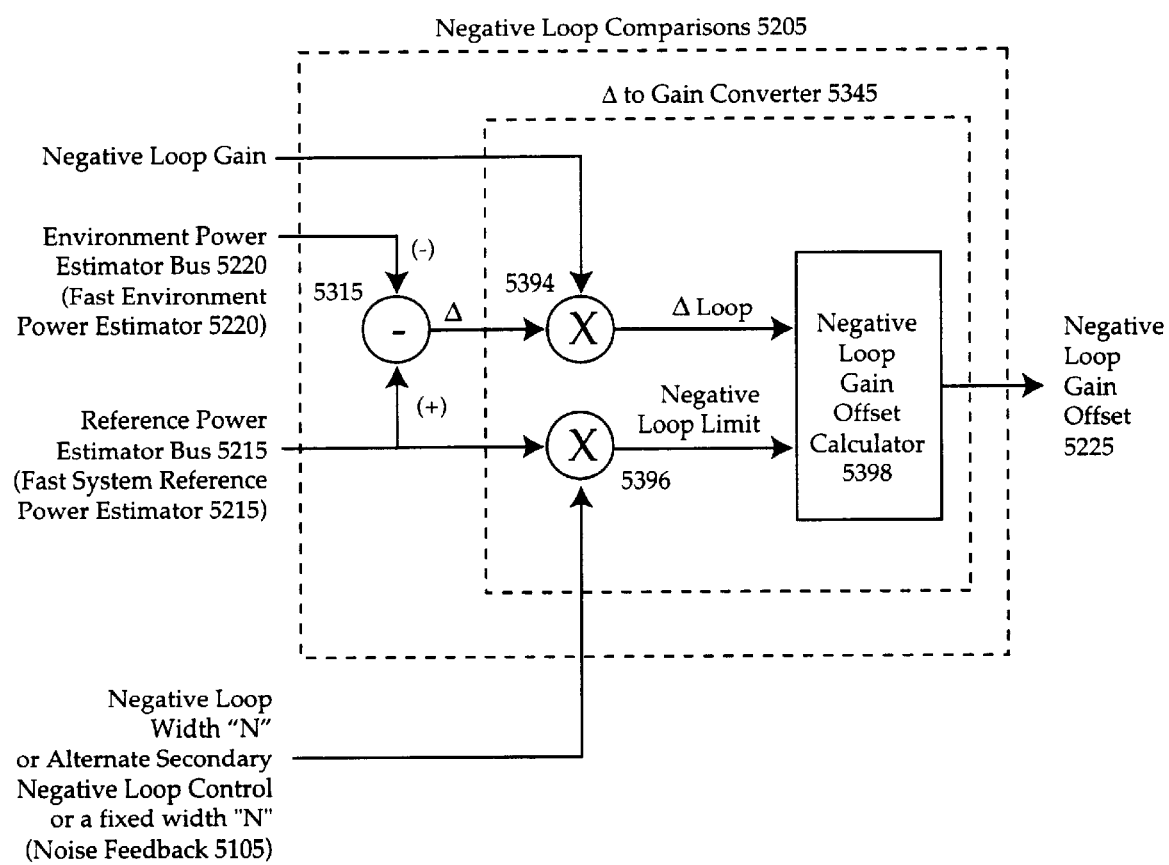

FIG. 53D shows a Detailed Negative Loop Comparison and Δ to Gain Converter.

Figure 53E:
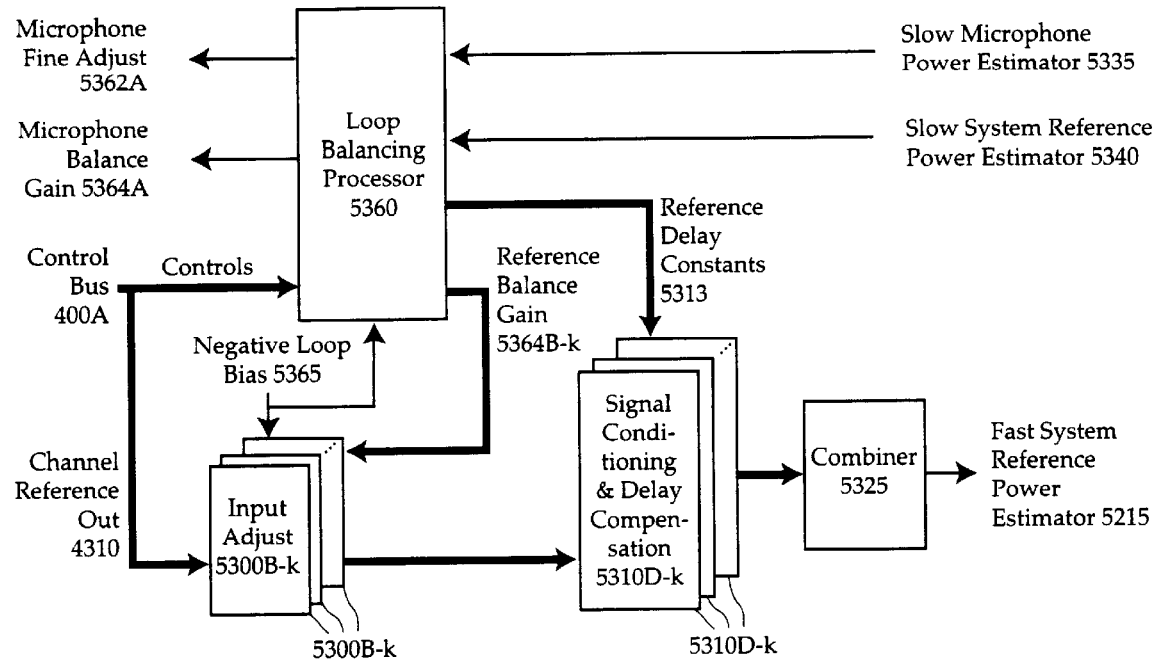

FIG. 53E shows an example of Loop Balancing with Multiple Delay Compensation Elements.

Figure 53F:
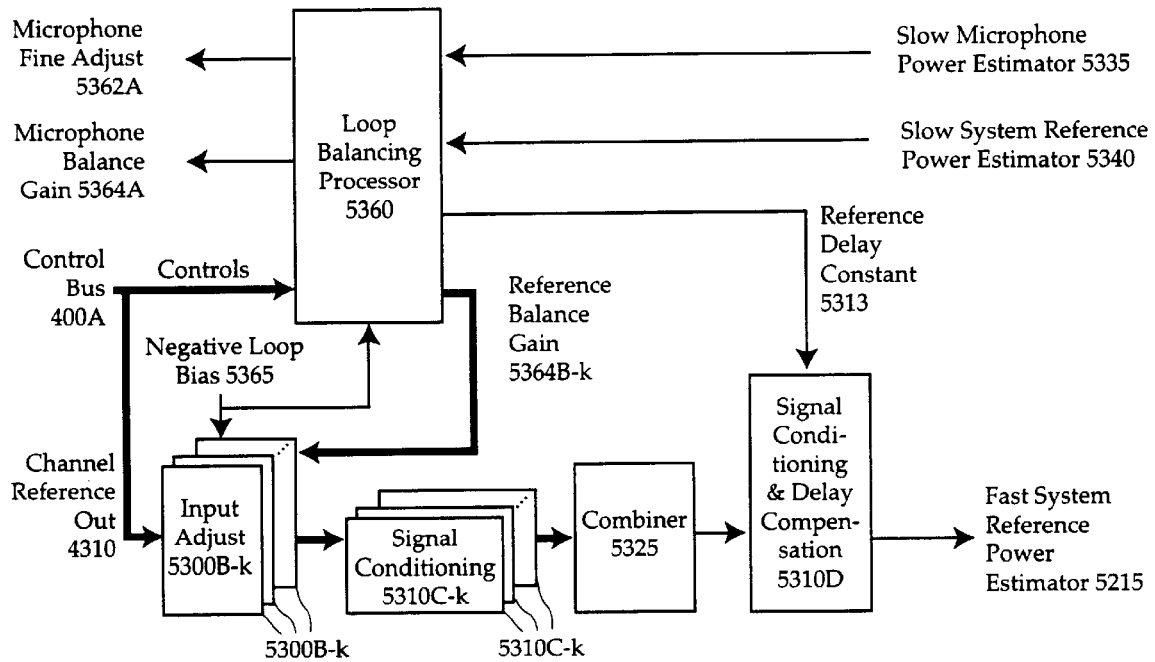

FIG. 53F shows an example of Loop Balancing with a common Delay Compensation Element.

Figure 54A:
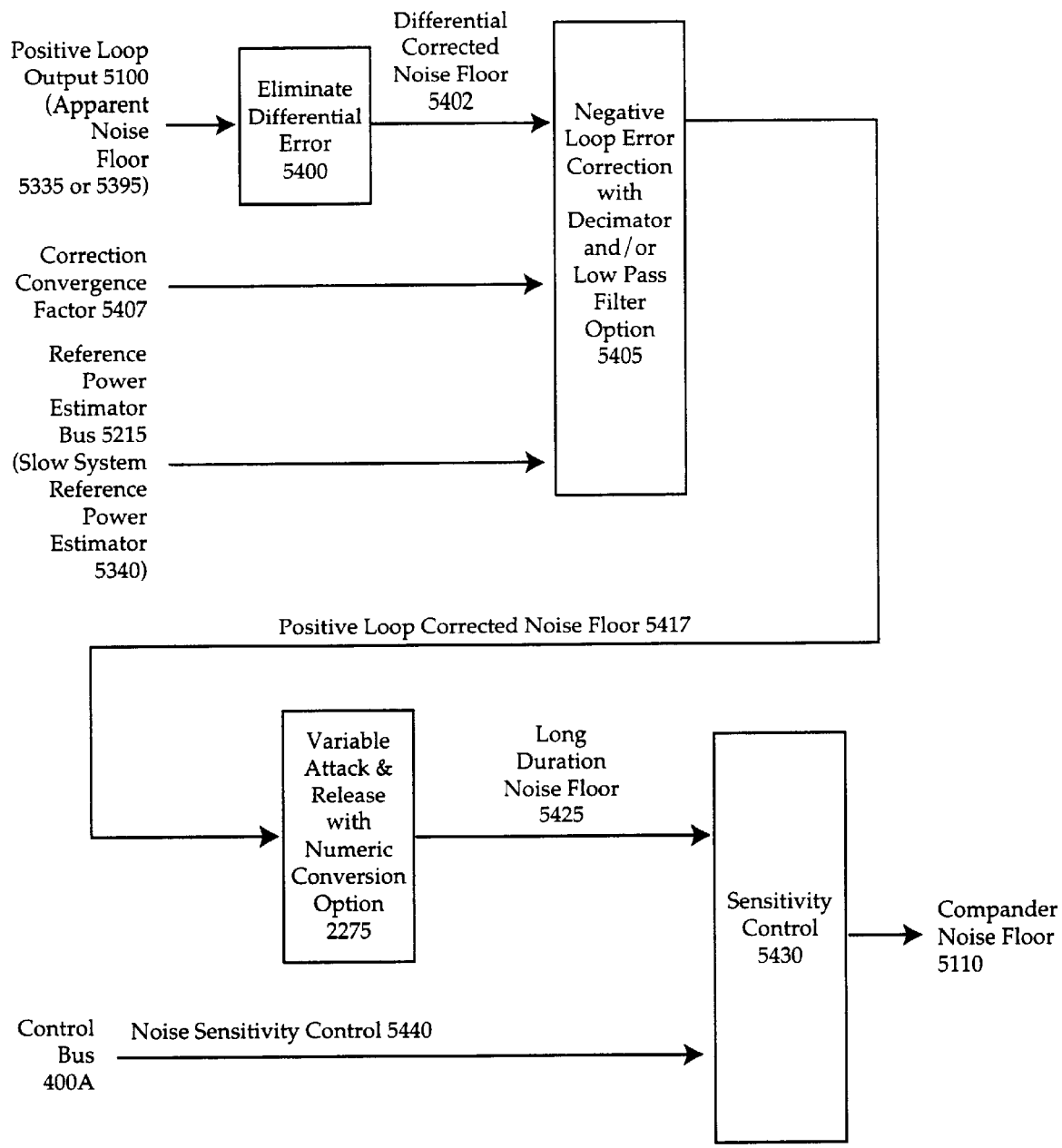

FIG. 54A shows a Preferred Embodiment Noise Processor for Compander Method.

Figure 54B:
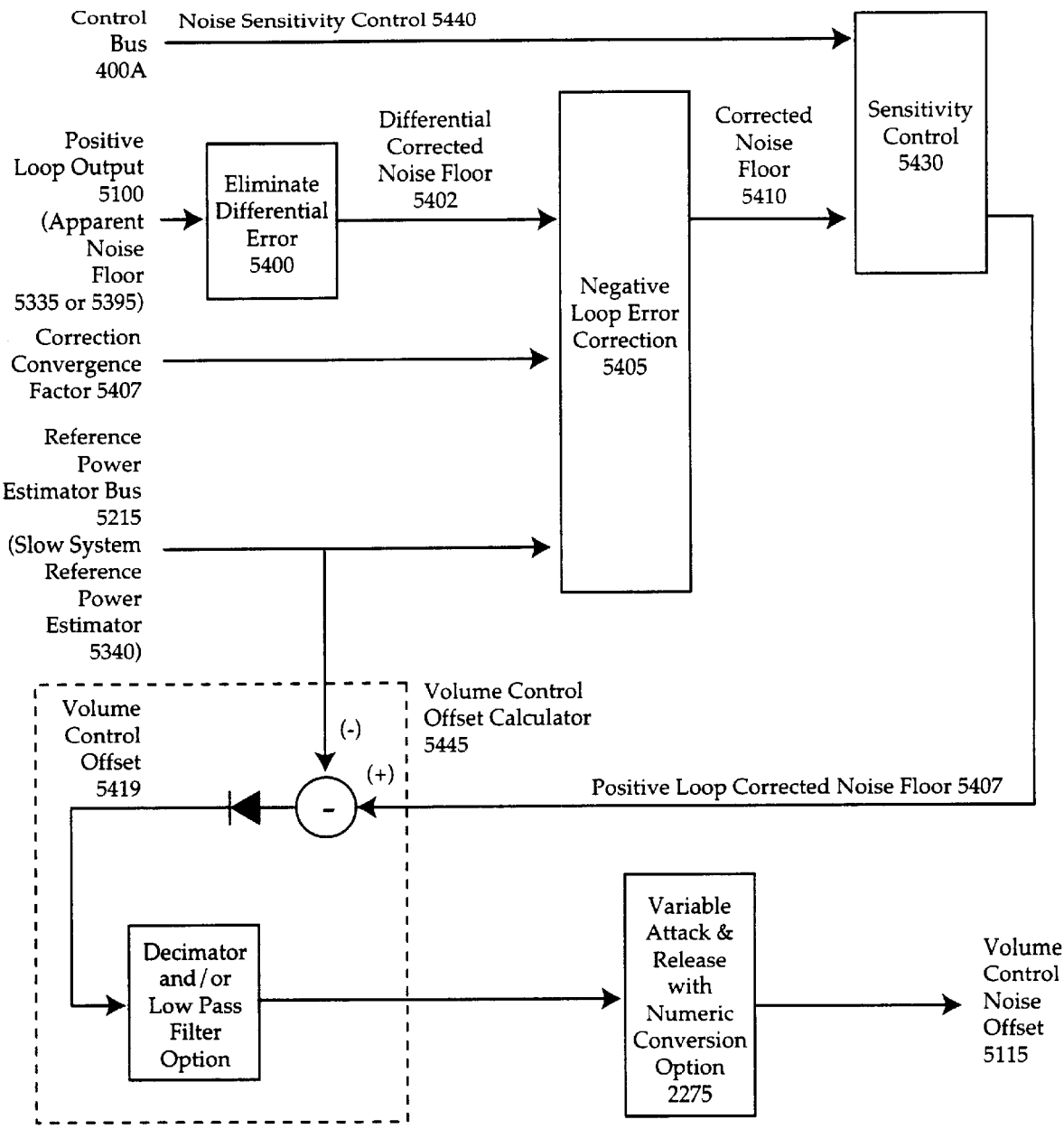

FIG. 54B shows a Preferred Embodiment Noise Processor for Volume Control Only Method.

Figure 54C:
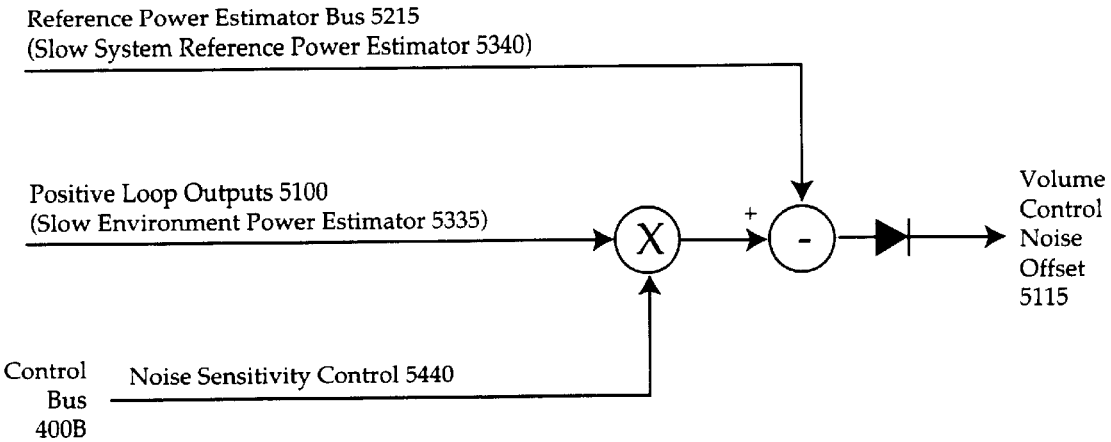

FIG. 54C shows an example of a Simple Noise Processor for Volume Control Only Method.

Figure 54D:
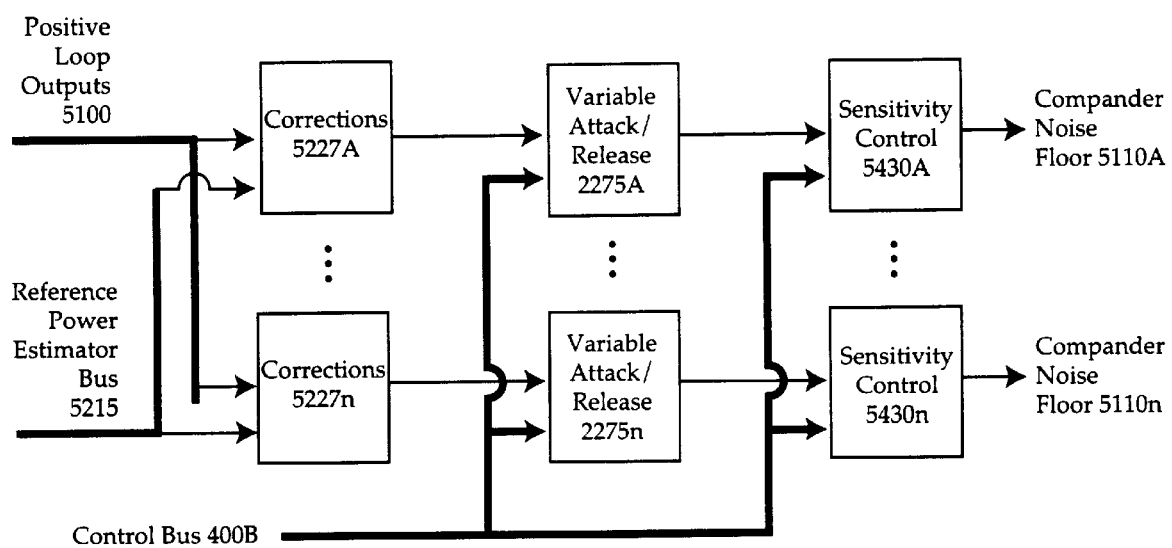

FIG. 54D shows an example of a Multiple Positive Loop Input Noise Processor for Multiple Independent Companders.

Figure 54E:
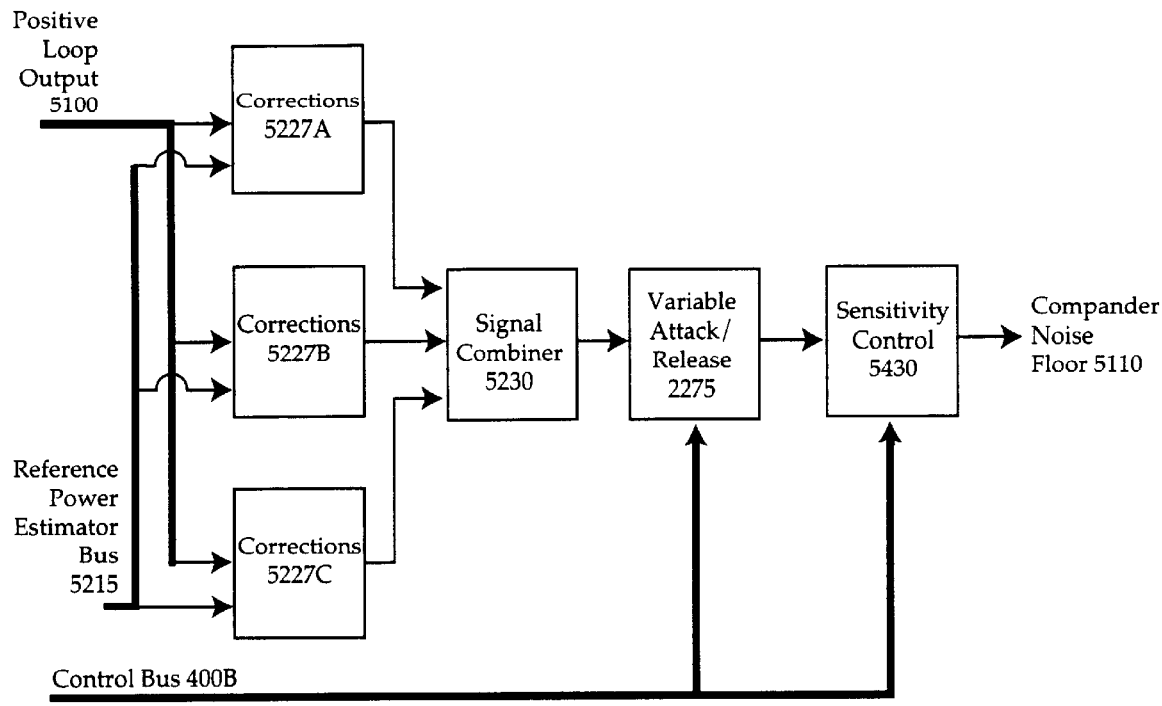

FIG. 54E shows an example of a Three Positive Loop Input Noise Processor.

Figure 54F:
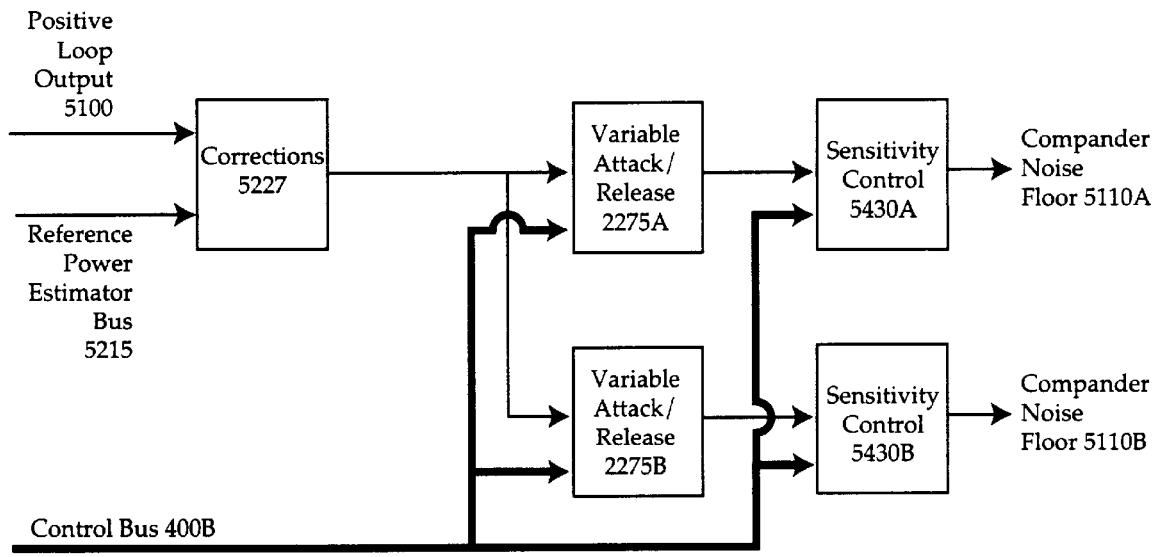

FIG. 54F shows an example of a Single Positive Loop Input Noise Processor for Multiple Independent Companders.

Figure 54G:
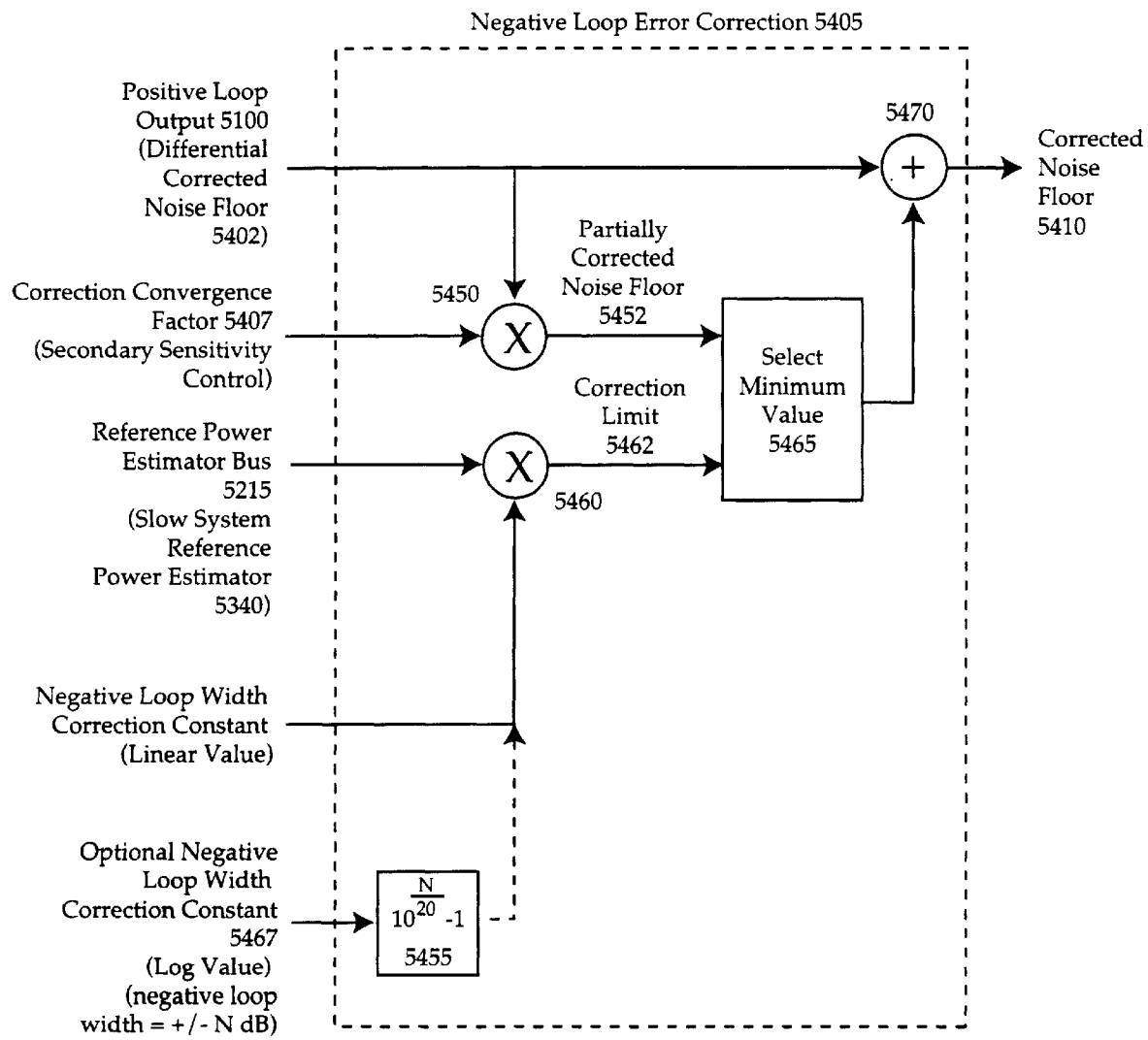

FIG. 54G shows an Example of Negative Loop Error Correction.

Figure 54H:
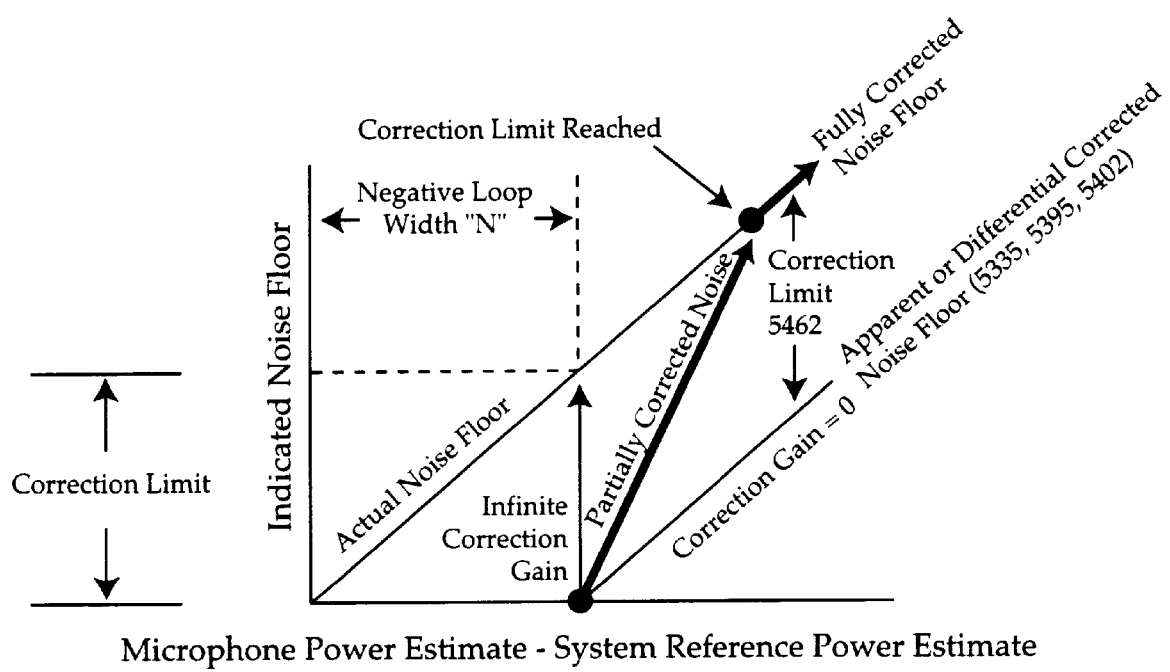

FIG. 54H shows a Noise vs. Microphone Graph.

Figure 55A:
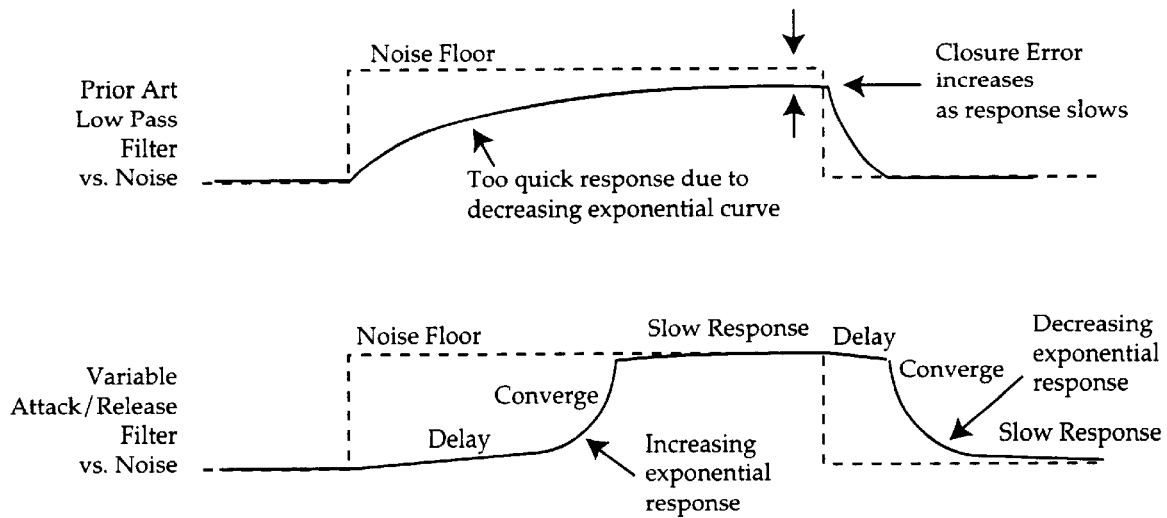

FIG. 55A shows a Noise Compensation Variable Attack/Release Linear Response.

Figure 55B:
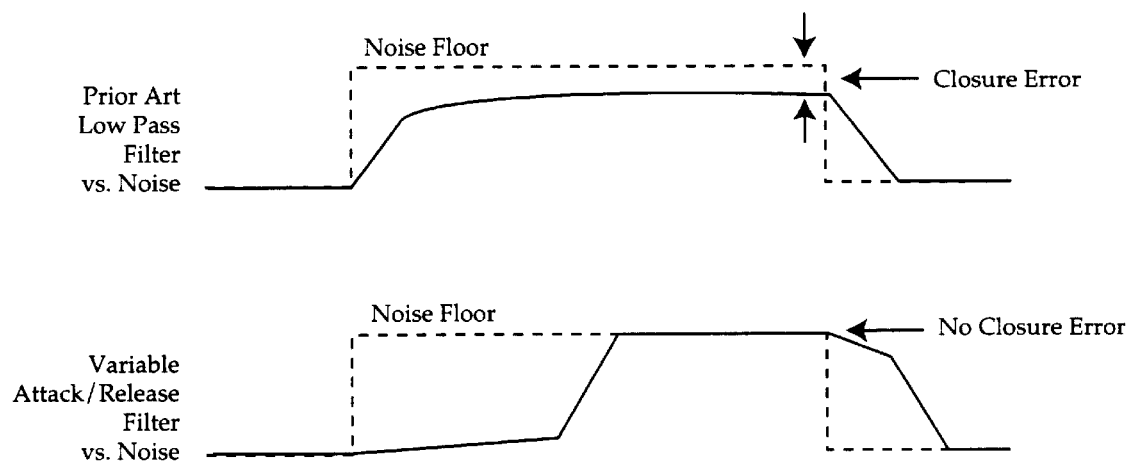

FIG. 55B shows a Noise Compensation Variable Attack/Release Log Response (Ear Response).

Figure 55C:
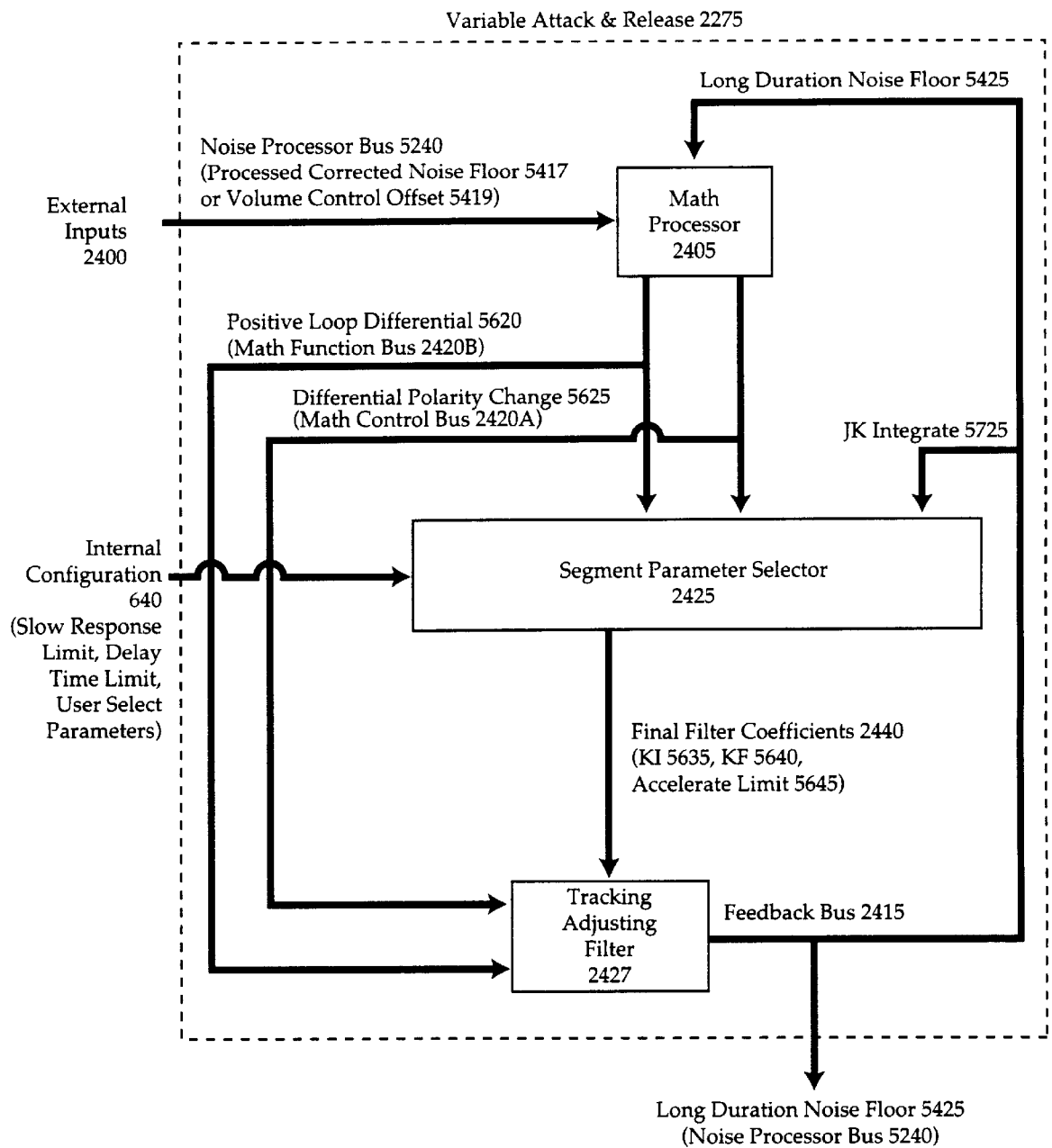

FIG. 55C shows a Noise Compensator Attack/Release Processor Block Diagram

Figure 56:
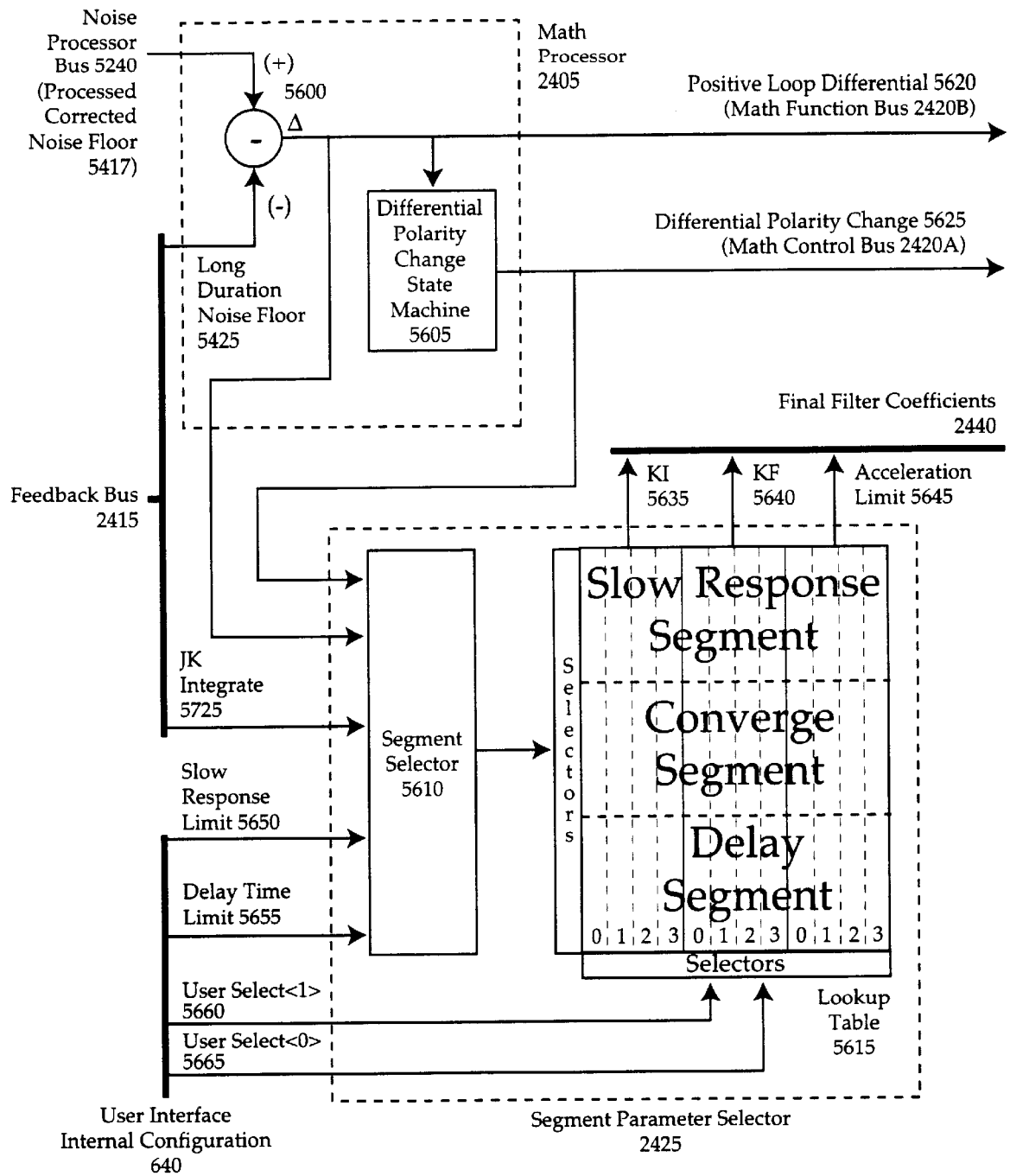

FIG. 56 shows an exemplary Embodiment Attack/Release Module for Noise Processor—Part A.

Figure 57A:
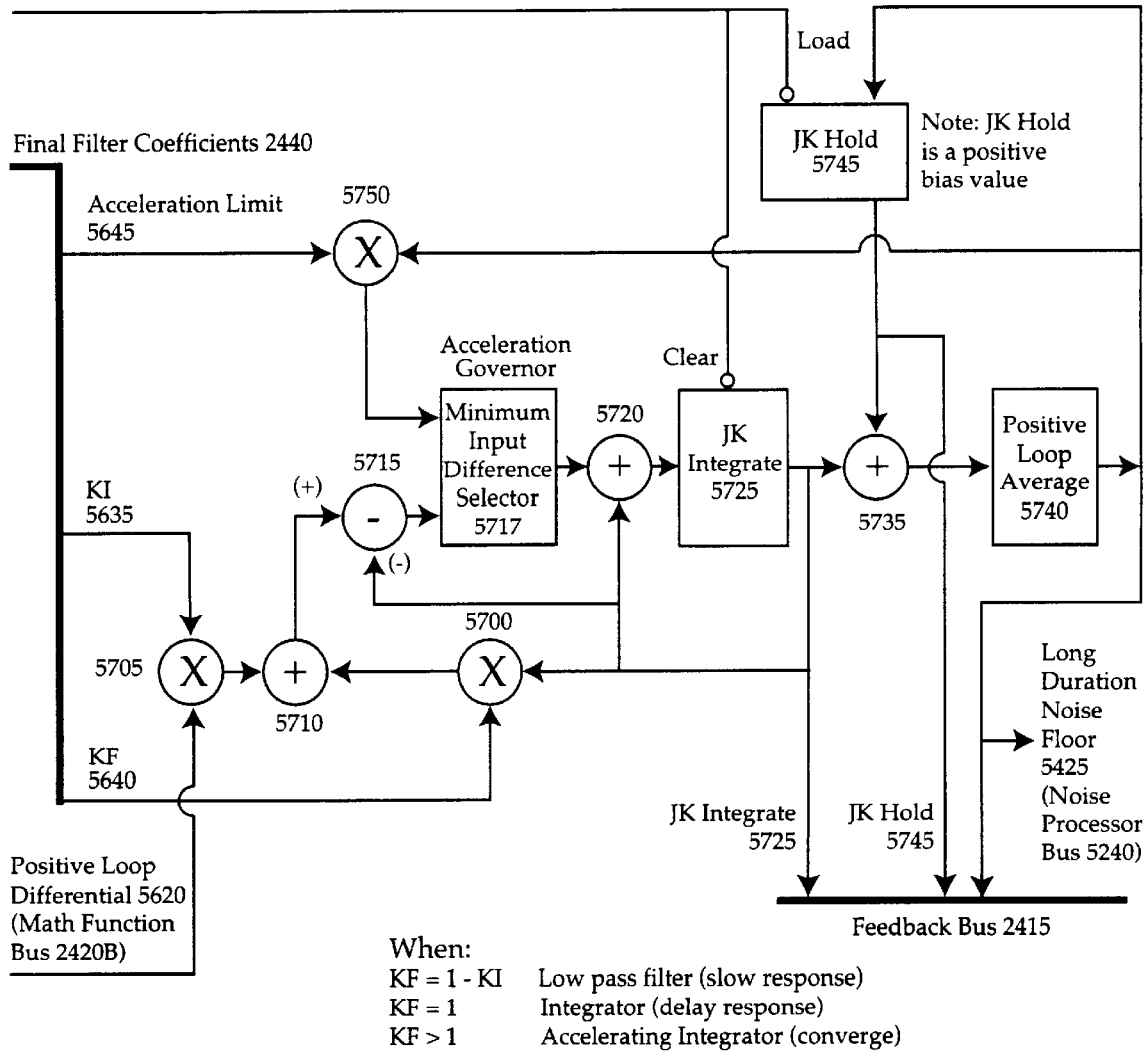

FIG. 57A shows an exemplary Embodiment Attack/Release Module for Noise Processor—Part B.

Figure 57B:
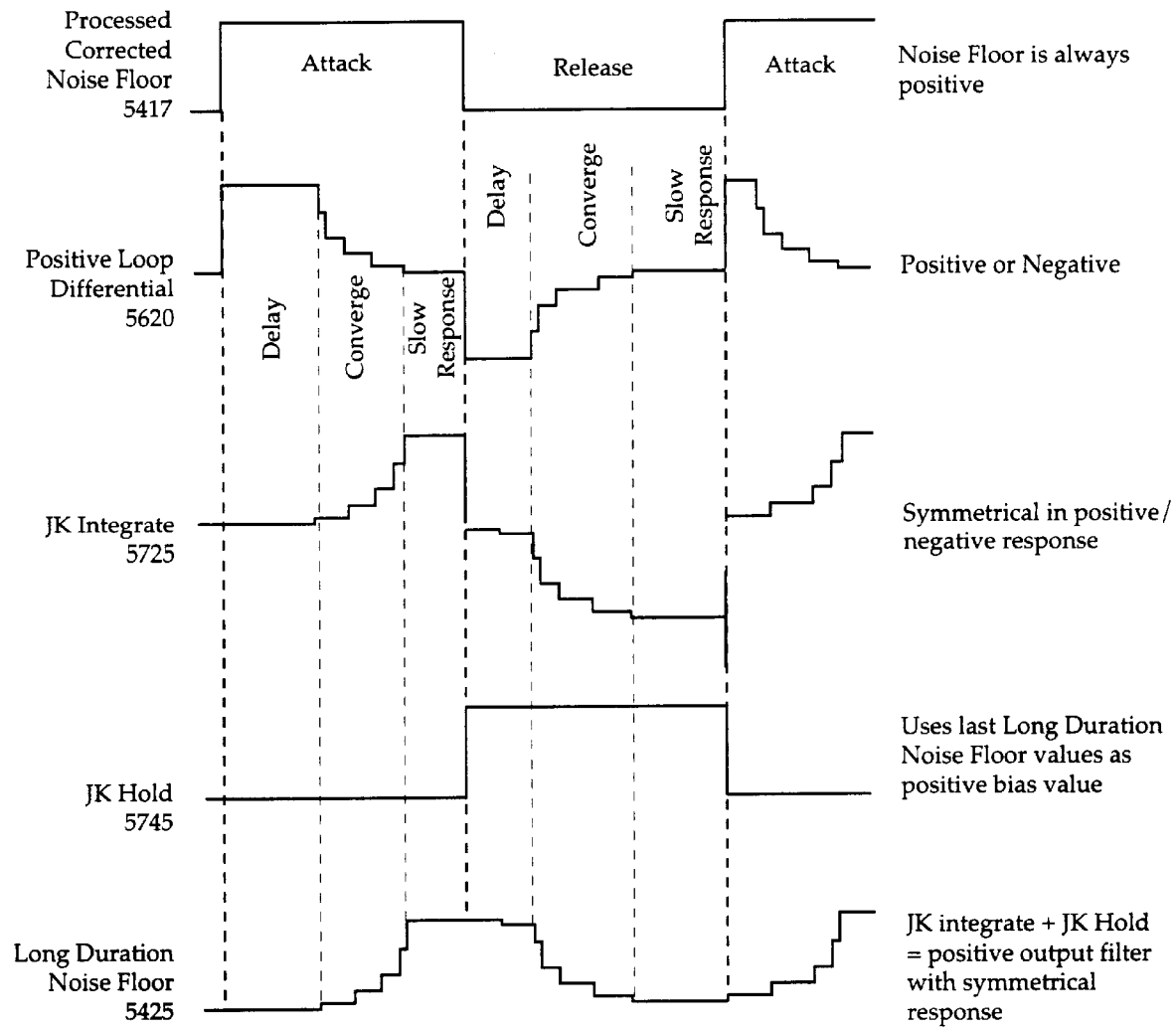

FIG. 57B shows Tracking Adjusting Noise Filter Signals.

Figure 58:
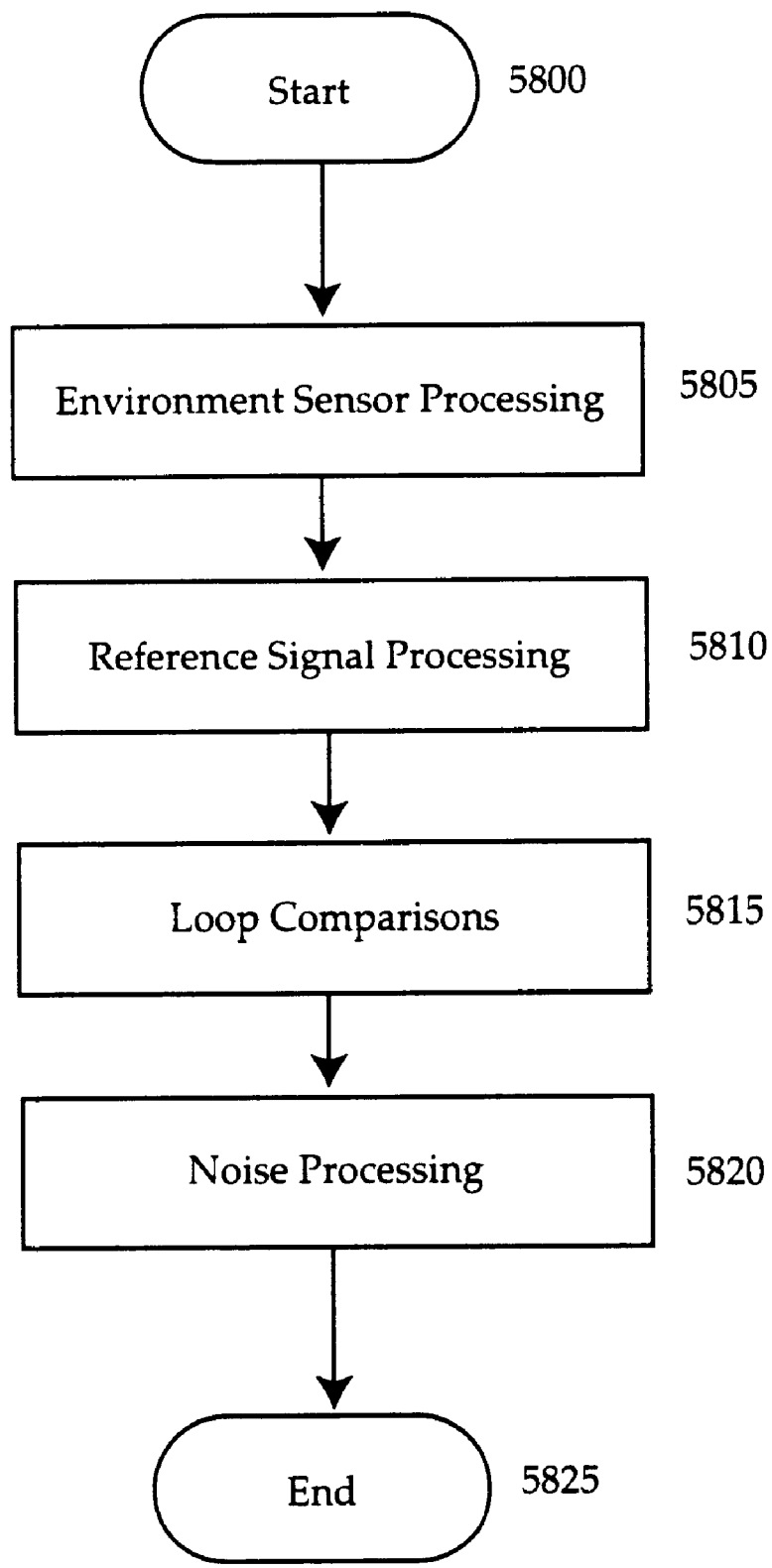

FIG. 58 shows the Top Level Noise Detector flow diagram.

Figure 59A:
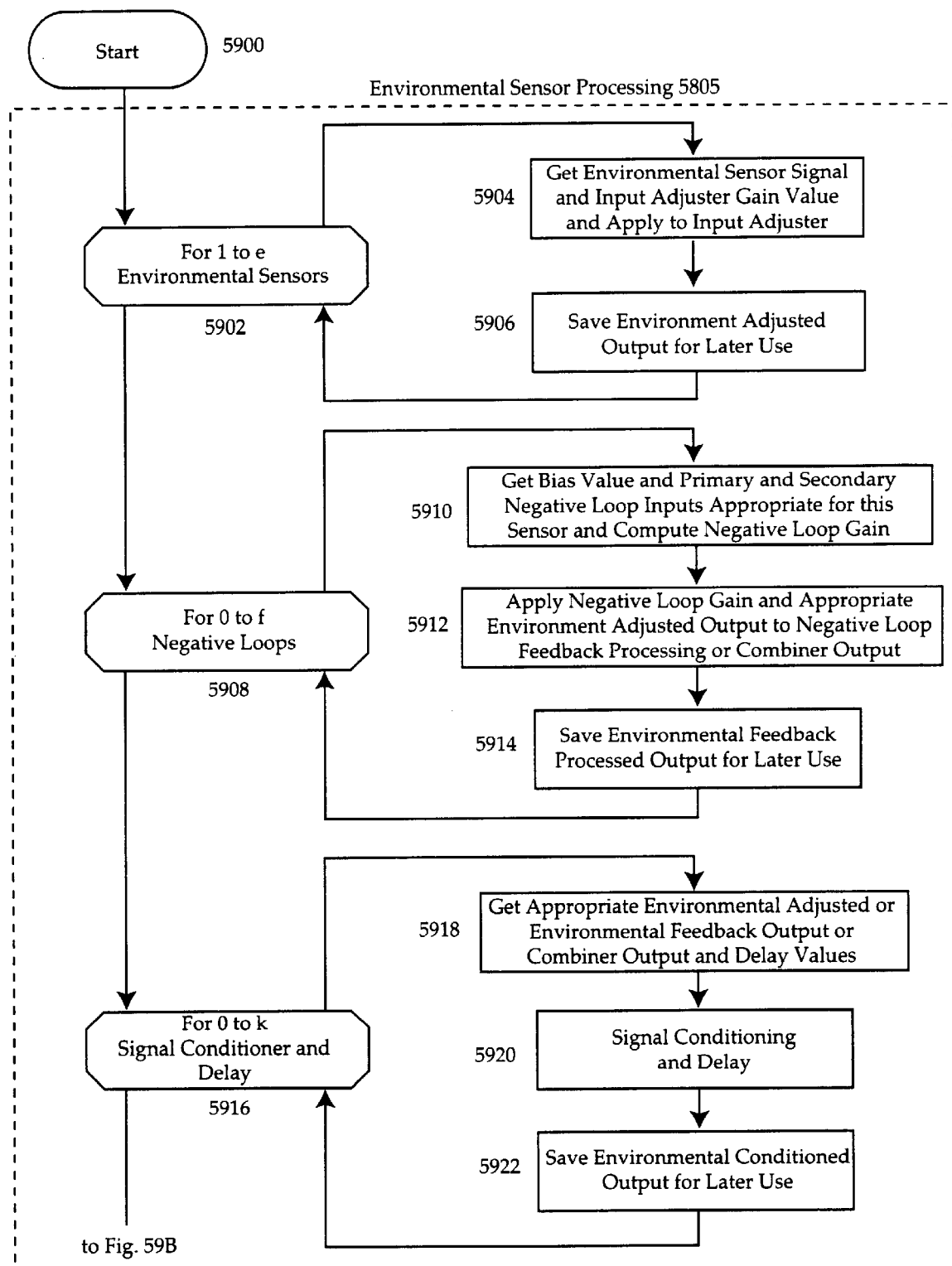

FIG. 59A shows the Environmental Sensor Processing flow diagram, Part 1.

Figure 59B:
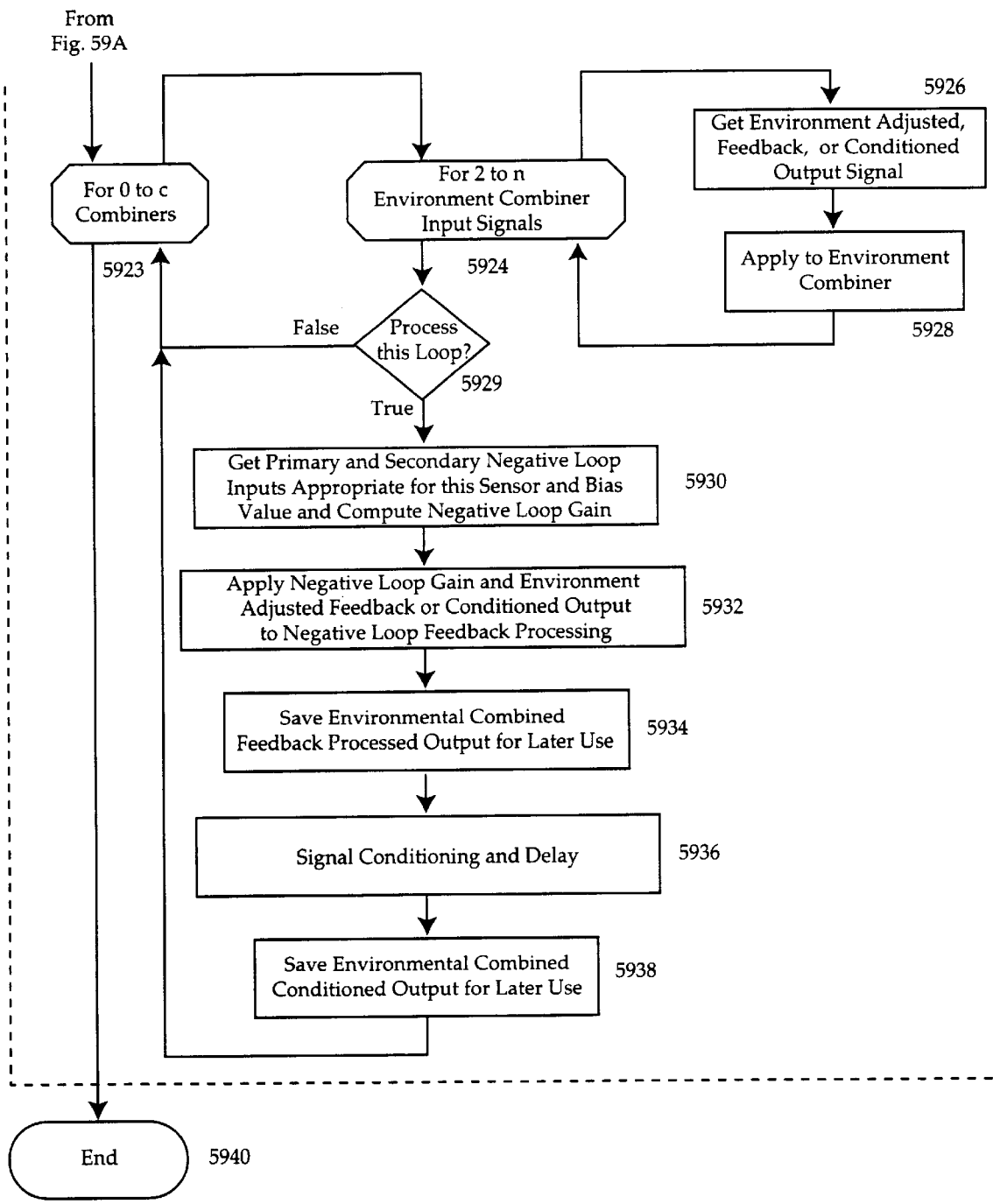

FIG. 59B shows the Environmental Sensor Processing flow diagram, Part 2.

Figure 59C:
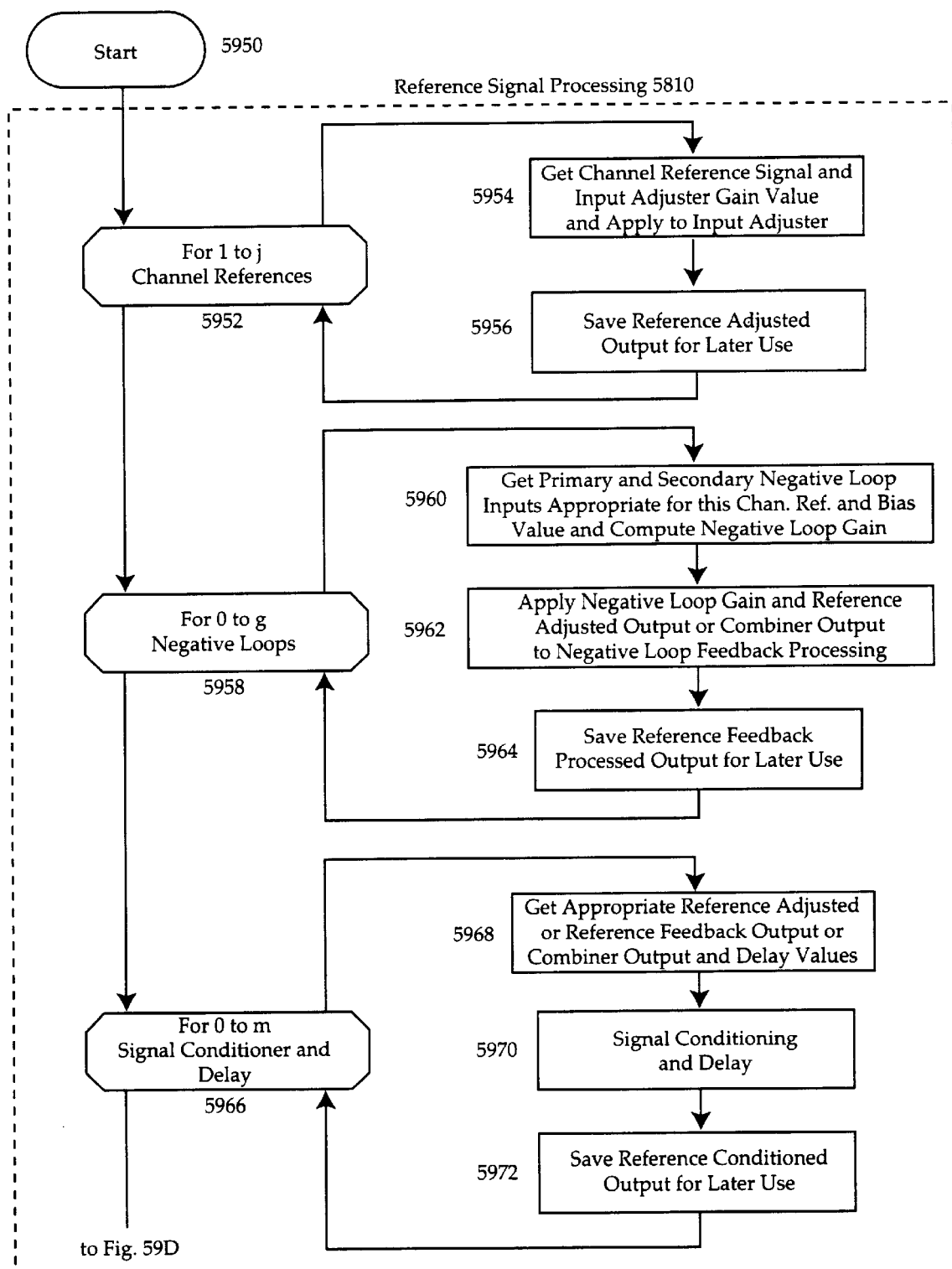

FIG. 59C shows the Reference Signal Processing flow diagram, Part 1.

Figure 59D:
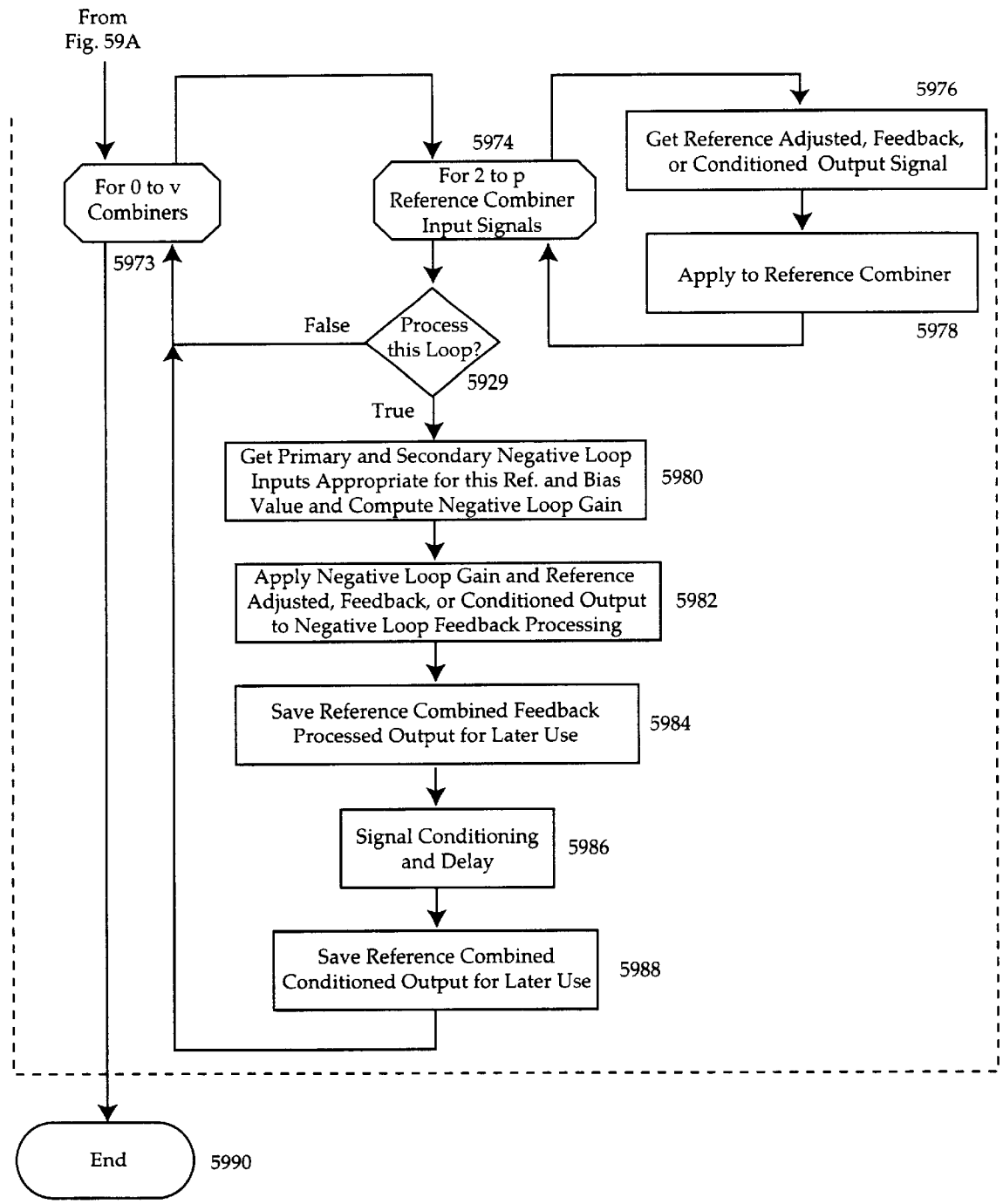

FIG. 59D shows the Reference Signal Processing flow diagram, Part 2.

Figure 60A:
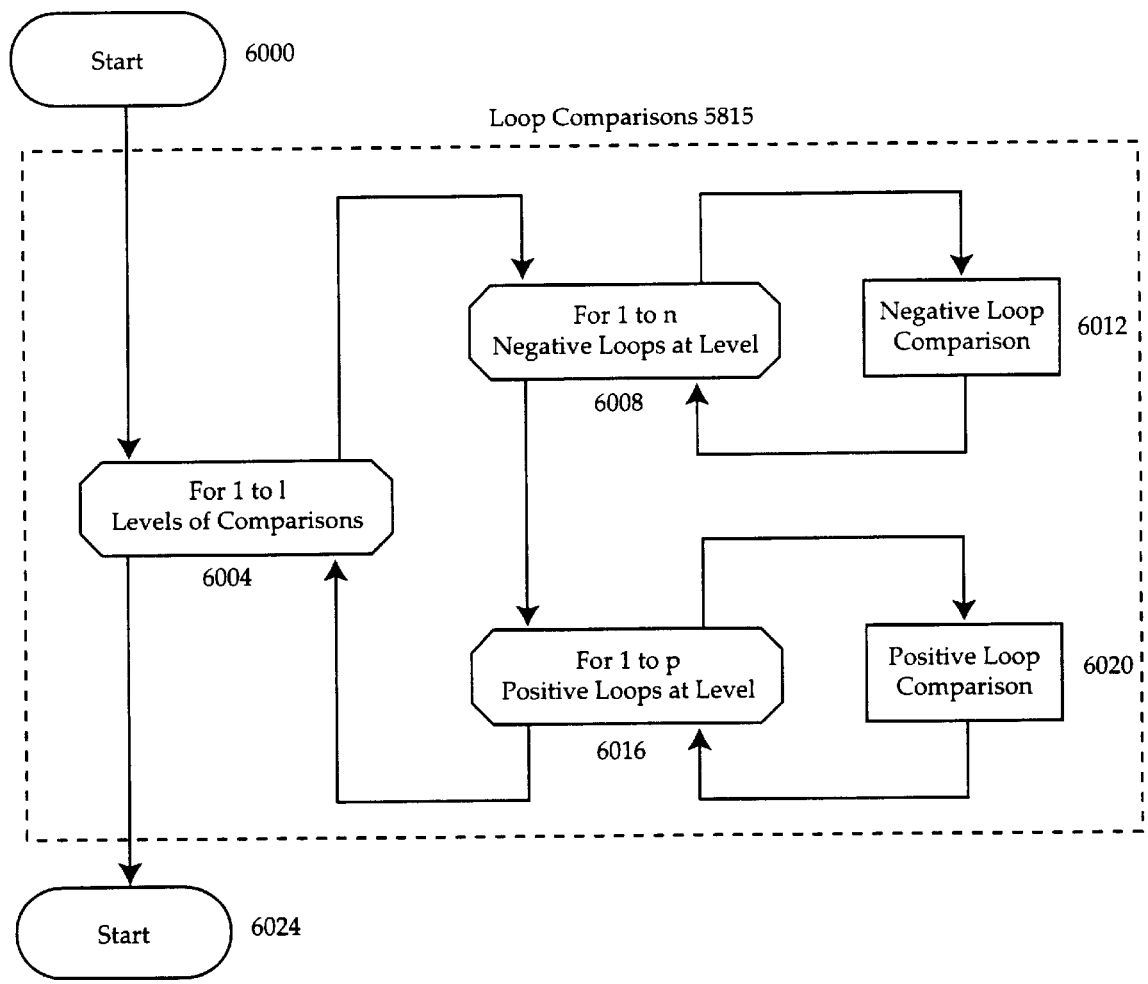

FIG. 60A shows the Loop Comparisons flow diagram.

Figure 60B:
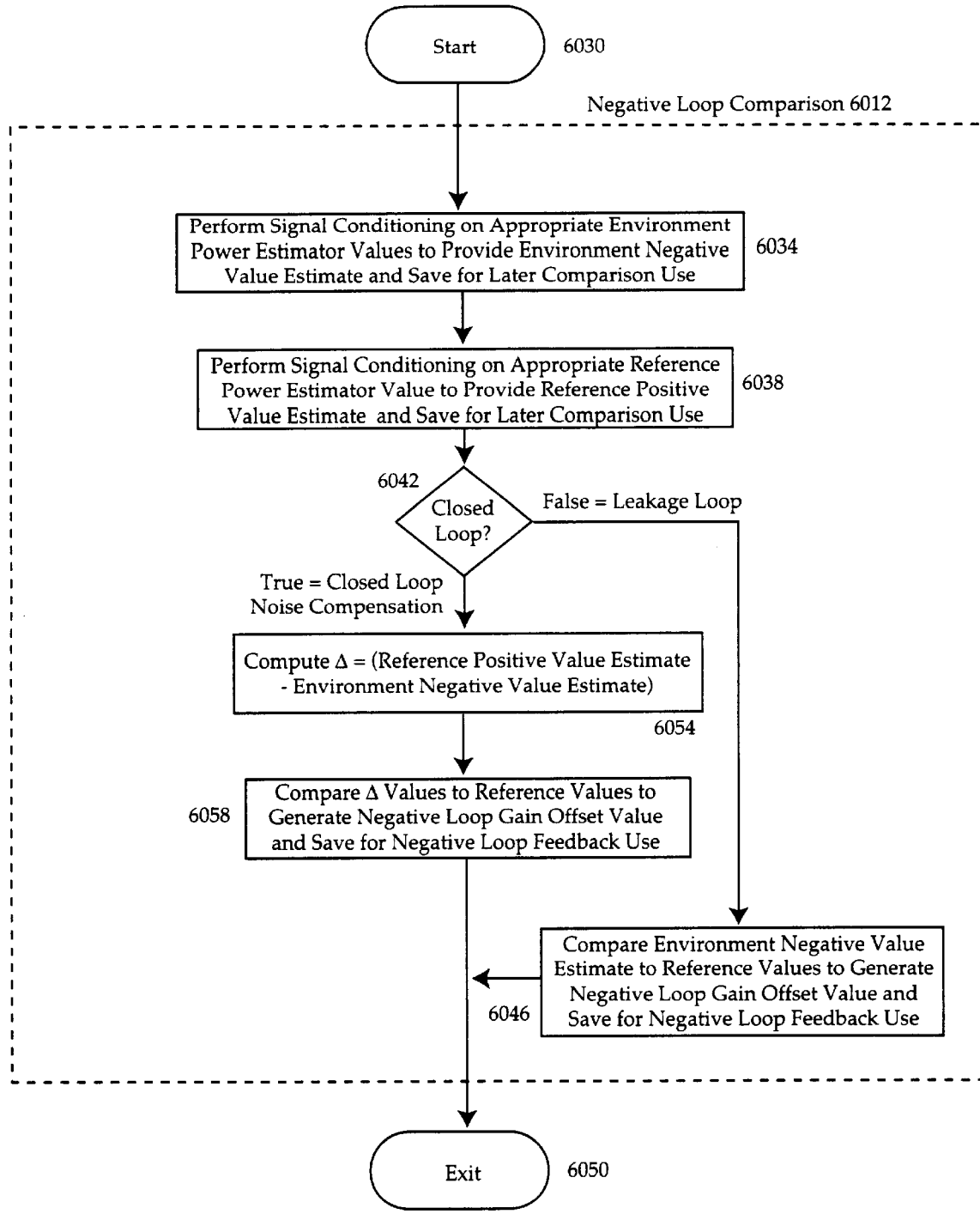

FIG. 60B shows the Negative Loop Comparison flow diagram.

Figure 60C:
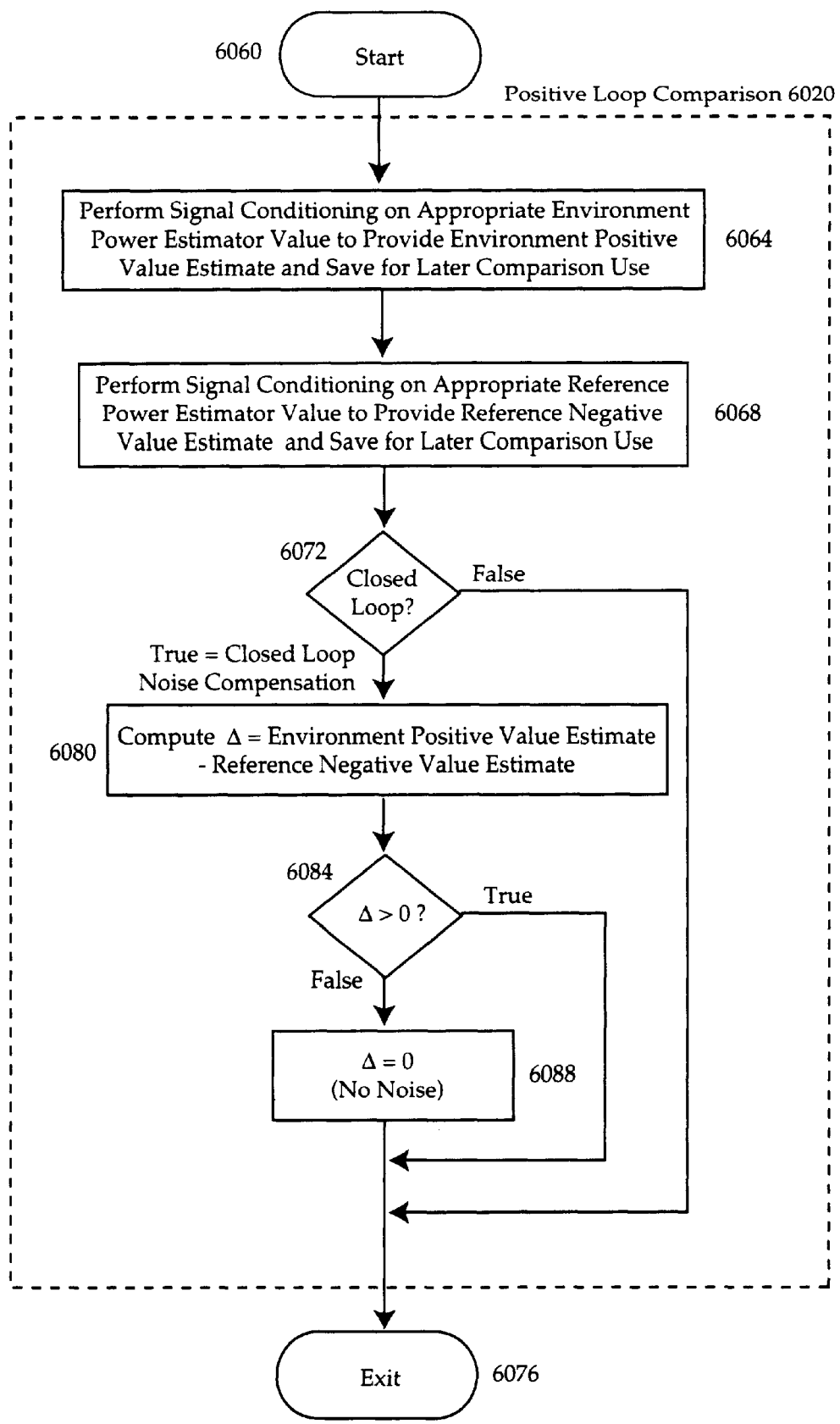

FIG. 60C shows a Positive Loop Comparison flow diagram.

Figure 61A:
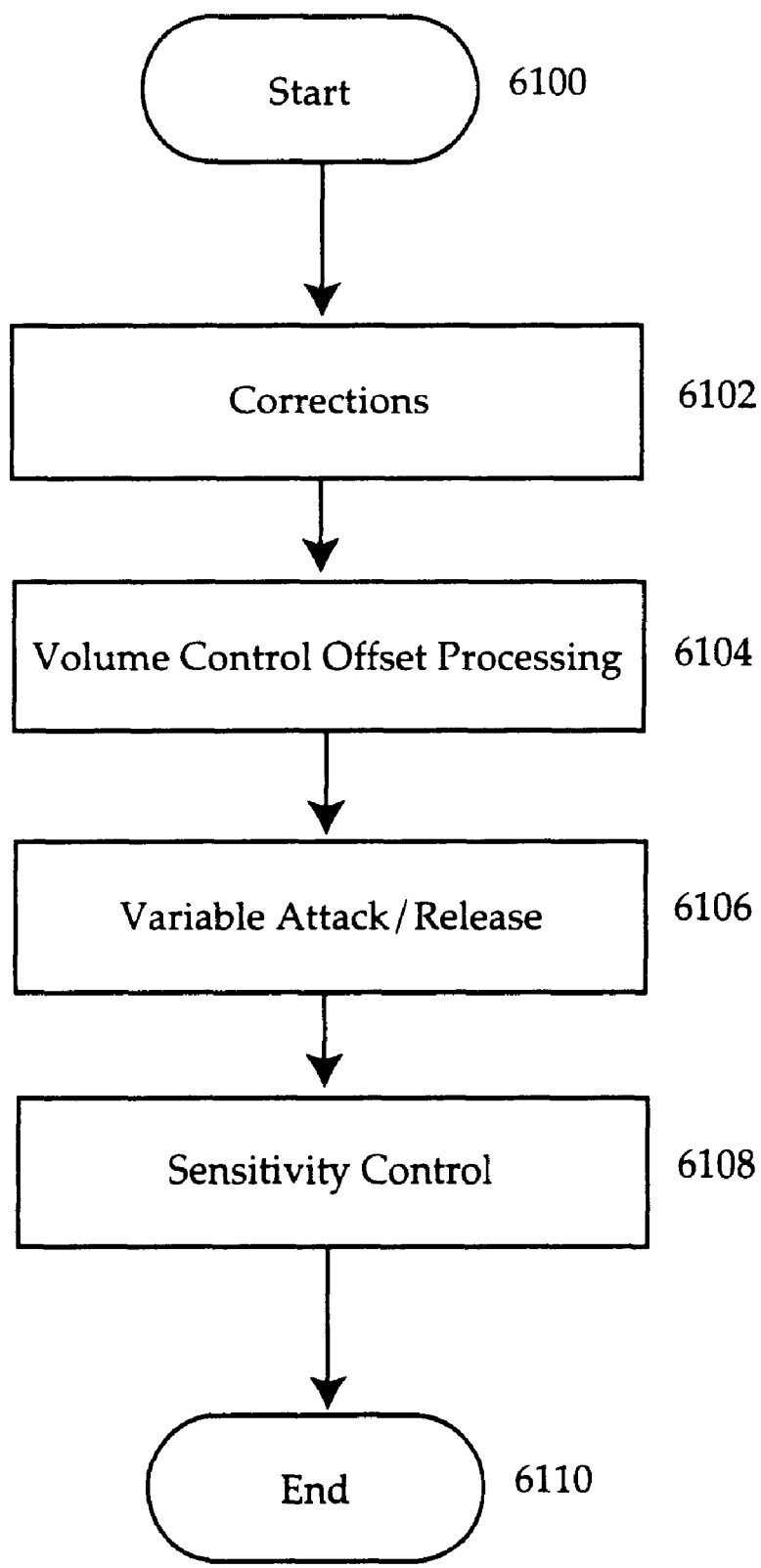

FIG. 61A shows a Noise Processor flow diagram.

Figure 61B:
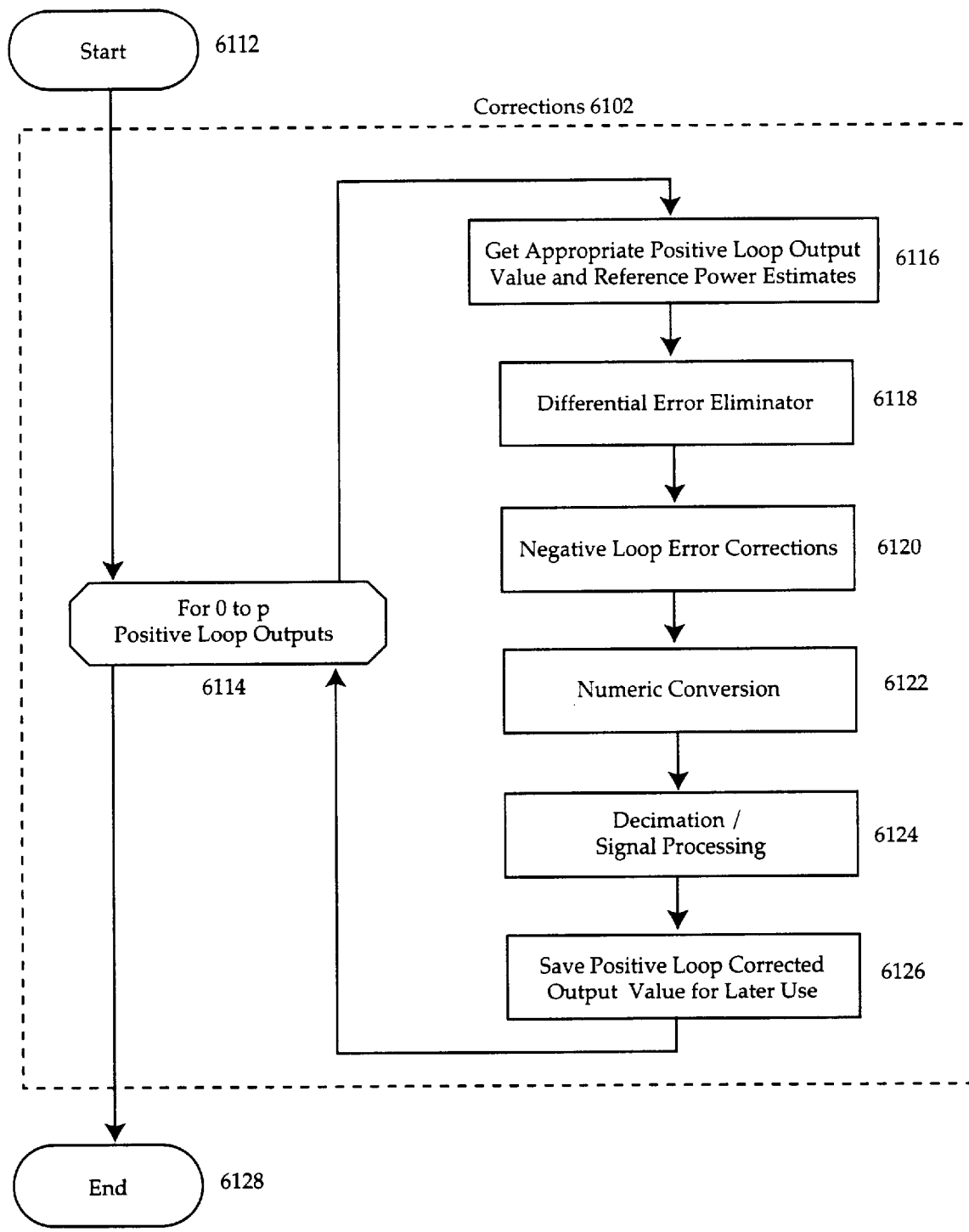

FIG. 61B shows a Corrections flow diagram.

Figure 61C:
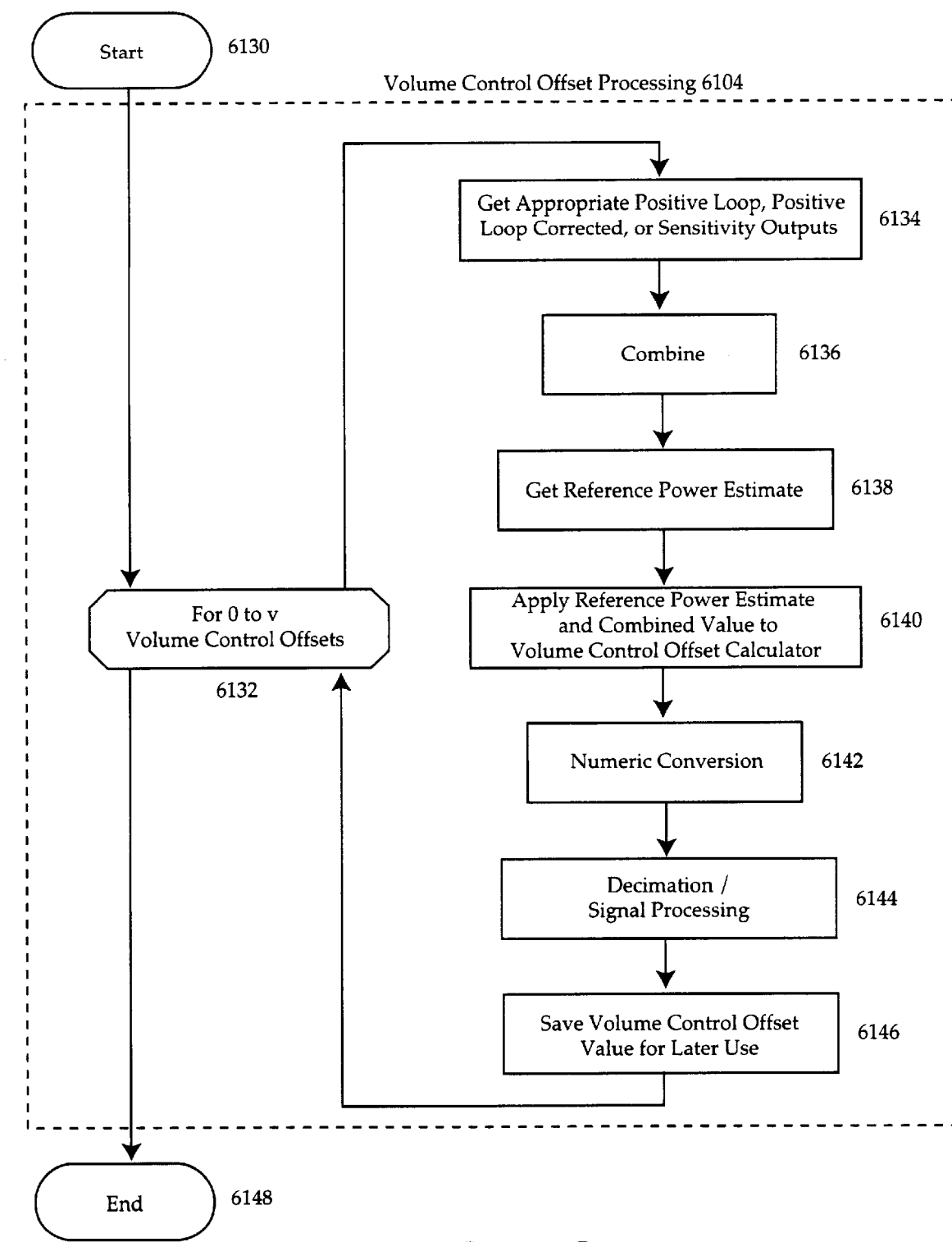

FIG. 61C shows a Volume Control Offset Processing flow diagram.

Figure 61D:
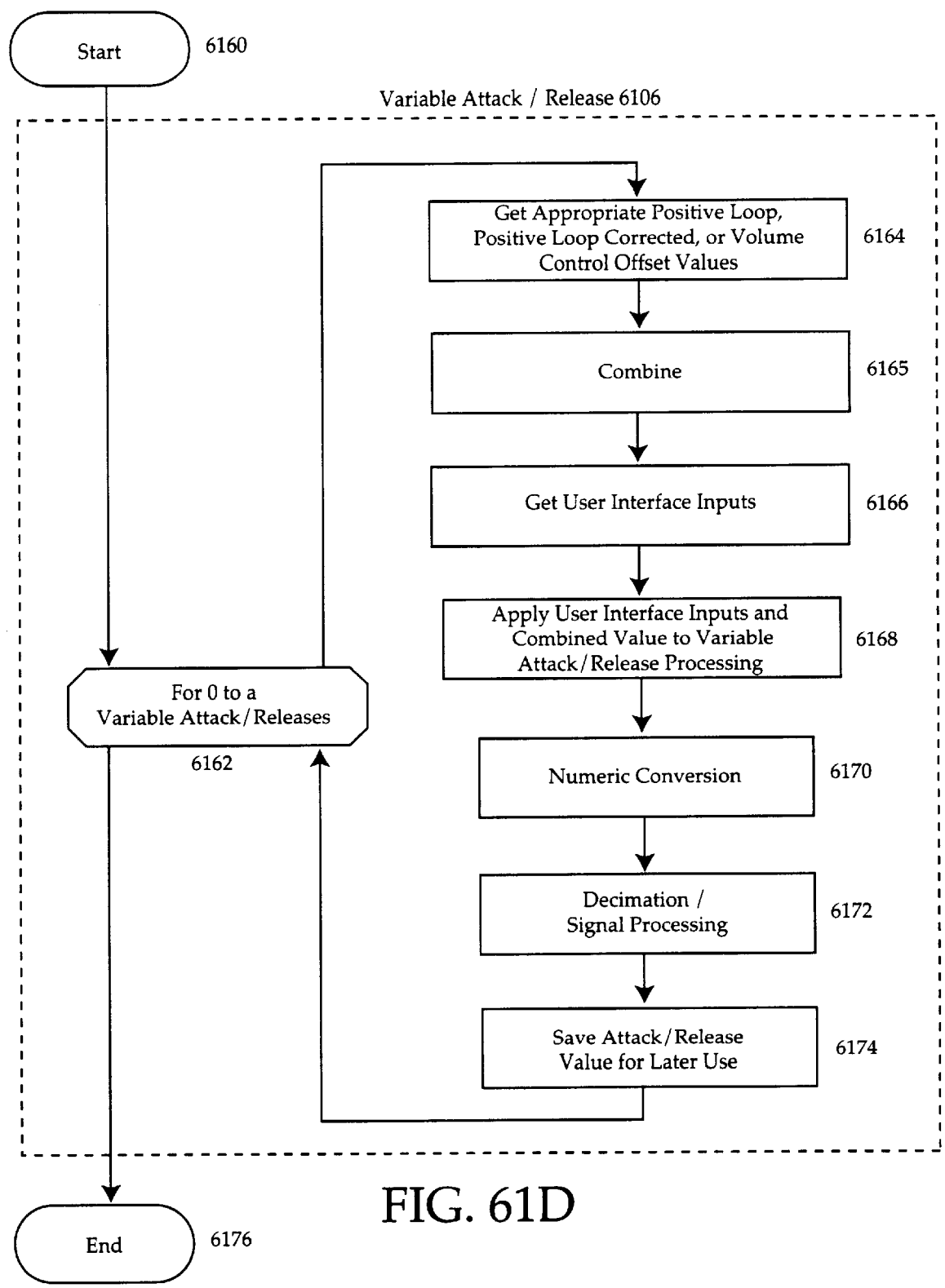

FIG. 61D shows a Variable Attack/Release flow diagram.

Figure 61E:
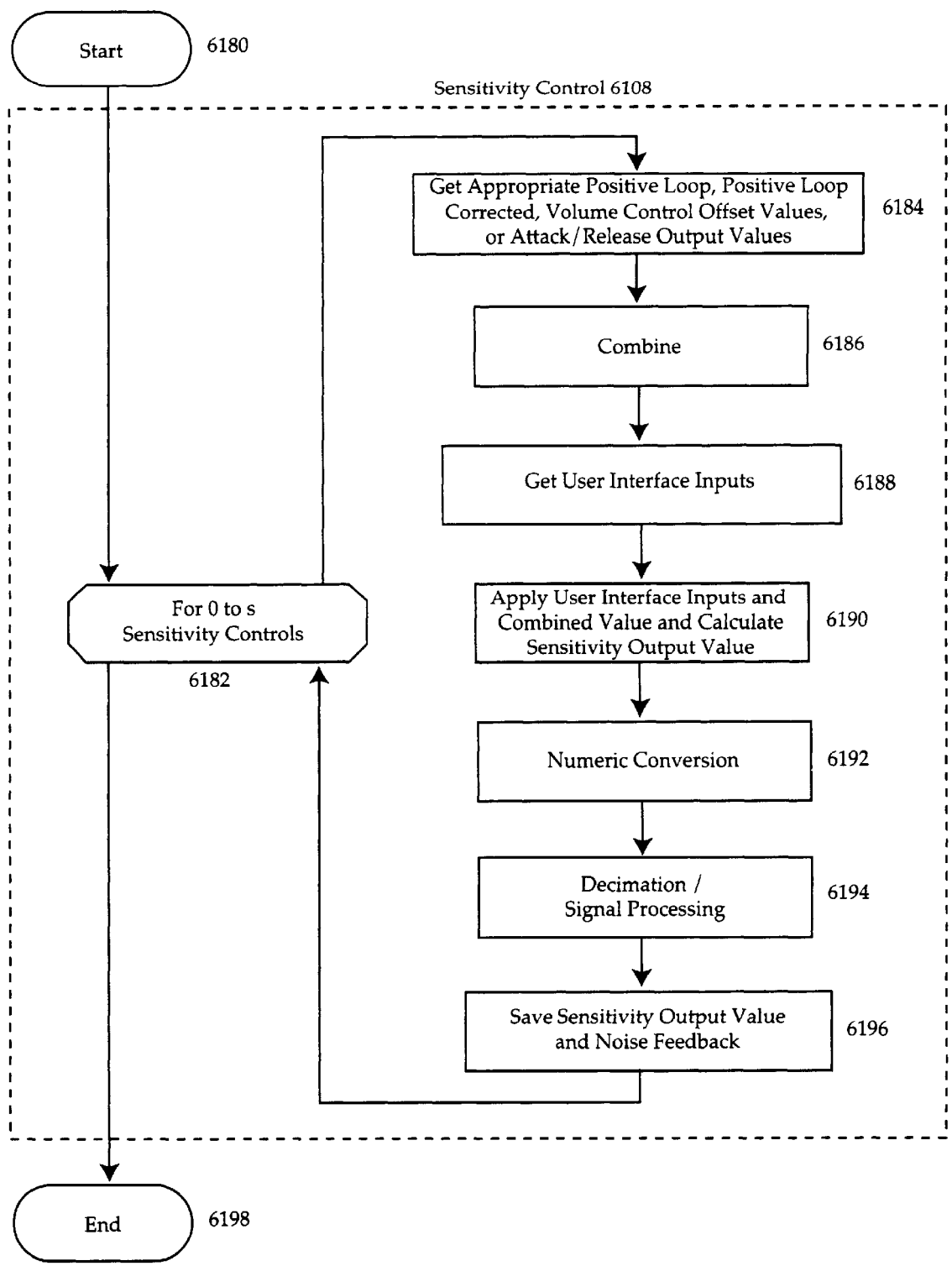

FIG. 61E shows a Sensitivity Control flow diagram.

Figure 62:
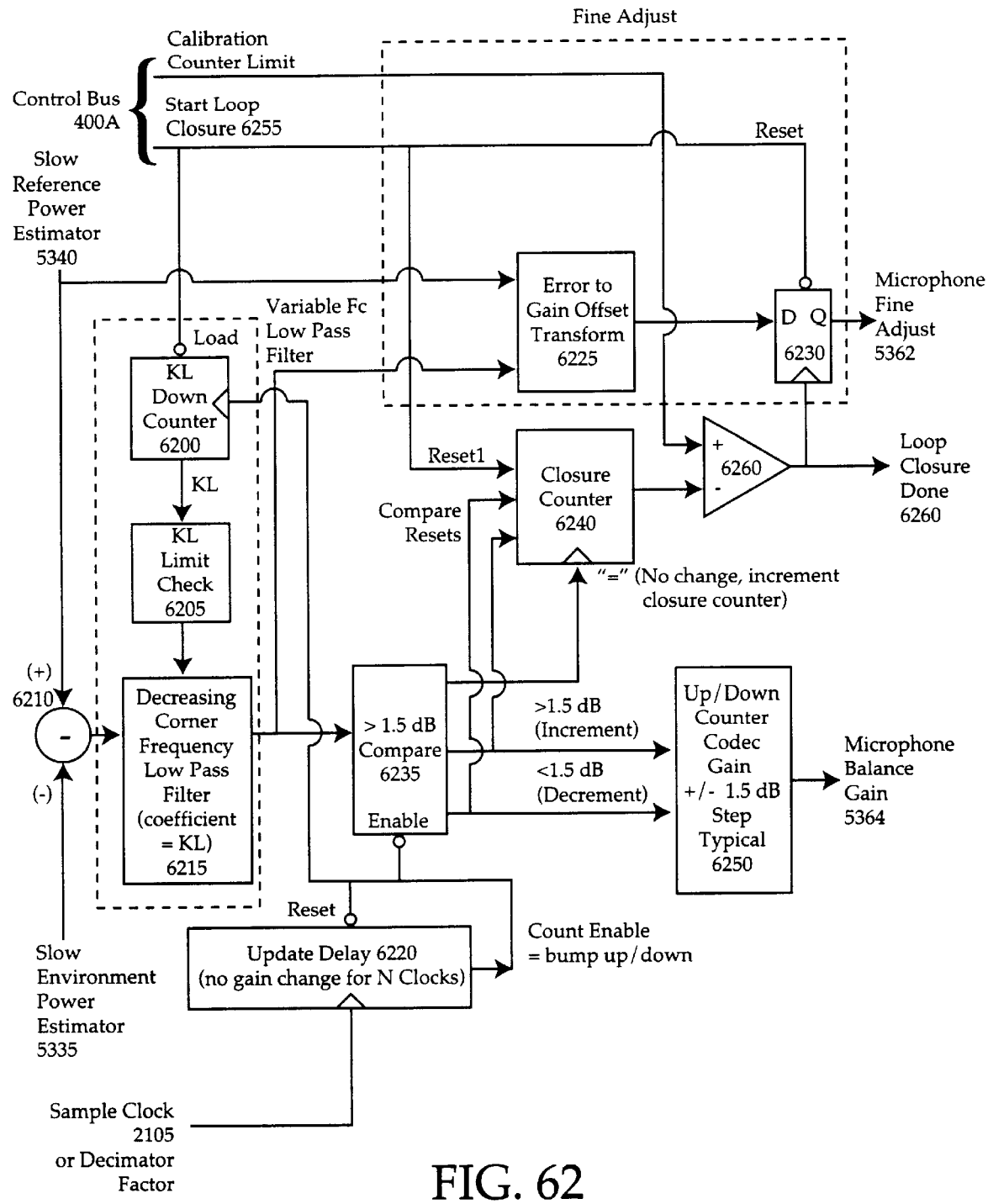

FIG. 62 shows an exemplary Embodiment of Coarse and Fine Acoustic Loop Balance Processor—Two Stage Balancing Method.

Figure 63:
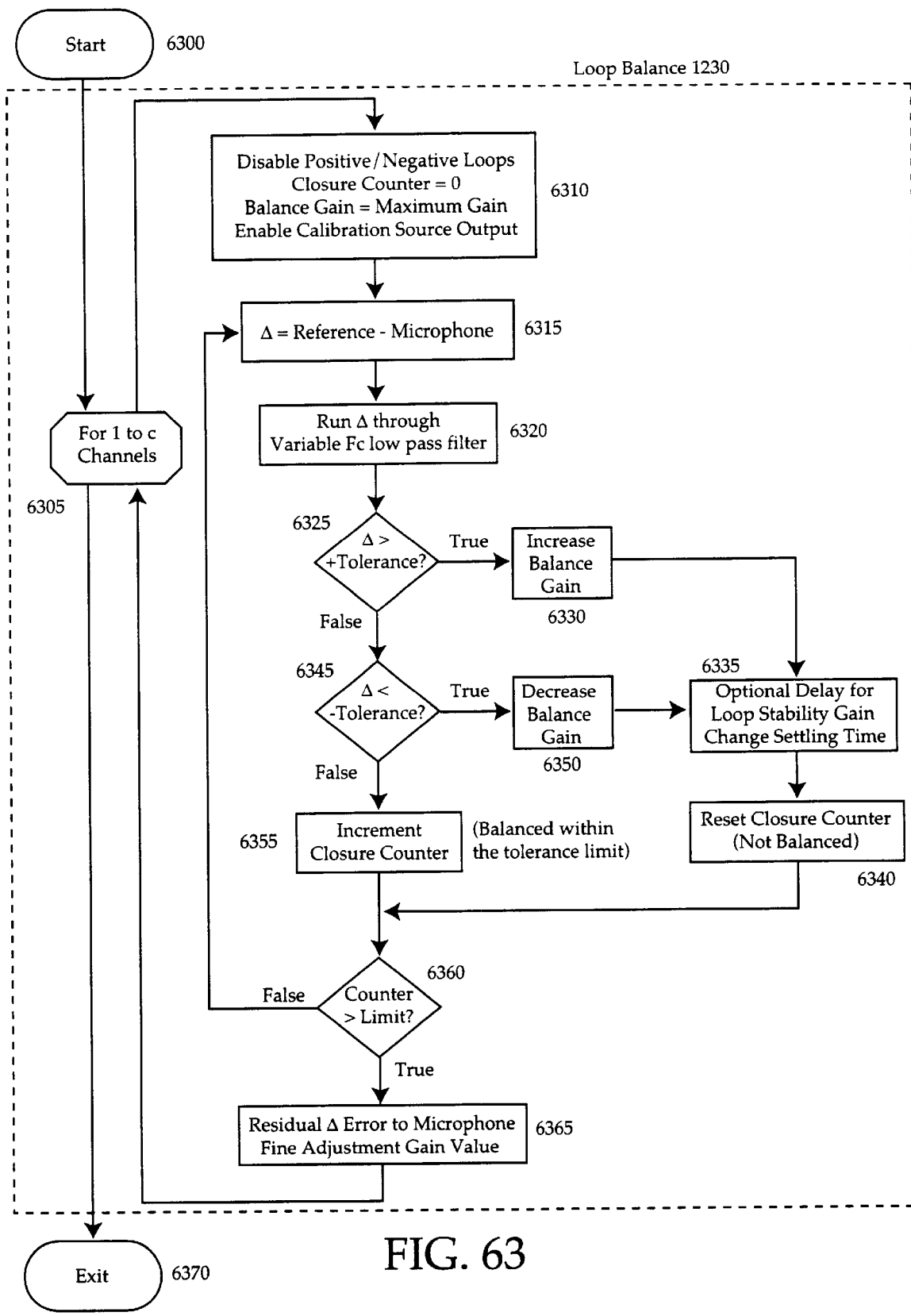

FIG. 63 shows a Loop Balance flow diagram.

Figure 64:
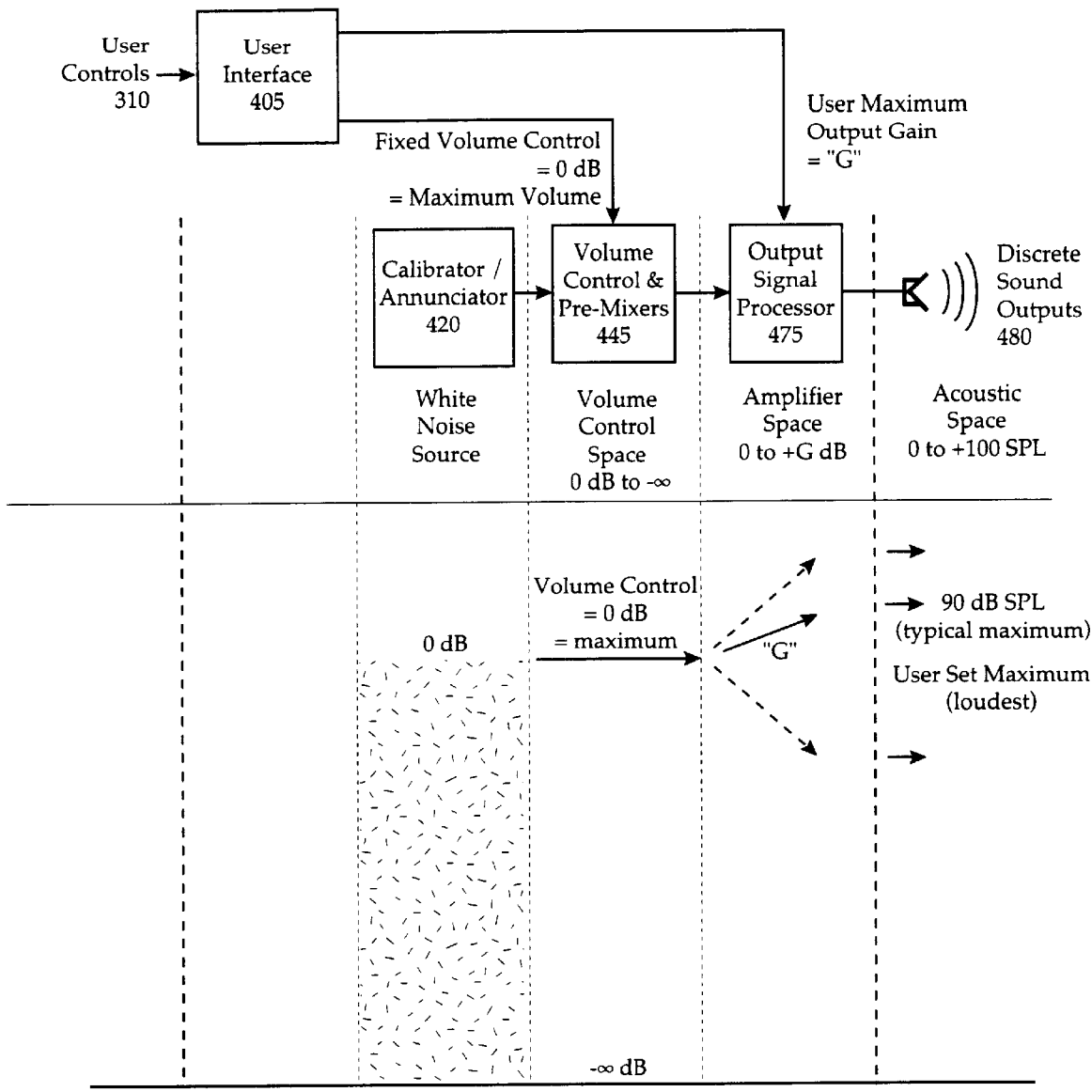

FIG. 64 shows a Set Minimum and Maximum Method: Step 1—Set Maximum.

Figure 65:
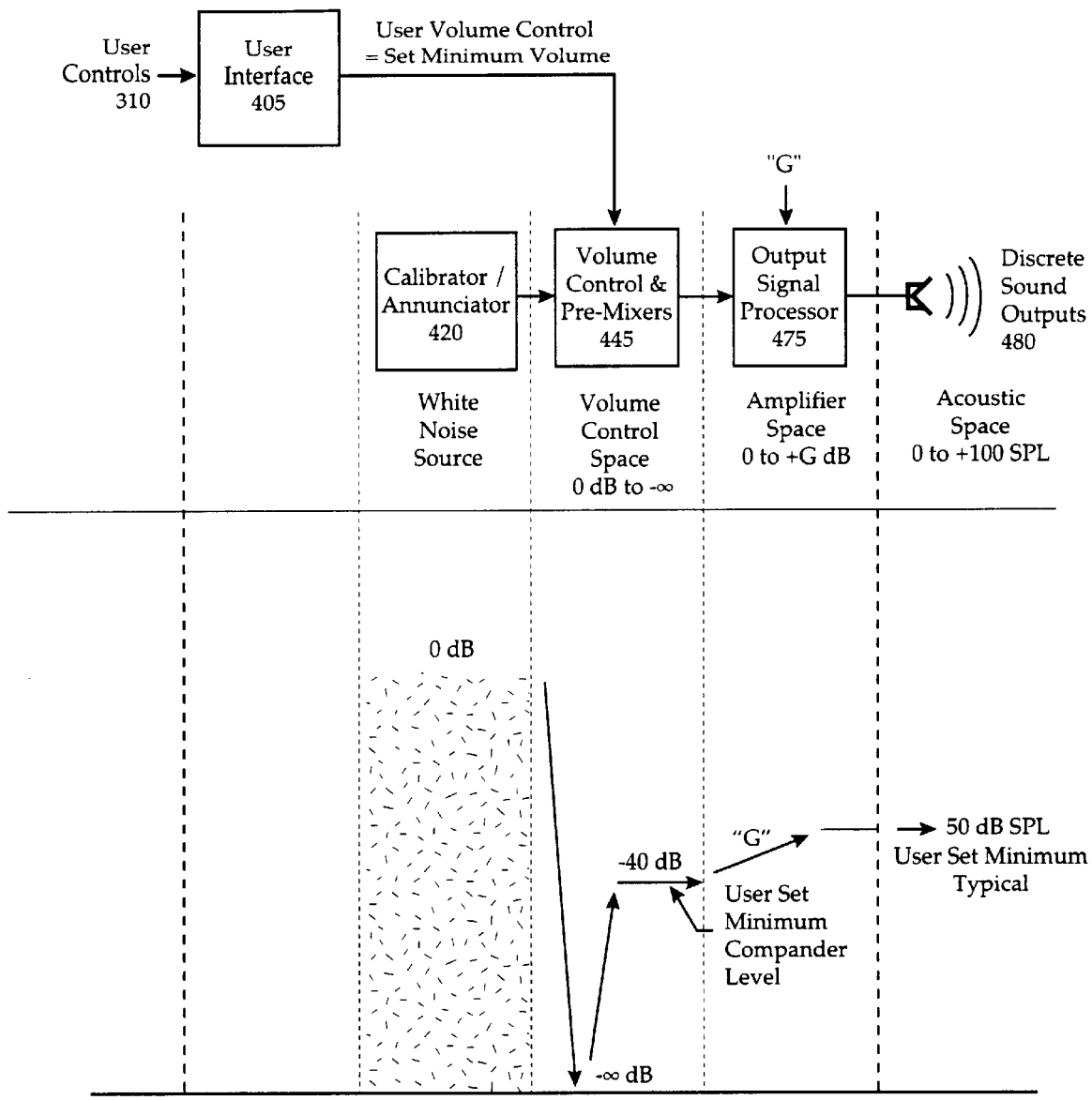

FIG. 65 shows a Set Minimum and Maximum Method: Step 2—Set Minimum.

Figure 66:
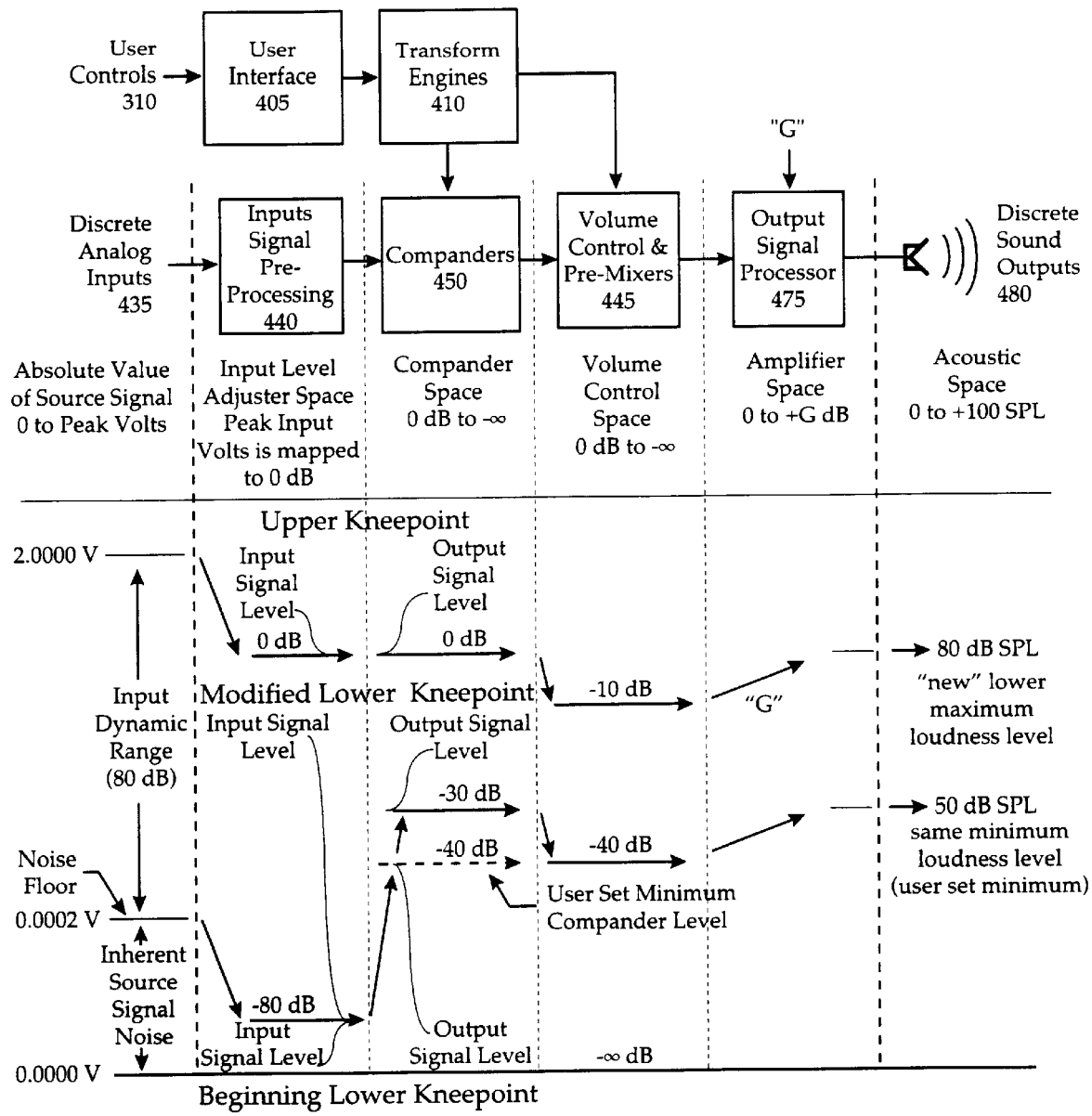

FIG. 66 shows a Set Minimum and Maximum Method: Step 3—Post Set Volume Change.

Figure 67:
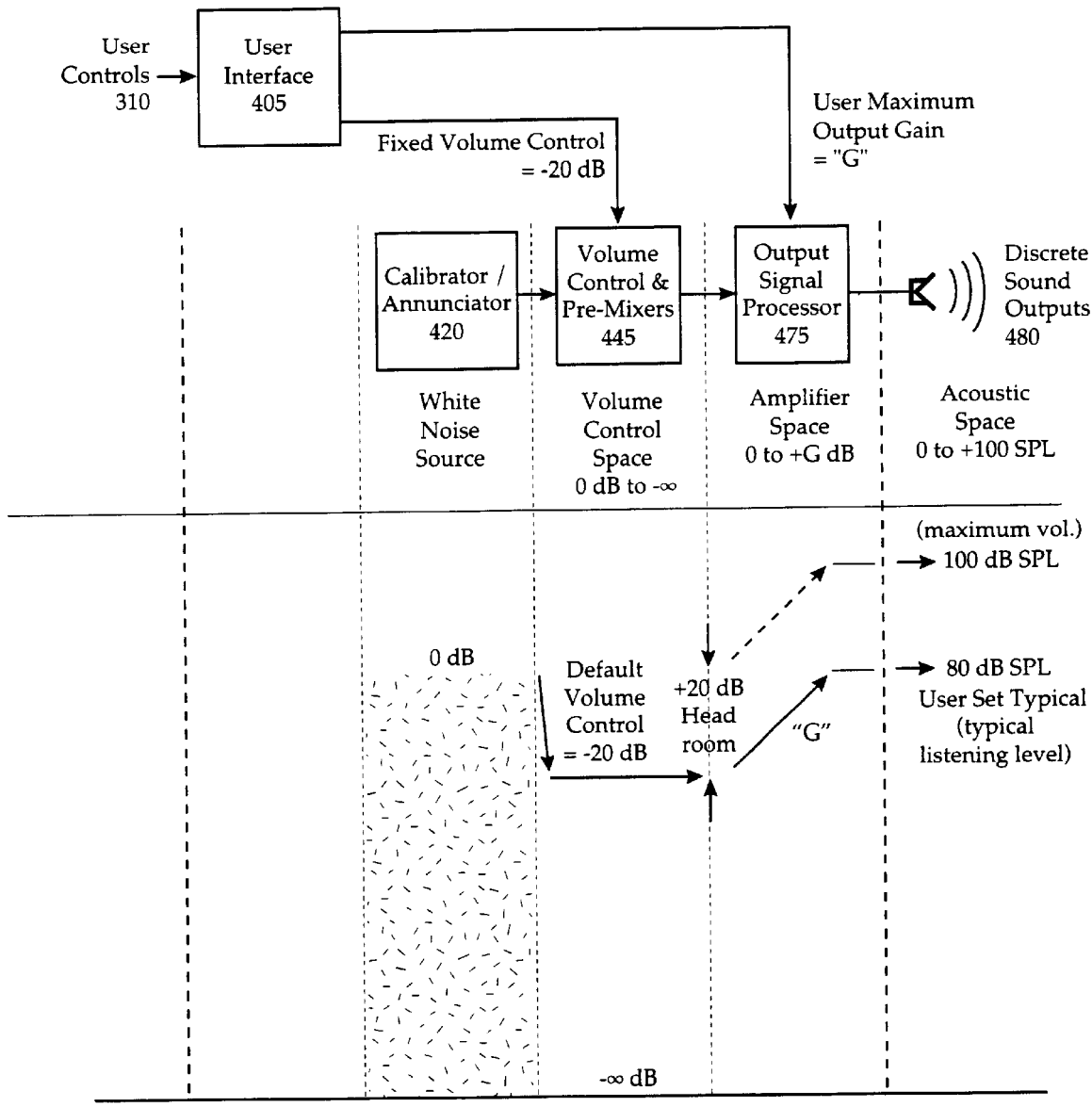

FIG. 67 shows a Set Minimum and Typical Method: Set Typical by Adjusting Volume Control.

Figure 68:
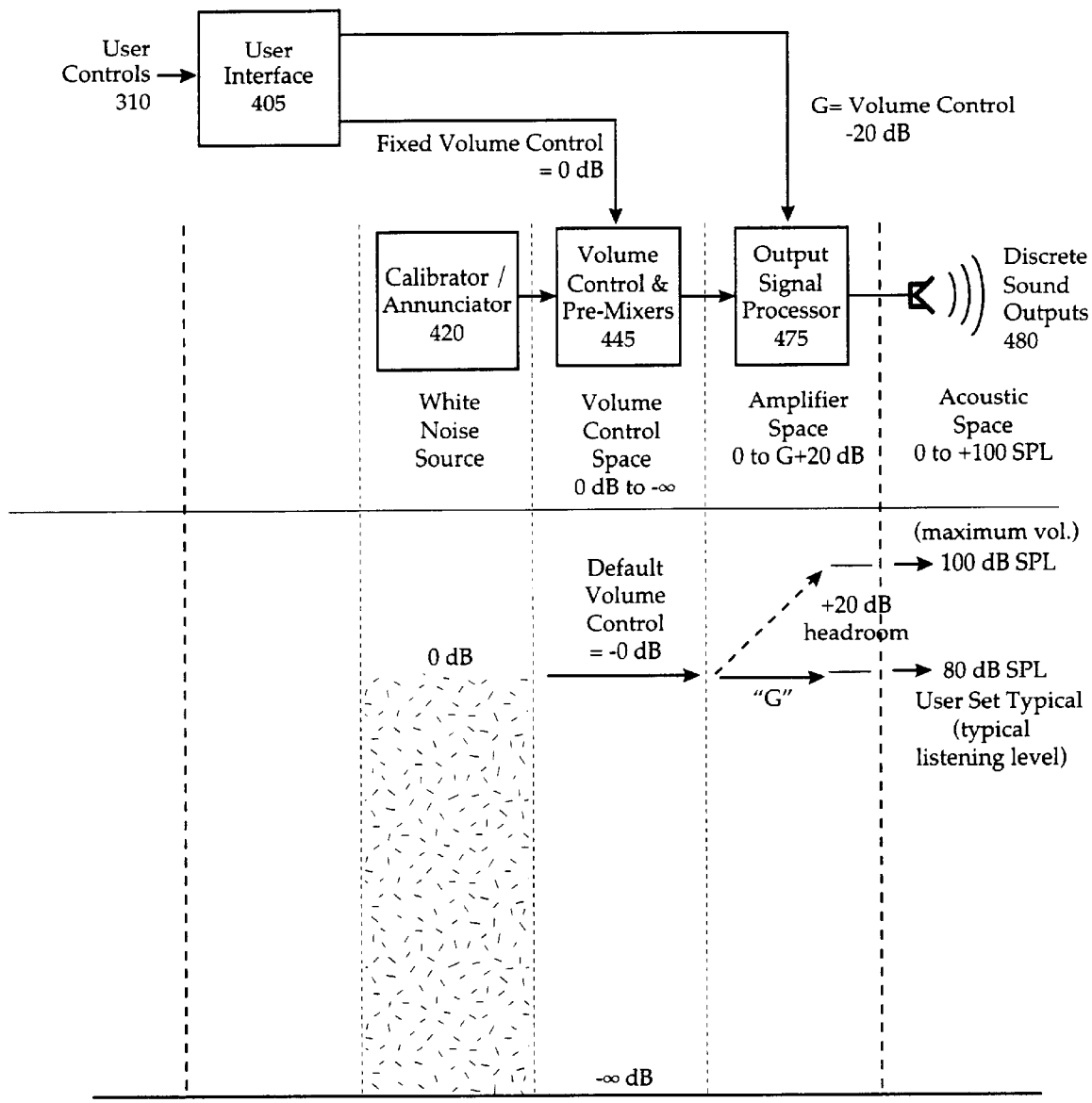

FIG. 68 shows a Set Minimum and Typical Method: Alternative Set Typical by Adjusting Amplifier Gain.

Figure 69:
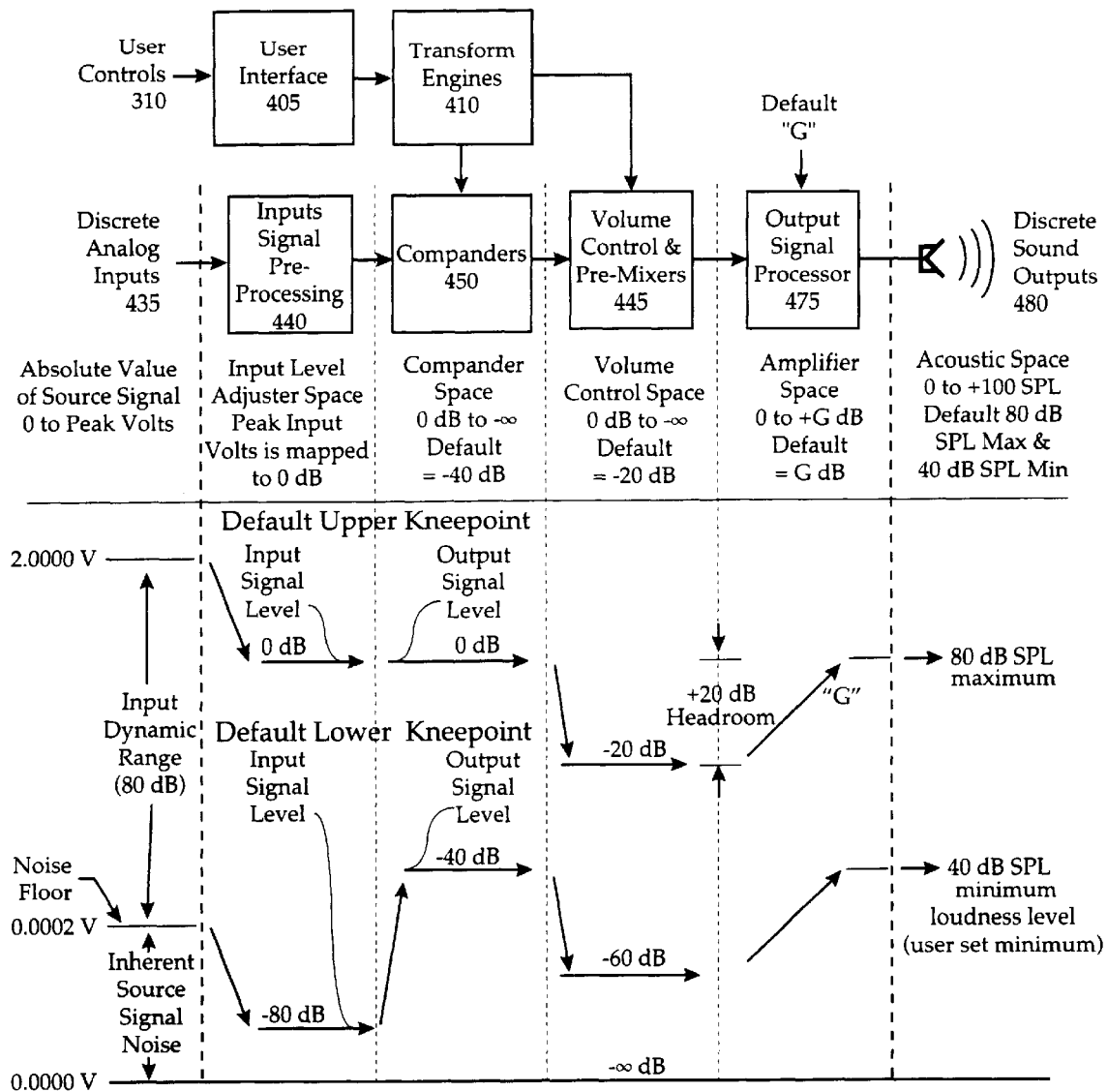

FIG. 69 shows an exemplary automatic method of default settings.

Figure 70:
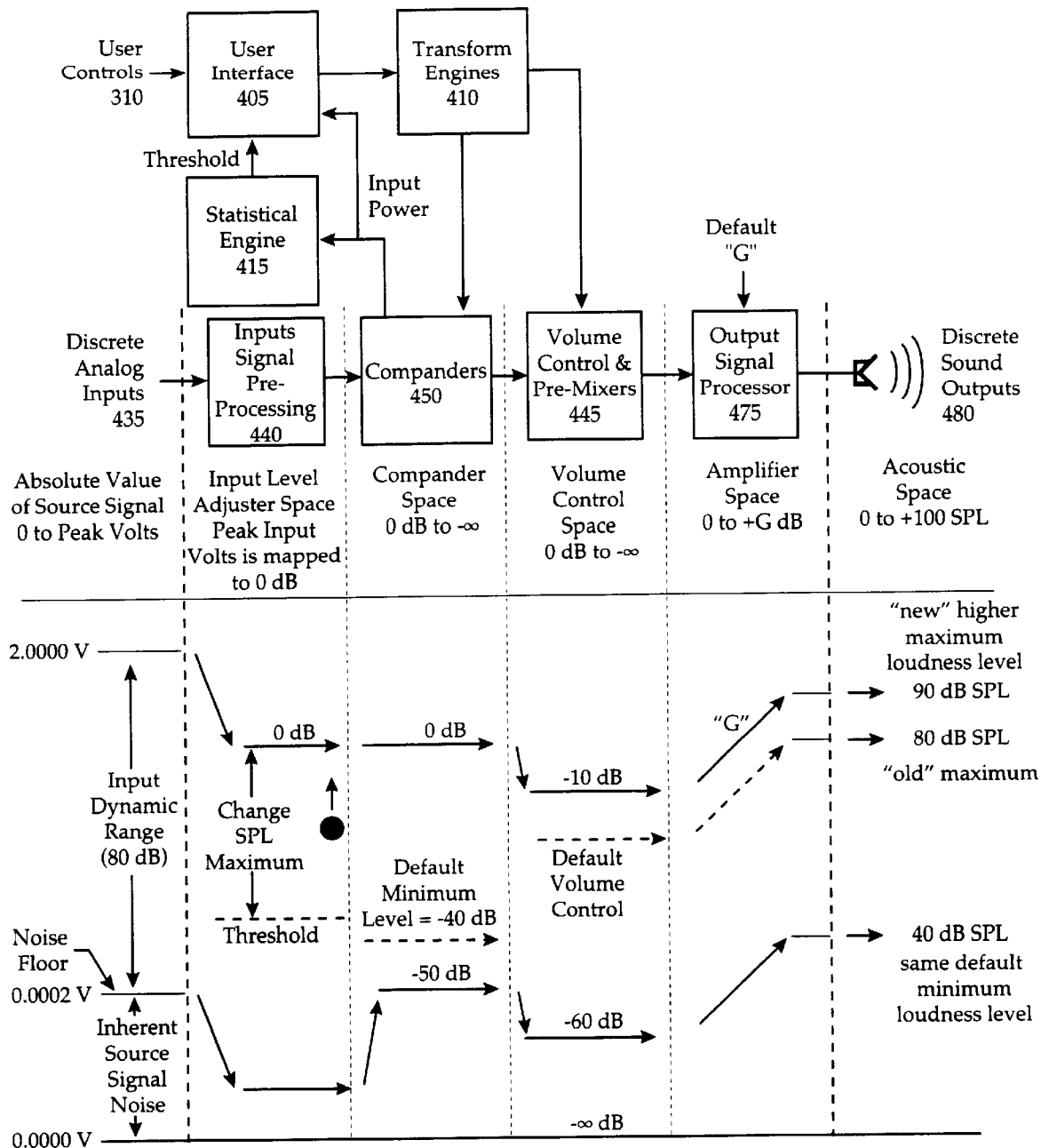

FIG. 70 shows an exemplary automatic method for increasing maximum volume.

Figure 71:
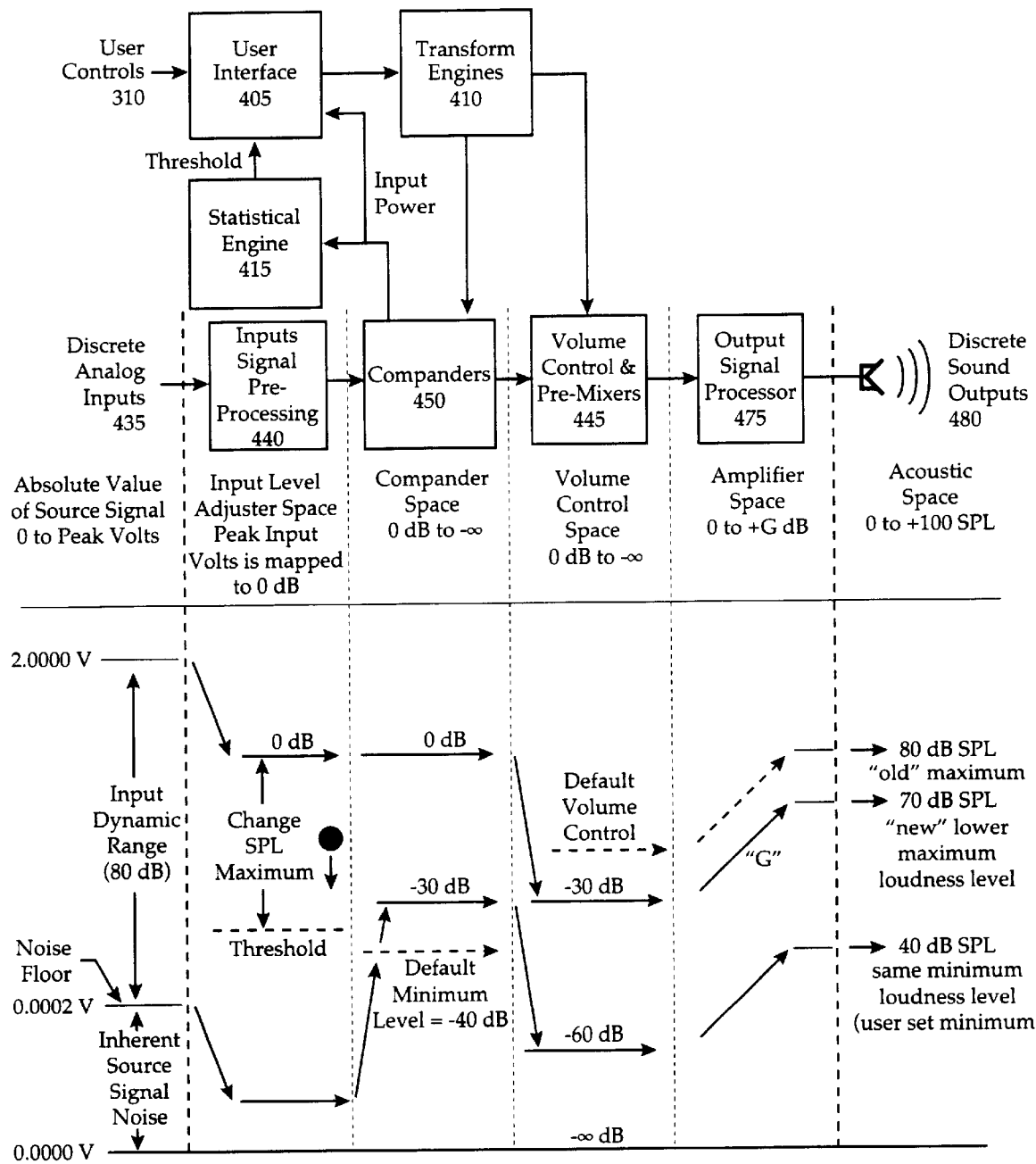

FIG. 71 shows an exemplary automatic method for decreasing maximum volume.

Figure 72:
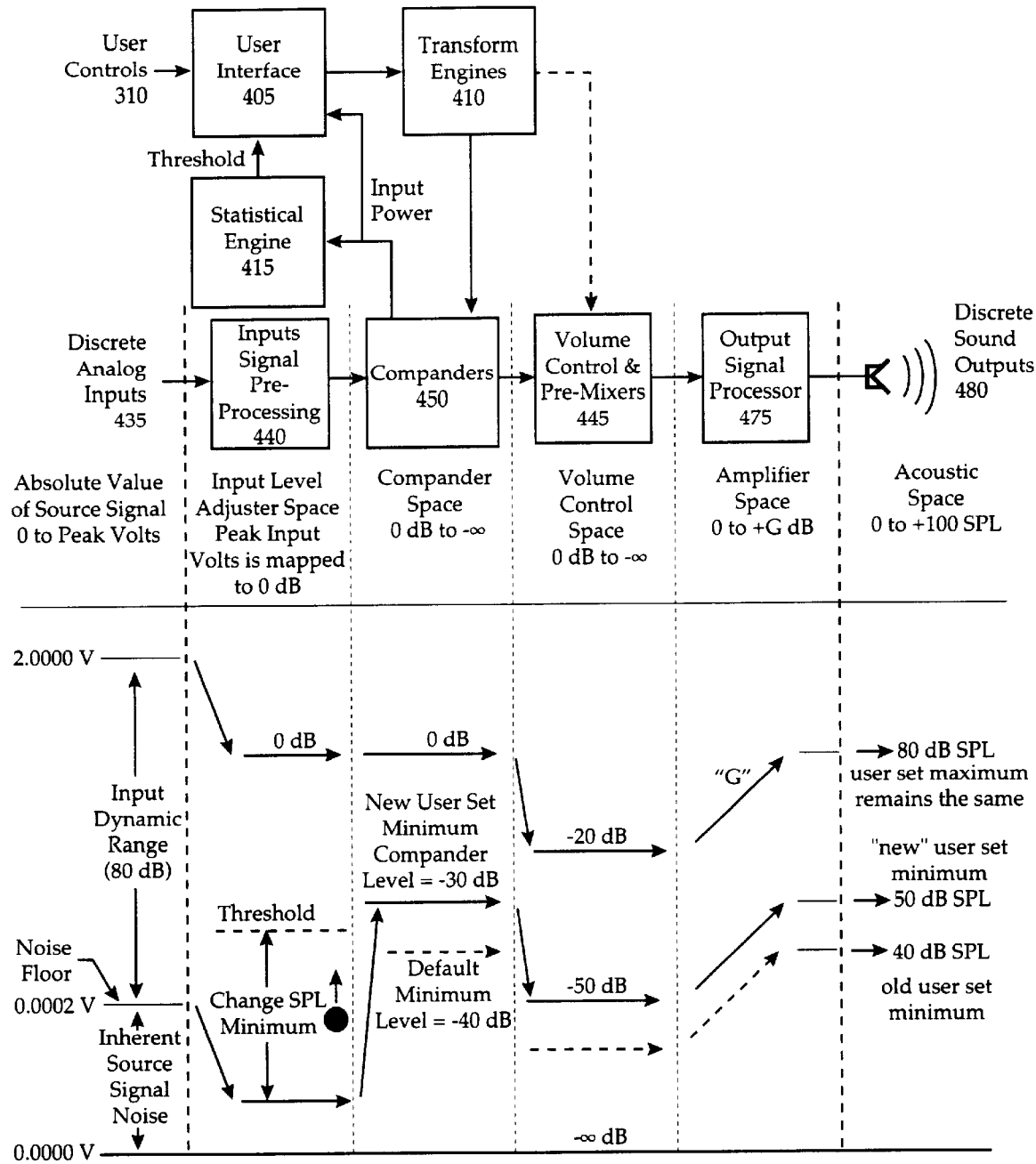

FIG. 72 shows an exemplary automatic method for increasing minimum volume.

Figure 73:
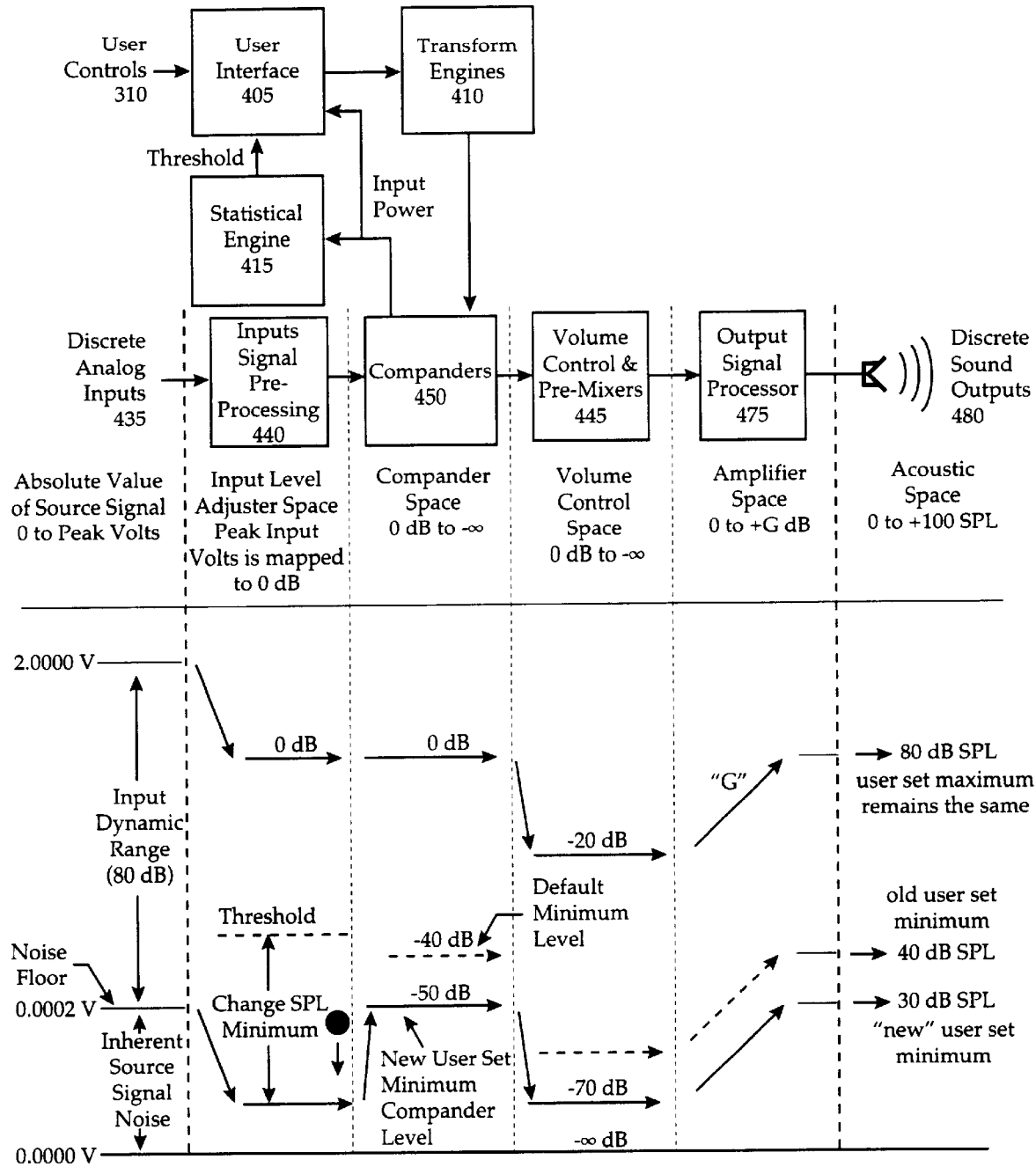

FIG. 73 shows an exemplary automatic method for decreasing minimum volume.

Figure 74:
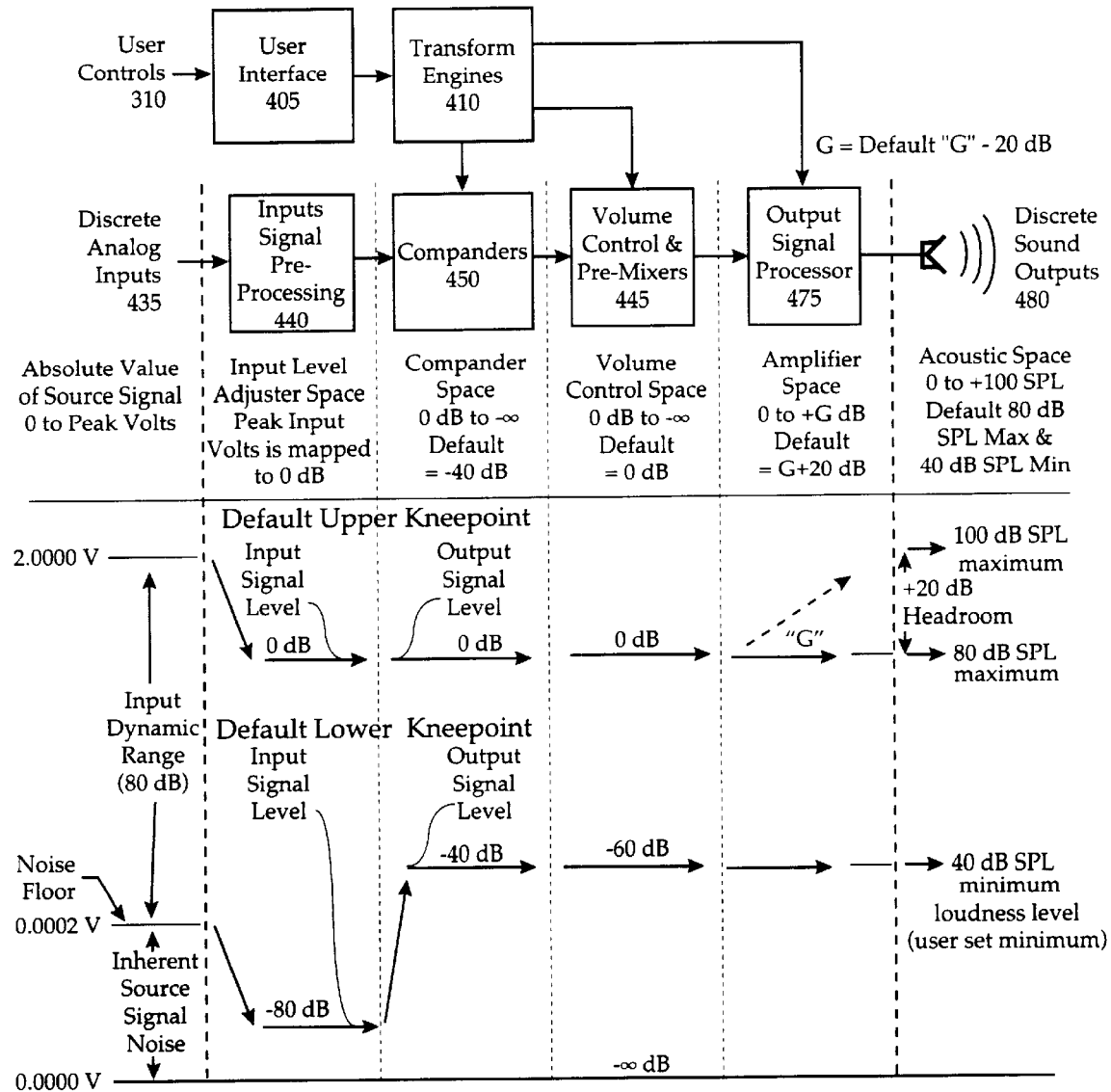

FIG. 74 shows an alternative automatic method for setting defaults.

Figure 75:
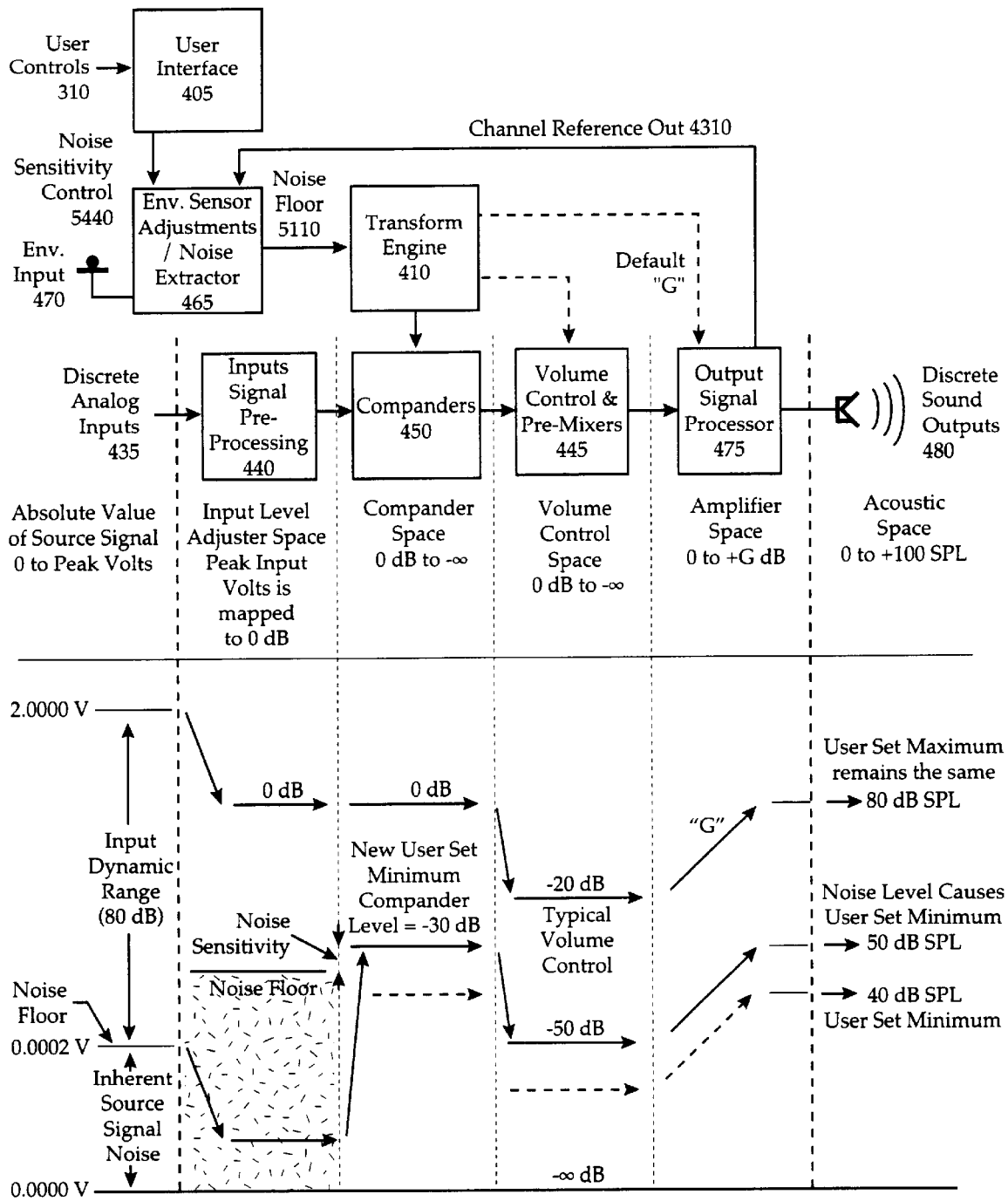

FIG. 75 shows an exemplary automatic method for increasing minimum volume in response to noise.

Figure 76:
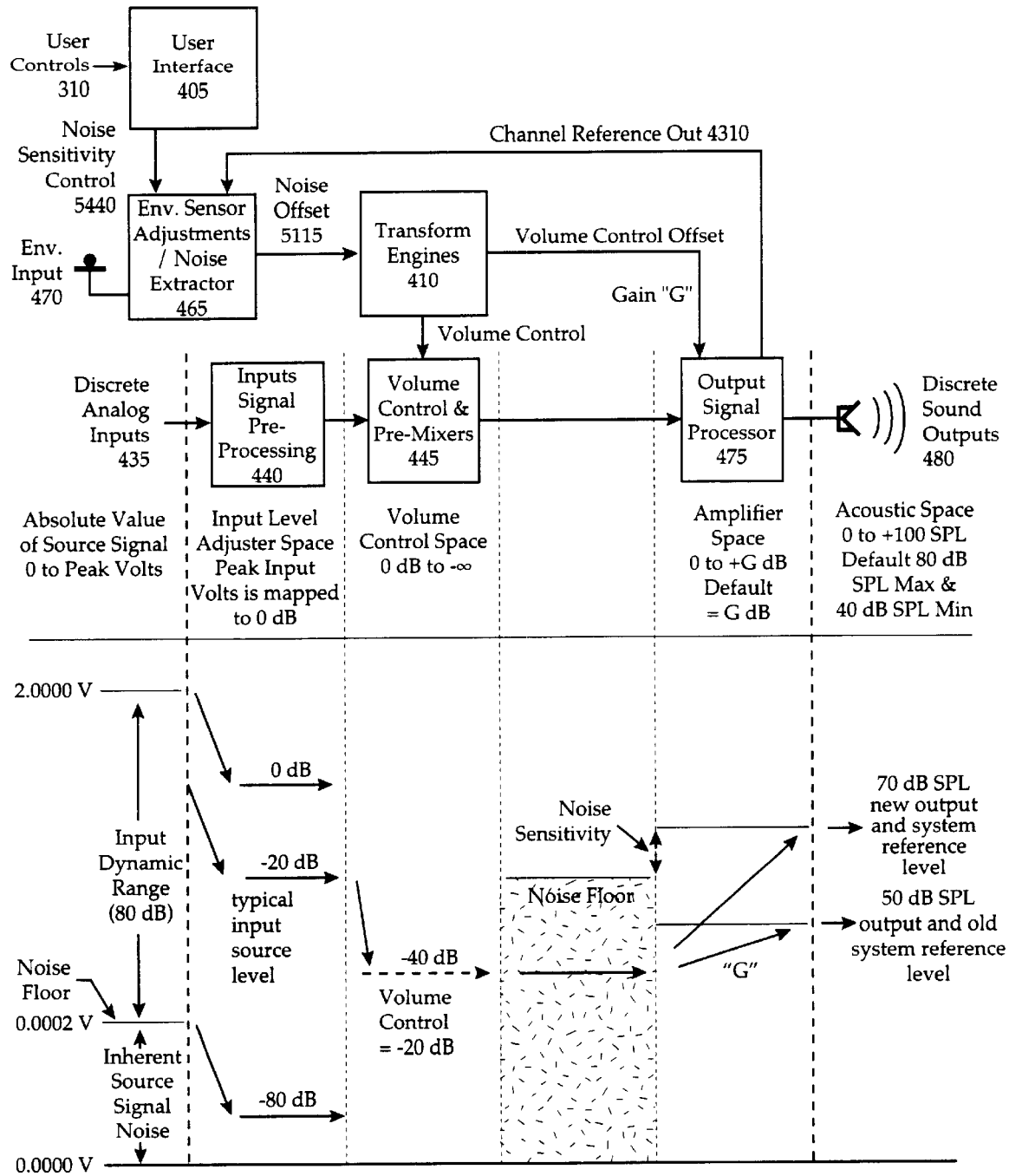

FIG. 76 shows Noise Level Compensation for Non-Compander Systems.

Figure 77:
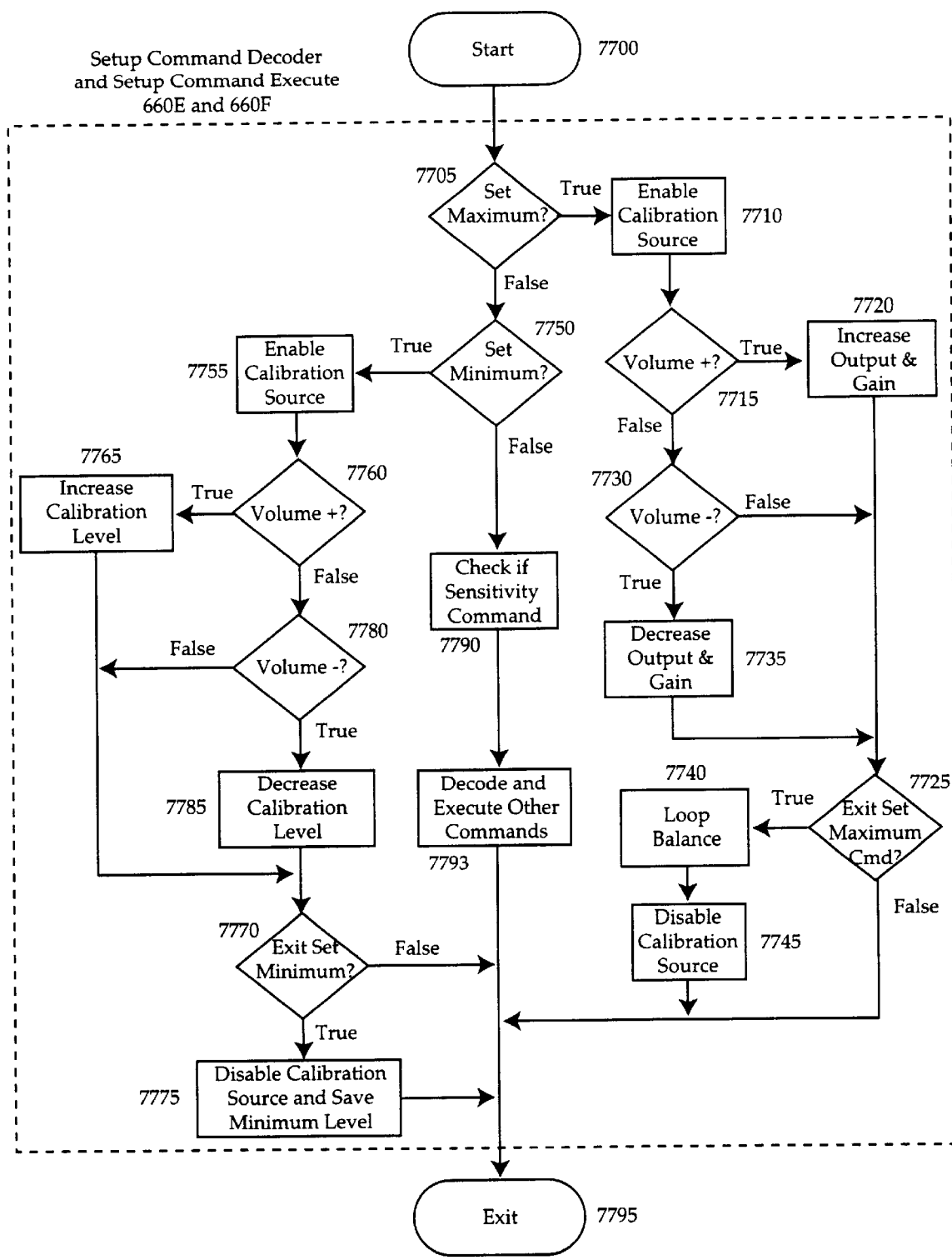

FIG. 77 shows a Conceptual Setup Command flow diagram.

Figure 78:
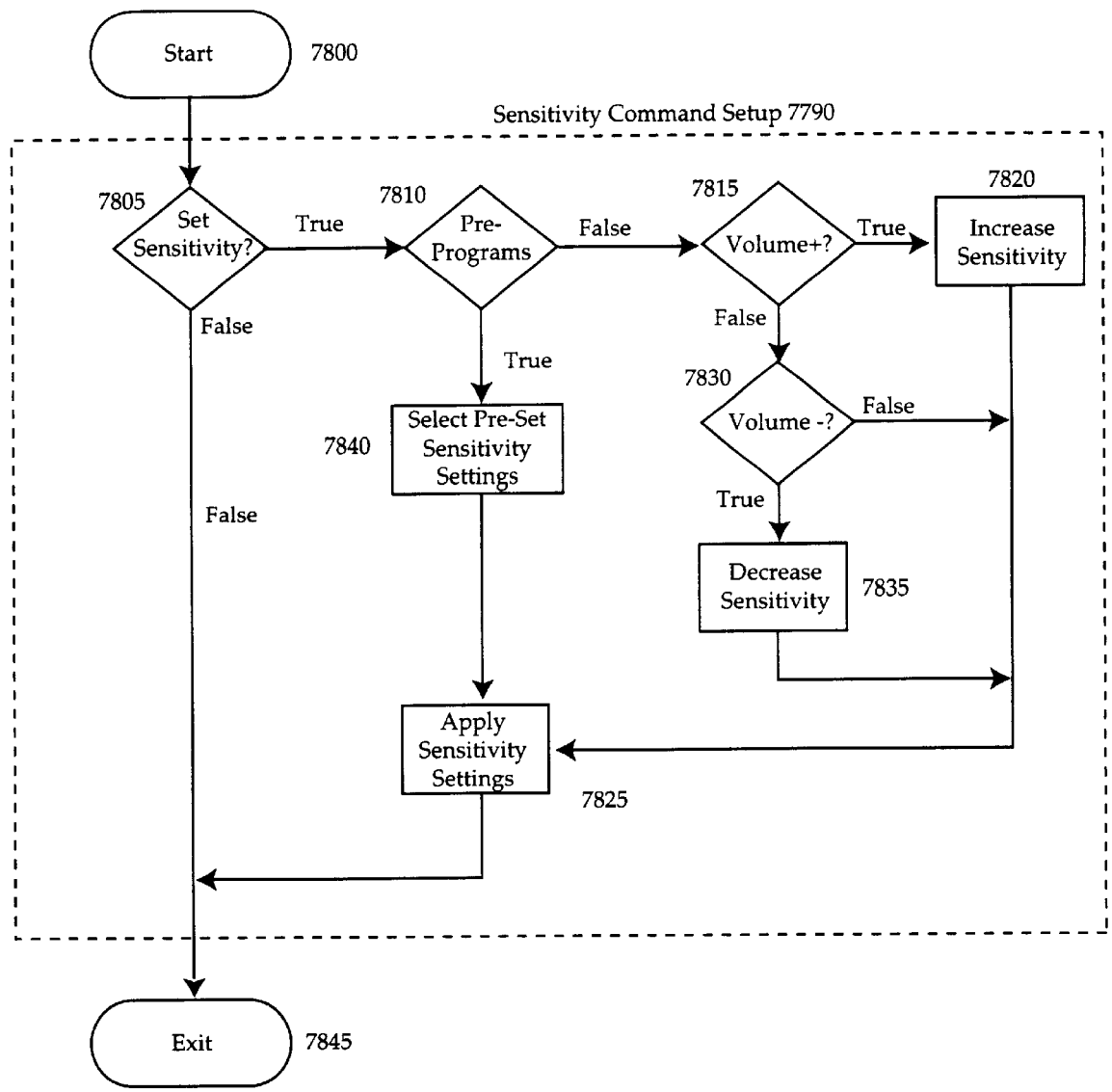

FIG. 78 shows a Conceptual Setup Sensitivity Command flow diagram.

Figure 79:
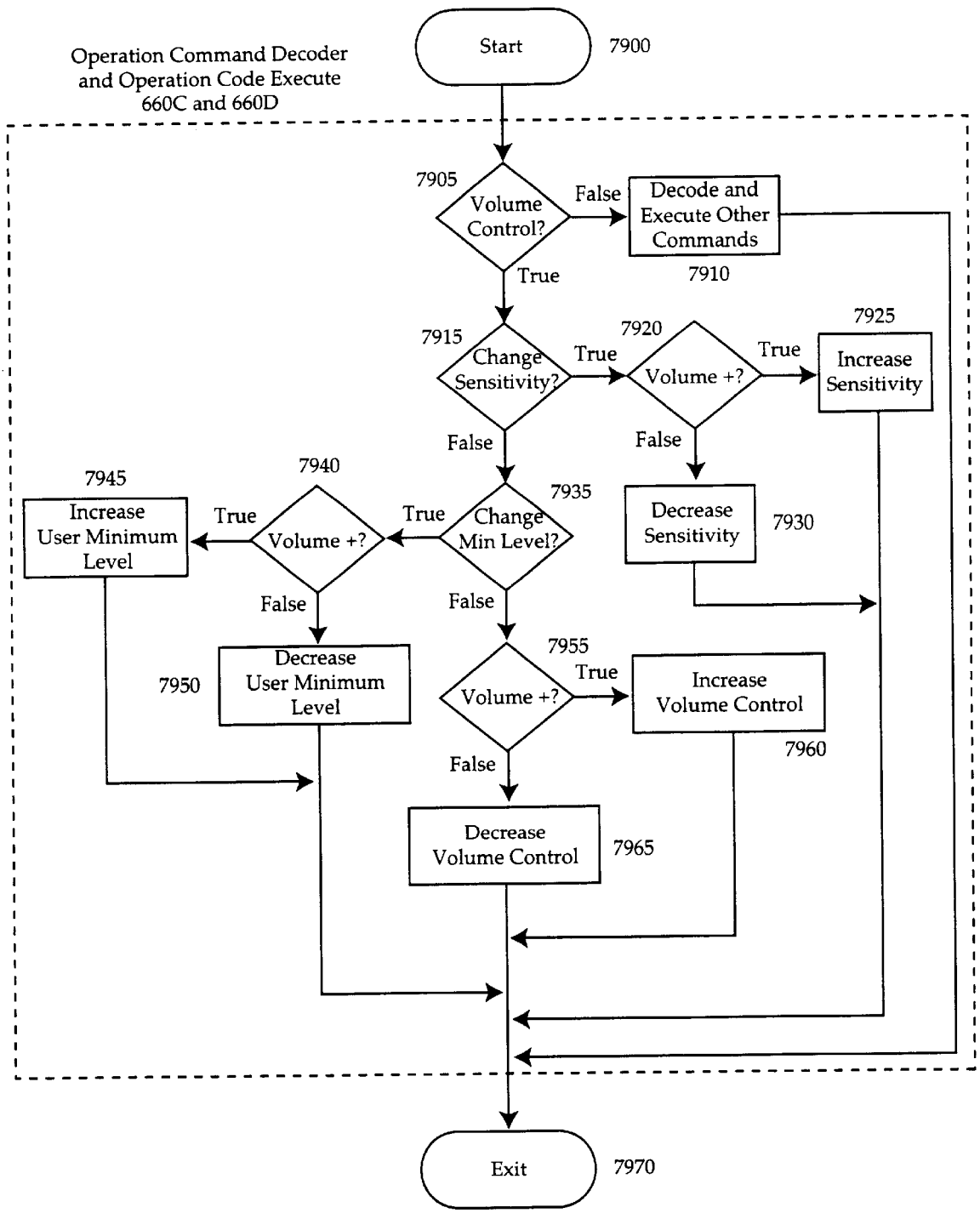

FIG. 79 shows a Conceptual Intelligent Volume Control Command flow diagram.

DETAILED DESCRIPTION OF THE INVENTION

Figure 1A:
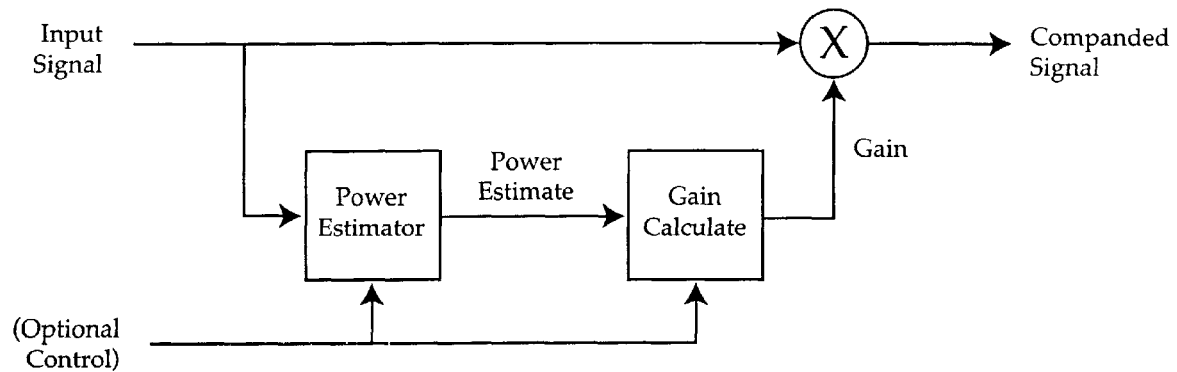
FIGS. 1A–1E show prior art signal processing systems.
Figure 1B:
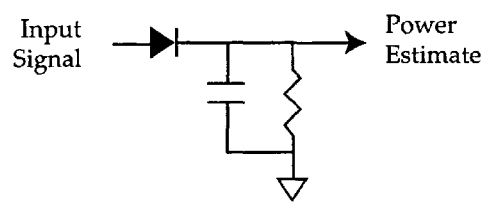
Figure 1C:
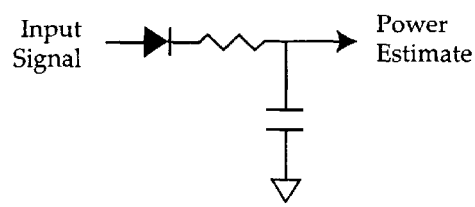
Figure 1D:
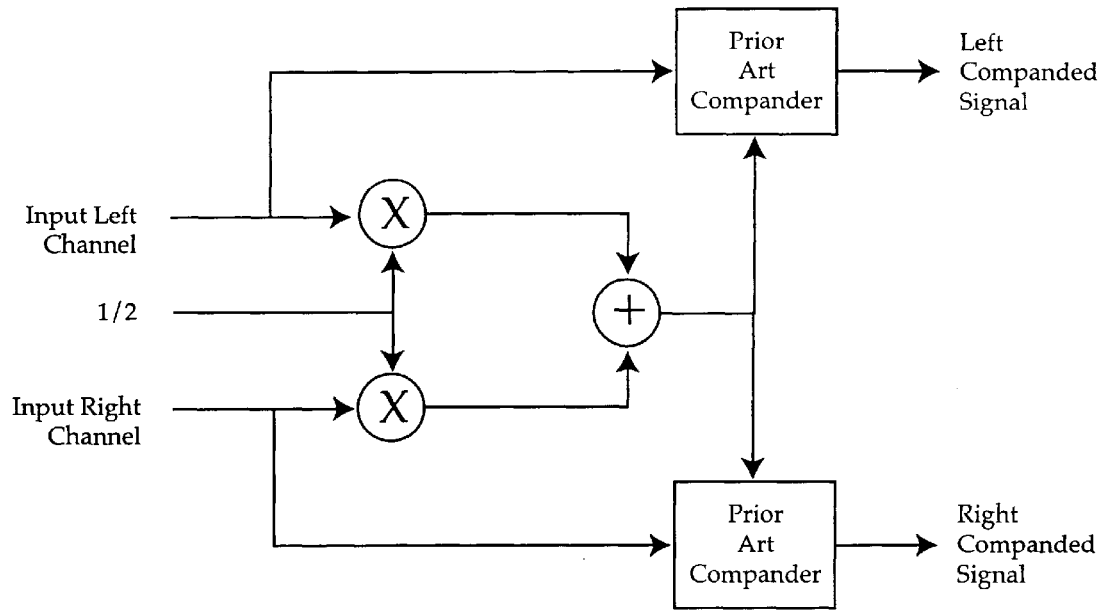
Figure 1E:
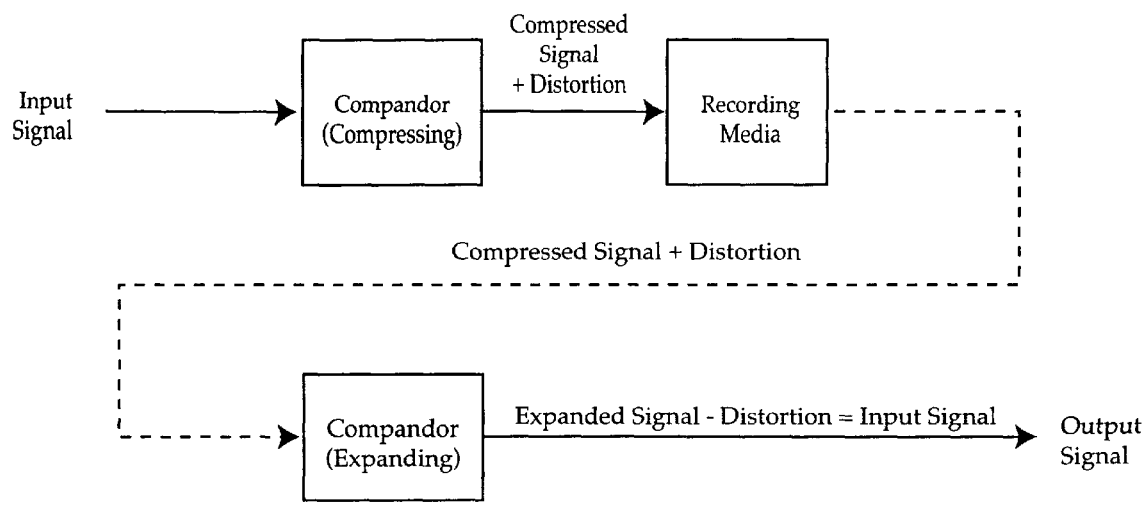
Figure 2:
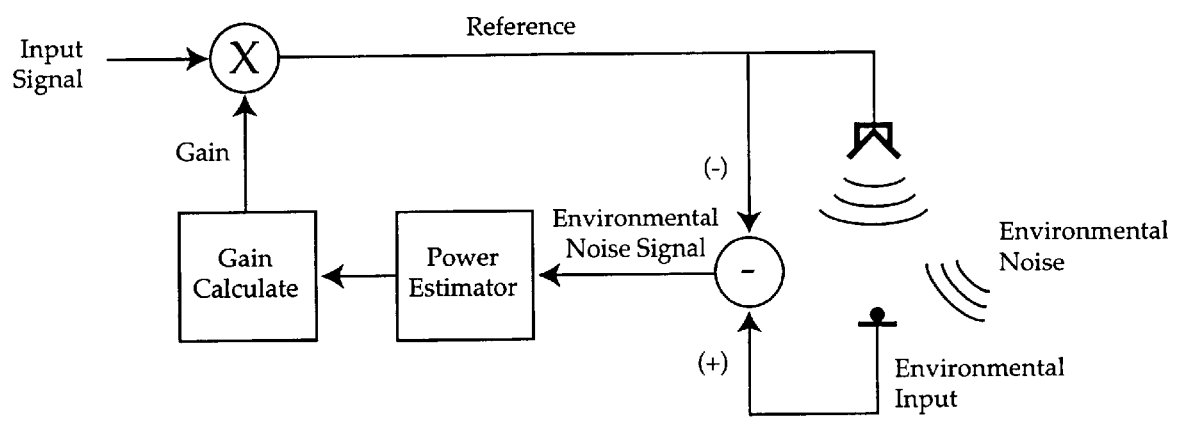
FIG. 2 shows a prior art example of a noise compensation system.
Figure 3A:
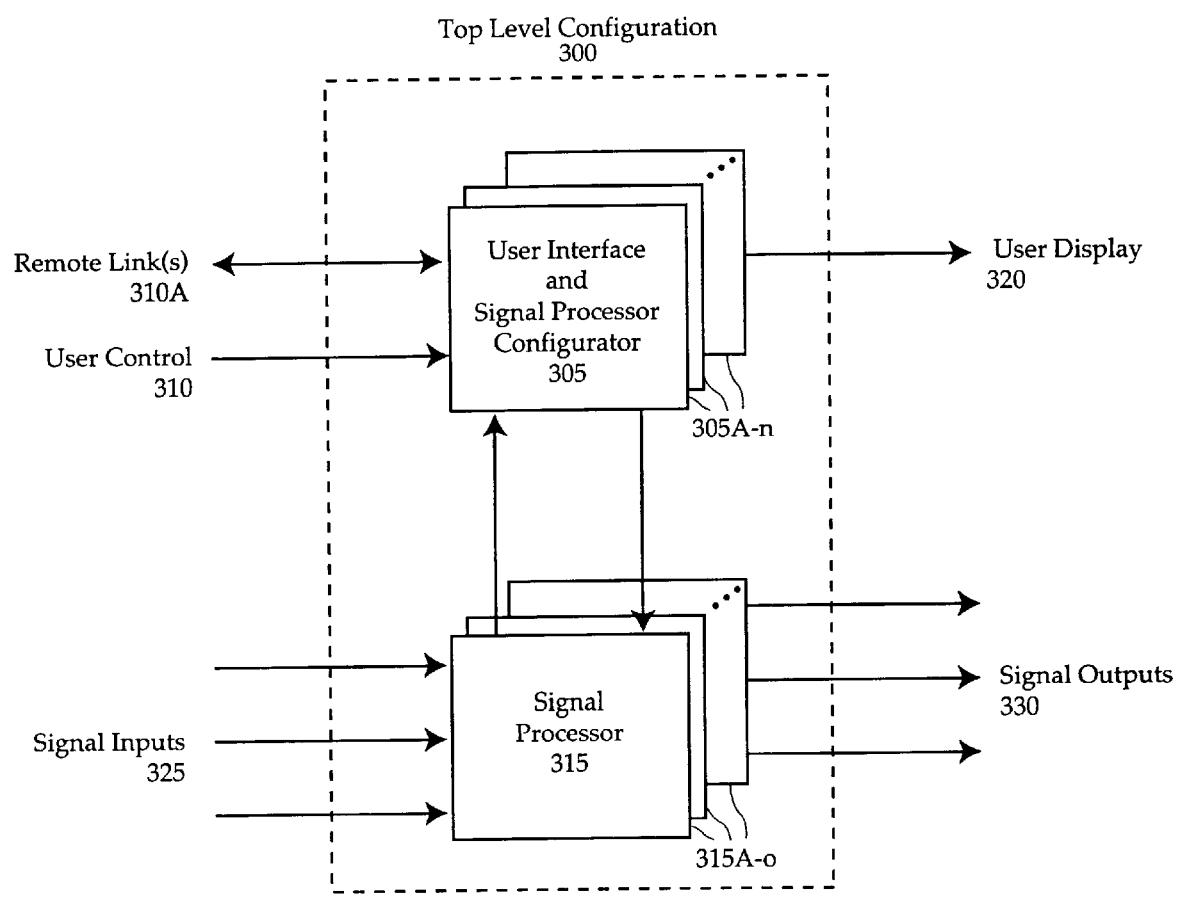
FIG. 3A shows a top level configuration of a partitioned audio system in accordance with the present invention.
Figure 3B:
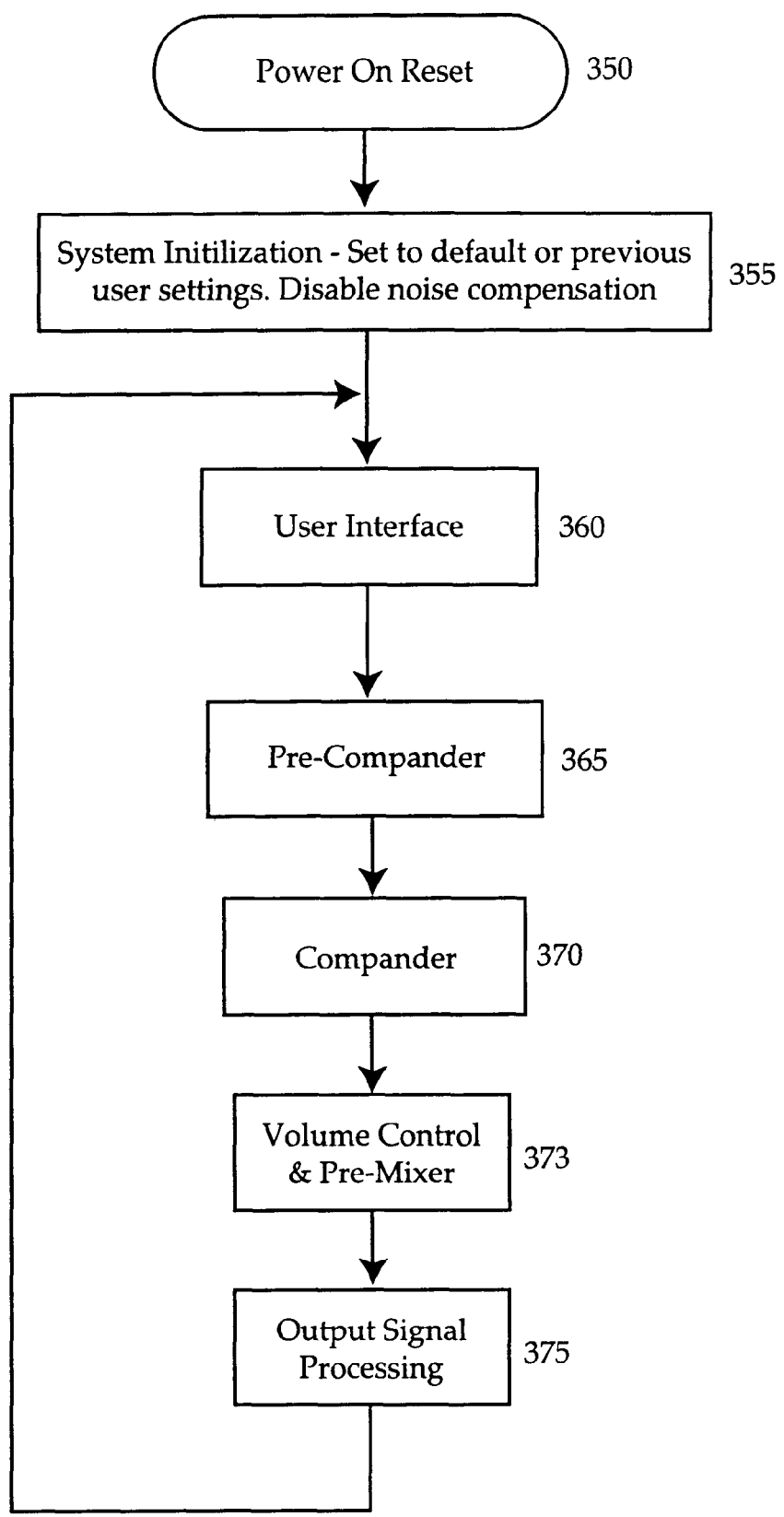
FIG. 3B shows a top level process flow diagram in accordance with the present invention.

Referring next to FIGS. 3A and 3B, numerous aspects of the overall system and process flow of the present invention can be appreciated at least generally. With particular reference to FIG. 3A, the system 300 can be seen, in broadest form, to comprise a plurality of user interface and signal processor configurator blocks 305A-n combined which receives user control signals 310 as inputs, including bidirectional remote links 310A, and communicates bidirectionally with signal processor blocks 315A-o. Aside from the signals communicated by the user interface block 305 to the signal processor block 315, the user interface block 305 also provides user display signals 320. The signal processor blocks 315A-o receive additional signal inputs 325, which may come from any of a variety of audio or similar sources, and generated one or more signal outputs 330 which have been expanded, compressed, or otherwise modified in accordance with features described in greater detail hereinafter.

The system 300 operates continuously to provide dynamic control and adjustment of the audio outputs in accordance with both user inputs and ambient or environmental conditions, with the net result of an enjoyable audio experience where the audio signals are automatically and dynamically adjusted to conform to the user's wishes in various conditions. Depending on user settings, for example, the present system may permit an audio signal to be reduced automatically in the presence of a conversation so that the conversation continues unimpeded as those conversing enter a room. Alternatively, the audio system and process of the present invention may be set to increase volume up to a predetermined limit if an intrusive noise—a gardener's blower, for example—suddenly intrudes on the user's audio environment.

In an exemplary embodiment of the present invention, the user interface block 305 will include a microprocessor and—depending on the particular microprocessor selected—may also include various A/D and D/A converters, buffers, drivers and related logic. Depending on the implementation selected, the user interface block may also be arranged to provide one microprocessor per listening environment, for example one user interface per room. As part of the user interface function, the microprocessor may also be configured to perform other related functions, including configuration, resource allocation, and control. These functions will be discussed in greater detail hereinafter. A typical microprocessor may be, for example, a Motorola 6805 or Intel 8048.

The signal processor block 315, on the other hand, typically will include one or more digital signal processors (abbreviated hereinafter as "DSP"). The DSPs may be assigned in many different configurations, including for example either a multi channel/band serial pipelined configuration or a parallel configuration with one DSP per channel or band. A typical DSP may be, for example Motorola 56300 or Texas Instruments TMS320C54X series architecture. Alternatively, and perhaps preferable in some applications, the signal processor block may be implemented in analog circuitry, particularly where cost issues prohibit the use of even an inexpensive DSP.

In the simplest case, both user interface 305 and signal processor 315 may be implemented in the same microprocessor or DSP or analog circuitry.

Keeping in mind the broad system description of FIG. 3A, the process may be broadly appreciated from FIG. 3B. In particular, the process begins at step 350 with a conventional power-on reset. The process advances to step 355 where the system is initialized in accordance with previous defaults or user settings. In a typical embodiment, noise compensation is initially disabled at step 355 as well. Noise compensation is initially disabled to avoid unpredictable behavior, since the state of the environmental noise cannot be accurately determined until after power-on initialization and system balancing. Once the system has balanced, as discussed hereinafter, noise compensation is typically employed. In addition, noise compensation may not be utilized in some implementations.

The process of FIG. 3B thereafter advances to the user interface functions of step 360, described in greater detail hereinafter. In general, the user interface step allows user-influenced operating conditions. The process then advances to process the input signal pre-processing functions at step 365. The input signal pre-processing functions, described in greater detail hereinafter at FIGS. 8A through 19, vary with implementation but generally include a plurality of functions which are best handled prior to the compander functions. Such functions may include all or only some of the following: input signal processor, environmental sensor adjustments and noise extraction, statistical engine, transform engine, and central power estimator mixer. In general, the multiple iterations of each function or combination of functions may be used to provide multi-band or multichannel processing; alternatively, the process can be executed in parallel rather than by multiple iterations.

Following the processing of the input signal pre-processing functions, the invention advances to step 370 for processing of the compander functions. The compander functions may, depending on the application involved and the acceptable cost, include some or all of: bandsplit filtering and scaling, half-wave signal processing, synchronization, setting gain, and, in some implementations, providing a soft clip function. The features and functions are described in greater detail hereinafter in connection with FIGS. 20A through 40C. As with the prior functions, multiple iterations may be required for multiband or multichannel implementations; alternatively, a parallel implementation may be used.

Following completion of the compander processing at step 370, the process advances to the volume control and pre-mixer functions at step 373. The volume control and pre-mixer functions may involve, depending on the implementation and the acceptable cost, various aspects of signal mixing and volume (i.e. signal amplitude) control, including some or all of multi-input signal mixing and scaling, volume control, and calibration signal selection.

Following completion of the volume control processing at step 373, the process advances to the output processing functions at step 375. The output processing functions may involve, depending on the implementation and the acceptable cost, various aspects of channel processing and band processing, including bandsplit filtering and scaling, signal combining, soft clip, amplification, output conversion, reference generation, and other similar functions. As before, the process may be iterative depending on the number of channels and whether one or more channels have been split into various frequency bands.

Once the steps 360 through 375 have been completed once, the process loops back to step 360 to process the next signals or, for digital signals, the next input samples.

While FIG. 3B shows a typical process flow, it can be appreciated that other alternative process flows may be realized. For example, not all process steps may be required, the process order may be mixed, process steps may be executed in parallel, and multiple occurrences of process steps may be used, for example, to implement a multilevel compander and volume control chain.

Figure 4:
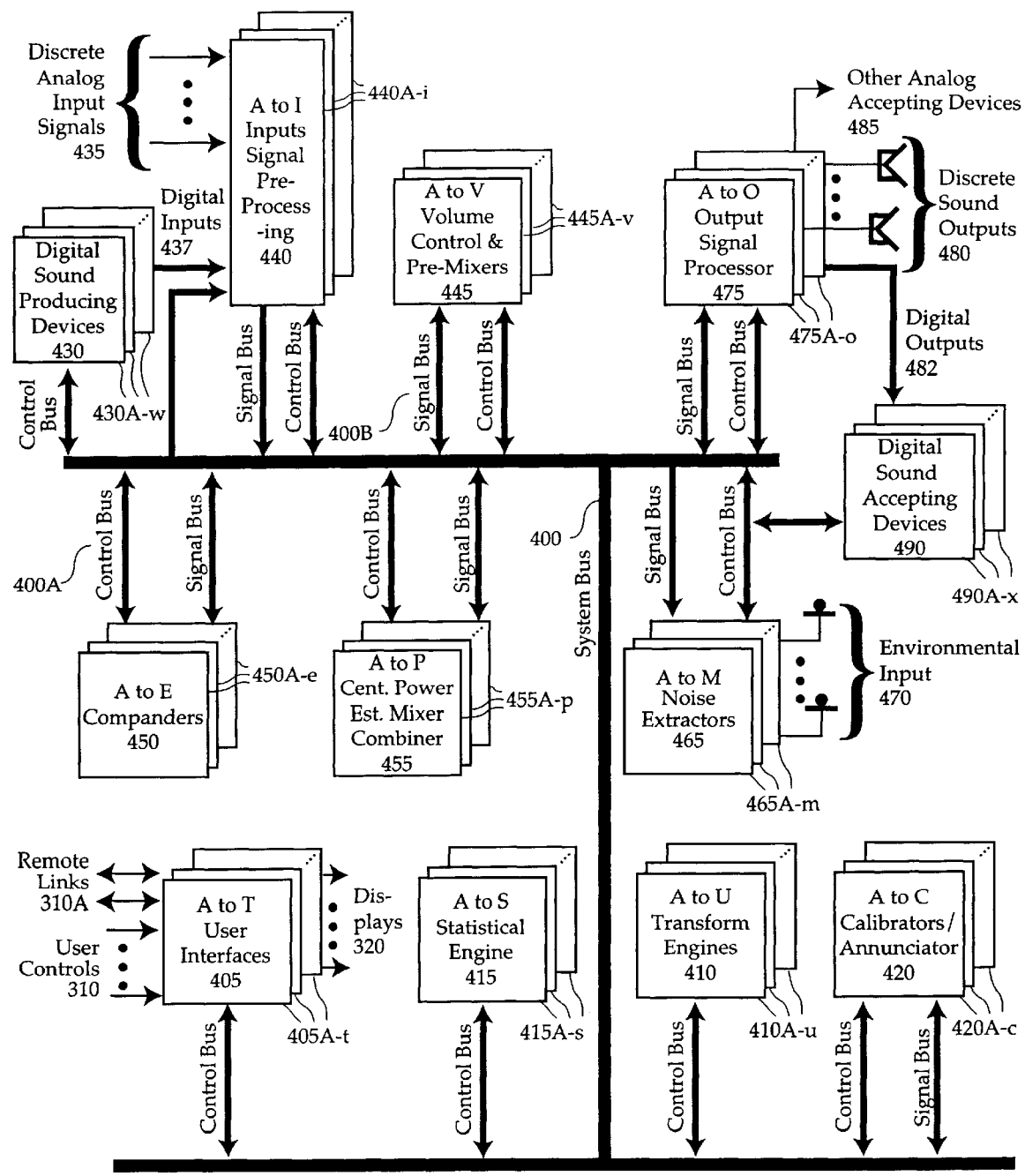
FIG. 4 shows a partitioned signal processing system in accordance with the present invention.

Referring next to FIG. 4, the overall system architecture of a generalized embodiment of the present invention may be better appreciated. In general, the architecture comprises a plurality of functional blocks connected by a system bus 400, which, for purposes of explanation may be thought of as comprising a control bus portion 400A and a signal bus portion 400B. However, the system bus 400 may be configured simply as a single bus over which both control packets and signal packets pass. A typical such implementation may be an IEEE 1394 network or other suitable networking configuration. Note that System Bus 400 can change in its implementations throughout the distributed system.

Regardless of how the system bus 400 is implemented, the functions of the system bus with respect to the functional blocks of FIG. 4A, including its control functions and signal functions, may be appreciated from Table A, below. The particular functional blocks will be described in greater detail hereinafter.

TABLE A

| Control Bus-User Interface Control Signals | | |
|---|---|---|
| Module | Inputs | Outputs |
| User Interface 405 (FIG. 6A) | Statistical Engine Flags & Data 1320 Current System Allocation 630 External Device Status 635 | Resource Allocation Signals 630 # of Channels 640 # of Bands 640 Add Computational Modules 630 Remove Computational Modules 630 Reconfigure System 630 Automatic Reconfiguration Using Statistical Engine Flags & Data, 640 -> Reset Statistical Engine Flags 650 External Configuration Radio/TV station selection 635 DVD/CD track and disk selection 635 MP3 song selection(s) 635 Transform Engine 410 Select Input Dynamic Range 645 User Set Minimum Output Level 645 User Set Maximum Output Level 645 User Volume Control 645 Statistical Engine 415 Reset all or specific histograms/analyzers 650 |
| User Interface 405 (FIG. 6A) | Statistical Engine Flags & Data 1320 & 1325 Input Clip Indicator and Clip Counter 990 Clip Event Counter and Indication 4020 | Internal Configuration Signals Compander Module: Synchronizer 2045 (FIG. 21A) Initialize Wave Buffer Initialize Gain Buffer Compander Module: Variable Attack/Release 2275 (FIG. 24A) Internal Configuration 640 |

TABLE A-continued

| | | |
|---|---|---|
| User Interface 405 (FIG. 6A) | Statistical Engine Flags & Data 1320 Loop Closure Done 6260 Input Clip Indicator and Clip Counter 990 Clip Event Counter and Indication 4020 | (e.g. Compander Operating Parameters-Slope 2290, User Selects, Selection Table Data), Attack/Release Parameters 2274 (Variable A/R Segment Kneepoints, Load Var. A/R Parameter) Compander Module: Soft Clip 2035 Clip Threshold, Reset Clip Counter Compander Module: Local Power Estimator 2280 (FIG. 25A, B) Local Post Power Estimator Parameters and Coefficients, Algorithm Select Compander Module: Linear to Gain Transform 2285 (FIG. 26A) Compander Gain Calculate Parameters 2290 (Segment Boundaries/Kneepoints, Linear Parameters, e.g. Slope M and B Offset, Non-Linear Parameters, User Select Preferences) Internal Configuration Signals Noise Compensation 465 (FIG. 51) Input Adjust blocks 5300 gain values (FIG. 52A) Noise Sensitivity Control 5440 Start Loop Closure 6255 User Select Preferences for Variable Attack/Release (shorter/longer responses) Transform Engine Data Volume Control/Pre-Mixer 445 (FIG. 41B): Volume Control Pre-Mixer Levels 4210 Calibrate 640 Volume Control Setting 1640 Output Signal Processor 475 (FIG. 43A): Input Mixing/Summing Control Analog/Digital Selection Data Word Scaling Select Data packet length Calibrator/Annunciator 420 (FIG. 50): Internal Configuration 640 (e.g. Calibrate, Calibrate Signal Select, Annunciator Command, Annunciator Message Select) Central Power Estimator 455 (FIG. 18): Parameters and Coefficients Algorithm Select Input Signal Pre-Processing & Input Level Adjust 440 (FIG. 8A): Reset, 0 dB Level, Load Gain Value, Save Gain Value, Input Select, Filter Parameters & Equalization Constants Soft Clip 2035: Set Clip Threshold, Reset Clip Counter |

Compander Control Signals
The adaptive variable dynamic compander has multiple modules with signals connecting to the system bus 400.
Control Bus-Compander Control Signals

| Compander Module | Inputs | Outputs |
|---|---|---|
| Synchronizer 2045 (FIG. 21A) | Initialize Wave Buffer Initialize Gain Buffer | |
| Variable Attack/Release 2275 (FIG. 24A) | Internal Configuration 640 (e.g. Compander Operating Parameters-Slope 2290, User Selects, Selection Table Data), Attack/Release Parameters 2274 (Variable A/R Segment Kneepoints, Load Var. A/R Parameter) | |
| Soft Clip 2035 | Clip Threshold Reset Clip Counter | Clip Event Counter and Indication 4020 |
| Local Power Est. 2280 (FIG. 25) | Local Post Power Estimator Parameters and Co-efficients Algorithm Select | |
| Gain Calculate (FIG. 26A) | Input Power 2620 (e.g. Final Power Estimators 2283, Half Cycle Peak Value 2289, Intermediate Power Estimate 2279), Compander Gain Calculate Parameters 2290 (Segment Boundaries/Kneepoints, Linear Parameters, e.g. Slope M and B Offset, Non-Linear Parameters, User Select Preferences) | Final Gain 2050 Log Input Power & Selected Segment 2287 |

Miscellaneous Module Control Signals
Control Bus-Control Signals

| Module | Inputs | Outputs |
|---|---|---|
| Noise Compensator 465 (FIG. 51, 52A–C) | Channel Reference Out 4310 Noise Sensitivity Control 5440 Start Loop Closure 6255 Input Adjust blocks 5300 gain values Internal Configuration 640 | Compander Noise Floor 5110 Volume Control Noise Offset 5115 Loop Closure Done 6260 |
| Transform Engine 410 (FIG. 15) | Internal Configuration 640 (e.g. set maximum level, set minimum level, user volume control, input dynamic range) Compander Noise Floor 5110 Volume Control Noise Offset 5115 Statistical Engine Flags & Data 1320 | Compander Gain Calculation Coefficients 2290 Volume Control Setting 1640 Vol. Cntl. Pre-Mixer Levels 4210 Attack/Release Parameters 2274 |

TABLE A-continued

| | | |
|---|---|---|
| Statistical Engine 415 (FIG. 13) | Statistical Engine Controls 650 (e.g. Reset all or specific histogram/analyzers) Inputs (e.g. Power Estimates) | Statistical Engine Controls 650 (e.g. Reset Input Level Adjuster, Input Dynamic Range) Statistical Engine Flags 1320 (e.g. New Knee-points, Active Channels, Inactive Channels) Statistical Data 1325 |
| Volume Control/ Pre-Mixer 445 (FIG. 41B) | Volume Control Pre-Mixer Levels 4210, Calibrate 640, Volume Control Setting 1640 | |
| Output Signal Processor 475 (FIG. 43A) | Input Mixing/ Summing Control Analog/Digital Selection Data Word Scaling Select Data packet length | Channel Reference Out 4310 |
| Calibrator/Annuciator 420 (FIG. 50) | Internal Configuration 640 (e.g. Calibrate, Calibrate Signal Select, Annunciator Command, Annunciator Message Select) | |
| Central Power Estimator 455 (FIG. 18) | Inputs 1800 (Exp. Local Power Estimates 2282 and Global Power Estimates 2281) Parameters and Co-efficients Algorithm Select | Global Power Estimates 2281 |
| Input Signal Pre-Processing and Input Level Adjust 440 (FIG. 8A) | Reset, 0 dB Level, Load Gain Value, Save Gain Value, Input Select, Filter Parameters & Equalization Constants | Exceeded Adjustment Range Input Clip Indicator and Clip Counter 990 |
| Soft Clip 2035 | Set Clip Threshold Reset Clip Counter | Clip Counter Value |

Power Estimator Signals
Control Bus-Power Estimator Signals

| Module | Inputs | Outputs |
|---|---|---|
| Local Power Estimator 2280 (FIG. 25) | Local Power Estimators 2279 and/or Initial Power Estimate 2273 Global Power Estimates 2281 | Exported Local Power Estimates 2282 Final Power Estimates 2283 |
| Central Power Estimator 455 (FIG. 18) | Local Exported Power Estimators 2282 Global Power Estimates 2281 | Global Power Estimates 2281 |

Monitor Signals
Control Bus-Monitor Signals

| Module | Inputs | Outputs |
|---|---|---|
| Compander Modules 450 (FIG. 22) | Attack/Release Parameters 2274 Global Power Estimates 2281 Gain Calculate Parameters 2290 | Half Cycle Power Estimates 2278 Initial Power Estimates 2273 Local Intermediate Power Estimators 2279 Exported Local Power Estimate 2282 Final Power Estimator 2283 Log Input Power, Selected Segment 2287 Final Gain 2050 |

Monitor signals are any not already covered under the User Interface, Compander, Miscellaneous Module, and Power Estimator System Bus signals that may be monitored by the Statistics Engine or User Interface.

As noted above, the foregoing aspects of the system bus 400 will be described in greater detail hereinafter in connection with the modules associated therewith.

With continued reference to FIG. 4, the user controls 310, including the bidirectional remote links 310A from FIG. 1, can be seen to be applied to a user interface stage shown generally at 405. User controls may include but not limited to keyboards, keypads, touch screens, and infrared and radio frequency remote controls. Remote links 310A typically connect to another computer or control system, such as an Internet website or customer service computer, typically through the use of an analog or digital modem or other serial or parallel interface, for purposes of running remote diagnostics, obtaining software updates, obtaining music or other sound data, and so forth. Depending on the particular implementation, the user interface stage 405 may be implemented as one user interface module per room or other suitable partition, in which case there will be a plurality of user interface modules 405A-t. The number of user interface modules 405A-t can vary with the number of listening environments, and is typically configured as one per listening environment although a smaller number is also acceptable in at least some embodiments. In addition to receiving user control signals 310, the user interface stage 405 receives various signals from the remainder of the system via the system bus, as shown above in Table A. The signals received by the user interface stage 405 include a statistics engine flags and data, transform engine controls, resource allocation signals, monitor signals, noise floor levels, and configuration data. Ultimately, the user interface stage generates signals to drive the various displays 320, which may be of any suitable type. For example, the displays may include LED's, Braille generators, annunciators, remote link outputs, or any other suitable signal indicator for indicating system operation. In addition, the user interface stage 405 provides various system bus signals as shown in Table A.

The user interface 405 also allows allocation of various system resources to optimize the performance of higher-end implementations of the system including assignment of new and existing system resources. For example, in a home environment involving several rooms and wherein the system of the present invention includes a plurality of processors, which can be timeshared, and related resources, it may be desirable to dedicate multiple modules to a primary listening room, and allocate only limited resources to other areas. That requirement may later change, in which case it may be desirable to reconfigure the system to reallocate multiple modules to different or multiple listening areas. The user interface 405 permits such defining and assignment of system resources, and may be implemented by appropriate signals on the system bus 400, a crossbar switch, a routing table or network, or other suitable means.

Also connected to the system bus 400 is a transform engine stage 410. The transform engine stage 410 operates to establish an operating configuration for the system overall, including responding to the user controls which are provided through the user interface stage 405. The transform engine typically accepts conventional inputs such as volume, noise level and minimum volume levels and converts them to operating parameters such as linear or non-linear multiplier values, volume control values, compander operating parameters, gain calculation values, and so on. The transform engine stage 410 may be comprised of a plurality of transform engine modules 410A-u, where some or all of the listening environments within an overall system may have a transform engine module 410 associated therewtih.

In at least some implementations, the user interface stage 405 and transform engine 410 provide the user the opportunity to establish performance parameters for the remainder of the system, as will be discussed in greater detail hereinafter. In particular, the user can set current volume, can set minimum and maximum volumes for audio signals, can determine whether the system outputs should dominate environmental noise (noise compensation) or should diminish in the presence of ambient sounds such as conversation (signal muting), can determine how quickly the system responds to changes in ambient conditions, can set dynamic range, and so on. In some implementations, however, it may be preferable to establish system defaults, in which case the user may not need to provide any controls except possibly volume. In other implementations, particularly lower end implementations involving single channels or simplified processing, it may be desired not to provide any user controls including configuration controls.

A statistical engine stage 415 may also be provided to track various historical operating parameters. The statistical engine stage, which need not be implemented in all embodiments, may be implemented in one or more modules 415A-s where each statistical engine can then instruct the user interface to change performance parameters for the remainder of the system by the use of generated flags. In addition, the user interface can use data supplied by statistical engines to intelligently change performance parameters for the remainder of the system.

Further, a calibrator/annunciator stage 420, also implemented as one or more calibrator modules 420A-c, may also be provided to permit setting of minimum and maximum volume, calibrating environmental compensation, and to balance multiband or multichannel systems. An annunciator function may also be implemented in the stage 420 to provide audible instructions or other comments to the user. In some embodiments, the calibrator function is of particular importance since it is helpful for balancing the system to provide effective noise compensation or for setting minimum and maximum volume levels. At calibration, the calibrator stage 420 generates a white noise or other appropriate signal which is permitted to override other system input signals so it alone is supplied as the system outputs. The resulting output is then measured and the system set accordingly. The annunciator function—which permits audible instructions or comments by the system to the user—may be implemented by bypassing portions of the signal path, although the compander will typically still be used in at least some embodiments such as, for example, applications involving the hearing impaired. The calibrator/annunciator functions may not be required in all systems. The calibrator/annunciator stage 420 communicates bidirectionally with the remainder of the system via the system bus 400, as described in Table A.

Having discussed the general operation of the user interface stage 405, transform engine 410, statistical engine 415 and calibrator/annunciator stage 420, the second major portion of the system of the present invention is the signal path. Still with reference to FIG. 4, digital signal inputs 430 or analog signal inputs 435 are provided to an input signal pre-processing stage 440. The digital signal inputs 430 may comprise one or more sources 430A-w. As with the user interface stage 405, the input signal pre-processing stage 440 may be configured as one or more pre-processing modules 440A-i depending on the desired implementation. In a robust implementation, the input signal pre-processing stage 440 may be configured as one module per channel, for example, although other signal partitions will be readily apparent to those skilled in the art. The general function of the input signal pre-processing stage 440 will be discussed in greater detail hereinafter in connection with FIGS. 8A–8F, 9A–C and 10A–10D, but is basically to allow multiple input signals to be multiplexed, to convert analog input signals to digital form, to synchronize relevant events and data, and so on.

The input level adjust stage also serves to establish what are generally referred to as "0 dB levels," as well as to load and to save input gain values. For purposes of the present description of an exemplary embodiment, 0 dB levels are set to permit optimal compander operation, and in a preferred embodiment are set so that the largest amplitude (or peak) input signal available from a given source maps to the maximum acceptable amplitude digital signal for the system. This concept is discussed in greater detail in connection with FIG. 8B, hereinafter. The maximum acceptable digital signal may be, for example, the maximum non-distorting signal permissible in the system for the range of frequencies of the system, or may be set at a different level, for example somewhat less than the maximum to allow a certain amount of headroom, to permit management of output signals which would otherwise be distorted through clipping. Thus, a peak analog signal from a first input may, for example, be two volts peak-to-peak and is mapped by the input level adjust stage to the maximum amplitude digital signal permissible by the system. But a second input source, for which the peak signal may be only 0.5 volts peak-to-peak, is also mapped by the input level adjust stage to that same maximum amplitude digital signal, or what may be thought of as the "compute space." That maximum amplitude digital signal is defined, for the exemplary embodiment described herein, as the "0 dB level." Thus, the volume of signals from varying input sources will all map to the same digital amplitude for further system processing.

In addition, in some configurations, the input signal pre-processing stage 440 may include a band-splitting function to, for example, divide the incoming signal into a plurality of frequency bands for subsequent processing, or to provide filtering or equalization.

Downstream of the input signal pre-processing stage 440, the input signals are provided to a dynamic compander stage 450, which in many embodiments will cooperate closely with a central power estimator mixer stage 455 to permit multiple bands or channels of signals without altering relative spatial information or causing signal distortion between the various bands or channels. While the power estimator mixer stage 455 is shown separately from the compander stage 450, in some embodiments the power estimator mixer function may be incorporated into the compander. In general, as the numbers of channels or bands increases it becomes more efficient to utilize a centralized power estimator mixer. Thus, for the exemplary embodiment of FIG. 4, a centralized version of the power estimator mixer has been shown. In some instances, a centralized power estimator mixer stage will cooperate with multiple local power estimator mixers associated with each compander stage, as discussed in greater detail hereinafter.

Referring still to the compander stage 450 in general, the function of the compander stage is to match the input source dynamic range to the listener's dynamic range by either expanding or compressing the input signals as appropriate in accordance with the user or system control signals provided either by the user interface 405 or in accordance with environmental levels provided by the noise extractor stage 465. The compander stage forms a central portion of many embodiments of the overall system, and in a presently preferred embodiment operates with low distortion. One element for providing particularly low distortion is the implementation of a variable attack and release function, which will be discussed hereinafter but basically permits the compander to dynamically adjust for changing parameters—either environmental or input signal changes—to maintain output signals within predetermined limits. As with several of the other stages, the compander stage may comprise a plurality of compander modules 450A-e, according to the number of channels or other signal partitions utilized in the particular embodiment. In an exemplary embodiment, the compander stage 450 will include a variable attack and release function to permit rapid adjustment of compander parameters while maintaining low distortion. In addition, as noted above, in multichannel embodiments the compander may include a local power estimator mixer.

The power estimator mixer stage 455 may be implemented as one or more modules 455A-p where, for example, each module may be associated with a listening environment. The power estimator mixer stage operates to permit multiple compander stages without altering relative spatial information or causing signal distortion between the various bands or channels.

In an additional feature, the compander stage 450 responds to inputs from user interface stage 405, transform engine stage 410 and environmental inputs from a noise extractor stage 465 discussed hereinafter to implement the users selection of either noise compensation or signal muting. In noise compensation, the audio signal is automatically compressed when environmental or ambient noise occurs, thus ensuring that the low volume portions of the audio signal can be heard despite the ambient noise. In signal muting, the ambient noise—which includes conversation or other high priority environmental sounds—is given priority over the system's audio signal, thus allowing the conversation to be heard even over the loudest audio signal portion.

The input signal pre-processing stage 440, compander stage 450, and power estimator mixer stage 455 each communicate bidirectionally with the remainder of the system via the system bus 400.

A noise extractor stage 465 may also be provided in some embodiments. As with the prior stages, the noise extractor stage 465 may be implemented as a plurality of modules 465A-m. The function of the noise extractor stage is to provide an indication of the environmental noise level in the listening environment through environmental inputs, typically one or more microphones or other sensor inputs positioned in that listening environment. The environmental inputs will typically have a combination of environmental noise and speaker output components. By comparing the environmental inputs with the estimated output power of the system—i.e., a representation of the speaker outputs, also referred to as the system reference signal—the environmental noise component can be isolated and a signal indicative of that noise component can be fed back to the remainder of the system to adjust output levels accordingly. The system reference signal may be, in at least some embodiments, a combination of reference signals, e.g. one per channel to facilitate efficient acoustic loop balancing, typically on a speaker-by-speaker basis.

Balancing, also referred to as acoustic loop balancing, system balancing or system calibration, is typically performed once for a given system configuration and acoustic environment—that is, a balancing typically is performed only when something about the system configuration or the listening environment changes. Balancing sets the environmental input to be substantially equal to the system reference signal in the absence of environmental noise. Once balanced, the correct amount of environmental noise can be determined from the environmental input. To ensure that the reference signal represents the power emitted from the speaker, any post-balancing signal changes (e.g. tone controls) are typically done before the reference signal is generated so that such changes are included in the loop, allowing the system to remain balanced.

It will be appreciated that the process of adjusting output in accordance with the noise extractor stage 465 essentially forms a positive feedback loop. As will be discussed in greater detail hereinafter, a negative feedback loop is also formed, to compensate for changes in the listening environment, for tolerances in the environmental sensors and associated components, and also to eliminate any "gain chase" issues. The noise extractor stage 465 communicates with the remainder of the system via the system bus 400.

Subsequent to the compander stage and noise extractor stage, the audio signals are provided to a volume control stage 445A-v and an output signal processor stage 475A-o via the signal bus 400B, with appropriate control signals as identified in Table A supplied by the control bus 400A. The volume control stage 445 and output processor stage 475 operate mainly to convert the signals into sound at appropriate volumes and output levels, and may include both signal mixing and amplification, depending upon implementation. The sound may be supplied to discrete sound outputs 480 or other analog devices 485; alternatively the output signal may be provided in digital form to various digital receivers 490A-x.

From FIG. 4, the overall structure of the present invention may be appreciated. It can be appreciated that many different configurations of the elements of FIG. 4 can be realized. For example, not all elements may be required, the element order may be mixed, elements may be executed in parallel, and multiple occurrences of elements may be used. FIG. 5A–I give examples of a variety of configurations.

Figure 5A:
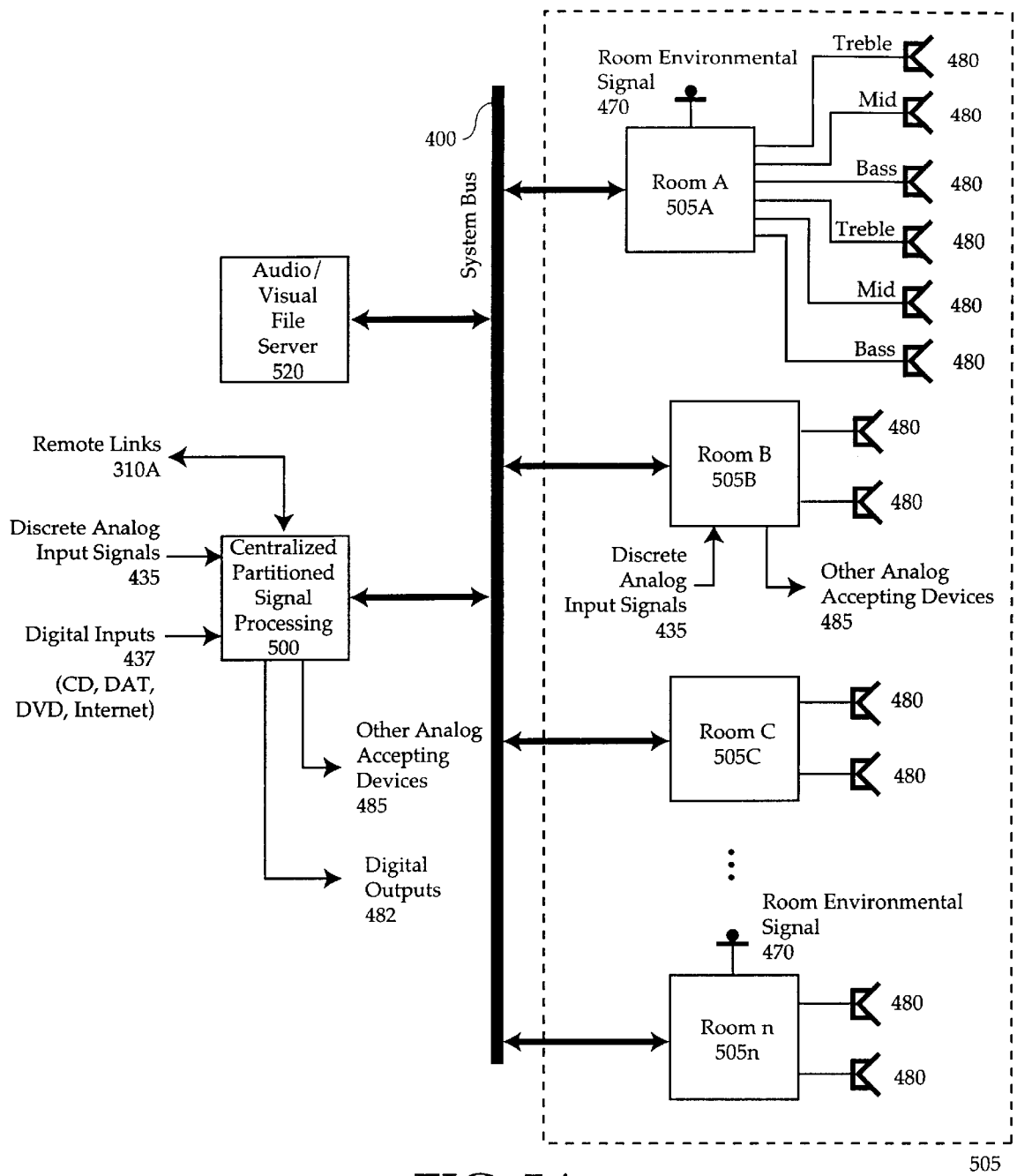
FIG. 5A shows an exemplary home-wide audio server network in accordance with the present invention.

With reference to FIG. 5A, the application of the system to a user environment can be better appreciated. The partitioned audio system of the present invention can be seen to include analog sources, or inputs, 435 provided to centralized partitioned signal processing 500, which also receives digital inputs 437 from digital sound producing devices 430 and remote commands, data, or programs from remote link 310A. The centralized partitioned signal processing 500 may include, depending upon the particular embodiment, one or more input signal pre-processing stages, volume control and pre-mixer stages, compander stages, central power estimator mixer stages, and so on as discussed in connection with FIG. 4.

A significant advantage of the expandable audio server network shown in FIG. 5A is its ability to minimize redundant equipment. By providing centralized partitioned signal processing 500, other room locations are able to share input and output devices, and computational modules. By using an audio/visual file server 520, once a given sequence of sounds has been acquired, it can be stored on the server, and played at any location connected to the network. Prior-art solutions often required having standalone complete sound systems in each room or required every device to be located at a single common location.

Rooms connected to the network may have a wide range of capabilities, ranging from the very simple stereo only configuration of Room C 505C, to the complex, three-band, stereo, noise compensation for Room A 505A. Equipment may also be distributed and shared across the network, such as the additional devices shown in Room B 505B.

The sound in each room can be optimized in a wide variety of manners to meet listener preferences. For example, a different listener dynamic range can be specified for each room. Rooms that have noise extractors 465 can be configured to automatically transform the sound being played when environmental noise interferes with listening conditions. Prior-art solutions only provided a conventional volume control.

Figure 5B:
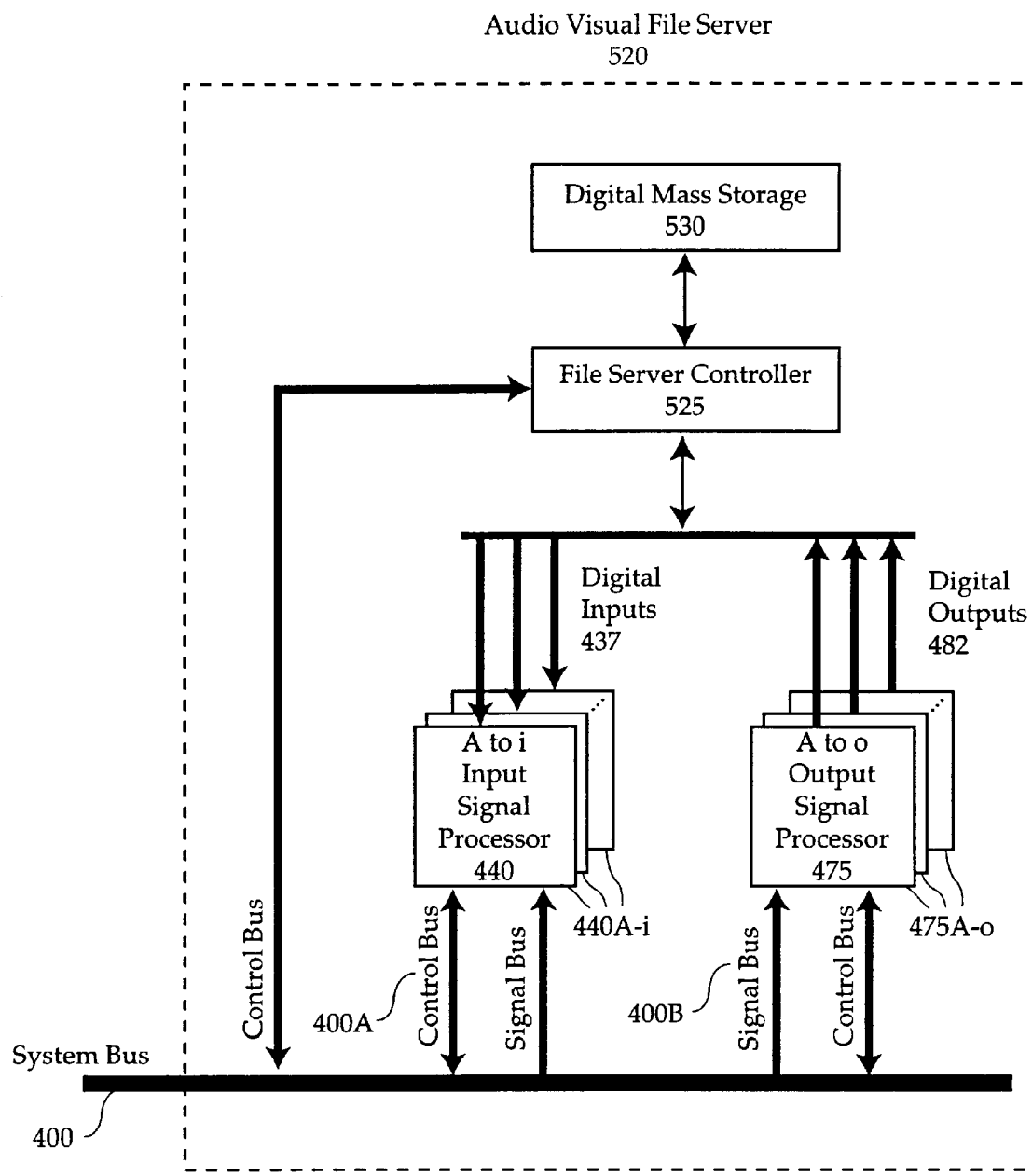
FIG. 5B shows an audio visual file server in accordance with the present invention.

The audio/visual file server 520 shown in FIG. 5B makes use of the input signal processor 440 and output signal processor 475 to interface between the system bus 400 and the file server controller 525. While the file server controller 525 and digital mass storage 530 might be a dedicated file server, it also could be provided by means of a PC, network appliance, or any other digital device able to provide and/or accept digital information used to encode sound. Often sound would be stored in a compressed format using MP3 or AC-3 algorithms, and subsequently decoded by the file server controller or other means.

Advantages of the audio/visual file server 520 are that it minimizes redundant input devices, reduces the labor required to play music, eliminates needing to store recordings near sound reproduction equipment, and allows multiple, concurrent streams of audio to be processed by the centralized partitioned signal processing 500 and then sent to each room.

Figure 5C:
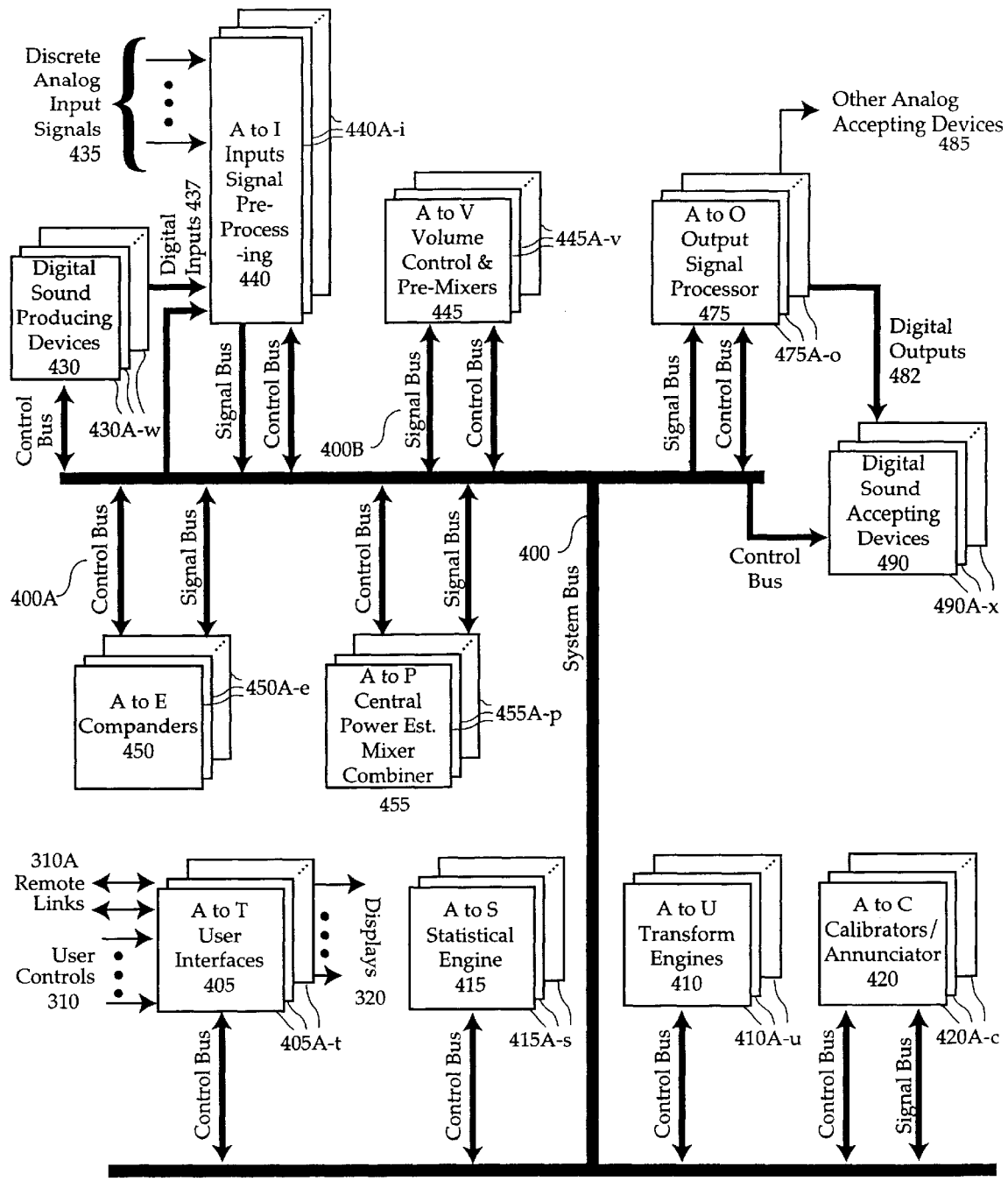
FIG. 5C shows an exemplary centralized partitioned signal processing system.

FIG. 5C shows that a centralized partitioned signal processing 500 may include all of the modules articulated in FIG. 4, with the normal exception of the noise extractor 465 that typically must be located in each room in order to measure the local ambient noise level. Multiple rooms can make concurrent use of the resources provided by centralized partitioned signal processing 500. Resources can be timeshared or dedicated as desired by its users. Prior-art solutions provide fixed allocations of resources, preventing their full use.

Figure 5D:
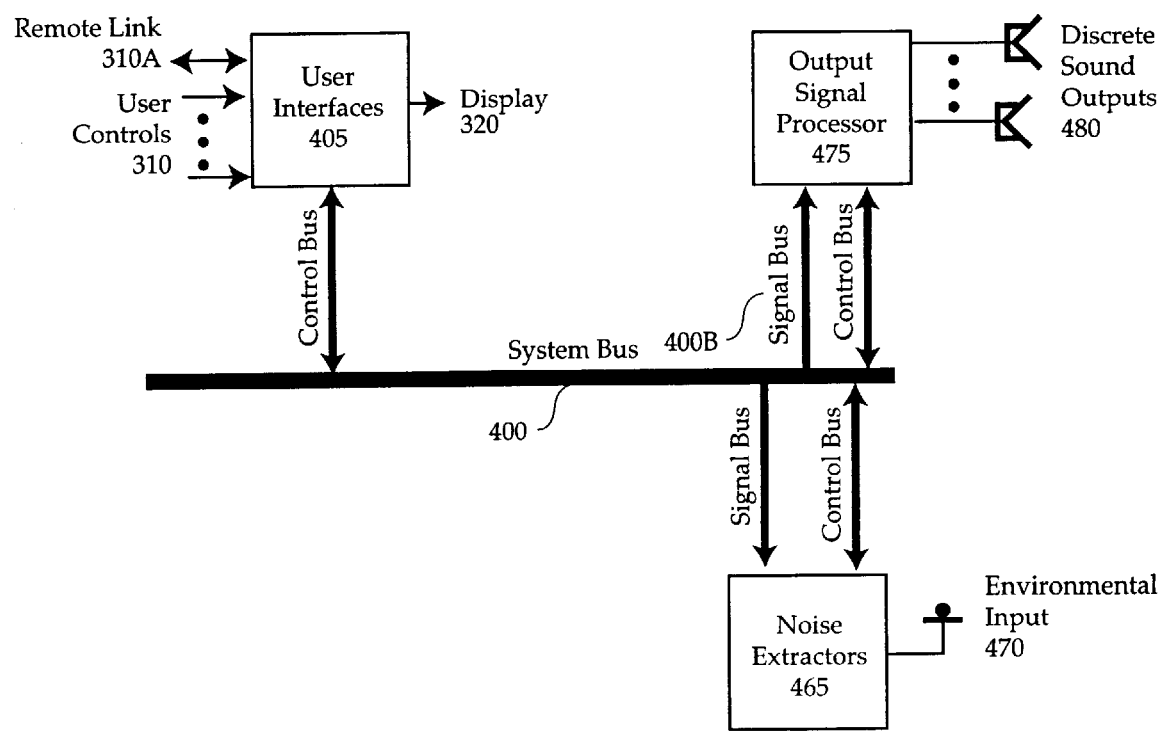
FIG. 5D shows an exemplary system for a single listening environment, with noise compensation.

Typically a room with noise compensation would include the minimum modules shown in FIG. 5D. The discrete sound outputs 480 are driven by the output signal processor 475 which receives signal information from the centralized partitioned signal processing 500. The noise extractor 465 detects the total environmental input 470 and send environmental noise information to the centralized partitioned signal processor 500. The user interface 405 allows the user to control the operation of the modules distributed throughout the network by means of user controls 310 in the room, as well as to make requests of the centralized resources, such as to play a particular song from the file server. When using this room configuration, the centralized partitioned signal processing 500 would provide all other sound processing capabilities.

Figure 5E:
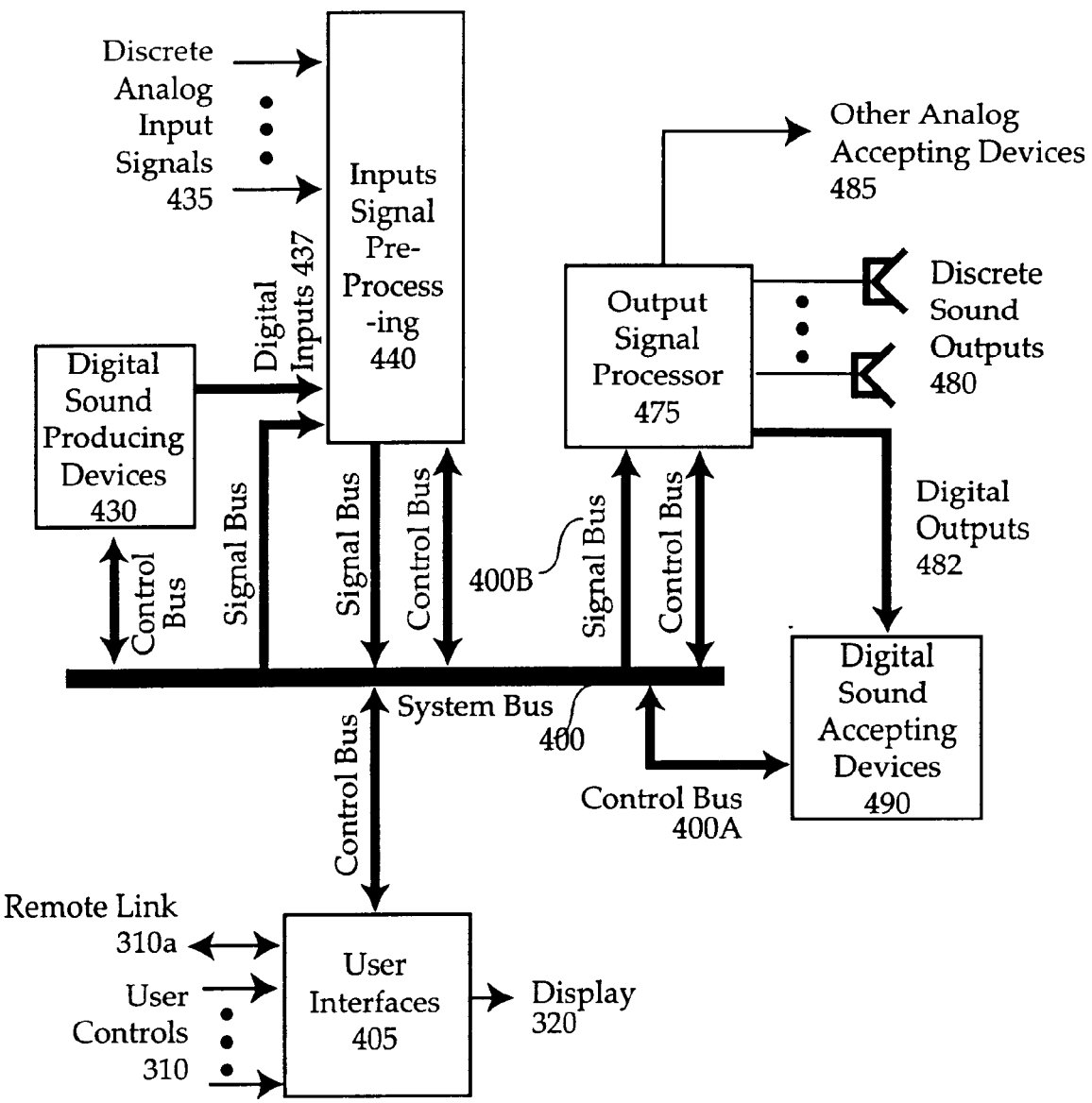
FIG. 5E shows a exemplary system for a single listening environment with local I/O, but without noise compensation.

To implement Room B 505B, a room with local input/output capabilities, but without noise compensation could be implemented as shown in FIG. 5E. This figure is similar to FIG. 5D with additional modules to provide input/output capabilities, but lacks the noise extractor 465. A digital sound producing 430 and sound accepting device 490 facilitate local connection of devices such as a portable digital recorder. A recordable CD player might be input to the room by discrete analog input signals 435, input signal processor 440, and output via output signal processor 475, and analog accepting devices 485. An universal serial bus (USB) device such as a MP3 player might be interconnected to the digital sound producing device 430 and digital sound accepting device 490. These modules allow the user to have local devices while making use of the centralized partitioned signal processing 500 and file server 520 resources.

Figure 5F:
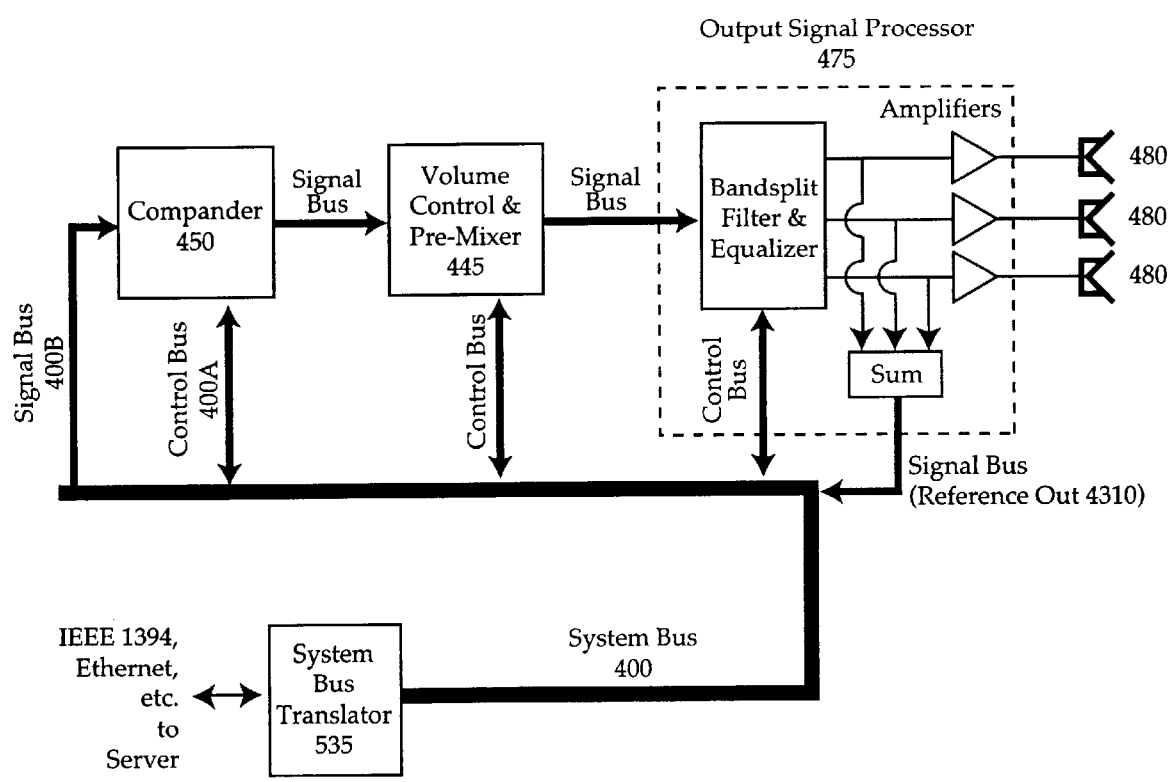
FIG. 5F shows an exemplary embodiment of an intelligent speaker in accordance with the present invention.

FIG. 5F indicates how a "smart speaker" might be implemented. Using the compander 450, volume control and pre-mixer 445, and output signal processor 475, a speaker can be implemented, that allows matching the dynamic range of the sound input with the output dynamic range desired by the listener, speaker equalization, and easy installation. The smart speaker generates a reference out 4310 signal to allow its use with a noise extractor 465 to facilitate its use in systems performing automatic noise compensation.

Typically the smart speaker will be connected to the other portions of the system via a single cable, easy to install bus suitable for substantial distances. A system bus translator 535 converts the local system bus 400 to signals or packets sent on interfaces such as IEEE 1394, Ethernet, or other means having adequate bandwidth.

Figure 5G:
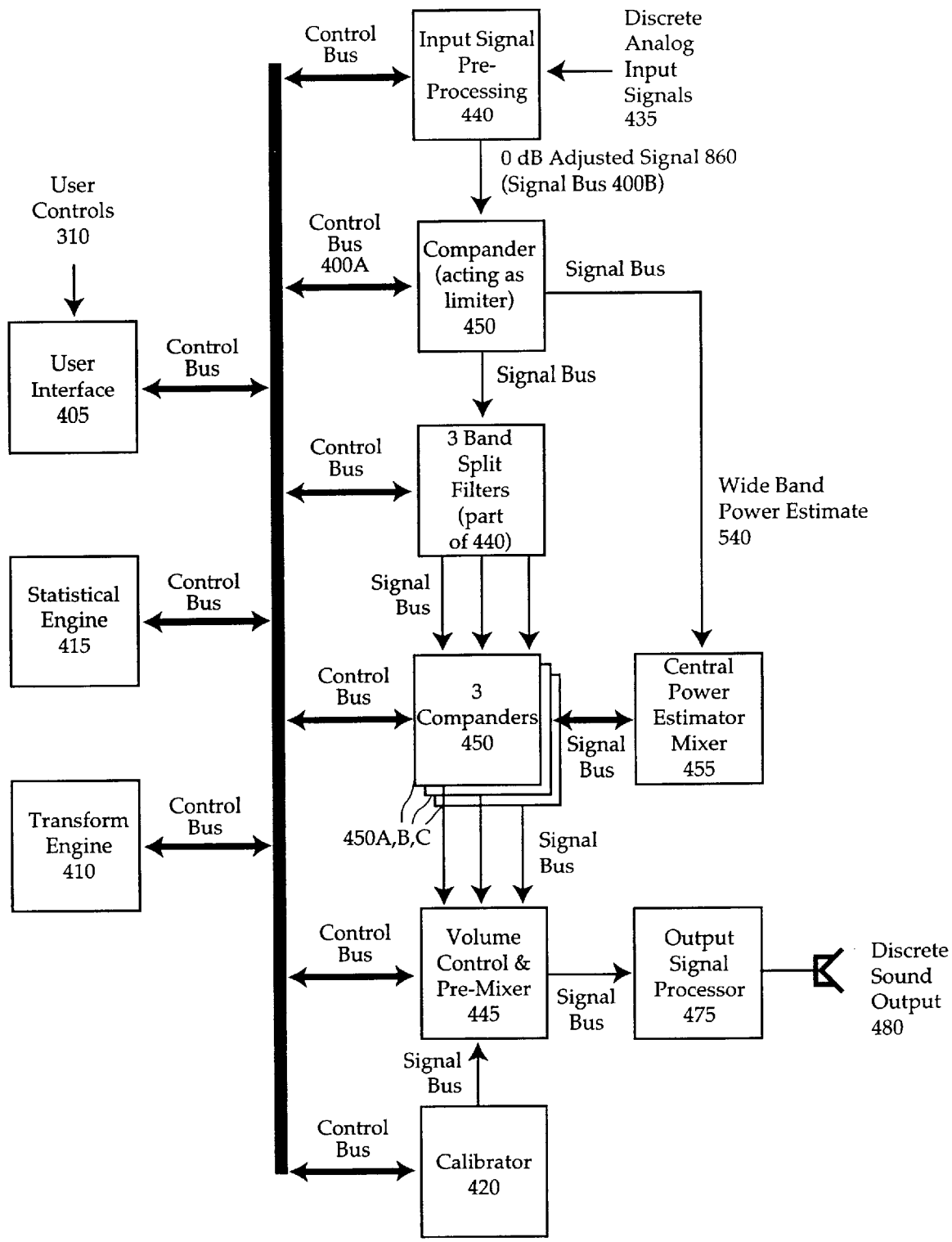
FIG. 5G shows an exemplary implementation of the present invention as a hearing aid.

The partitioned signal processing system can also be used to implement a superior hearing aid as shown in FIG. 5G. This example also shows how multiple levels of companders can be used.

Figure 8A:
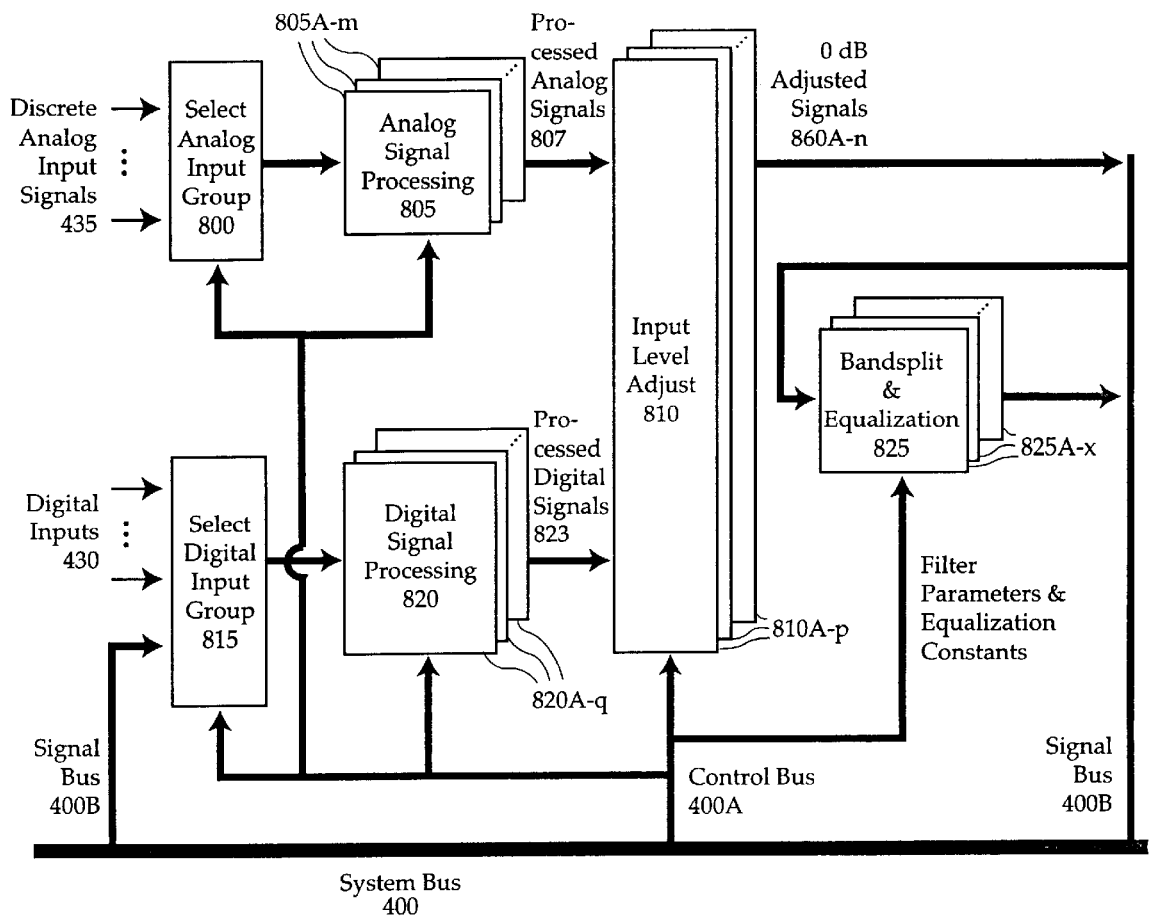
FIG. 8A shows an Input Signal Pre-Processing Block Diagram.

In a hearing aid, a microphone provides a discrete analog input signal 435. This signal is processed by the input signal preprocessing 440 that processes and converts it into a 0-dB adjusted signal 860. This signal is provided to a compander that acts to limit its maximum amplitude without causing signal distortion, and generates a wide band power estimate 540 of the signal. As shown in FIG. 8A, the input signal pre-processor 440 contains a band-split filter that may be used separately. This band-split filter is now used to split the limited signal into three different frequency bands.

One compander 450A,B,C is used for each frequency band, allowing each to be individually compressed or expanded by different amounts. Using the central power estimator mixer 455, the three outputs from the companders are adjusted with relation to each other and the previously calculated wide band power estimate signal. This allows more optimal correction of an individual's hearing loss. The calibrator 420 can be used to determine the optimal signal-processing configuration for a given user's hearing loss.

The outputs of the variable dynamic companders 450 are provided to a volume control & pre-mixer 445 that combines the three bands into a single composite signal. This signal in turn is provided to the output signal processor 475 that generates the signal supplied to the discrete sound output 480, in this case a miniature speaker. User controls 310, such as volume, work with the volume control and mixer 445, transform engine 410, statistical engine 415, and compander 450, to provide optimized signal intelligibility no matter what the volume setting.

In contrast, prior art hearing aids change the overall volume of the signal and interfere with the optimal correction. In addition, the adaptive dynamic compander 450 provides virtually distortion free companding, providing superior sound quality over prior art solutions.

Figure 5H:
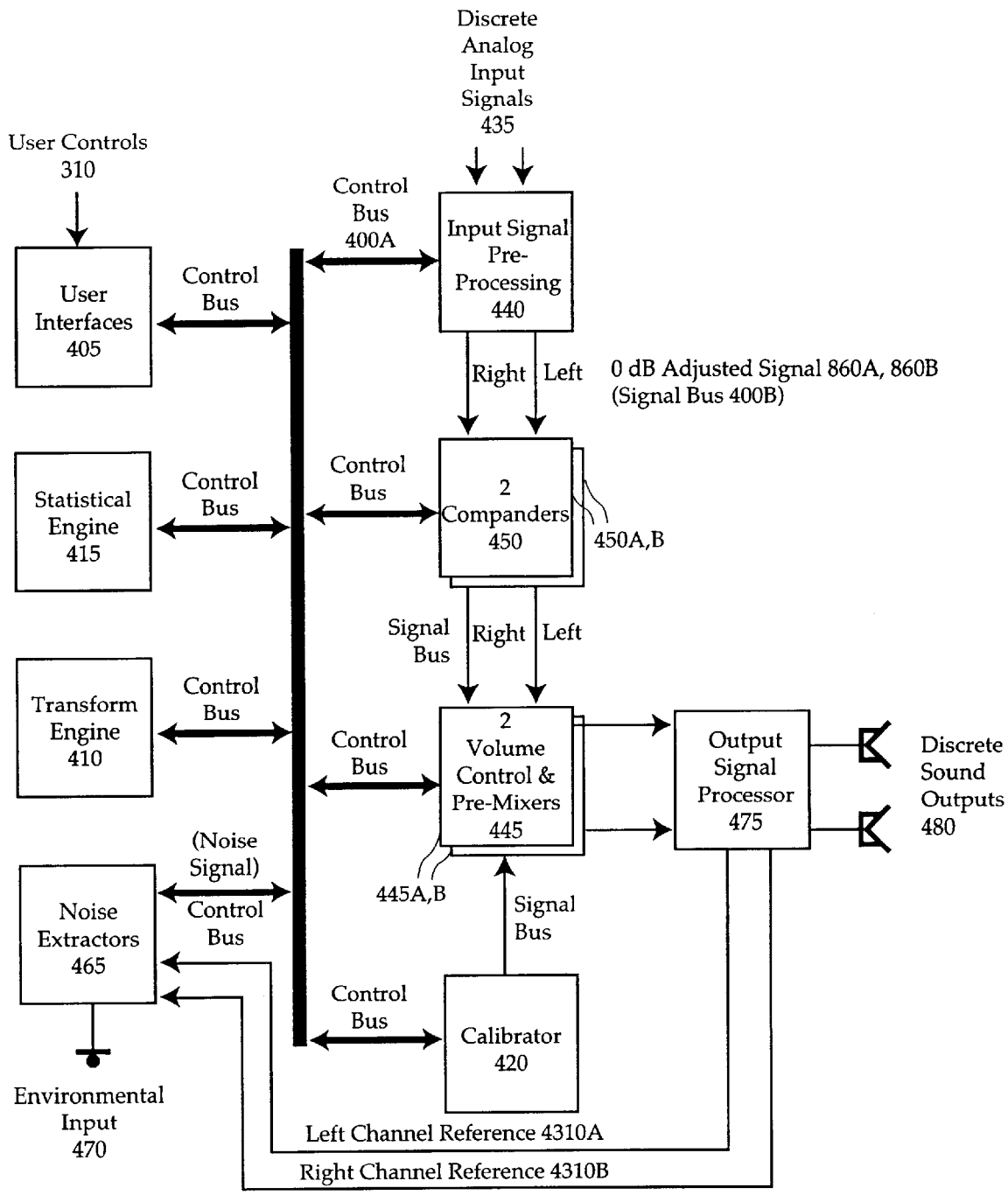
FIG. 5H shows an exemplary stereo system implementation.

FIG. 5H shows a noise compensating, dynamic range mapping stereo implementation of the partitioned signal processing system that could be used in a radio or television. The input signal pre-processing 440 takes the left and right discrete analog input signals 435, and produces two 0-dB adjusted signals. Each signal is provided to a compander 450 that compresses or expands the signal as required. Local power estimator mixing in companders 450A and B provides automatic maintaining of the correct spatial balance between left and right channels.

The left and right signals from the compander are provided to two volume control & pre-mixer 445A and B, where the overall volume level is adjusted. These two signals are sent to the output signal processor 475 that produces the signals necessary for the discrete sound outputs 480, typically speakers, as well as the left and right channel reference signals 4310A,B supplied to the noise extractor 465.

As the total environmental noise component of environmental input 470 changes, the noise extractor generates a noise signal that is used by the transform engine 410, to control the compander 450 and volume control 445 to produce signals with a dynamic range appropriate for the current acoustic environment.

The calibrator 420 is used in a method for calibrating the operation of the system. The statistical engine 415 monitors the overall operation of the system, and is periodically used by the transform engine 410 and/or user interface 405 to adjust parameters of the system. Similarly, the user interface 405 allows the user to adjust and modify operation of the system.

Prior art implementations only allow changing the maximum volume. They are unable to do dynamic range mapping or accommodate environmental noise.

Figure 5I:
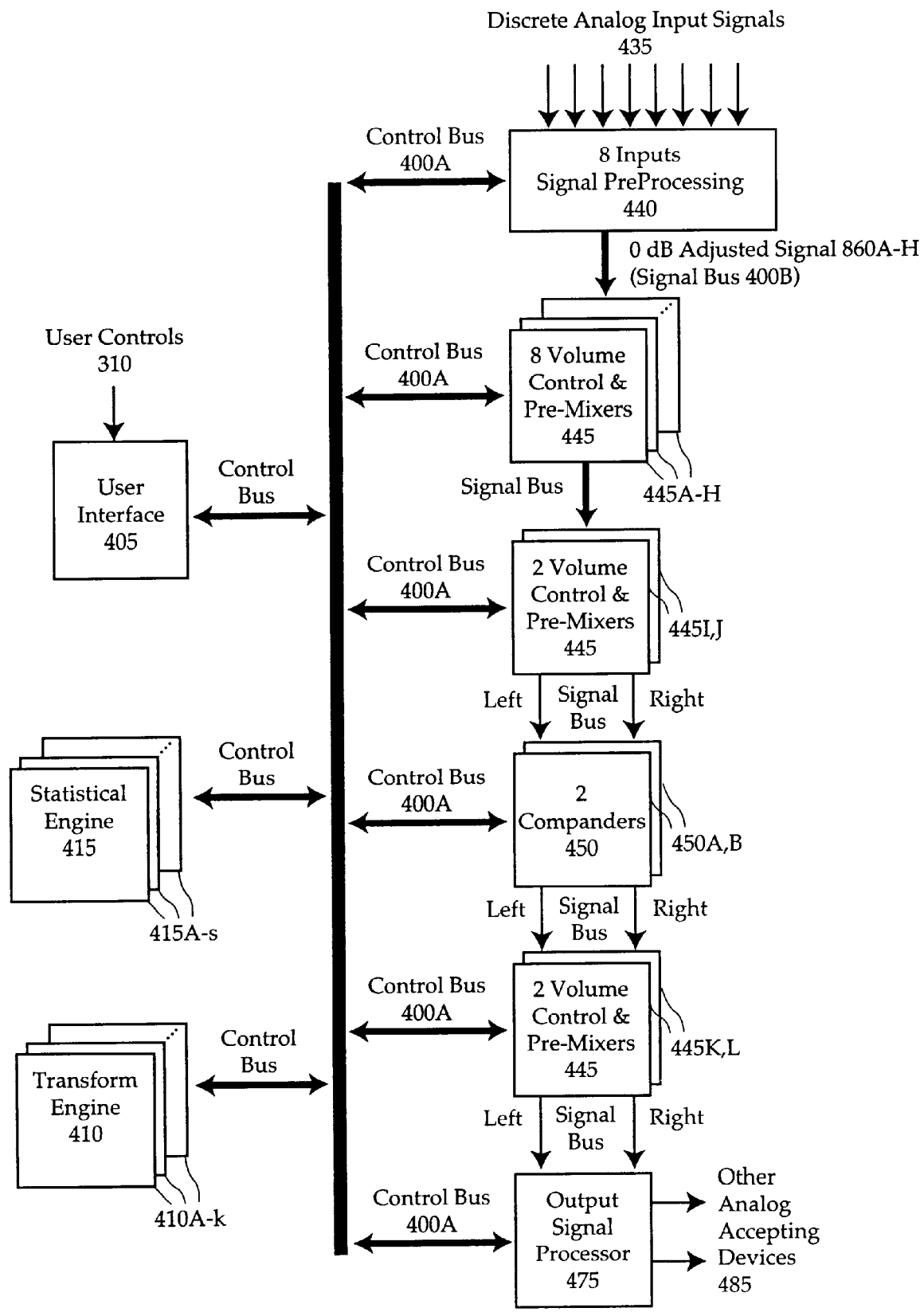
FIG. 5I shows an exemplary eight channel studio mixer in accordance with the present invention.

FIG. 5I shows the use of multiple layers of volume controls and pre-mixers to implement an 8 channel studio mixer. The signal pre-processing 440 enables all of the discrete analog input signals 435 to be adjusted into a consistent 0-dB level. The first two sets of volume controls and pre-mixers 445A–J enables any portion of the eight signals to be combined into a left or right channel.

Two companders 450A and B allow the left and right channels to be compressed or expanded, and use local power estimator mixing to maintain the spatial balance between the two channels. Companding allow adjusting the output dynamic range to that of the recording or transmission media. A third set of two volume controls and pre-mixers 445K,L allow the overall amplitude of the stereo channels to be changed. Last, an output signal processor 475 is used to produce the desired analog outputs 485.

Adjustment of the volume control & pre-mixer 445 levels and compander 450 functions are provided by the transform engine 410A-k. The control of the transform engines is provided by the statistical engine 415A-s and user interface 405.

This example of a mixer provides virtually distortion free companding with superior spatial balancing. The input level adjusting greatly simplifies initialization and setup of the mixer versus prior art implementations.

The individual elements, and the processes associated with them, will now be discussed in turn.

Figure 6A:
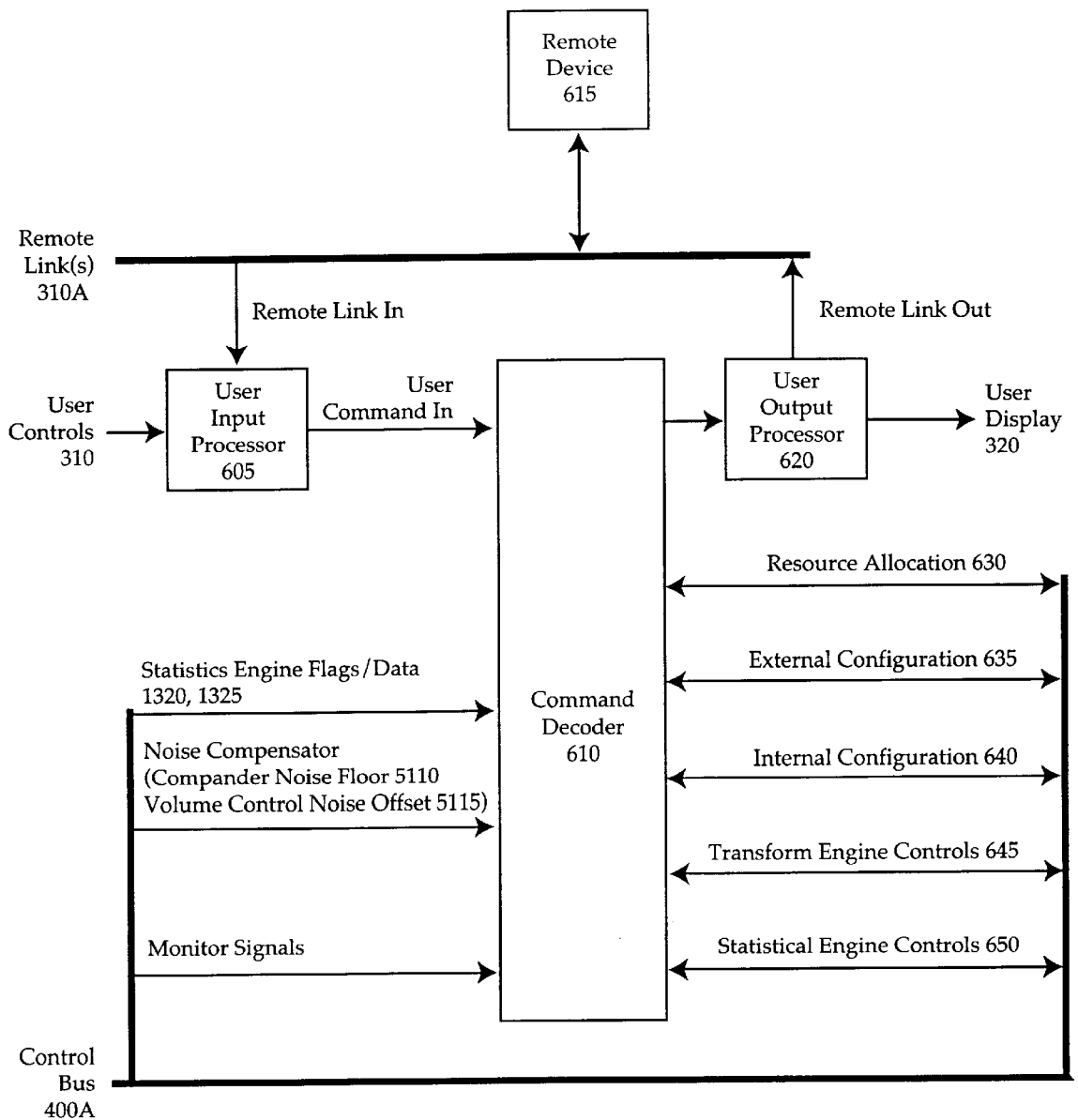
FIG. 6A shows in block diagram form a user interface in accordance with the invention.
Figure 6B:
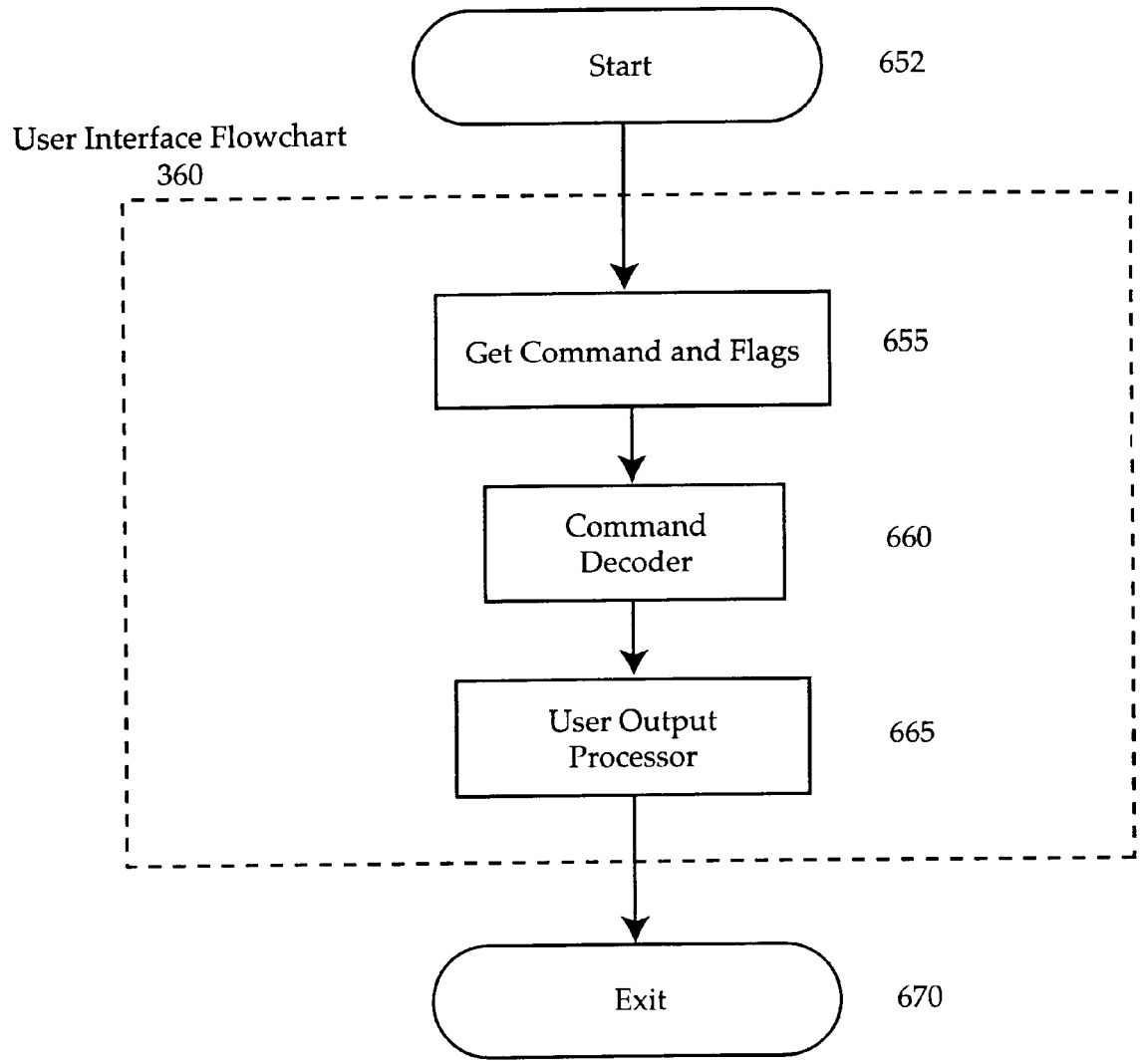
FIG. 6B shows a process flow diagram for a user interface in accordance with the invention.
Figure 6C:
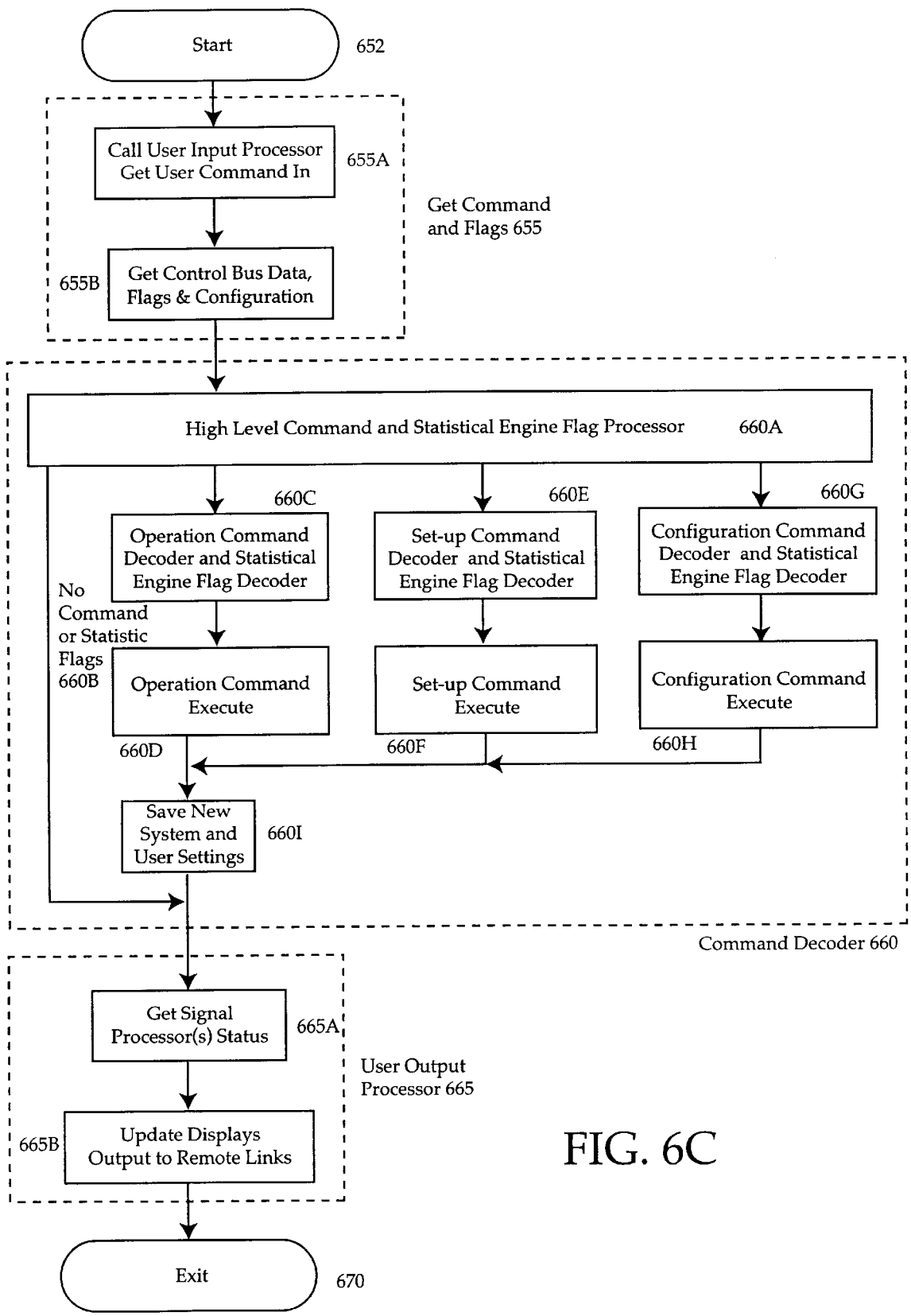
FIG. 6C shows a more detailed process flow diagram for a user interface.

Referring first to FIGS. 6A–6C, the steps implemented in the user interface stage, and the associated logic, may be better understood. In particular, FIG. 6A depicts in functional block form the logic comprising the user interface, while FIG. 6B provides a simplified version of the process implemented by the user interface of FIG. 6A. FIG. 6C provides a more detailed version of the process implemented by the user interface of FIG. 6A. Various user signals 310 are provided to user input processor 605, the output of which is provided to a command decoder 610. A remote device 615, typically another computer or control system, such as an Internet website or customer service computer connected by the use of an analog or digital modem or other serial or parallel interface, may also provide inputs via remote link 310A to the user input processor 605. The command decoder 610 is typically implemented as a function within the microprocessor that operates to provide the user interface stage 405, but could be implemented as an independent microprocessor. The command decoder 610 also receives various signals from the user interface via the system bus 400, especially statistical analysis, noise floor, and monitor portions thereof, which can determine dynamically operating conditions and related operating parameters. The command decoder 610 then provides outputs to drive a user output processor 620 and downstream display devices 320 and remote link 310A, as well as resource allocation signals 630, external configuration information 635, internal configuration information 640, transform engine controls 645, and statistical engine controls 650. Each of these output signals is then provided to the relevant portions via the system bus 400.

The associated operational steps can be appreciated from FIG. 6B, where the process begins with a typical process start at step 652, followed by retrieving the commands and flag data at step 655, which will typically comprise user commands and statistical engine flag data. The command decoder then establishes the responsive operating conditions at step 660, including supplying outputs to the display processor, etc., at step 665. The process then exits at step 670.

The user interface process may be further illustrated with reference to FIG. 6C. The process begins at step 652 as in FIG. 6B, and proceeds to step 655. Step 655 may be seen to include step 655A, where a call is made to the user I/O process to get the User Command, followed by step 655B which calls for getting the statistical engine flags and associated data as well as other relevant data and configuration information from control bus 400A. The process then advances to step 660 from FIG. 6B, but may be seen to comprise several command processing events. First, from a high level command and statistical engine flag processor function 660A of the command decoder 610, a plurality of sequences may be initiated which may be generally characterized as either no command, an operation command, a set-up command, or a configuration command. If no command is detected by the high level command processor 660A, the process advances to step 665 on path 660B.

However, if an operation type command or flag is detected by the processor 660A, it is passed to the operation command decoder 660C, which in turn indicates to operation command execute step 660D which command to execute. At step 660D, that command is then executed. Similarly, if the processor 660A detects a set-up command or flag, it is passed to the set-up command decoder 660E which in turn indicates which set-up type command should be called and executed at step 660F. Likewise, if a configuration type command or flag is detected at step 660A, it is passed to configuration command decoder 660G for execution at configuration command execute step 660H. After execution of these commands, the system advances to step 660I, where the new system and user settings are saved. The process of FIG. 6C then advances to step 665, where the user output processor step can be seen to comprise the sub-steps of getting the signal processors status at step 665A, and updating the user display and sending output to remote link 310A at step 665B. The process then exits at 670 as discussed with regard to FIG. 6B.

Figure 7:
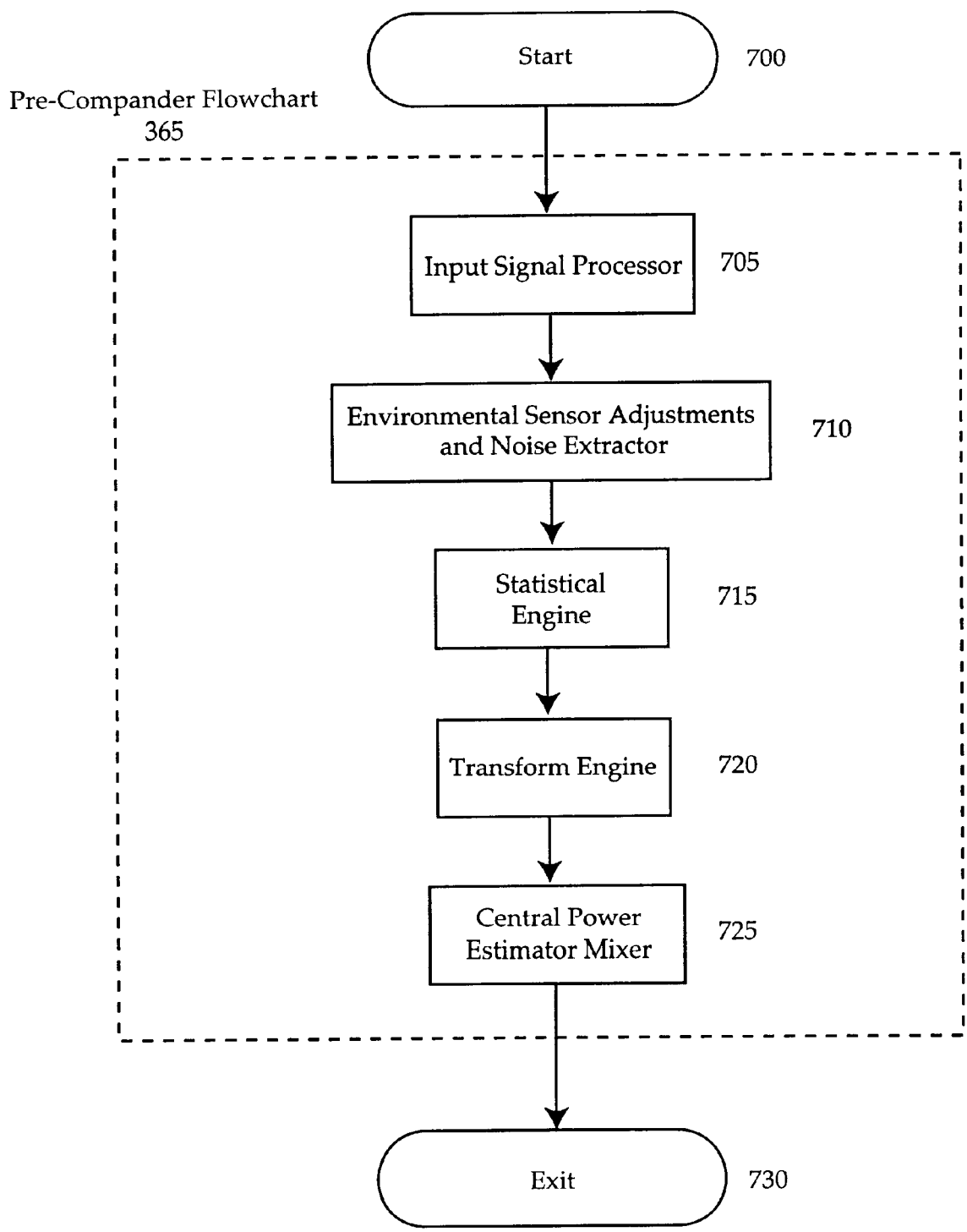
FIG. 7 shows a Pre-Companderflow diagram.

Referring next to FIG. 7, the process by which a variety of the modules shown in FIG. 4 are incorporated into the system of the present invention can be better appreciated. The process of FIG. 7 begins at step 700, and advances to step 705, when an input signal processor function is implemented. The function and its associated logic are described in connection with FIGS. 8A through 10D. The process then advances to the noise extractor step 710, as shown generally at module 465 in FIG. 4. The noise extractor step 710 is more fully described in connection with FIGS. 11,12 and 51–63. The process then advances to the statistical engine function 715, which is more fully discussed in connection with FIGS. 13 and 14. Thereafter, the process advances to the transform engine function 720, more fully described in connection with FIGS. 15–17, after which the overall process advances to the central power estimator mixer function, shown at step 725. The central power estimator mixer function and associated hardware are more fully described in connection with FIGS. 18 and 19. The process shown in FIG. 7 then ends at step 730.

Figure 8B:
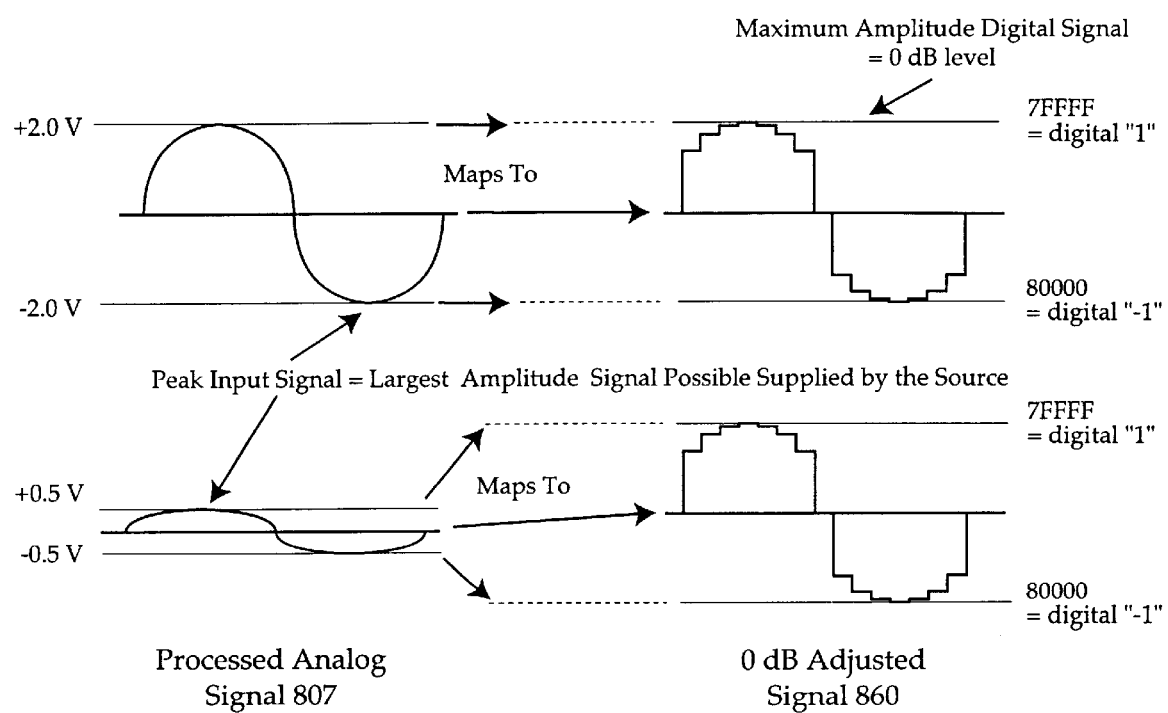
FIG. 8B shows the mapping of an input signal to digital space for use establishing a system signal level, or 0 dB level.
Figure 8C:
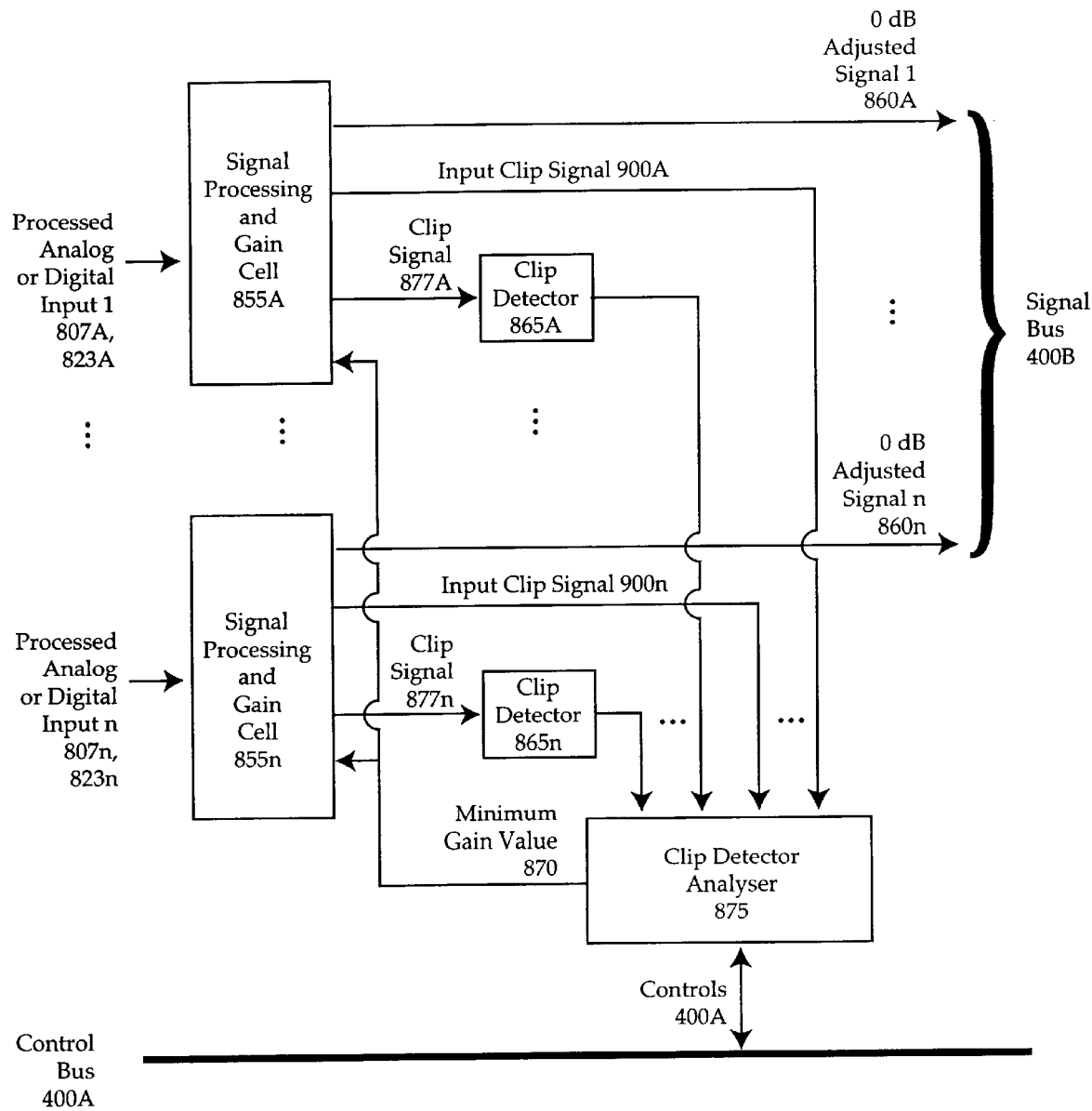
FIG. 8C shows in block diagram form an exemplary form of input level adjust logic.
Figure 8D:
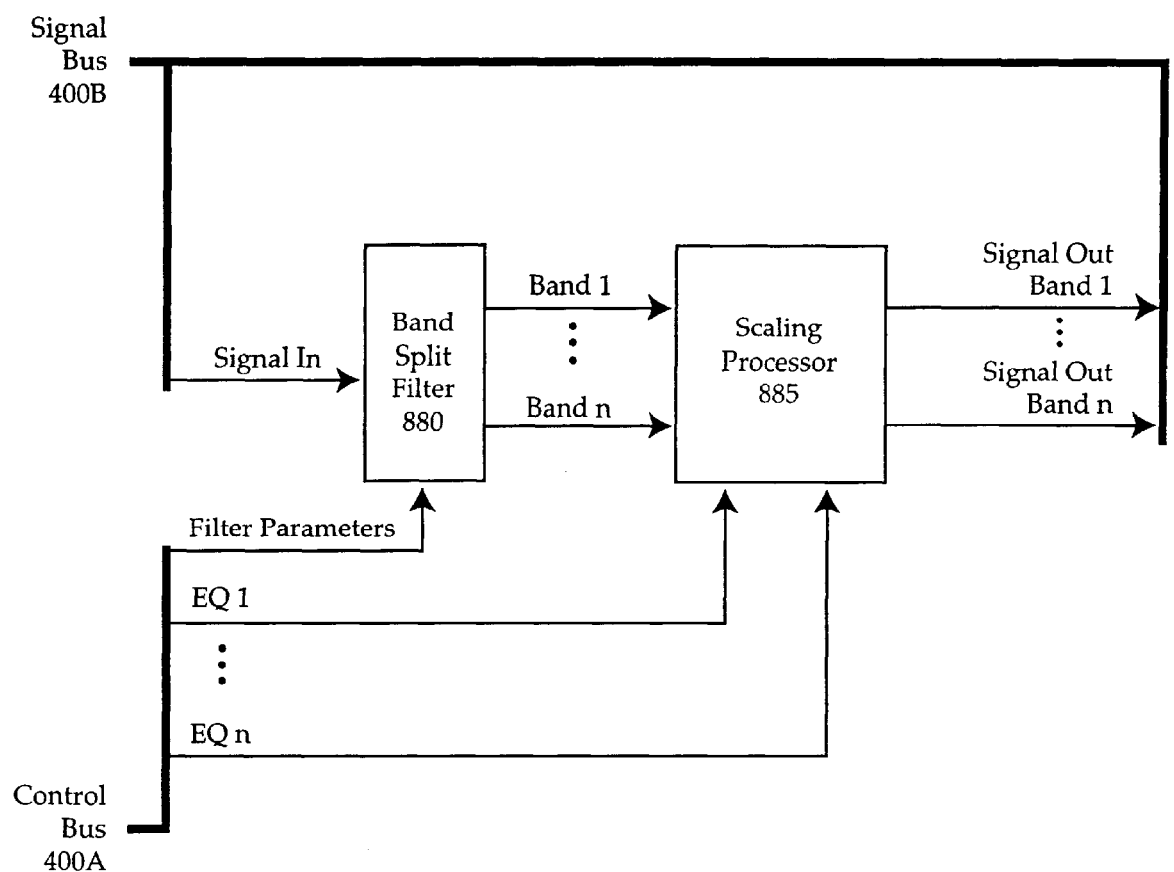
FIG. 8D shows an exemplary bandsplit filters/scaling processor.
Figure 8E:
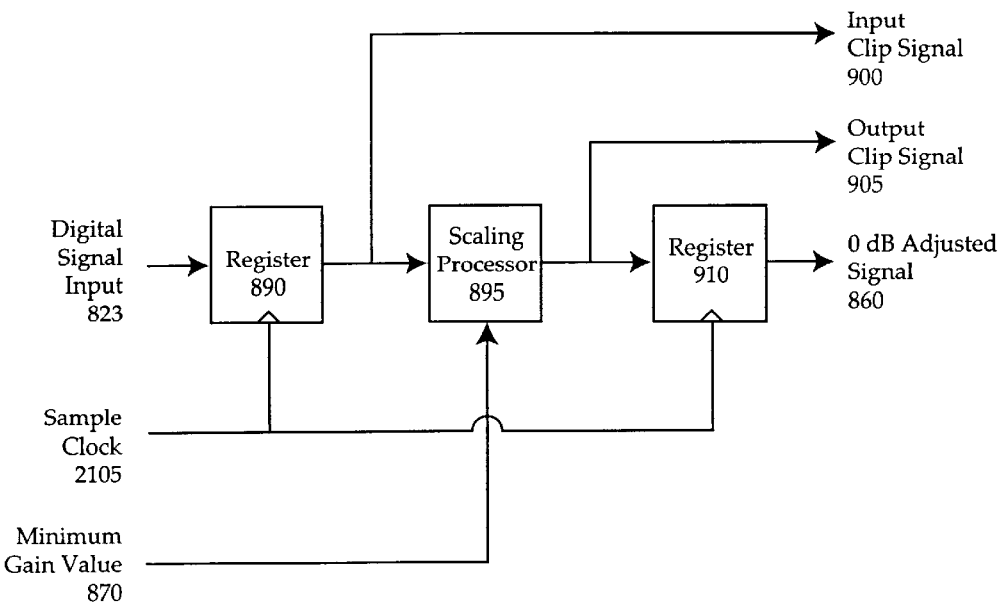
FIG. 8E shows in block diagram form the logic for a digital signal processor and gain cell.
Figure 8F:
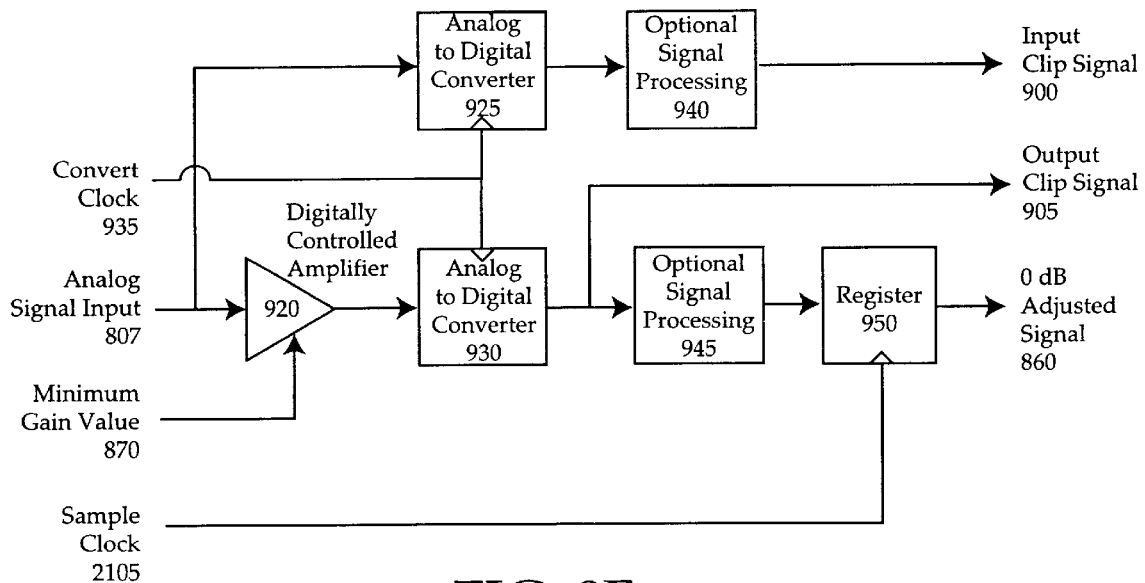
FIG. 8F shows a hybrid signal processor and gain cell block diagram.
Figure 8G:
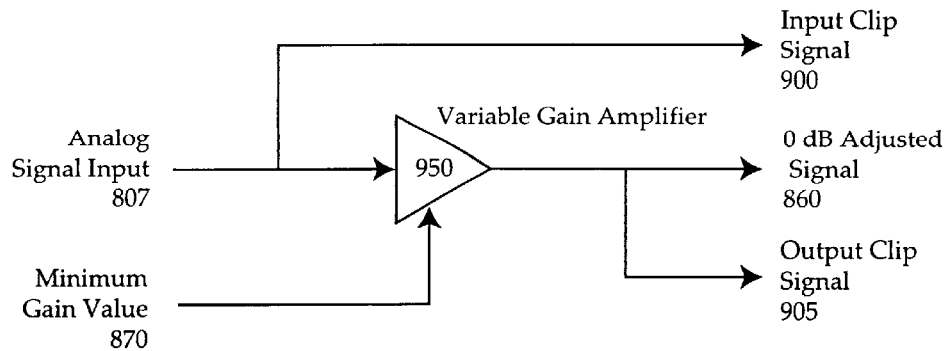
FIG. 8G shows an analog signal processor and gain cell.
Figure 9A:
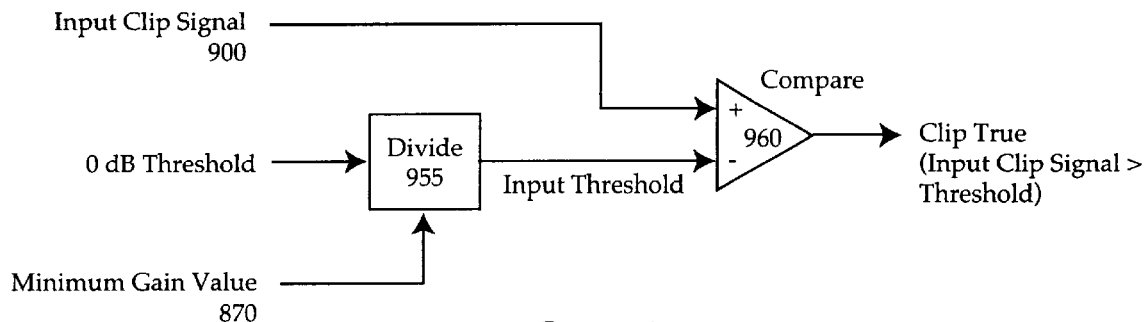
FIG. 9A shows the logic for an input version of a clip detector.
Figure 9B:
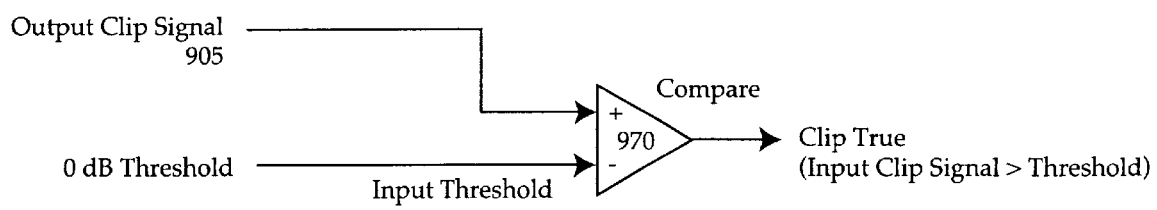
FIG. 9B shows the logic for an output version of a clip detector.
Figure 9C:
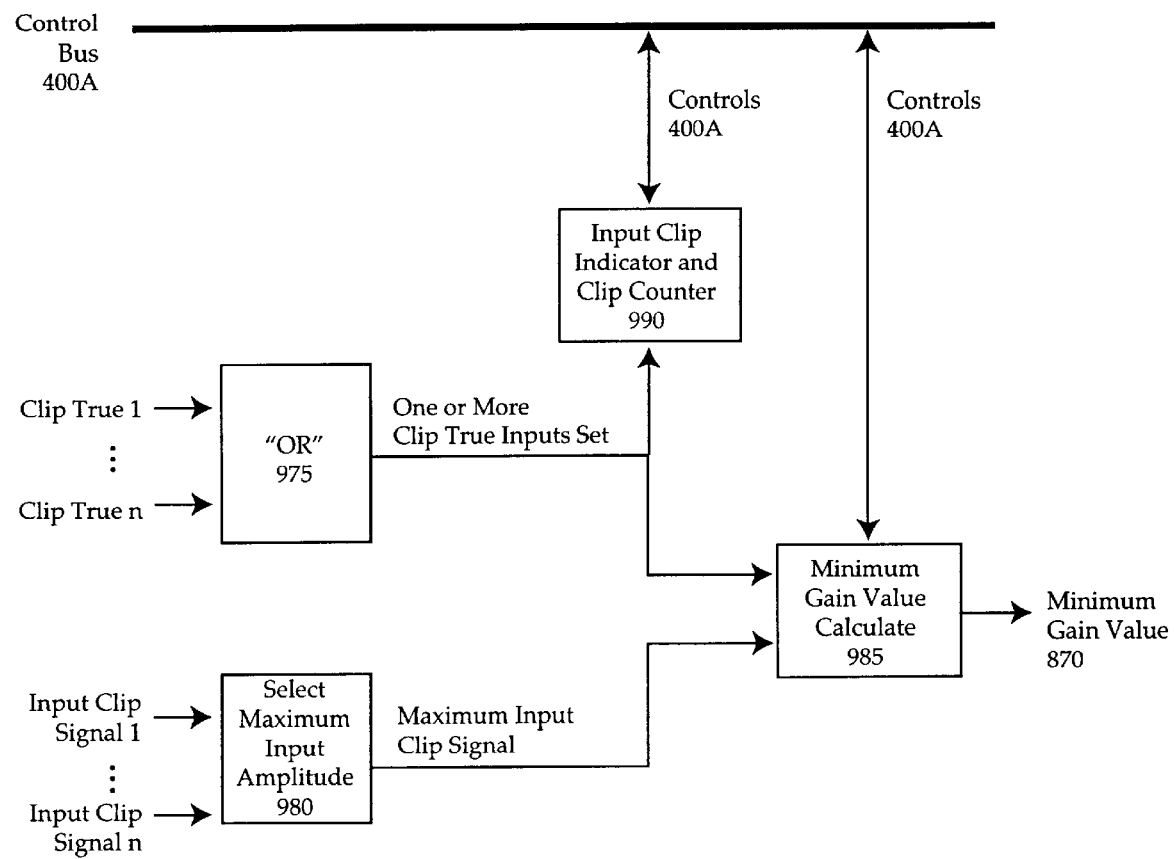
FIG. 9C shows in block diagram form the logic for a clip detector analyzer.
Figure 10A:
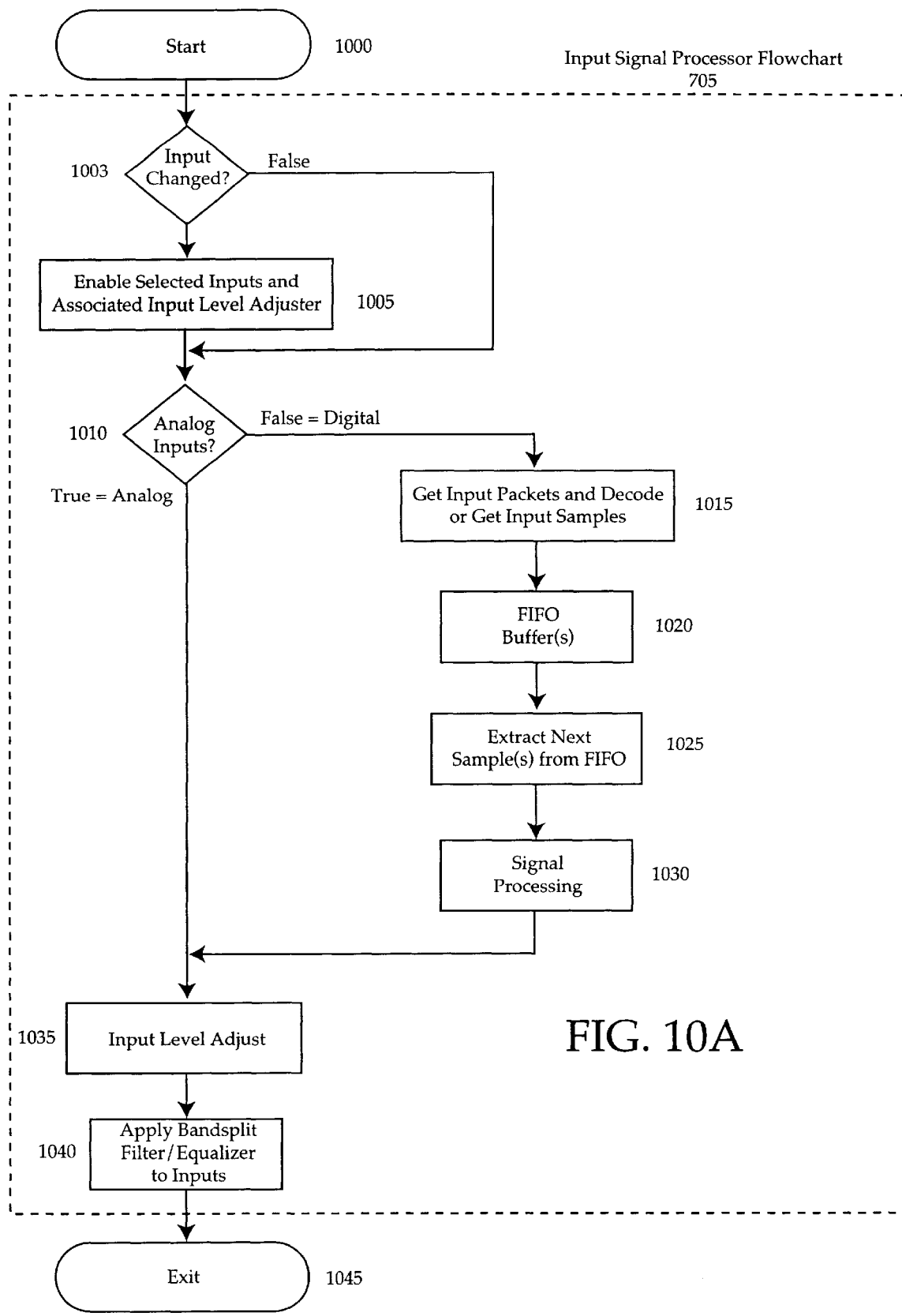
FIG. 10A shows in flow diagram form the operation of an input signal processor.
Figure 10B:
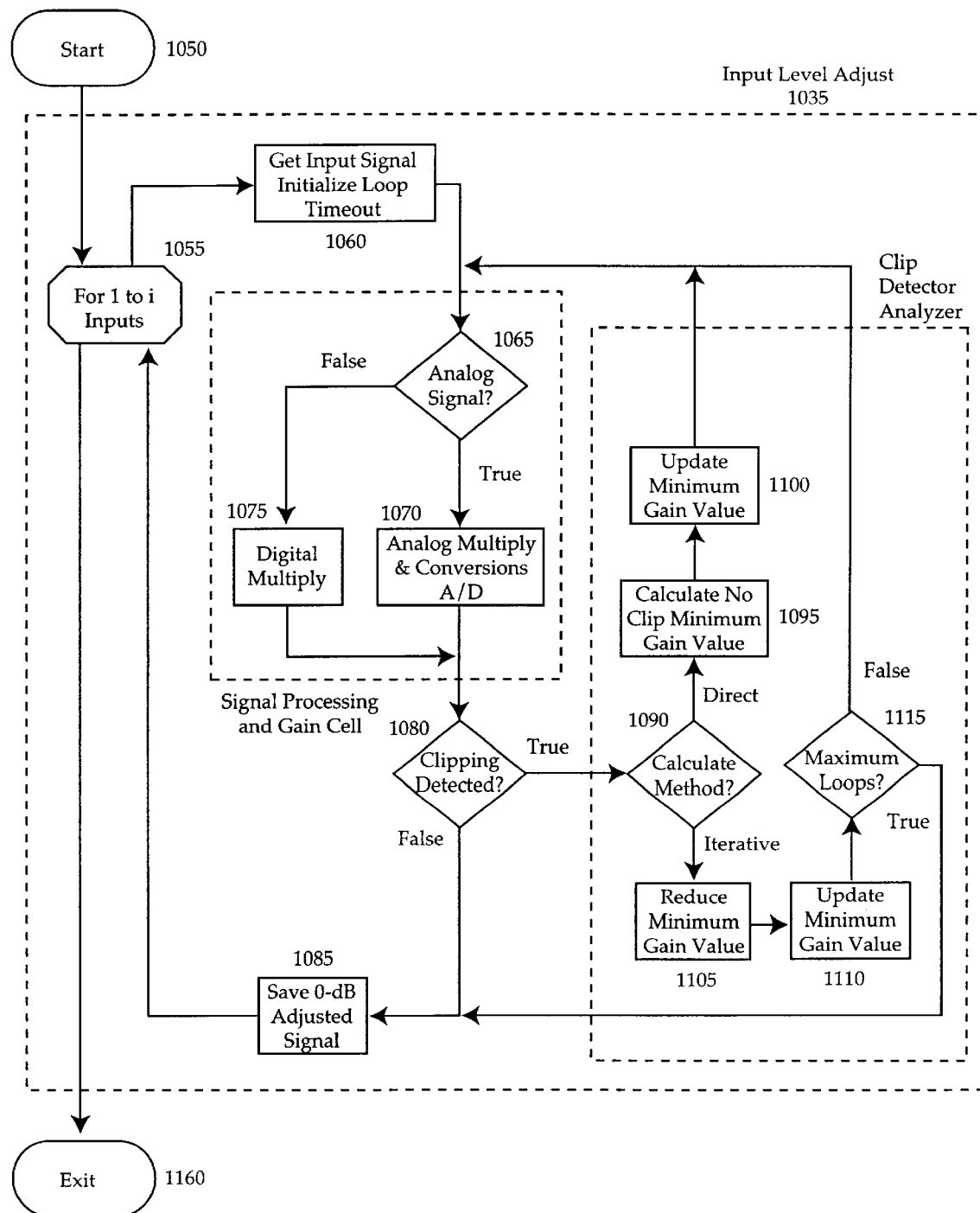
FIG. 10B shows in flow diagram form a single loop input level adjust process.
Figure 10C:
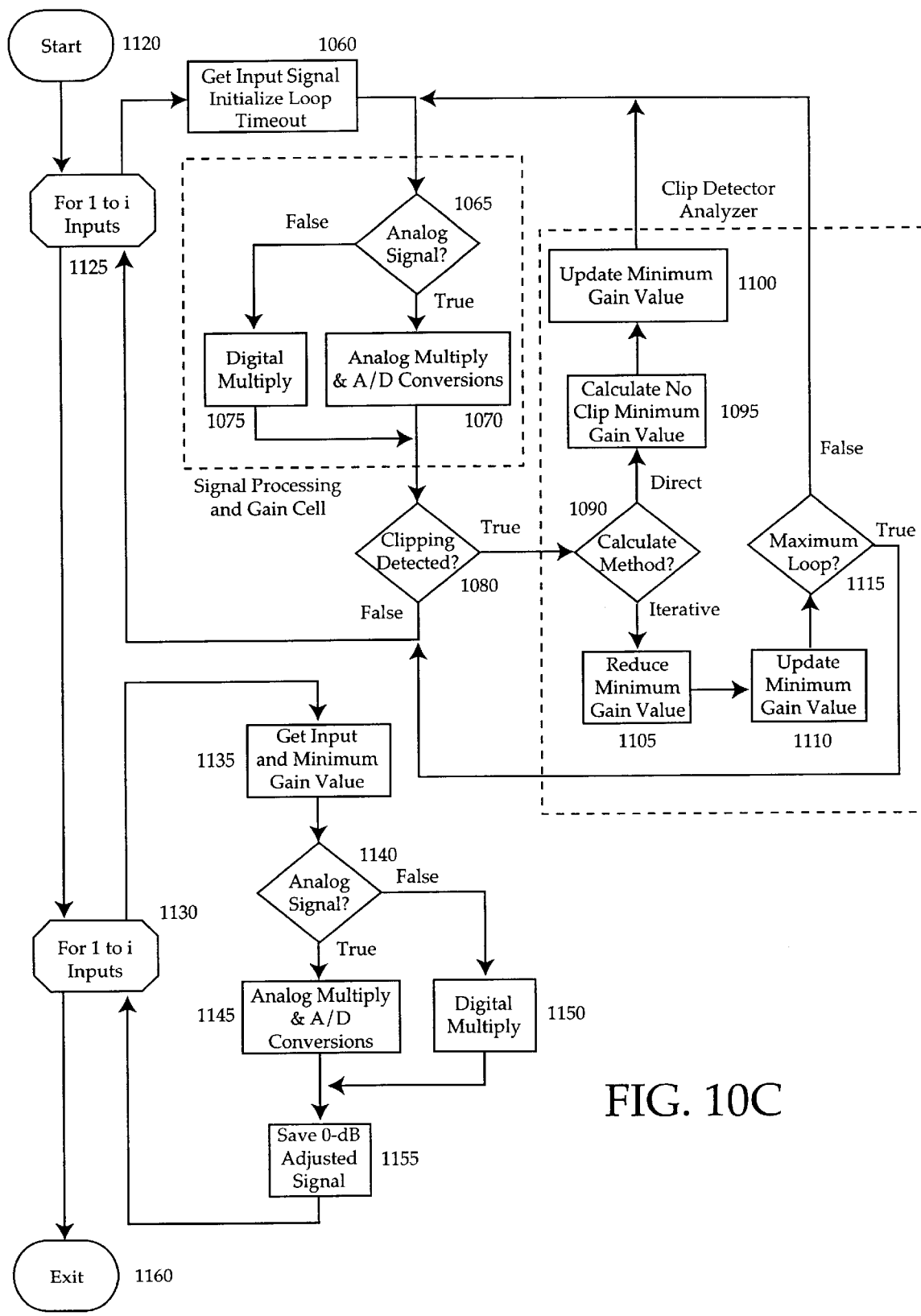
FIG. 10C shows in flow diagram form a two loop input level adjust process.
Figure 10D:
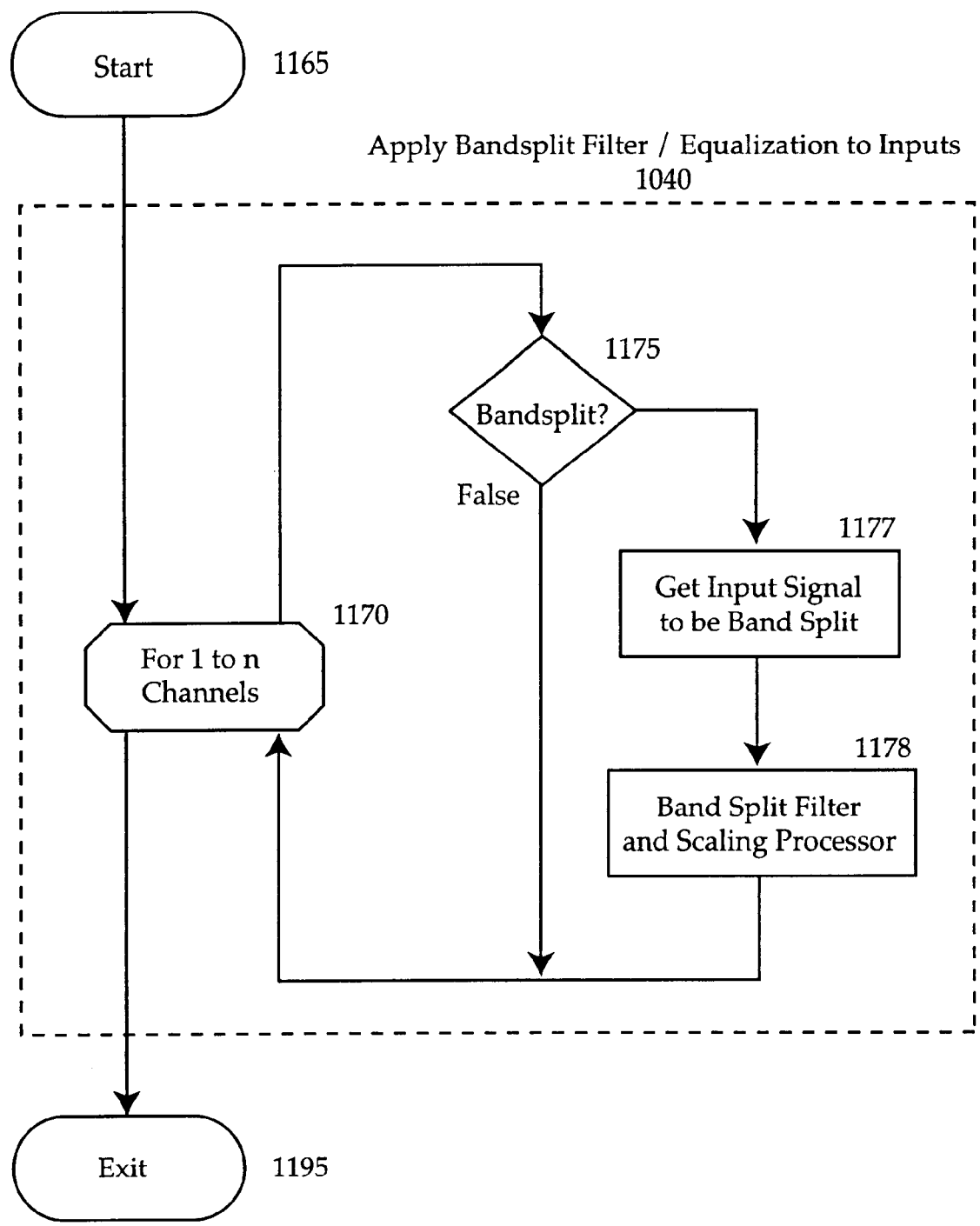
FIG. 10D shows in flow diagram form the Apply Bandsplit Filter/Equalizer process.

Turning next to FIGS. 8A–8G, FIGS. 9A–9C and FIGS. 10A–10D, the input signal pre-processing 440 function and associated logic, which may be broadly thought of as an input level matching system, may be better appreciated. FIG. 8A shows in schematic block diagram form the logic of the input signal pre-processing 440 stage, while FIG. 8B shows graphically the adjusting of various input signals 807 to the 0 dB level. FIG. 8C shows in schematic block diagram form the input level adjust 810 portion of FIG. 8A, which may be broadly thought of as level matching logic. FIG. 8D shows in block diagram form the bandsplit and equalization function 825. FIGS. 8E through 8G show more detail concerning digital, analog and hybrid implementations of the signal processor and gain cell, while FIGS. 9A–9C show alternatives of the clip detector and analyzer logic implemented in the input level adjust stage. FIG. 10A shows the process flow of the input pre-processor stage, while FIGS. 10B–10D show details of the process of FIG. 10A.

Referring first to FIG. 8A, a plurality of analog inputs 435 can be seen to be provided to "select analog input group" logic 800. Typical inputs may be any conventional audio inputs, including CD's, minidisks, TV, camcorders, PCs, radio receivers, and other similar devices, while an input "group" refers to the one or more channels provided by the selected input or inputs. The "select input group" logic 800, which basically performs a multiplexer function, receives a select input signal via the control bus 400A which forms a portion of the system bus 400. The select input signal may be provided by user inputs or other suitable controls. The selected analog signal groups are then provided to analog signal processing logic 805. The analog signal processing logic 805 may comprise a plurality of logic blocks 805A-m, typically configured as one per input channel in more robust embodiments. Processed analog signals, which are typically converted to digital form, are provided from the processing logic 805 to input level adjust logic 810, which may likewise configured as a plurality of logic modules 810A-p.

Similarly, a plurality of digital inputs 430 may be provided to digital form of "select digital input group" logic 815, which is again essentially a mux. The logic 815 also receives a "select input" signal from the control bus 400A, which causes selected inputs to be supplied to digital data processing logic 820 which may comprise a plurality of modules 820A-q. Typical digital inputs may include any form of digital audio input, but particularly include USB and IEEE 1394 devices, including minidisk players, CD and DVD players, PC's, digital VCRs, satellite receivers, HDTV, IR repeaters, printers, and other similar devices. The digital signal processing logic 820 provides data buffering, packet disassembly and signal processing functions, after which the processed signals are provided to the input level adjust logic 810.

One important function of the input level adjust logic 810 is to set the 0 dB level for each of the input signals for the various devices described above, as discussed generally in connection with FIG. 4 but shown graphically in FIG. 8B. As noted previously, 0 dB levels are set to permit optimal compander operation, and in a preferred embodiment are set so that the largest amplitude (or peak) input signal available from a given source maps to the maximum acceptable amplitude digital signal for the system. Thus, a peak analog signal 807 from a first input is shown at the upper left of FIG. 8B. That input signal, which may, for example, be two volts peak-to-peak, maps to the maximum amplitude digital signal 860 permissible by the system, or what may be thought of as the "compute space." That maximum amplitude digital signal 860 is defined, for the exemplary embodiment described herein, as the "0 dB level." In a feature of the present invention, a peak input signal from a second input 807 is shown at the lower left of FIG. 8B, and may be only 0.5 volts peak-to-peak but still maps to the maximum amplitude digital signal as shown at 860. Thus, the amplitude of signals from varying input sources will all map to the same digital amplitude for further system processing. It is to be understood that the 0 dB level is in some respects arbitrary, and may be set, for example, to the maximum amplitude digital signal the system can generate without distortion as happens with low cost delta-sigma analog to digital converter; or may be set to a lower level which allows a certain amount of headroom beyond the 0 dB level such as might be desirable for managing signals which might otherwise clip. This situation might occur when the input level adjuster reaches it's minimum gain limit.

As noted above, the input level adjust logic is described in greater detail below in connection with FIG. 8C; it also receives control signals from the control bus 400A. As with logic 805, the logic 820 may comprise multiple processors, for example one per input channel. Likewise, the input level adjust logic may also be configured as multiple units, typically one per group of inputs or shared among groups. The output of the input level adjust logic 810, which typically comprises a group of 0 dB adjusted signals, is provided either directly to the signal bus portion 400B of the system bus 400, or is provided to bandsplit and equalization logic 825A-x. The bandsplit/equalization logic is described in greater detail in connection with FIG. 8D, below.

Referring next to FIG. 8C, the input level adjust logic 810 can be appreciated in greater detail. A plurality of processed analog or digital signal inputs 1 to n, shown as 807A-n or 823A-n, which comprise what has been referred to previously as an input group, are provided to corresponding signal processing and gain cells 855A-n, typically either shared or arranged one gain cell 855 per group of inputs as discussed above. The gain cells each provide an output signal 860A-n, typically a 0 dB adjusted signal as previously discussed, an input clip signal 900A-n output to clip detector analyzer 875 and also provide a clip signal 877A-n, which is either input clip signal 900 or output clip signal 905, to clip detector logic 865A-n, arranged one clip detector per gain cell in a typical embodiment. As will be discussed hereinafter, input clip signals 900A-n are only required for direct input gain calculations by clip detector analyzer 875. The outputs of all of the clip detectors 865A-n are typically provided to clip detector analyzer logic 875, which receives a control signal to either reset or to load in a minimum gain value 870 for the selected input group (again, in a preferred embodiment, either the maximum or the last prior setting for that input group) from the control bus 400A. The control bus 400A also provides a path for storage of the latest minimum gain value 870 for the selected input group which can be stored locally or in some common system memory. Clip detector analyzer 875 may also provide to control bus 400A an input clip indicator signal typically for use by statistical engines and user interfaces and may also contain a clip counter to provide a clip count value. The clip counter may be reset via control bus 400A. The clip detector analyzer logic 875 in turn provide a minimum gain value signal 870 to each associated signal processing and gain cell. In an exemplary embodiment, the same minimum gain value signal 870 is supplied to each of the gain cells 855A-n to ensure equal gain settings across all channels in the input group. The signal processing and gain cells 855, the clip detectors 865 and the clip detector analyzer 875 will all be discussed in greater detail in connection with FIGS. 8E–8G, 9A–9B, and 9C.

Referring next to FIG. 8D, the bandsplit and equalization stage 825 of FIG. 8A can be better understood. In particular, the bandsplit and equalization stage 825 can be seen from FIG. 8D to comprise a bandsplit filter 880, which receives the input signal from the signal bus 400B. The bandsplit filter divides the incoming signal into as many frequency or other bands as desired for the particular embodiment, resulting in n Band output signals from the filter 880, where n can vary from one to any higher integer. The n Band signals are provided to a scaling processor 885, which receives a equivalent number, from one to n, equalization signals from the control bus 400A. The scaling processor 885, typically a plurality of multipliers, provides n Signal Out Band output signals of equal or varying maximum amplitudes, which are provided to the next stage via the signal bus 400B. Referring back to FIG. 8A momentarily, it will be appreciated that each of the elements described in FIG. 8A have now been described.

However, some additional details of FIGS. 8C remain to be further described. Referring now to FIGS. 8E, 8F and 8G, digital, hybrid and analog signal processor and gain cells (855 in FIG. 8C) can be better appreciated. FIG. 8E shows an exemplary digital cell, in which the signal input 823 is supplied to a register 890, which also receives a sampling clock 2105. The output of the register 890 is provided to a scaling processor 895 and provides an input clip signal 900. The scaling processor 895 also receives as an input a minimum gain value signal 870, and provides as its output an output clip signal 905, which also serves as an input to a register 910. The register 910 receives via bus 400A the same sampling clock signal as the register 890. The gain cell of FIG. 8E thus receives a digital input signal which is sampled by the register 890, scaled by processor 895 in accordance with the signal 870, and then placed in register 910. The output of the register 910 serves as an output signal, typically a 0 dB adjusted signal 860.

FIG. 8F illustrates an exemplary form of hybrid signal processor and gain cell 855. The hybrid cell basically provides A/D conversion, followed by any desired signal processing, to yield the same outputs as the cell shown in FIG. 8E. More specifically, the analog input 807 signal is supplied to a digitally controlled amplifier (DCA) 920 and an A/D converter 925. The DCA 920 also receives the minimum gain signal 870 as an input. The output of the DCA 920 is provided to a second AND converter 930, which along with the A/D converter 925 receives a convert clock signal 935. The convert clock can operate at the same rate as the sample clock 2105 on the bus 400A, but may also be configured to operate at a much higher rate, to permit multiple iterations before a 0 dB adjusted signal is supplied by register 950 for subsequent processing. This permits improvement in the accuracy of the register sample. The output of the A/D converter 925 is provided to optional signal processing logic 940, which in turn provides as its output an input clip signal 900. The output of the A/D converter 930 is provided as output clip signal 905, which also provides an input to an optional signal processing stage 945. The output of the signal processing stage 945 provides an input to a register 950, which also receives an input from the sample clock 2105 signal on bus 400A. The register 950 typically provides as its output the 0 dB adjusted signal 860.

In FIG. 8G, an exemplary analog version of the signal processor and gain cell 855 can be better appreciated. An analog signal 807 input is provided via signal bus 400B, but also is provided as the input clip signal 900. The analog signal input is provided to a variable gain amplifier (VGA) 950. The VGA 950 also receives the minimum gain signal 870 as a control input, and provides as its output both the 0 dB adjusted signal 860 and the output clip signal 905.

Referring next to FIGS. 9A–9B, the clip detector 865 of FIG. 8C can be better appreciated. The clip detector 865 can be implemented as either an input clip detector or an output clip detector. Referring first to FIG. 9A, in which an exemplary version of an input clip circuit is depicted, a 0 dB threshold signal is provided as an input to a divider circuit 955, which generates a input threshold signal as its output. The minimum gain value 870 is provided as a divisor input to the divider 955. The threshold signal provides a negative input to a comparator 960, which receives its positive input from the input clip signal 900. The comparator 960 generates a clipping signal indicative, in this exemplary embodiment, of whether the input clip signal is greater than the threshold signal. Similarly, and referring to FIG. 9B, an exemplary version of the output clip circuit can be better understood. The output clip signal 905 is provided as the positive input to a comparator 970, with the 0 dB threshold signal providing the negative input. The output of the comparator 970 serves as a "clip true" output signal, indicating whether the input clip signal has greater magnitude than the threshold signal. It will be appreciated that the output clip detector shown in FIG. 9B does not require the divide logic used in the input clip detector of FIG. 9A, and for that the output clip detector implementation offers some advantage over the input clip detector implementation.

Referring next to FIG. 9C, the clip detector analyzer logic 875 of FIG. 8C may be better appreciated. The basic function of the clip detector analyzer logic is to determine whether gain should be reduced to avoid clipping and if true, to calculate a new minimum gain value. The "clip true" signals from each of the clip circuits 865 serve as inputs to an OR gate 975, which provides an output indicating whether any of the "clip true" inputs was set. The input clip signals 1-n are provided as inputs to "select maximum input amplitude" logic 980. The output of the selection circuit 980 indicates the amplitude of the maximum input clip signal, which is provided as one input to a minimum gain value calculate block 985. The output of the "clip true" OR gate 975 provides another input to the gain value calculate circuit 985 and, more specifically, signals the minimum gain value calculate logic 985 that the minimum gain value 870 must be reduced, as well as enabling a new gain value calculation. The "clip true" OR gate 975 output is also provided to input clip indicator and clip counter 990 to provide to control bus 400A an input clip indicator signal and a clip count value. The clip counter may be reset via control bus 400A. The minimum gain value calculate logic 985 uses the maximum input clip signal from the logic 980 to establish the new gain value by direct calculation, typically the result of dividing the 0 dB maximum amplitude value by the maximum input clip signal value. The logic 980 and the associated input to the block 985 can be eliminated in at least some embodiments by setting the gain reduction at some specified amount, for example a fraction of the prior gain. This fractional reduction process is easier to implement (e.g., no A/D converter 925, FIG. 8F) and particularly well suited to iterative adjustment of the gain value 870, but offers less immediate precision than an implementation using the select maximum input amplitude logic 980.

The control bus 400A also provides a communications path for the minimum gain value calculate logic 985, including a reset signal, setting a minimum gain value, and providing a new minimum gain value to be shared with the remaining stages. As before, the new minimum gain value may be stored in memory local to the stage, or may be provided to a common shared memory accessible to each stage that requires the data. The output of the calculate circuit 985 is the minimum gain value signal 870.

With the foregoing logic of FIGS. 8A–9C in mind, the input signal processing implemented by that logic can be better appreciated from FIG. 10A. As will be appreciated by those skilled in the art, relevant steps of the process shown in FIG. 10A are performed for each sample. The process starts at step 1000, and advances to step 1003 at which a check is performed to determine whether a change in inputs has occurred. If a change has occurred, such as the user ceasing use of a radio input and instead selecting a DVD input, the process advances to step 1005. At step 1005, the selected inputs and the associated input level adjusters are enabled; the last minimum gain value associated with the prior-selected input device is stored in memory, and the appropriate gain value for the newly selected device is loaded. As noted previously, in a presently preferred embodiment, the gain value is set either at maximum or at the last valid value as stored in memory. As long as the input device attached to the selected port has not been changed by the user, the last valid value continues to represent the maximum amplitude signal available from that input device.

If a change in inputs has not occurred, or after step 1005 has executed, a check is then made at step 1010 to determine whether the inputs enabled in step 1005 are analog. If the check at step 1010 shows the signals to be digital, the process branches to step 1015 where input packets are received and decoded, or input samples are taken. The process then advances to step 1020 where the samples or packets are supplied, in an exemplary embodiment, to FIFO buffers which permit asynchronous inputs to be transformed into a continuous rate output. At step 1025, the next samples are extracted from the FIFO buffers, after which signal processing is performed at step 1030. Typical signal processing includes expansion and scaling of the signal represented by the data packets. The branch then concludes and rejoins the sequence from the step 1010.

If the check at step 1010 showed that the inputs are analog, or following completion of the signal processing at step 1030, the process advances to step 1035 where input level adjusting is done, as further described hereinafter in connection with FIGS. 10B and 10C. The process then advances to step 1040, where the input signals are bandsplit and equalized, if desired for the particular implementation, and as further described in connection with FIGS. 10D and 10E. The process then exits at step 1045.

Referring next to FIGS. 10B and 10C, the input level adjust step 1035 can be appreciated in greater detail. For clarity, two different exemplary processes are discussed for implementing the input level adjust process: a single loop process, shown in FIG. 10B, and a two loop process, shown in FIG. 10C.

The single loop input level adjust process of FIG. 10B begins at step 1050, after which the process advances to step 1055 where a loop is begun with the iteration of the loop being defined by how many inputs are processed. The number of inputs can vary over a wide range, and is identified here as simply 1 to i. When the process loop begins, the input signals are obtained and a loop timeout is initialized at step 1060. The loop then advances to step 1065 to check whether the input signals are analog or digital. If the inputs are analog signals, the process advances to provide analog multiply and A/D conversion at step 1070. If the check at step 1065 showed the signals were digital, a digital multiply is performed at step 1075. Whether the signals are analog or digital, the process advances after either step 1070 or step 1075 to step 1080, where a check for clipping is made. If no clipping is found, the process advances to step 1085 to save the resulting 0 dB adjusted signal, after which the process loops back to step 1055.

If, however, clipping is detected at step 1080—which indicates that the signal has exceeded the 0 dB threshold and is not 0 dB adjusted, the process branches to step 1090, where a check is made to determine whether a direct or an iterative calculate method is to be used to calculate gain. If the direct calculate method is to be used, the process advances to step 1095, where the minimum gain value is calculated to avoid clipping. The gain can generally be represented as the 0 dB signal amplitude divided by the input signal amplitude. After the minimum gain is calculated, the process advances to step 1100 where the minimum gain value is updated. The process then returns to step 1065 to reprocess the input sample with the updated minimum gain value 870.

If the check at step 1090 showed the minimum gain value was to be reduced by an iterative method, the process advances to step 1105, where the default minimum gain value is reduced by a predetermined fraction, where the fraction is between 0 and 1. The reduced gain value is then stored as the new minimum gain value at step 1110. The process then advances to a "maximum loops" check at step 1115. The "maximum loops" check, which may not be required in all embodiments, establishes a maximum number of iterations which is permitted for a single sample. By establishing such a maximum the delay before accepting a new minimum gain value is potentially reduced; any further reduction may be performed when the next sample is processed. If the loop timeout has occurred, the process advances to step 1085 and the 0 dB adjusted signal is saved. However, if the loop timeout has not yet occurred, the process loops back from step 1115 to step 1065, where another loop begins and a further test for clipping is made, after which a further reduction may be performed as necessary. It will be appreciated that the iterative loop value takes longer, while the direct gain calculate method requires greater processing power. Regardless which method is used, once the new minimum gain value is calculated, the process ultimately saves the 0 dB adjusted signal (or its approximation, if the iterative process has reached maximum loops without iterating sufficiently to achieve an accurate 0 dB level during this sample) at step 1085 and returns to step 1055 to process the next input. Once the appropriate number of loops has been performed, the process exits at step 1160.

Although FIG. 10B shows a check being performed at step 1090, to determine whether an iterative approach is used or whether a direct calculate method has been implemented, in most instances only one approach or the other will actually be implemented. In this instance, no check step 1090 is required. It has been shown here largely for ease of exposition.

Referring next to FIG. 10C, the alternative of the two loop input level adjust process can be better appreciated. A two loop process ensures that all gain values applied to all inputs will be the same. With a single loop process, the minimum gain value changes when an input clips, such that not all inputs will have the same gain value. By using two loops, a minimum gain value which can be applied to all inputs is established by the first loop, after which that single minimum gain value can be applied to all inputs by means of the second loop. The two loop approach thus offers slightly increased accuracy, although in most instances, the difference in output signal is difficult, if not impossible, to detect. If the two loop process is selected, it starts at step 1120, and advances to step 1125 where the first loop begins for 1 to i inputs. Because the first loop is very similar to that shown in FIG. 10B, identical reference numerals will be used for identical steps, and will not be further described. The first loop of FIG. 10C differs from the loop of FIG. 10B in that the 0 dB adjusted signal is not stored yet, as shown at step 1085 in FIG. 10B. Instead, the process simply returns to the loop step 1125. Once the appropriate number of loops have been completed at step 1125, the process advances to the second loop at step 1130. The loop advances to step 1135, to get the input and the associated minimum gain value determined in the first loop. The process then advances to step 1140, another check to determine if the input is analog or digital. If the input is analog, an analog multiply and A/D conversion is performed at step 1145, while if the input is digital a digital multiply is performed at step 1150. In either event, the process then advances to step 1155 where the 0 dB signal for that input is saved. The loop then returns to step 1130 and, once the appropriate number of loops has been performed, the process exits at step 1160.

Referring next to FIG. 10D, the bandsplit and equalization step 1040 from FIGS. 8C and 10A can be better appreciated. The process starts at step 1165, after which a loop begins at step 1170, with the number of loops determined by the number of inputs. The loop advances to step 1175, where a check is made whether a bandsplit is to be done for that input. If not, the process returns to step 1170 for processing of the next channel. But if the channel being processed is to be bandsplit, the process advances from step 1175 to step 1177, which obtains the appropriate input signal to be bandsplit and provides it to step 1178, where the actual bandsplitting and scaling occurs. The process then returns to step 1170 for processing of the next channel. When all channels have been processed, the process exits at step 1195.

Figure 10E:
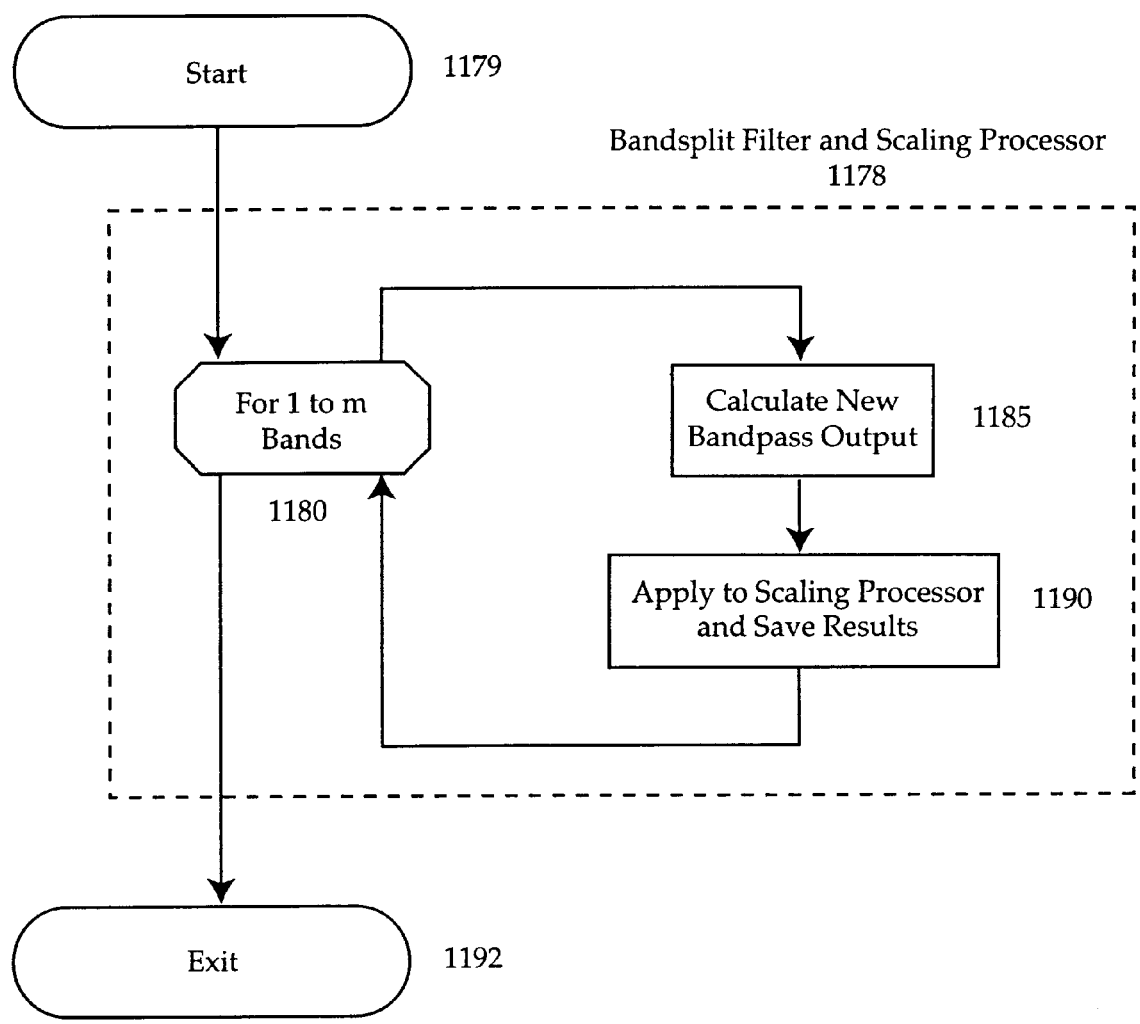
FIG. 10E shows a Bandsplit Filterflow diagram.

Referring next to FIG. 10E, the bandsplit filter and scaling processor step 1178 from FIG. 10D can be better appreciated. The process starts at step 1179, after which a loop begins at step 1180, with the number of loops to be processed at step 1180 is determined by the number of bands the channel is to be split into. The loop advances to step 1185, where the band output is calculated, after which scaling and equalization is performed and the results saved at step 1190. The process then loops back to step 1180 for processing the next band. Once the requisite number of bands for that channel are processed, the process exits at step 1192.

Figure 11:
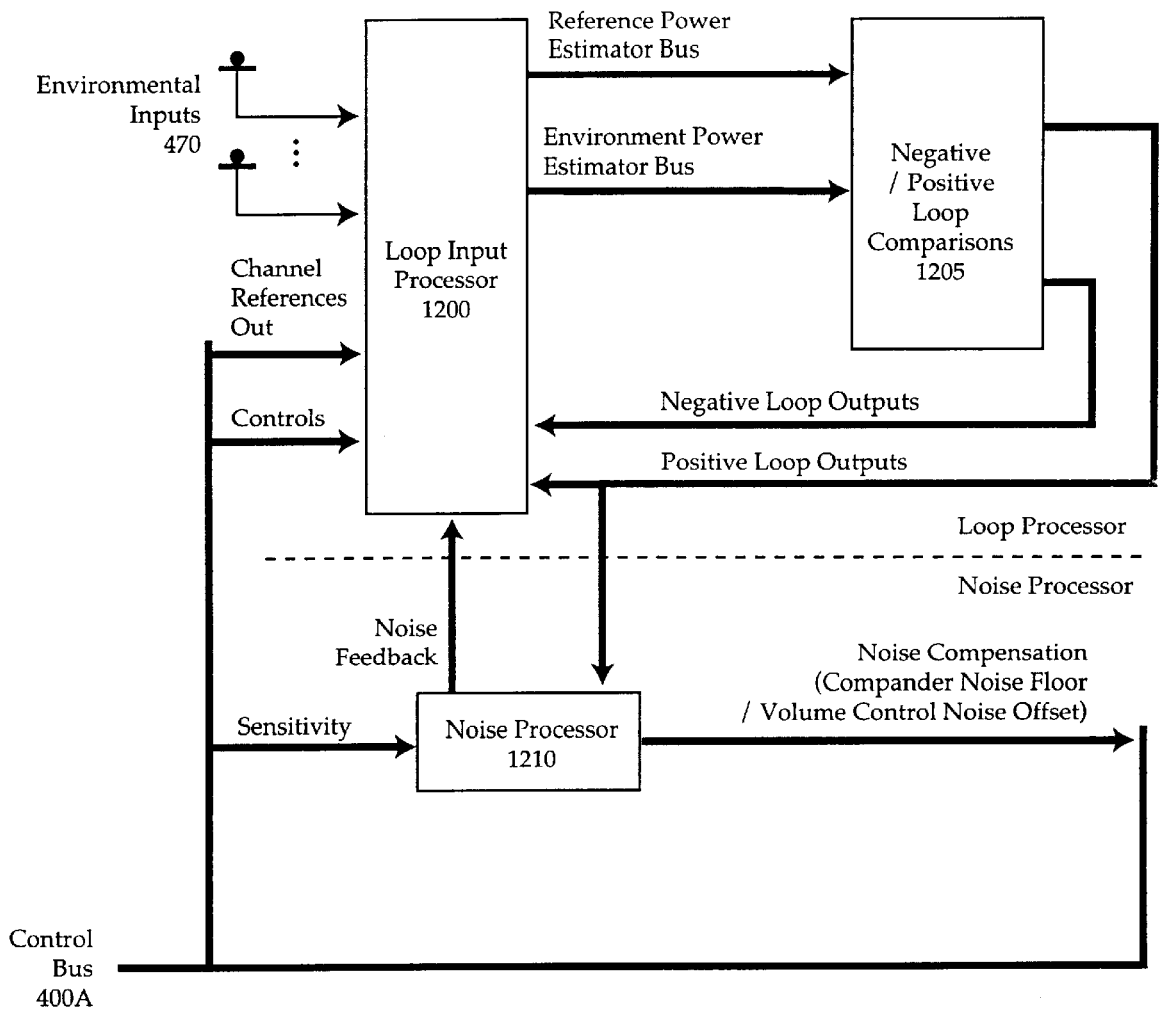
FIG. 11 shows an Environmental Sensor Adjustment and Noise Extractor Block Diagram.

Referring next to FIG. 11, exemplary logic for implementing the environmental sensor adjustments and noise extraction process can be better appreciated. A plurality of environmental inputs 470, which may comprise a plurality of microphones or other sensors, are provided to a loop input processor 1200. In addition, the loop input processor gets reference signals from output signal processors 475 via signal bus 400B, and a series of control signals as shown in Table A via the control bus 400A. The loop input processor provides acoustic loop balancing, negative loop feedback and signal conditioning functions. The loop input processor 1200 provides as its outputs, typically, a fast reference power estimator and a fast environment power estimator, both of which are supplied to negative/positive loop comparison logic 1205. The outputs of the loop comparison logic 1205 provide both negative loop outputs and positive loop outputs, which are fed back to loop input processor 1200. While the loop input processor 1200 and loop comparison logic 1205 are both portions of the loop processor, signals are also communicated between the loop processor and a noise processor. In particular, the control bus 400A provides a sensitivity signal to correction and conversion logic contained in noise processor 1210. The correction and conversion logic 1210 provides a noise feedback signal to the loop input processor 1200, while the positive loop outputs are also provided to the noise processor 1210. The output of the noise processor 1210 is a compander noise floor or volume control offset signal supplied via the control bus 400A.

Figure 12:
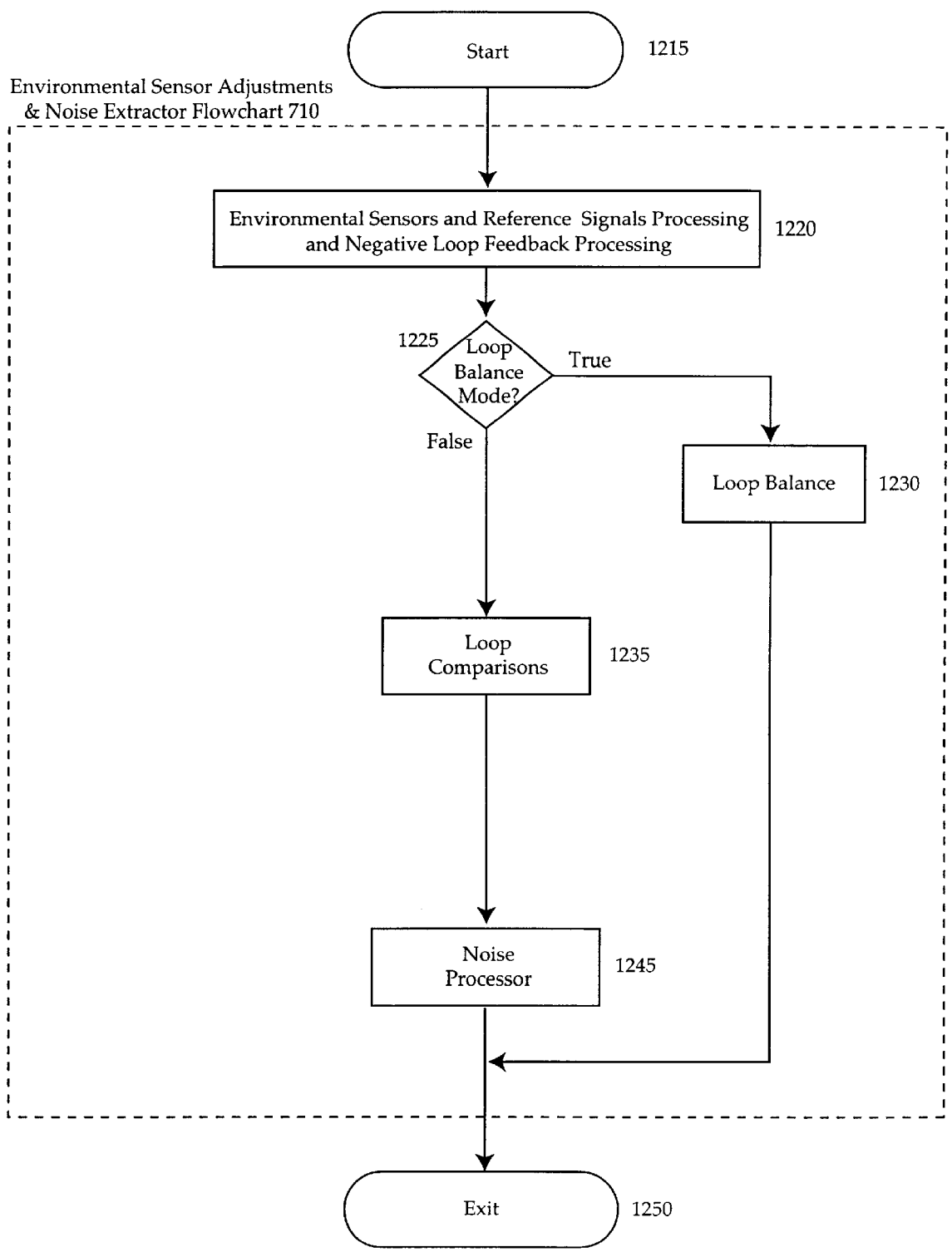
FIG. 12 shows an Environmental Sensors Adjustment and Noise Extractorflow diagram.

The process implemented by the logic of FIG. 11 can be better appreciated from FIG. 12, where the process begins at step 1215 and then advances to step 1220 for processing of environmental sensors and reference signals and negative loop feedback processing. It will be appreciated by those skilled in the art that the implementation of the environmental sensors and reference signals processing involves, in at least some embodiments, processing of multiple bands and acoustic delay compensation. The process then advances to step 1225, where a check is made of whether a loop balance mode is active. If so, the process advances to a loop balance step 1230. If not, the process advances to step 1235 to process the positive/negative loops comparisons. Process steps 1220, 1225, and 1230 are similar to the previously described loop input processor 1200 and step 1235 is similar to the previously described negative and positive loop comparisons 1205. The process then advances to step 1245 for noise processing. After completion of step 1245, or completion of step 1230, the process completes and exits at step 1250.

Figure 13:
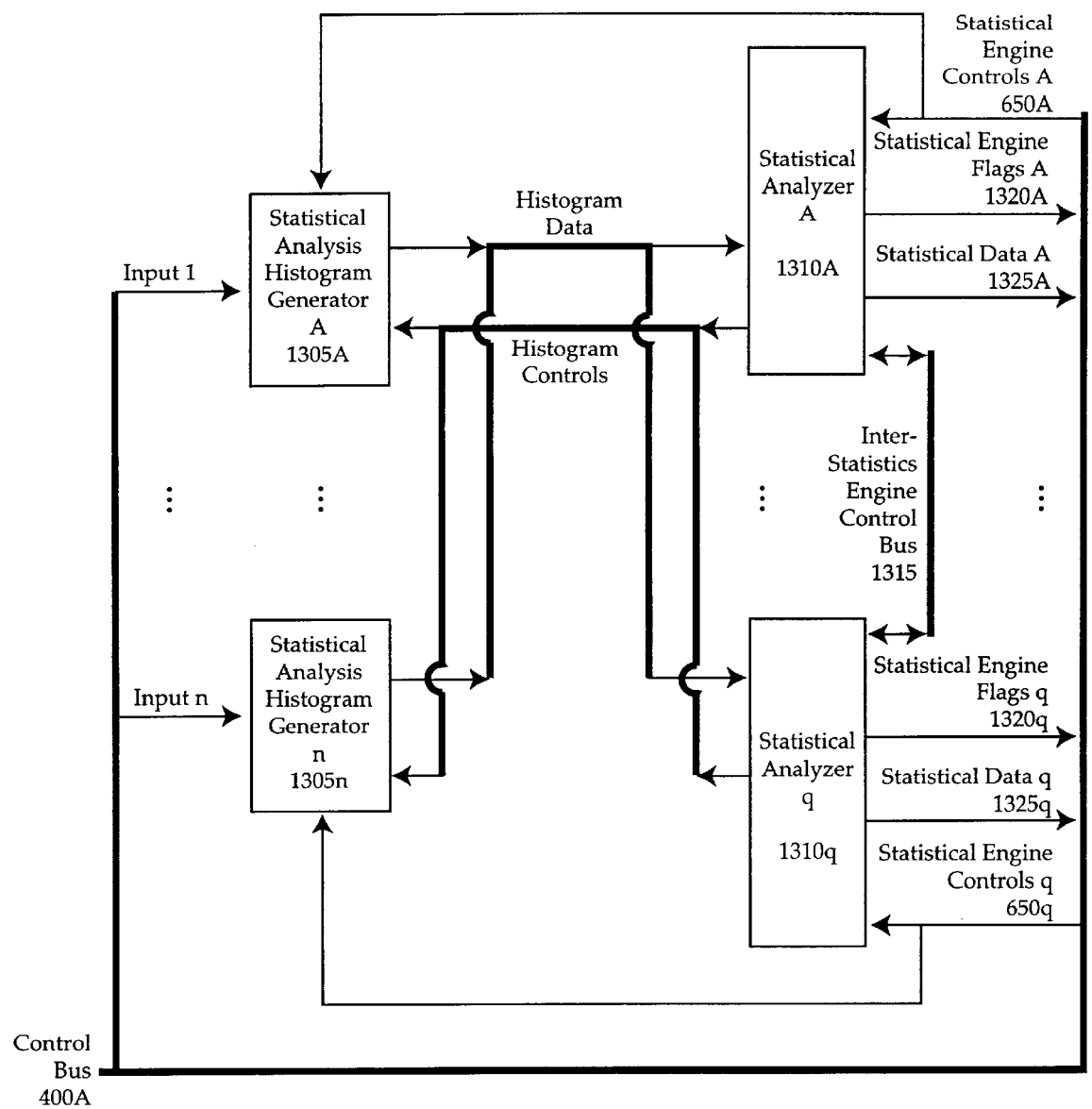
FIG. 13 shows a Statistical Engine Block Diagram.

Referring next to FIG. 13, the statistical engine 415 of FIG. 4 may be better appreciated. The statistical engine inputs are provided from the control bus 400A, and comprise inputs 1 through n, which are provided to statistical analysis histogram generators 1305A-n, which process the historical data to generate histograms representative of the prior performance of the system. The histogram data outputs of the generators 1305A-n are provided to one or more statistical analyzers 1310A-q. Signals are exchanged among the various analyzers 1310 via an interstatistics engine control bus 1315, while the outputs of the analyzers 1310A-q are statistical flags 1320A-q and statistical data 1325A-q. In addition, the statistical analyzers 1310 and generators 1305 receive as additional inputs statistical controls 650A-q. The analyzers 1310A-q provide outputs in the form of histogram controls back to the generators 1305A-n. The statistical flags 1320, statistical data 1325, and statistical controls 650 are all communicated among the various components by means of the control bus 400A.

Figure 14:
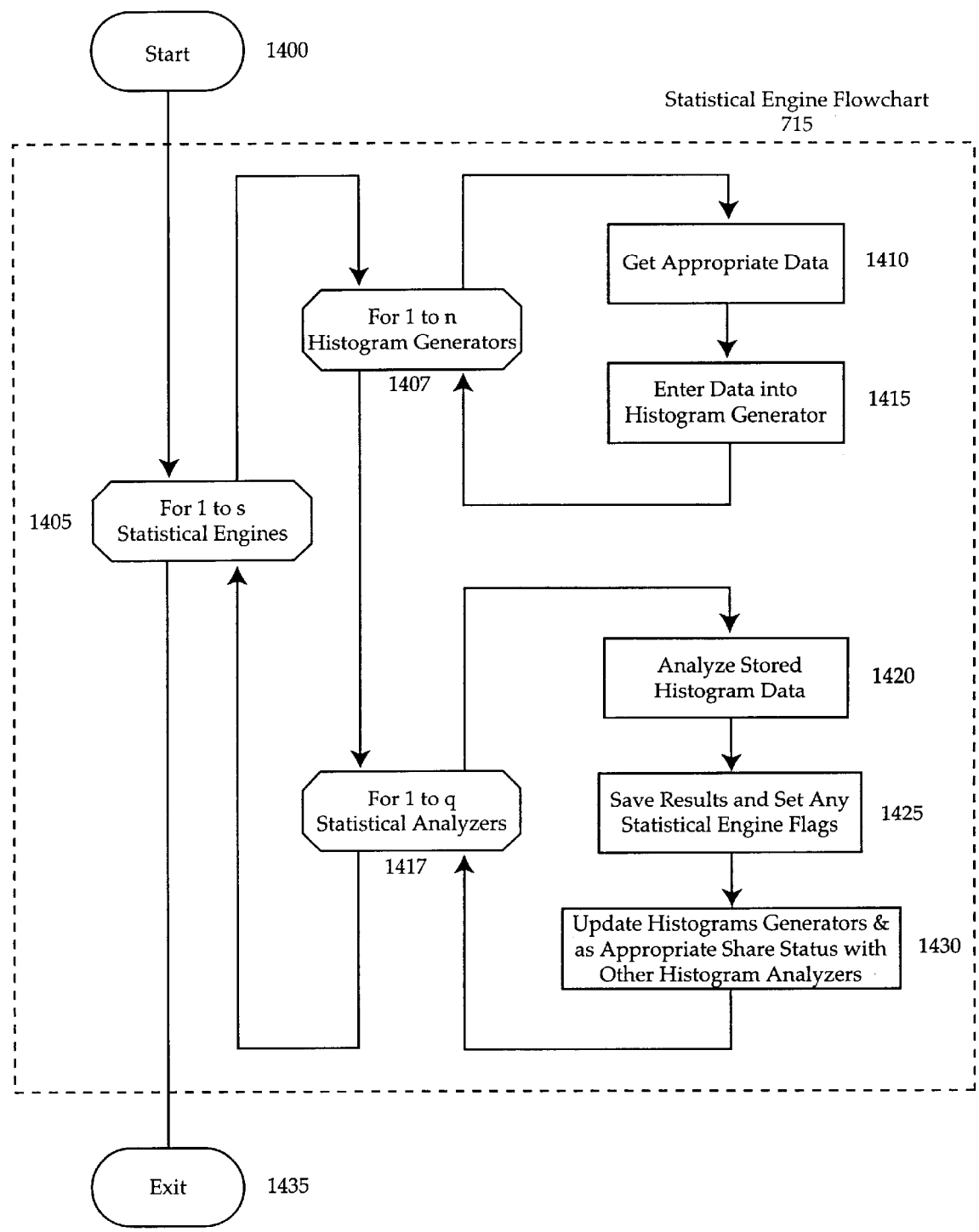
FIG. 14 shows a Statistical Engineflow diagram.

Referring next to FIG. 14, the process implemented by the statistical engine logic of FIG. 13 can be better understood.

The process starts at step 1400, and advances to step 1405 where a loop is initiated with one loop for each of the statistical engines. The loop advances to step 1407 where a loop is initiated with one loop for each of the histogram generators. The loop advances to step 1410, where the appropriate data is gathered from any desirable location in the system. Once the appropriate data is collected, the process advances to step 1415, where the data is entered into the histogram generator appropriate for this loop. When all the histogram generators have been processed, step 1407 advances to step 1417 where a loop is initiated with one loop for each statistical analyzer. The loop then advances to step 1420 where the stored histogram data is analyzed. The results are then saved and, if required, appropriate statistical engine flags are set at step 1425, after which the histogram generators are updated at step 1430 and, where appropriate, the histogram status is shared with other statistical analyzers. The process then loops back to step 1417 for processing of additional statistical analyzers. When all statistical analyzers have been processed, step 1417 loops back to step 1405 for processing of additional engines. Once the full complement of engines has been processed, the process ends at step 1435.

Figure 15:
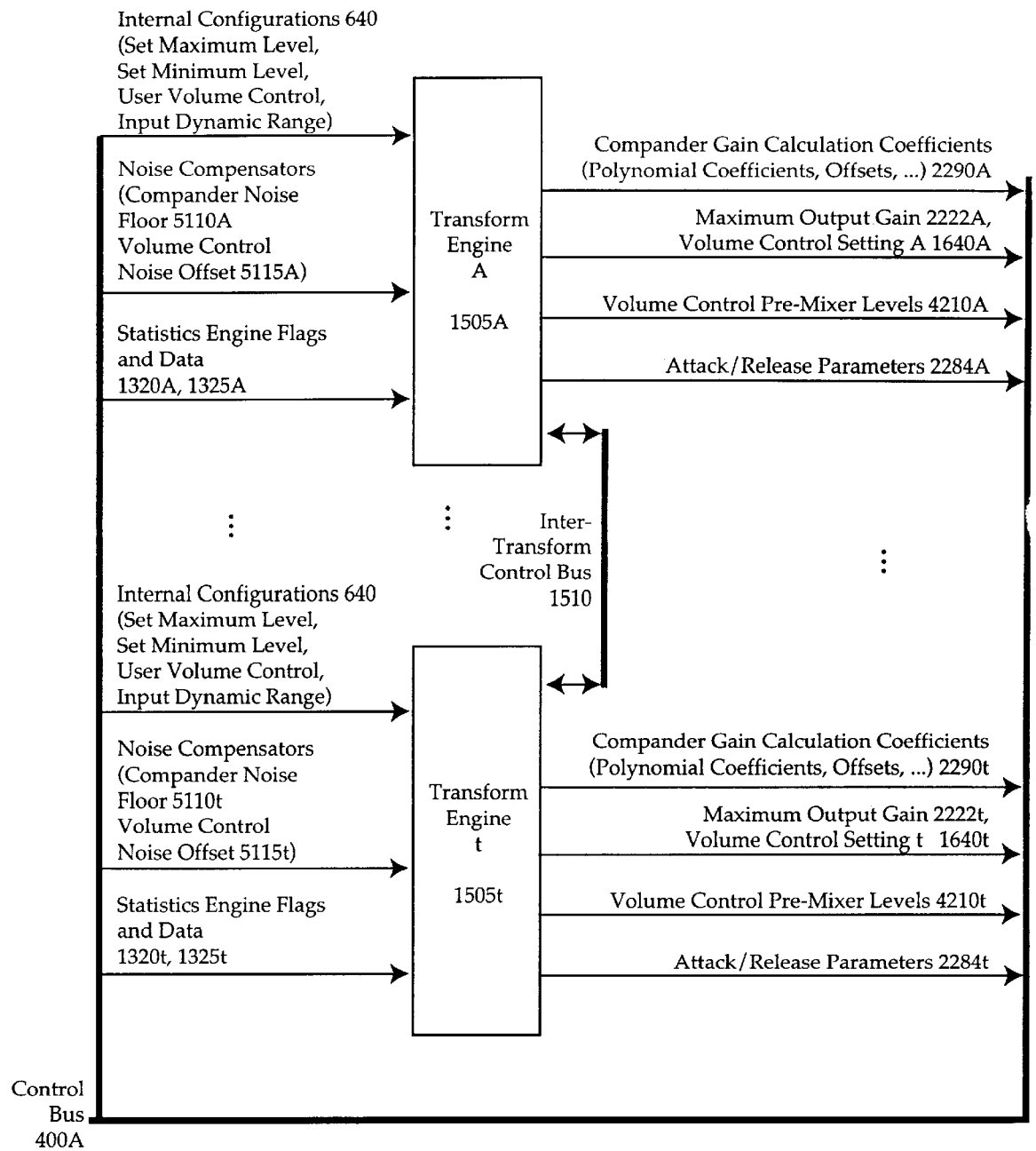
FIG. 15 shows a Transform Engine Block Diagram.
Figure 16:
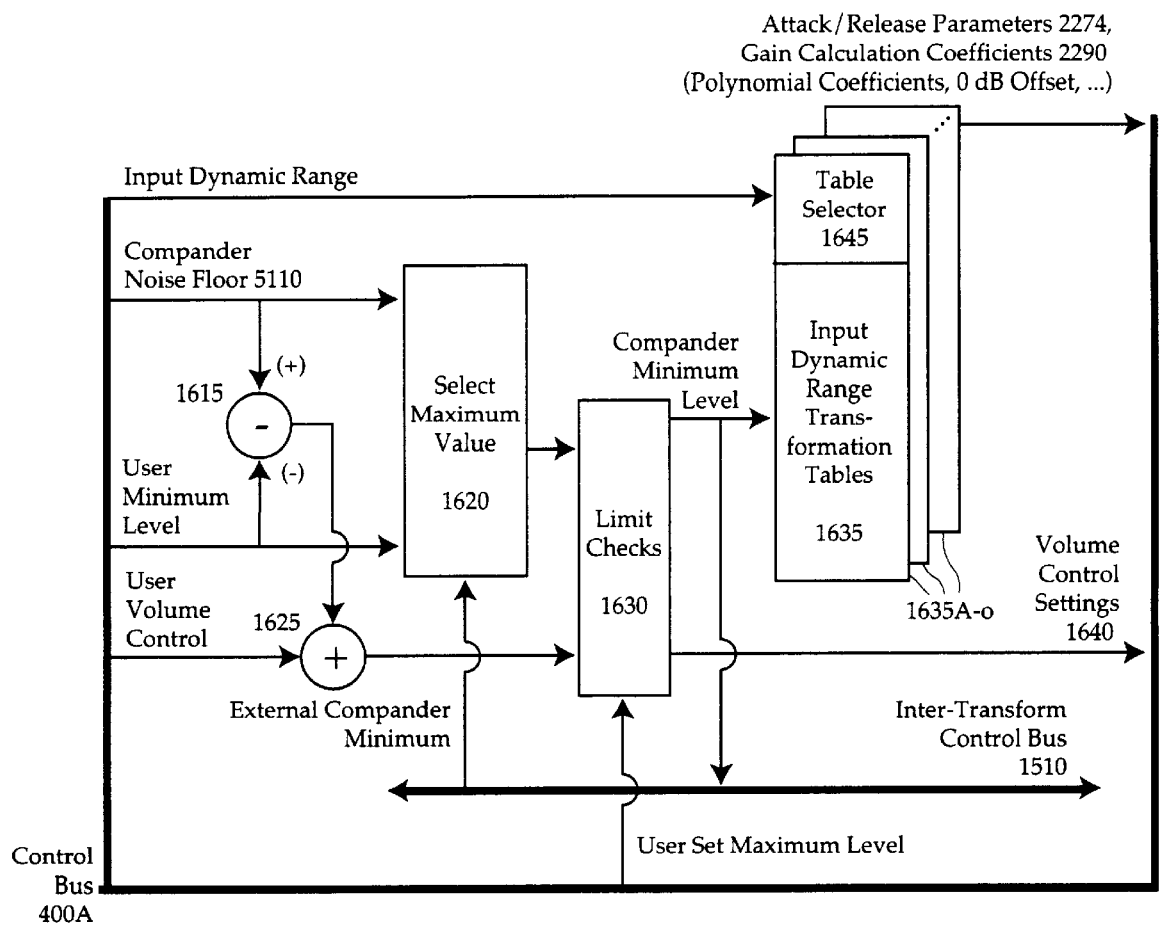
FIG. 16 shows a Transform Engine Example.

Referring next to FIGS. 15 and 16, the transform engine 410 of FIG. 4 may be better appreciated. The control bus 400A provides a series of inputs as shown in Table A, typically inputs from user interfaces, noise extractors and statistical engines, to one or more transform engines 1505A-t. Each of the transform engines then provides a series of outputs, which typically includes compander gain calculation coefficients and kneepoints, volume control settings, and volume control pre-mixer levels. In addition, an inter-transform control bus 1510 shares information among the various transform engines 1505.

Referring next to FIG. 16, an example of the transform engine 410 can be better appreciated. In this example, if the compander noise floor becomes greater than the user minimum level, both the amount of compander compression (determined by outputs 2290) and the output volume level (determined by outputs 1640) are increased. The control bus 400A provides a user set minimum level to both a subtractor 1615 and select maximum value logic 1620. The subtractor 1615 receives as a second input a compander noise floor signal from the bus 400A, which also serves as an input to the select maximum value logic 1620. The subtractor 1615 provides only its zero or positive values to an adder 1625, which also receives an input from the user volume control signal via the control bus 400A. The output of the adder 1625 is provided to limit checks logic 1630, which receives a second input from the select maximum value logic 1620. The select maximum value logic also receives a control input from the inter-transform control bus 1510. The limit checks logic 1630 receives a control signal from the control bus 400A, and provides an output to one or more input dynamic range transformation tables 1635 as well as the inter-transform control bus 1510. The limit checks logic 1630 also provides, as an additional output, a volume control setting 1640. An input dynamic range signal is provided from the control bus 400A to a table selector 1645, associated with the tables 1635. The tables 1635 then provide compander gain calculation coefficients to the control bus 400A.

Figure 17:
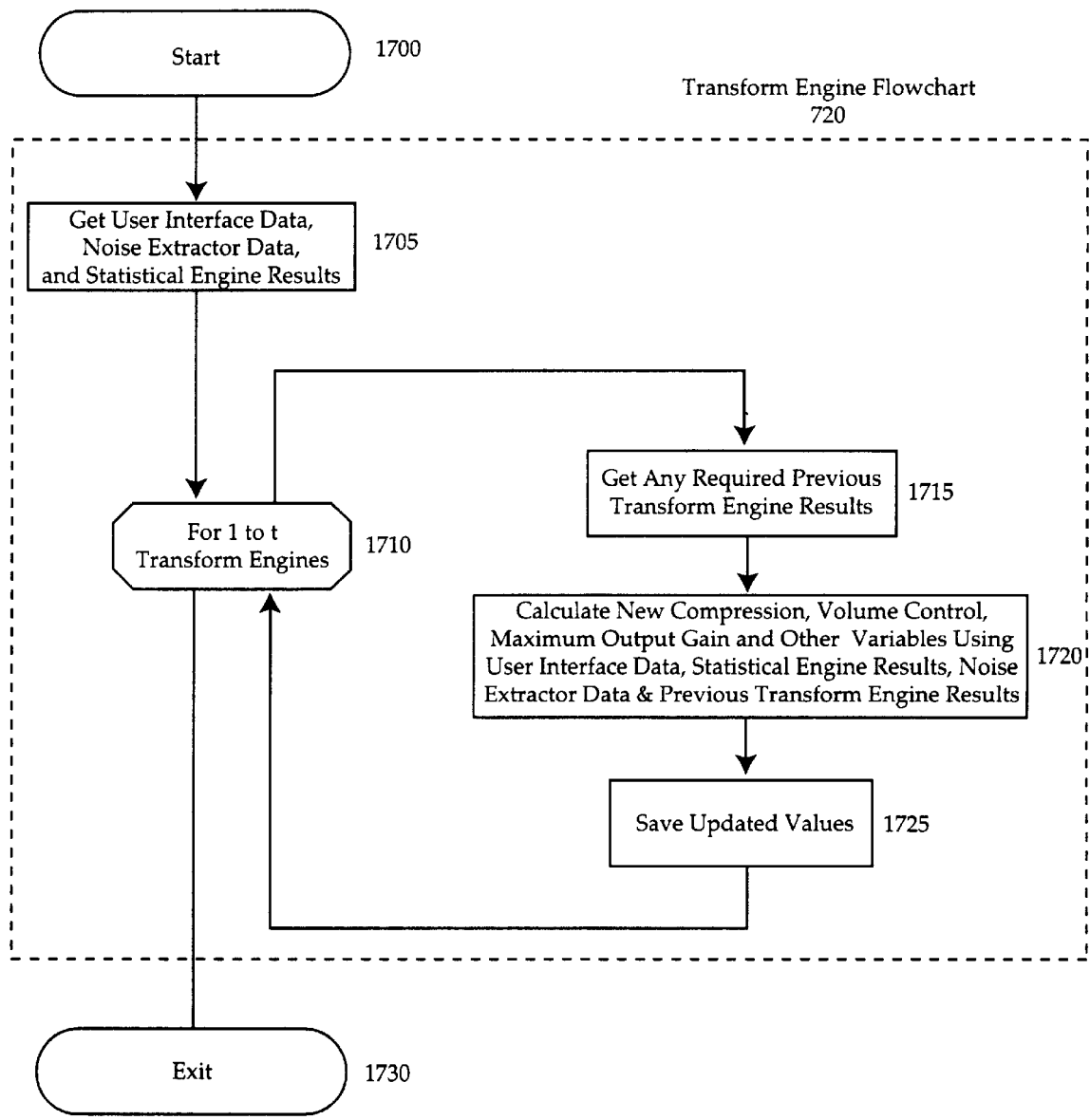
FIG. 17 shows a Transform Engineflow diagram.

Referring next to FIG. 17, the process implemented by the transform engine 720 can be better appreciated. The process starts at step 1700, and advances to step 1705 where the user interface data, noise extractor data, and statistical engine results are obtained. The process then advances to a loop start at step 1710. The number of loops is determined by the number of transform engines. The loop begins by getting any required previous results from the appropriate transform engine at step 1715, followed by calculating new compression, volume, control and related variables at step 1720. The updated values are then saved at step 1725, after which the process loops back to step 1710. After processing of the requisite number of loops, the process ends at step 1730.

Figure 18:
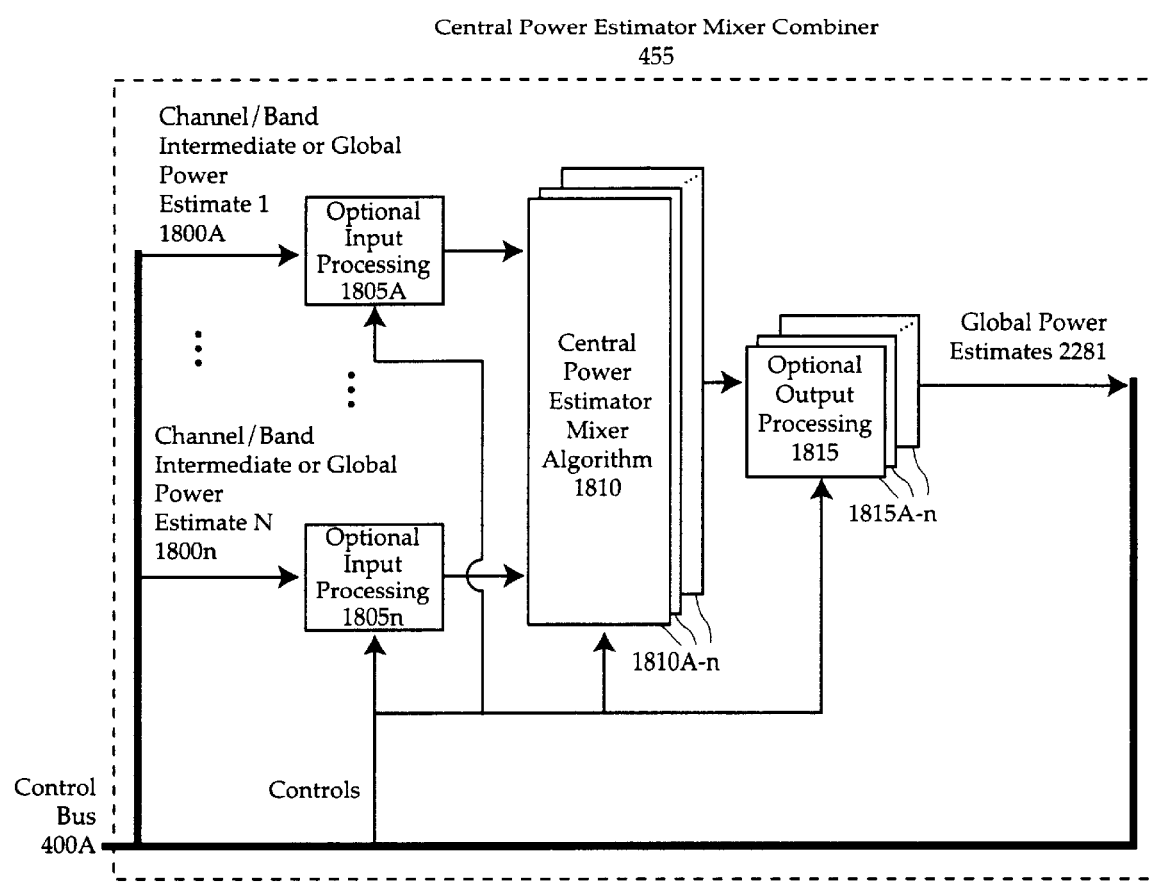
FIG. 18 shows a Centralized Multiple Band/Channel Power Estimator Mixer.

With reference to FIG. 18, the operation of a central power estimator/mixer 455 (from FIG. 4) can be better appreciated. As discussed in connection with FIG. 4, the power estimator mixer stage 455 operates to permit multiple compander stages without altering relative spatial information or causing signal distortion between the various bands or channels, and each separate listening environment may be provided with a separate power estimator mixer. For purposes of example only, FIG. 18 illustrates a power estimator/mixer for one channel which is configured to process power estimates for multiple bands per channel. As shown in FIG. 18, one or more power estimate signals 1800A-n, typically exported local power estimates 2282 or global power estimates 2281, are provided via the control bus 400A, with each power estimate signal 1800A-n being supplied to associated input processing logic 1805A-n. The input processing, which need not be implemented in all embodiments, can perform a plurality of functions, including a decoder for signal reception (either a demodulator or packet disassembly), or low pass filtering and/or a variable attack/release stage for reduced inter-channel and inter-band distortion. The outputs of the input processing logic 1805A-n are each supplied to one or more power estimator mixers 1810A-n, with the exact number being system dependent. For example, one mixer may be used for a pair of front speakers, while another is used for the rear speakers in a listening environment, where the two mixers communicate with each other. Each of the power estimator mixers 1810 in turn provides a single output signal representative of the power contained in the data signal being processed by that particular band of the channel. That output is supplied to associated output processing logic 1815A-n, which in turn supplies a global power estimate 2281 to the local power estimator/mixer in each compander as described hereinafter. The output processing logic is not required in all implementations and, if used, will typically perform functions similar to the input processing stage, except that the output stage will perform encoding rather than decoding. It will be appreciated that compander implementations involving mixers configured for multiple bands per channel will also typically have multiple bands per channel, in which case the global power estimates will be supplied to appropriate portions of the associated compander. It will further be appreciated that each of the input processing logic 1805A-n, power estimator mixers 1810A-n, and output processing logic 1815A-n will receive a reset signal from the control bus 400A, at least for purposes of initialization.

Figure 19:
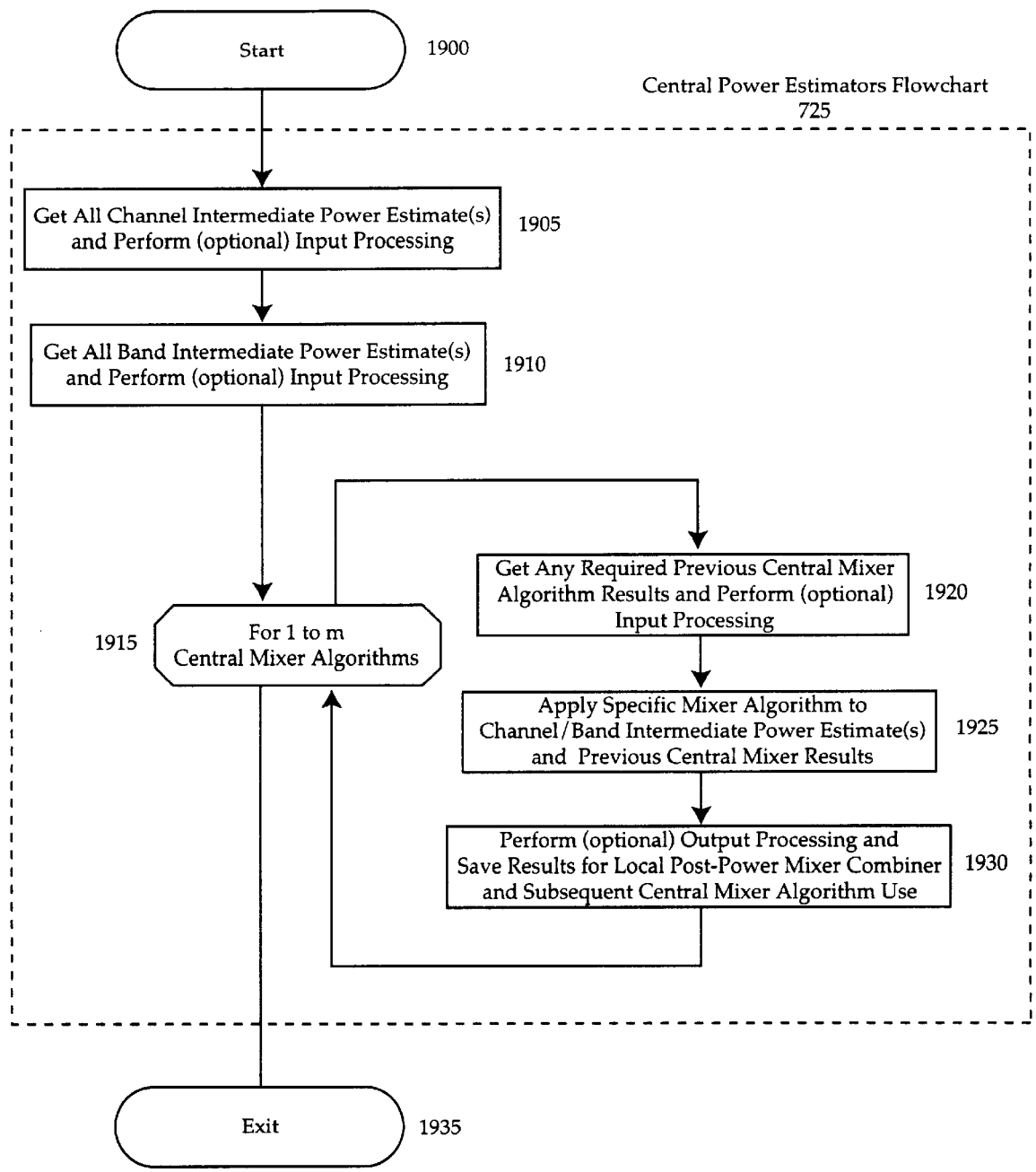
FIG. 19 shows a Central Power Estimatorsflow diagram.

Referring next to FIG. 19, the process by which the central power estimators 455 develop global power estimates can be better appreciated. Again, FIG. 18 illustrates a central power estimator for a single channel with multiple bands, while FIG. 19 illustrates processing for all bands and all channels. The process starts at 1900, and advances to step 1905 where all channel intermediate power estimates are obtained and, if desired, optional input processing may be performed. The process then advances to step 1910, where all power estimates for each of the bands within each channel (e.g., signals 1800A-n) are obtained, after which a loop is entered at step 1915. As an alternative to the input processing at step 1905, such input processing can also be performed at step 1910. The loop begun at step 1915 repeats m times for m control mixer algorithms. The loop starts at step 1920 by getting any previous central mixer algorithm results which are required for the algorithm executed by the loop. Step 1920 may also be used to perform input processing. The process then advances to step 1925, where a specific central mixer algorithm is applied to the channel/band intermediate power estimates together with any previous central mixer results. Then, at step 1930, optional output processing is performed and the results are saved for local post-power mixer use (i.e., the power estimator mixer which is local to the particular compander), and subsequent use by the central mixer algorithm, after which the loop returns to step 1915 to repeat as many times as necessary. After the requisite number of loops have executed, the process advances to step 1935 and exits.

Figure 20A:
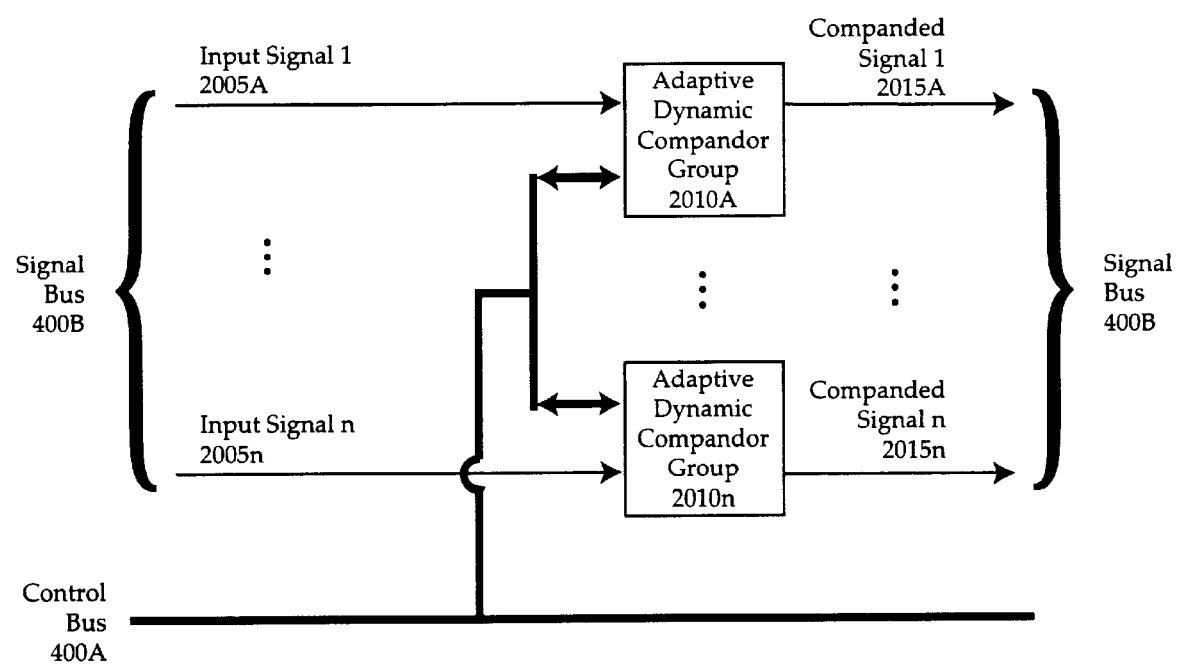
FIG. 20A shows an Independent Adaptive Dynamic Compander Group.

Referring next to FIG. 20A and the subsequent figures, the compander stage 450 of FIG. 4 may be better appreciated. As will be understood by those skilled in the art, the compander stage is a key element in the overall system, although many other elements of the present system are novel. FIG. 20A provides a generalized view, with the successive Figures providing greater detail of key elements. In FIG. 20A, a plurality of input signals 2005A-n, which may in an exemplary embodiment be 0 dB adjusted signals 860A-n, are supplied to one or more compander groups 2010A-n, with a plurality of control signals as shown in Table A communicated bidirectionally between the compander groups 2010 and the control bus 400A. The companded signals 2015A-n which comprise the outputs of the compander group 2010 are then provided to the next stage via the system bus 400B.

Figure 20B:
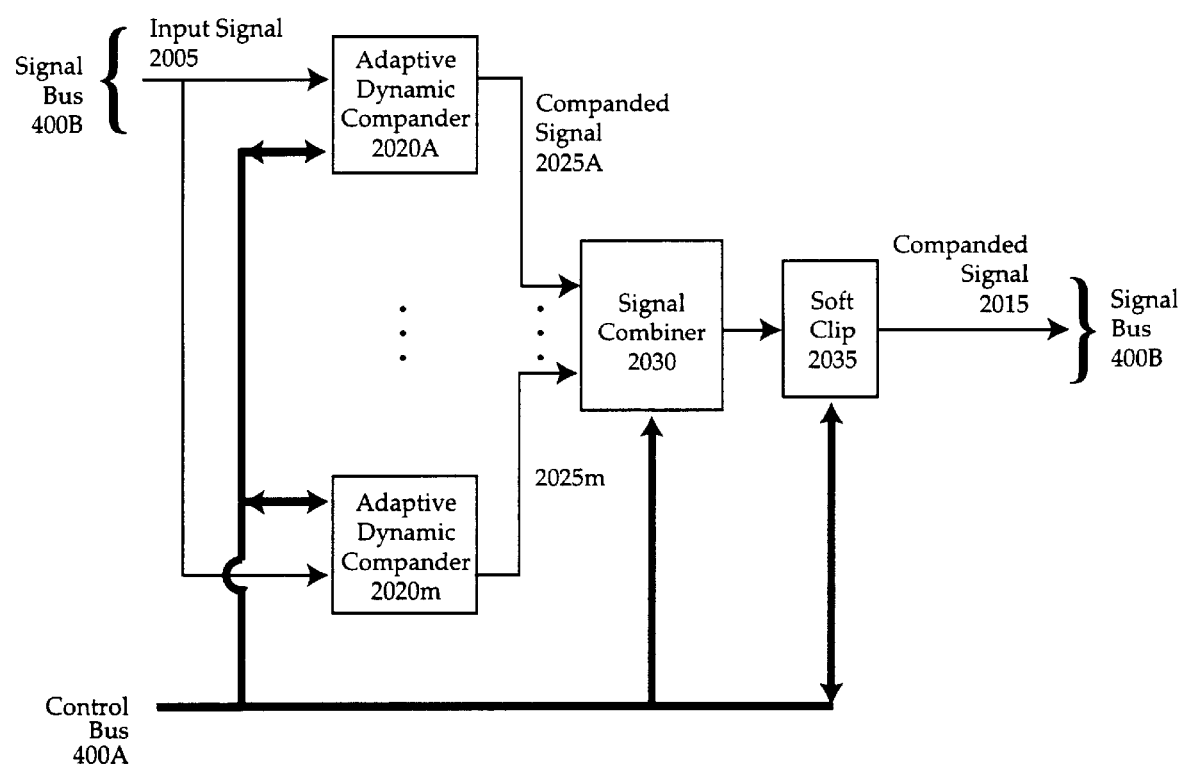
FIG. 20B shows an Adaptive Dynamic Compander Group Block Diagram.

With reference next to FIG. 20B, the compander groups 2010 of FIG. 20A may be better understood. In particular, each compander group 2010 typically comprises one or more companders 2020A-m, which may be more typically thought of as adaptive dynamic companders in most implementations. One of the input signals 2005A-m is supplied to each compander 2020A-m within the compander group, and as shown in FIG. 20A a plurality of control signals (Table A) are communicated bidirectionally via the control bus 400A. The output signal 2025A-m, respectively, of the companders 2020A-m are combined in a signal combiner 2030, which is typically implemented as a mixer function. The signal combiner 2030 receives control signals from the control bus 400A, as well. The output of the signal combiner is provided to a soft clip stage 2035, also discussed in greater detail hereinafter, and the output of the softclip stage 2035 is provided as the output of the compander group, or one of output 2015A-n, e.g. 2015A. It will be appreciated that the function of the soft clip stage is similar to that discussed previously. In general, it functions to minimize output distortion caused by signal clipping for signals that exceed the maximum signal level of the output stage. For example, if an input signal changes amplitude faster than the response time of the compander, the signal may be overamplified, and therefore clip. The resulting output typically is detectable as distorted, and may be perceived as unacceptable in some applications.

The soft clip stage functions to smooth the peaks of a signal that exceeds the 0 dB level, typically in a non-linear manner. In analog designs, a soft clip function can be implemented with a diode clipper or a fast-acting compressor. However, when implemented as a DSP function, special techniques must be used because DSP implementations rely on sampling of the input signal. While analog signals are continuous, digital signals may be non-clipping in one sample, and fully clipped on the next subsequent sample—with no intervening event or warning. Thus, a DSP implementation according to the present invention will preferably provide some headroom between the 0 dB level and the clipping threshold of the system. When a signal amplitude crosses a predetermined threshold, for example the 0 dB level although other thresholds may be used, a routine is called which calculates the slew rate (dV/dt). That slew rate is then used to apply non-linear smoothing which keeps the output signal under the clipping threshold. Although more complicated, essentially the same predictive function is applied when the signal amplitude decreases below the 0 dB level. The function may be implemented as a look-up table in at least some embodiments, although direct calculation may also be used.

As will be appreciated from the foregoing, the dV/dt information is used to determine how fast and how severely to smooth the input signal. Signals with high dV/dt values require more time for smoothing to avoid the abrupt flattening that causes clipping distortion. To accommodate this, they require a high soft-clip amplitude—i.e., more headroom above the 0 dB level—and the most severe amount of smoothing. Signals with lower dV/dt levels can be smoothed less severely, and may also be able to be smoothed over a longer period of time.

For implementations using a look-up table, when the signal amplitude exceeds 0 dB, the dV/dt information is used to select a table having appropriately smoothed amplitude values. The look up table may be implemented as a single monolithic table, or a plurality of discrete tables; any reference herein to a look-up table contemplates both implementations. When the input signal amplitude returns to less than the 0 dB level, subsequent input samples can be used to compute the exit dV/dt, after which the appropriate look-up table values can be selected. Use of a delay buffer on the input signal may be required in at least some implementations to allow time for the exit dV/dt calculation. In addition, in some implementations the exit tables can simply be the entry tables read in reverse, thus eliminating the need for additional tables.

Figure 20C:
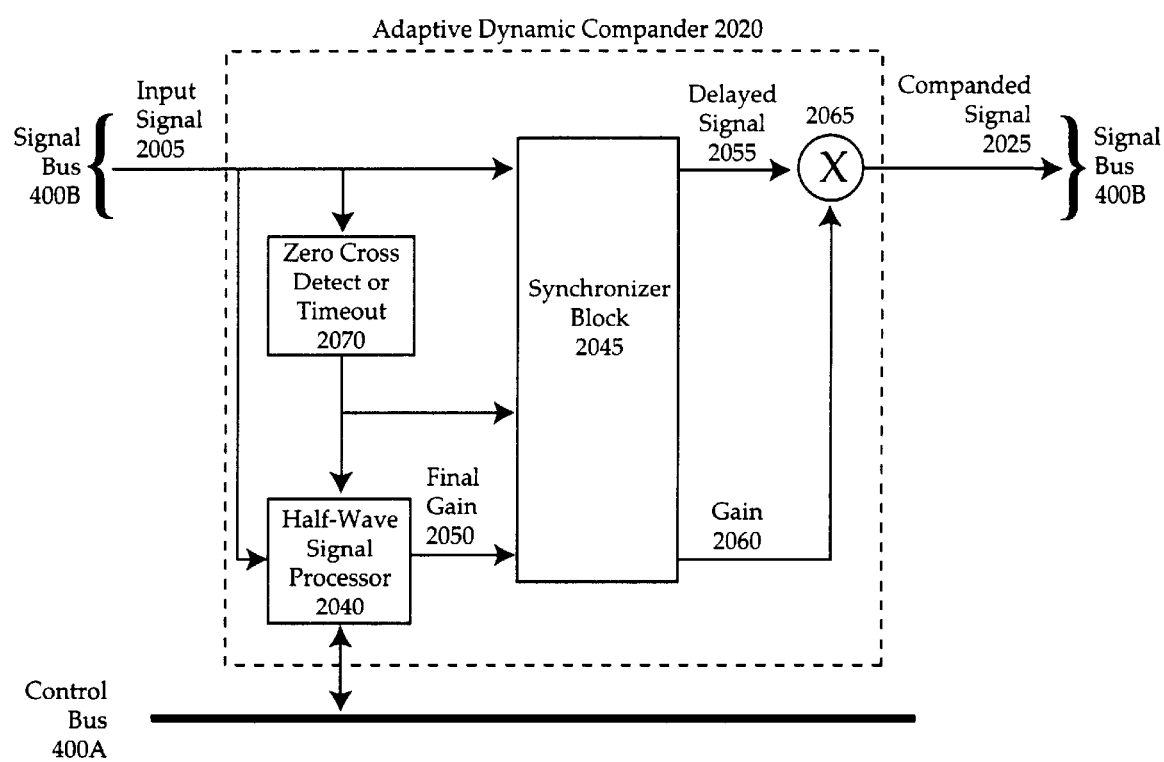
FIG. 20C shows an Adaptive Dynamic Compander with Low Distortion.

Next, turning to FIG. 20C, the structure of an adaptive dynamic compander 2020 may be better appreciated. The input signal 2005 (which, again, may be a 0 dB adjusted signal 860), is supplied from the system bus 400B to a half-wave signal processor 2040, a zero crossing or timeout detector 2070, and a synchronizer block 2045. The half-wave signal processor 2040, which is discussed in greater detail in connection with FIGS. 21 and 22, receives control signals from the control bus 400A, is enabled at zero-crossings or timeouts by the 0 dB adjusted signals, and calculates the appropriate gain for application at that point in the signal, thus minimizing distortion. That is, if the new gain is applied at the zero crossing, no detectable "glitch" in the signal occurs, thus minimizing distortion. The half-wave signal processor provides as its output signal a "final gain" signal 2050, but introduces a delay of typically a half cycle because of the need to calculate the gain at the end of each half cycle. The final gain signal comprises a second input to the synchronizer block 2045, which need not be used in all instances but which functions to compensate for the signal delay introduced by the half-wave processor. The synchronizer block is helpful in improving transient response and also ensures that the gain calculated by the half-wave processor is applied on the correct half-cycle. The synchronizer block typically comprises buffer memories, and may be most easily implemented in a digital form. The synchronizer block 2045 provides two output signals. The first is a delayed output signal 2055, while the second is a gain signal 2060. The delayed signal 2055 is combined with the gain signal 2060 by multiplier 2065 to provide the output companded signal 2025 shown in FIG. 20B.

Figure 21A:
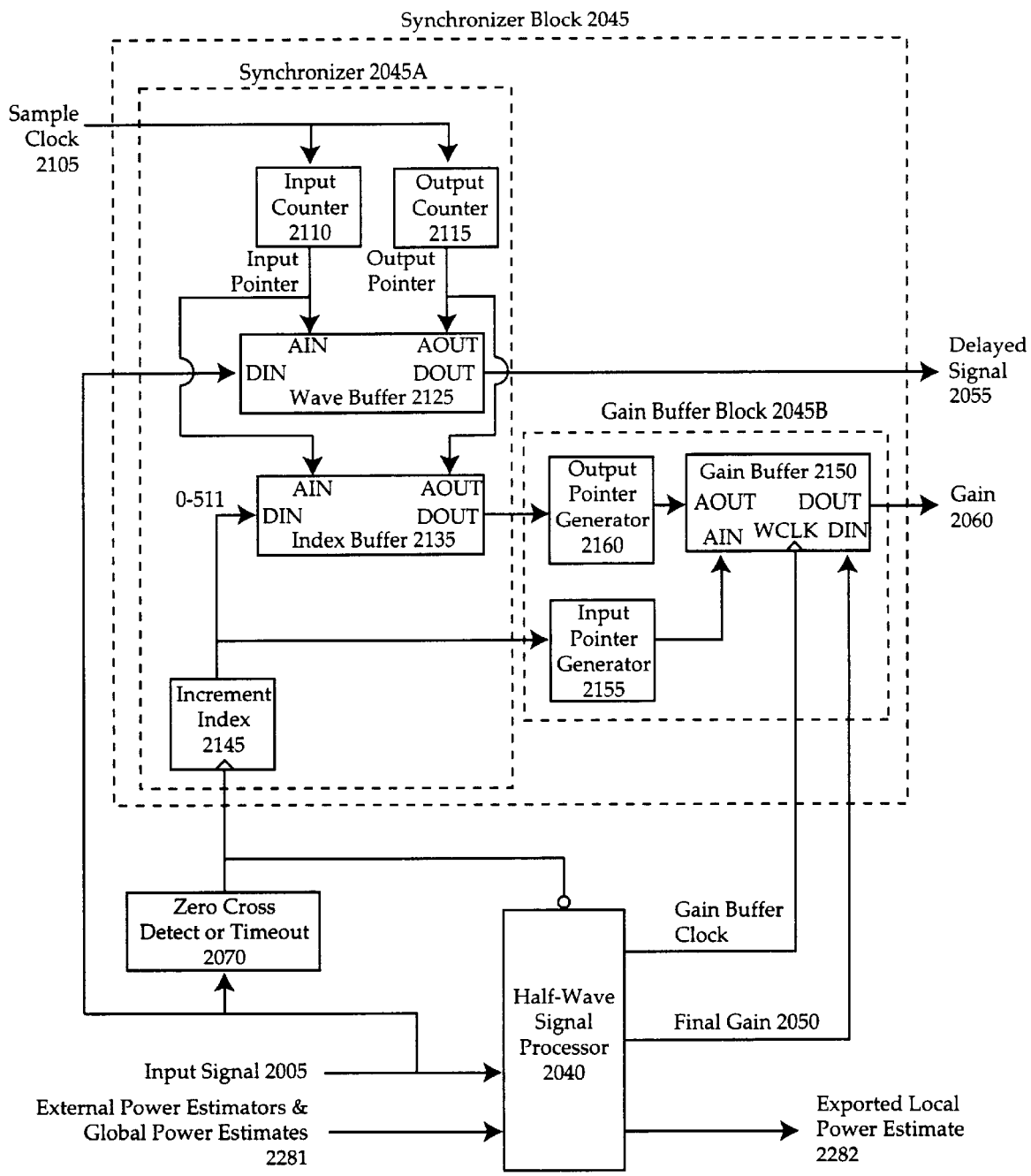
FIG. 21A shows an example of the Integration of a Synchronizer Block with a Half-Wave Signal Processor.
Figure 21B:
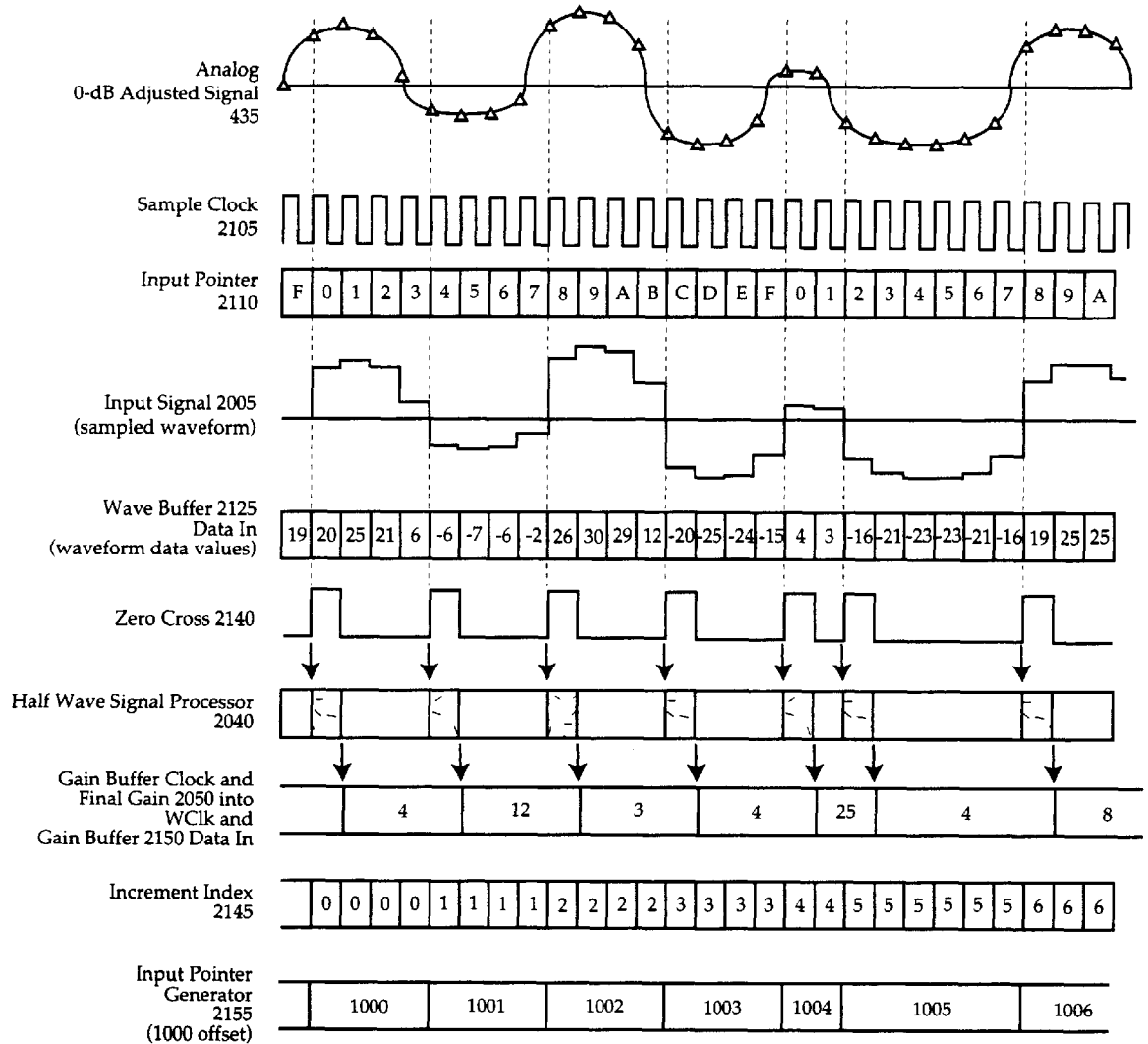
FIG. 21B shows a Synchronizer Input Signal Processing Example.
Figure 21C:
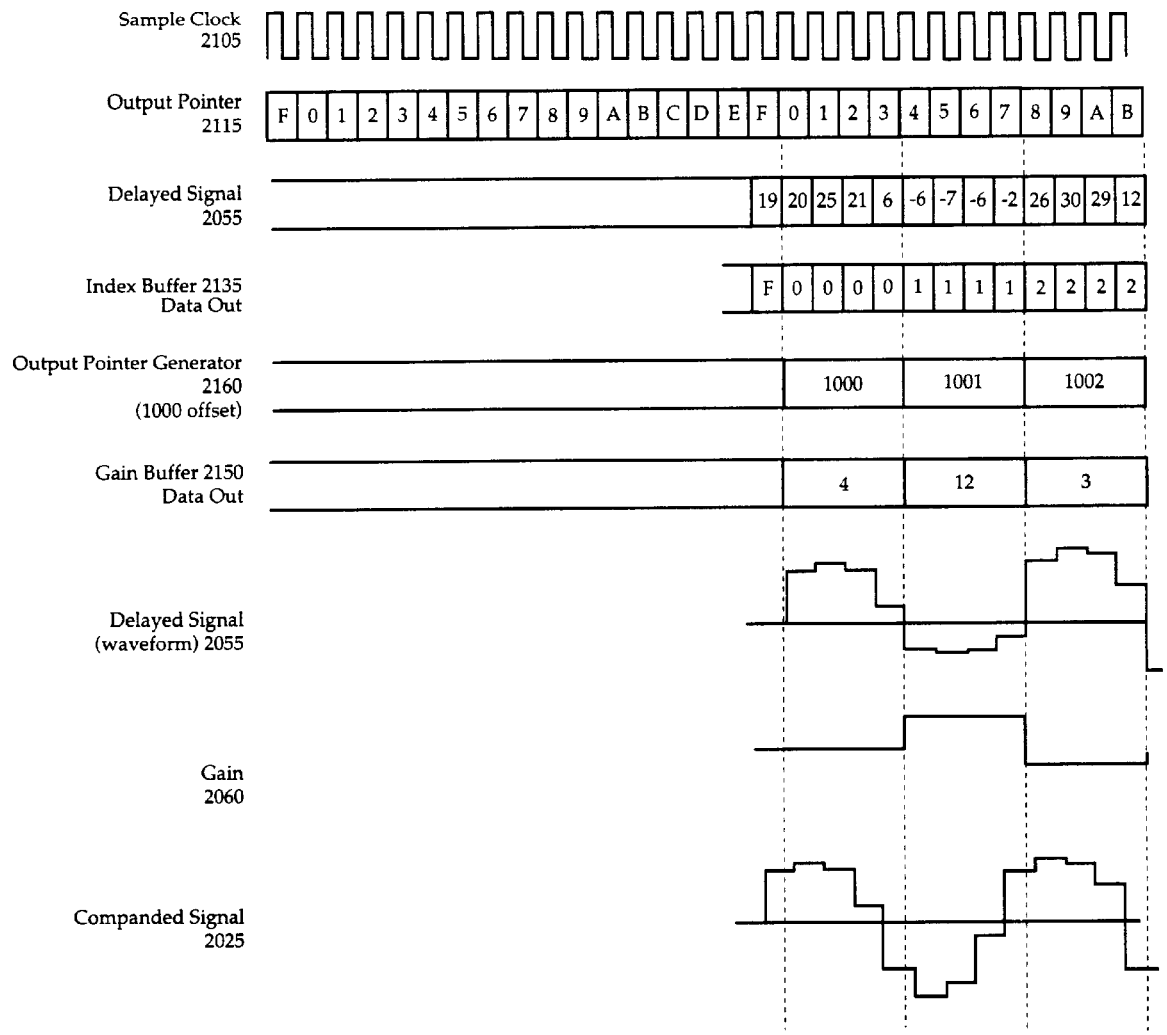
FIG. 21C shows a Synchronizer Output Signal Processing Example.

As discussed above, a desirable feature of a preferred compander according to the present invention is that it operates with very low distortion, relying in part on half-wave signal processing as shown generally in FIG. 20C. With reference to FIGS. 21A–C, an exemplary form of synchronizer block 2045 and half-wave signal processor 2040 can be better appreciated. In general, the function of the synchronizer is to ensure that the input signal is delayed by the same amount as the delay imposed by the half-wave signal processor 2040. An exemplary implementation can be appreciated from FIG. 21A, while the associated input and output waveforms can be better appreciated from FIGS. 21B and 21C, respectively. The synchronizer block 2045 generally comprises a synchronizer 2045A and a gain buffer block 2045B, each so labeled and indicated by dashed lines in FIG. 21. The synchronizer portion 2045A receives a sample clock signal 2105 from the control bus 400A, which provides the input to an input counter 2110 and an output counter 2115. The output of the input counter 2110 provides an input pointer to the "AIN" (address in) port of wave buffer 2125 and index buffer 2135, while the output of the output counter 2115 provides an output pointer to the "AOUT" (address out) port of the wave buffer 2125 and index buffer 2135. The input signal 2005, typically a 0 dB adjusted signal 860, provides a "DIN" (data in) input to the wave buffer 2125 and "DOUT" (data out) signal provides the delayed signal 2055. Wave buffer 2125 and index buffer 2135 are typically FIFO (first in first out) buffers as shown in FIG. 21A.

At the same time, the input signal 2005, typically the 0 dB adjusted signal 860, is also supplied to the half wave signal processor 2040 and a zero cross detector 2070, which detects the zero crossing point of the input data stream. It also detects an input timeout which occurs if the input half wave length exceeds the length of the synchronizer wave buffer 2125. The output of the zero cross detector 2070 serves as the input to an increment index 2145 and enables the half wave signal processor 2040 to calculated the final gain for the input half wave that just ended. The output of the increment index 2145, typically a Modulo-"n" counter, provides the "DIN" (data in) input of the index buffer 2135 and also provides the input to an input pointer generator 2155. The output of the input pointer generator 2155 provides the "AIN" (address in) input to the gain buffer 2150. The output of the index buffer 2135 serves as the input to an output pointer generator 2160, which in turn provides the "AOUT" (address out) input to the gain buffer 2150. The "DIN" (data in) input and "WCLK" write clock input of the gain buffer 2150 are supplied by the outputs of the half-wave signal processor 2040. It will be appreciated that the wave buffer and index buffer operate to continuously sequence the incoming data stream by establishing a match between the "address in" of the incoming signal, and the "address out" of that same data suitably delayed to match the delay imposed on the input signal 2005 by the half-wave signal processor 2040. The result is the delayed signal 2055 and the gain 2060 are synchronized. The half-wave signal processor 2040 also receives external and global intermediate power estimates 2281, and exports local power estimates 2282. It will also be appreciated that additional signal delays may result from the use of half-wave signal processor 2040, in which case such delays may be compensated for by inserting appropriate additional delay into the wave and index buffers.

Figure 22:
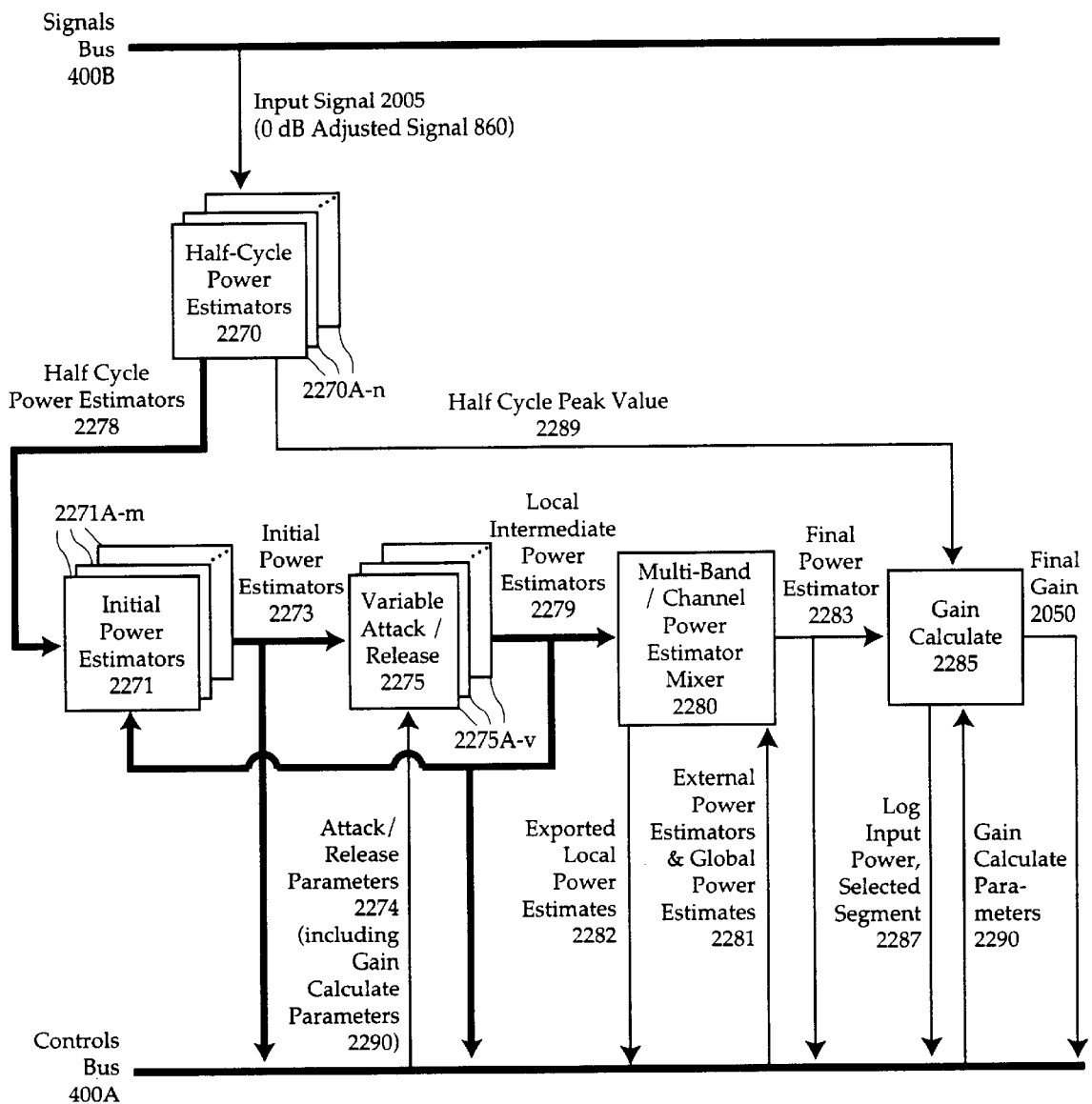
FIG. 22 shows a Half-Wave Signal Processor Block Diagram.

The half-wave signal processor 2040 may be better appreciated from FIG. 22. The half-wave signal processor may be thought of as active only at the end of a half-wave as indicated by zero crossings of the input signal. The input signal 2005, typically the 0 dB adjusted signal 860, is provided from the signal bus 400B to one or more half-cycle power estimators 2270A-n. Here the input signal power is calculated on a half cycle basis, typically by calculating the peak, average, or RMS value of the half cycle input. These half cycle power estimates fluctuate too rapidly for gain calculation use which would result in signal distortion. The half-cycle power estimators 2270A-n supplies an input to one or more initial power estimators 2271A-m which smooth the rapid fluctuations by varying amounts, typically by the use of lowpass filters. Initial power estimators 2271A-m in turn provide initial power estimator signals 2273 to one or more variable attack and release portions 2275A-v and control bus 400A for monitoring purposes. The variable attack and release portions 2275 control the rate at which the gain is allowed to change at the half-wave intervals. The variable attack and release portions 2275 typically work in series with the less smoothed initial power estimators 2271 and are perturbed to greater or lesser amounts by the less smoothed initial power estimators as will be discussed in greater detail in connection with FIG. 23C. The resulting local intermediate power estimator signals 2279 are fed back to initial power estimators 2271 and are also supplied to the control bus 400A for monitoring purposes, while various attack/release parameters are supplied to the variable attack/release portions 2275A-v by the control bus 400A.

The variable attack/release portions 2275A-v receive from the control bus 400A a plurality of attack and release parameters 2274 and outputs intermediate power estimators signals 2279, which may in some implementations have undergone a log conversion to allow easier signal manipulation. It will be appreciated that log-converted signals may be manipulated as linear signals, whereas more complicated calculations are required for signal which are not log converted. The log conversion, where desired, may be performed in any of several stages of the system of the present invention. Regardless, the local intermediate power signals 2279 are supplied to a multi-band/channel power estimator mixer 2280, but also feeds power estimators signals 2279 back to the initial power estimators 2271 and likewise provides the power estimators signals to control bus 400A for use by other modules. Similarly, the mixer 2280 receives as one or more inputs 2281 the external power and global power estimates typically from other channels, bands, and central power estimator mixers and also exports local power estimates 2282. The function of the mixer 2280 is to maintain the relative amplitude relationship between channels, thus preserving spatial location information. The mixer also helps to eliminate interband/channel phase cancellation and beating which can exist in at least some prior art devices. The output of the mixer 2280, the final power estimator 2283, is an updated, or "post-mix" input power factor or value which is supplied to a Segmented Mapping Converter gain calculate stage 2285 and also to the control bus 400A for monitoring purposes. The gain calculate stage 2285 operates on the final power estimator value 2283 to calculate the final gain value 2050 required to generate the companded signal. The gain calculate stage can also provide, as an output supplied to the control bus 400A, for example, a log input power signal or selected segment indication 2287 for monitoring purposes. In addition, in some implementations a half cycle peak value signal 2289 may be supplied by the half-wave power estimator 2270 to the gain calculate stage 2285 to provide look-ahead clip detection. In some implementations, this arrangement may be used to determine if a signal will clip, in which case the peak value may be substituted to compute a non-clipping gain value. This may, in some instances, eliminate the need for a post-compander soft clip function. Other gain parameters 2290 are supplied as controls to the gain calculate stage from the control bus 400A.

It will be appreciated that, for a number of applications of the present invention, not all of the stages shown in FIG. 22 are required. Thus, for many implementations of the present invention, the attack/release stage is not required. Likewise, in other implementations the multi-channel power estimator mixer is not required.

Figure 23A:
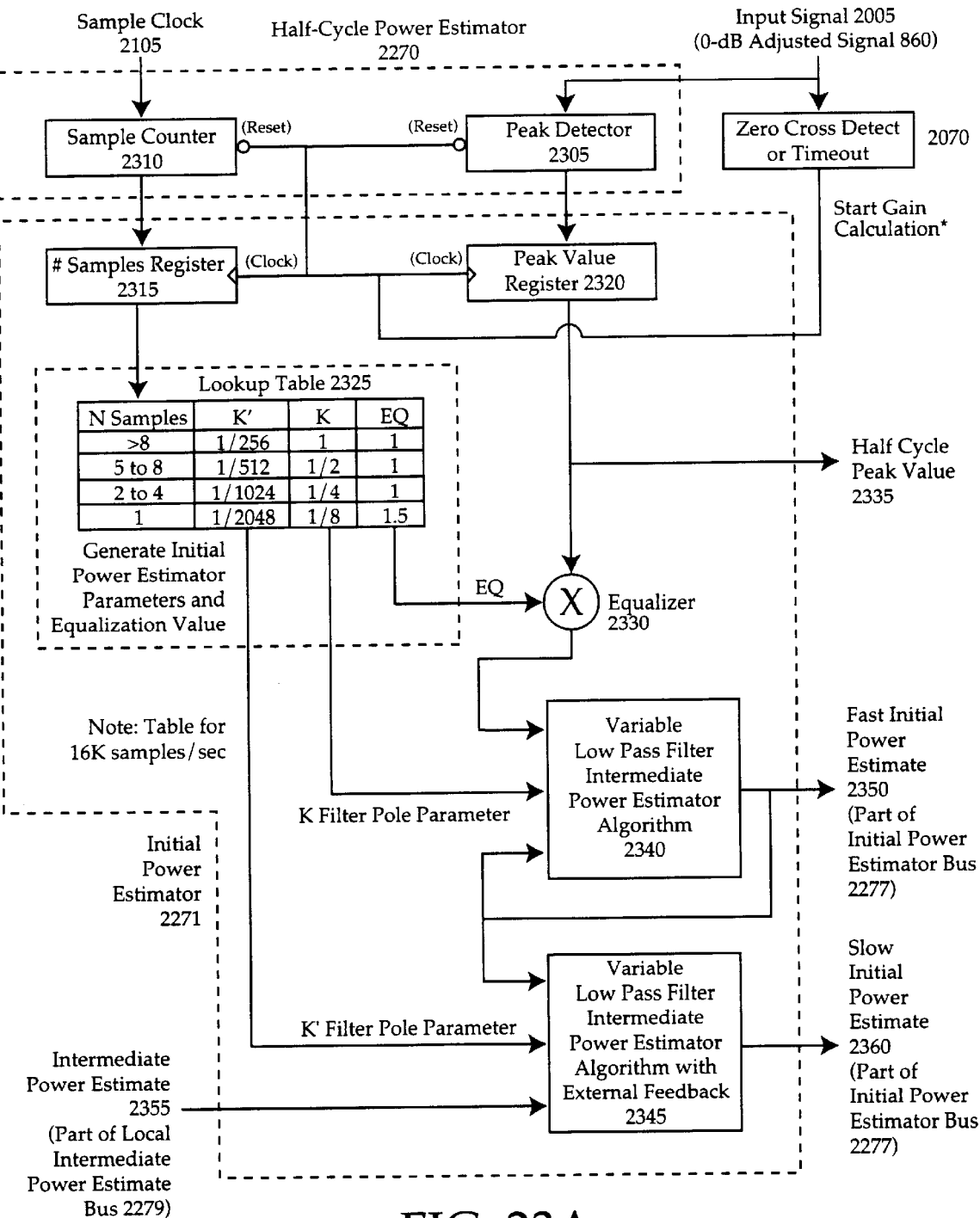
FIG. 23A shows an exemplary Embodiment of Half-Cycle and Initial Power Estimators.
Figure 23B:
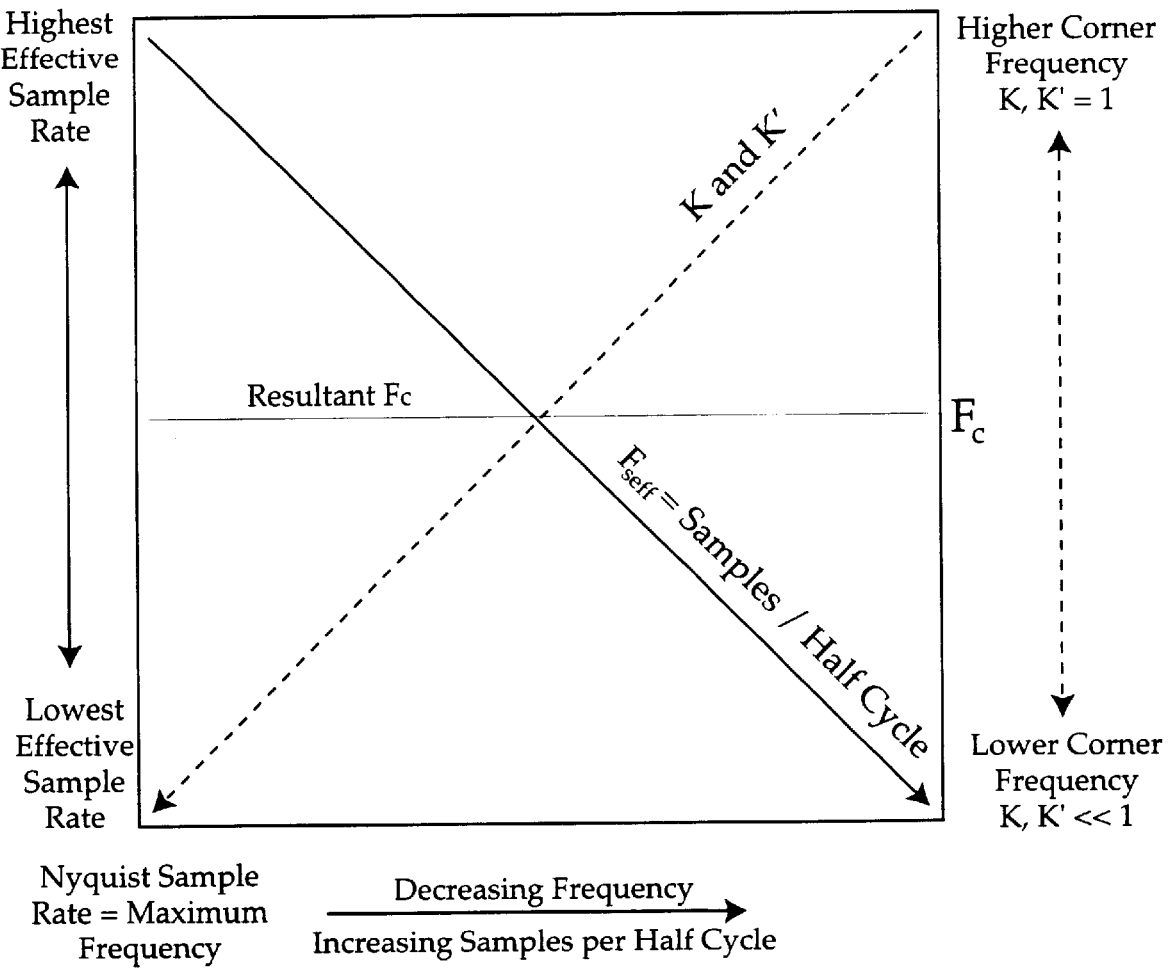
FIG. 23B shows a Changing K and K' Lowpass Filter Coefficients to Compensate for Changing Effective Sample Rate (Fseff) Resulting in Constant Initial Power Estimator Low Pass Filter Response (Fc).
Figure 23C:
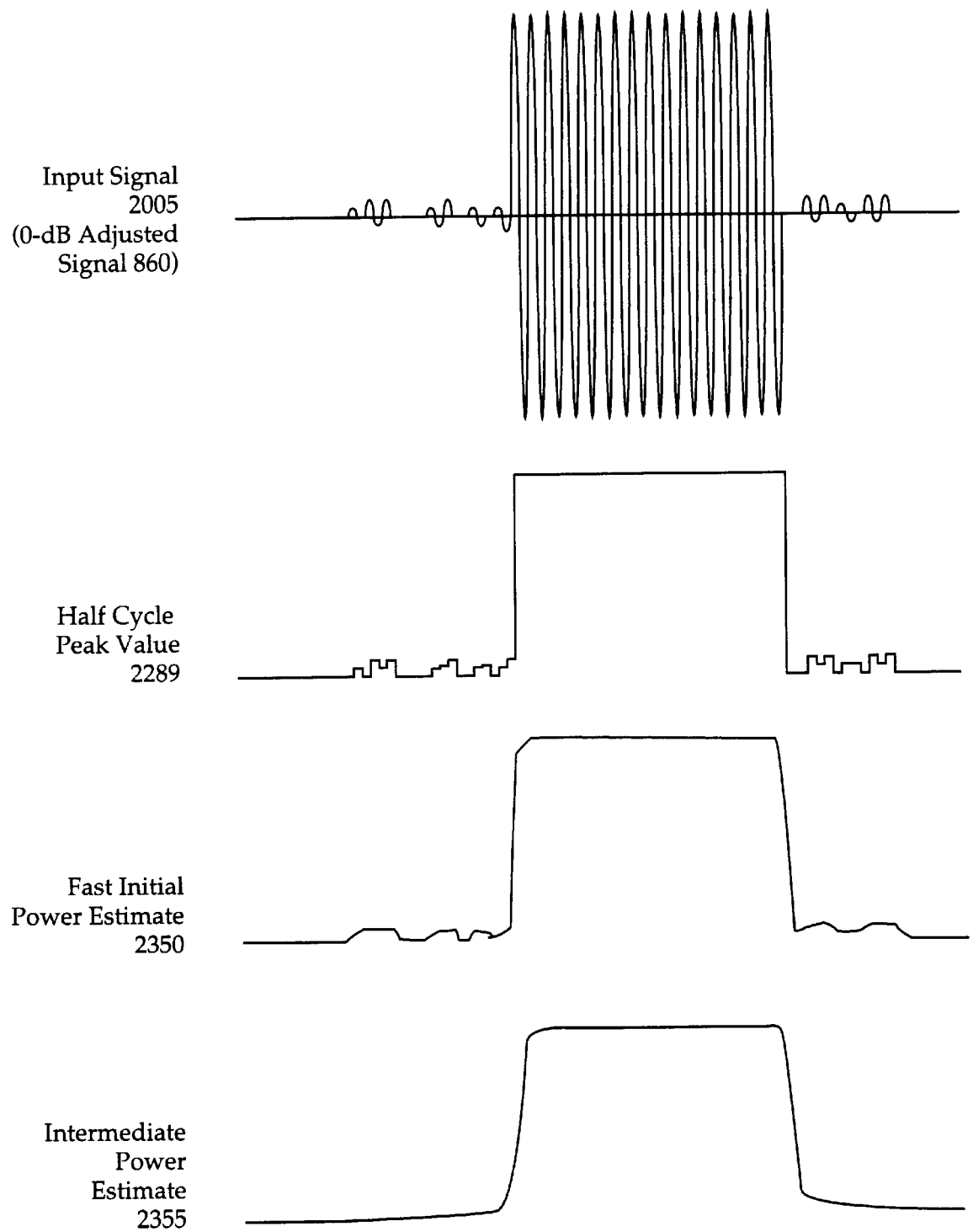
FIG. 23C shows exemplary Half-Wave Power Estimator Signals.

Referring next to FIGS. 23A–23C, an exemplary embodiment of a half-cycle power estimator 2270 and an initial power estimator 2271, each respectively shown by a dashed line box, can be better appreciated. FIG. 23B shows the relationship between the K and K' lowpass filter coefficients used in the initial power estimators of FIG. 23A and an increasing number of samples per half cycle (which corresponds to a decreasing frequency.) As the number of samples in a given half wave decreases, it is less likely that the peak input value will be sampled on every half cycle. This beating between the input and the sample rate causes fluctuations in the half cycle peak value which increase with increasing frequency (less samples per half cycle). The fluctuations can be eliminated by use of a lowpass filter however an adequate filter results in very slow response times to low frequency inputs. The second issue is that the effective sample rate of the digital lowpass filters decreases with input frequency since there are less half cycles per unit of time. This causes the corner frequency of the lowpass filters to decrease slowing the low frequency response even more. To counteract these effects, the lowpass filter coefficients of the initial power estimators can be made to vary with input frequency to produce a constant response Fc over all input frequencies as shown in FIG. 23B. Alternatively, the coefficients can be made to vary so that the response time is different for different input frequencies, for example, instant response for low frequencies and slower response for high frequencies. FIG. 23C shows a series of exemplary waveforms for the inputs and outputs of the stage of FIG. 23A and the action of variable attack and release portions 2275A. In successive sequence, each signal smooths the fluctuations of the previous signal. The intermediate power estimate 2355 is a serial combination of the slow initial power estimate 2360 of FIG. 23A and a variable attack and release portion described more fully in connection with FIGS. 24B and 24C. The slow initial power estimate is responsible for the smooth appearance of signal 2355 while the variable attack/release is responsible for the rapid perturbation of the signal. This provides a smooth power estimate for low distortion companding while still being able to provide excellent tracking of the input power which is required for reduction or elimination of compander gain undershoots and overshoots and possible output clipping.

Referring particularly to FIG. 23A, the input signal 2005, typically 0 dB adjusted signal 860, is supplied to the zero crossing detector 2070 and to a peak detector 2305. The output of the zero crossing detector 2070 provides as its output to inverting reset inputs of the peak detector 2305 and sample counter 2310, and also to the non-inverting clock inputs of a "number of samples" register 2315 and peak value register 2320. The sample clock 2105 serves as a count input to a sample counter 2310, and provides its output to the register 2315. Similarly, the output of the peak detector 2305 serves as the input to the peak value register 2320. This allows the half cycle power estimator sample length counter and peak detector value to transfer to the initial power estimator at an input signal zero crossing to start the half wave signal processor. The sample length counter and peak detector are then reset for the next half cycle.

The peak value in 2320, with appropriate filtering, provides a reasonable representation of the power of the 0 dB adjusted signal. The output of the "number of samples" register 2315 can readily be seen to be the number of samples taken of a signal between zero crossings. In an exemplary arrangement, the output of the samples register 2315 is supplied to a look-up table 2325 which relates the number of samples to filter pole parameters K and K' and equalization EQ. The lookup table 2325 may be configured for, for example, 16K samples/second. The EQ value from the lookup table 2325 is supplied to a multiplier 2330, where it is combined with the peak value signal 2335 from the peak value register 2320. This compensates for the effective lowering of higher frequency peak half cycle values since it is less likely that the peak input value will be sampled on every half cycle. The output of the equalizer 2330 is supplied to a low pass filter/intermediate power estimator 2340, which also receives the K filter pole parameter from the lookup table 2325. Similarly, the K' filter pole parameter is supplied from the lookup table 2325 to a low pass filter/ intermediate power estimator with external feedback 2345. The output of the low pass filter 2340 serves as a fast initial power estimator signal 2350, and is supplied as an output from the stage as well as an input to the filters 2340 and 2345. The filter 2345 also receives as an input an intermediate power estimate signal 2355 from the associated variable attack and release modules 2275A-v, which can be better appreciated from FIGS. 24A–C, and provides as its output a slow initial power estimate 2360. The values of K and K' basically define the corner frequencies of the low pass filters 2340 and 2345, such that varying values of K and K' causes the filters 2340 and 2345 to be variable low pass filters able to compensate for the issues discussed previously in FIG. 23B.

Figure 24A:
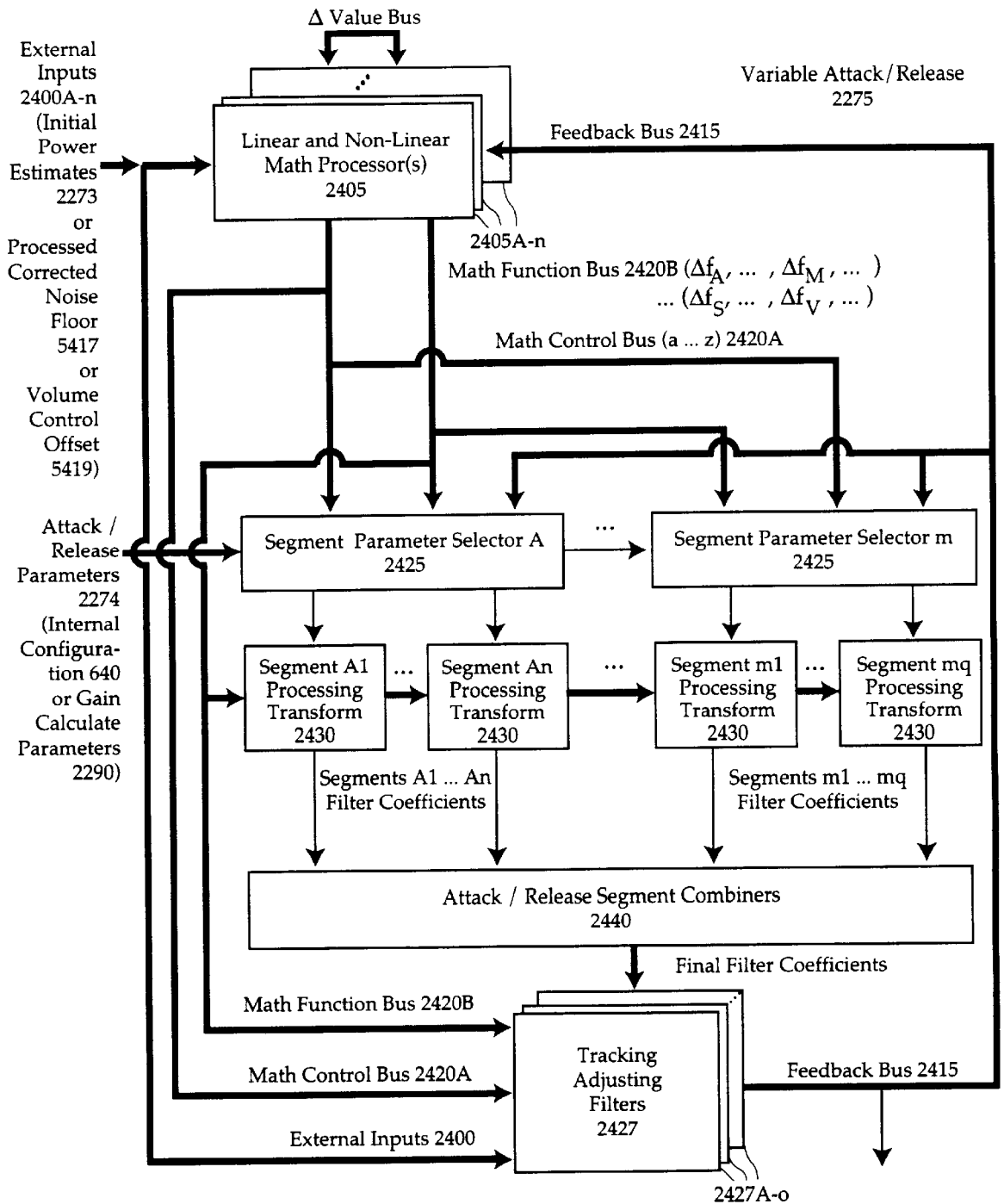
FIG. 24A shows a Generic Variable Attack/Release Block Diagram.
Figure 24B:
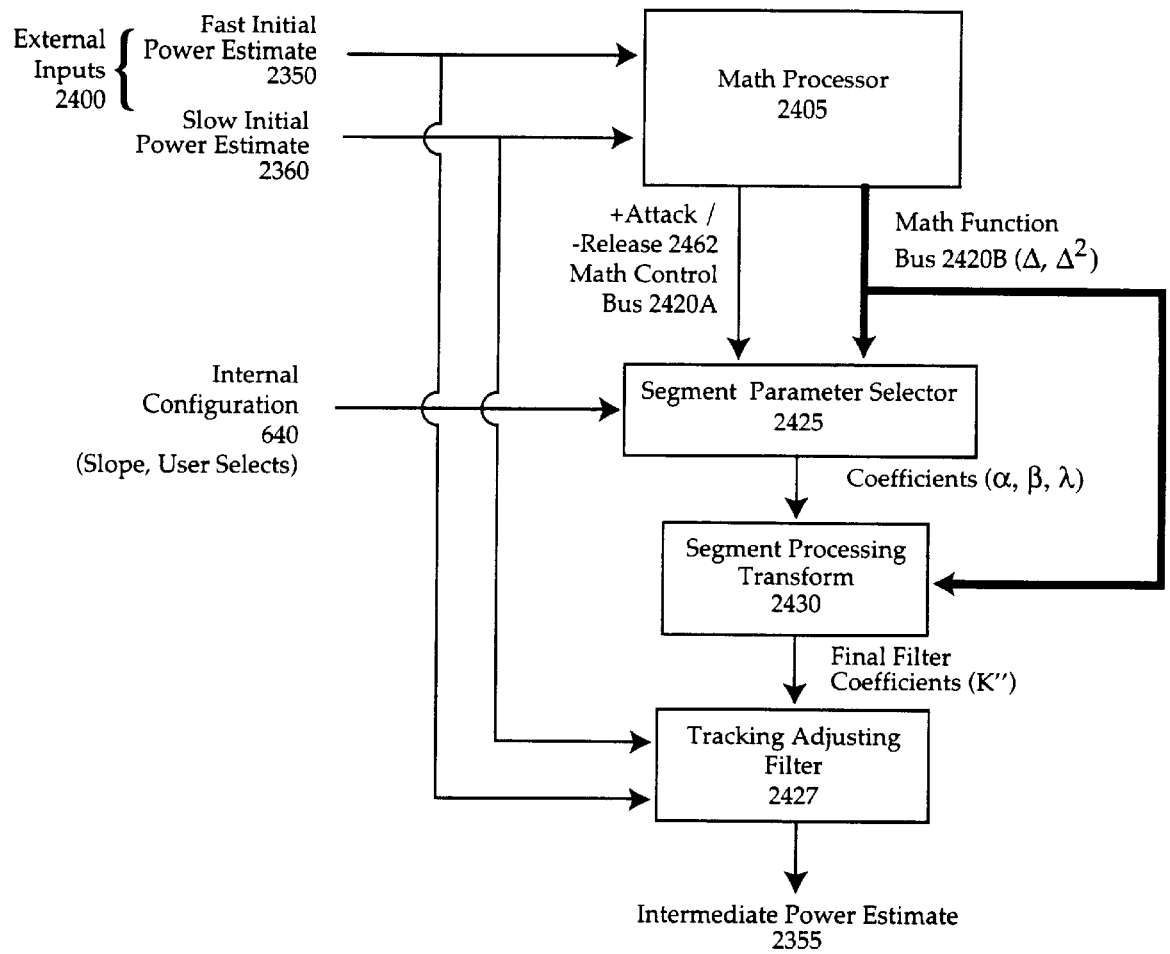
FIG. 24B shows a block diagram of a One K" Segment Variable Attack/Release Processor example.
Figure 24C:
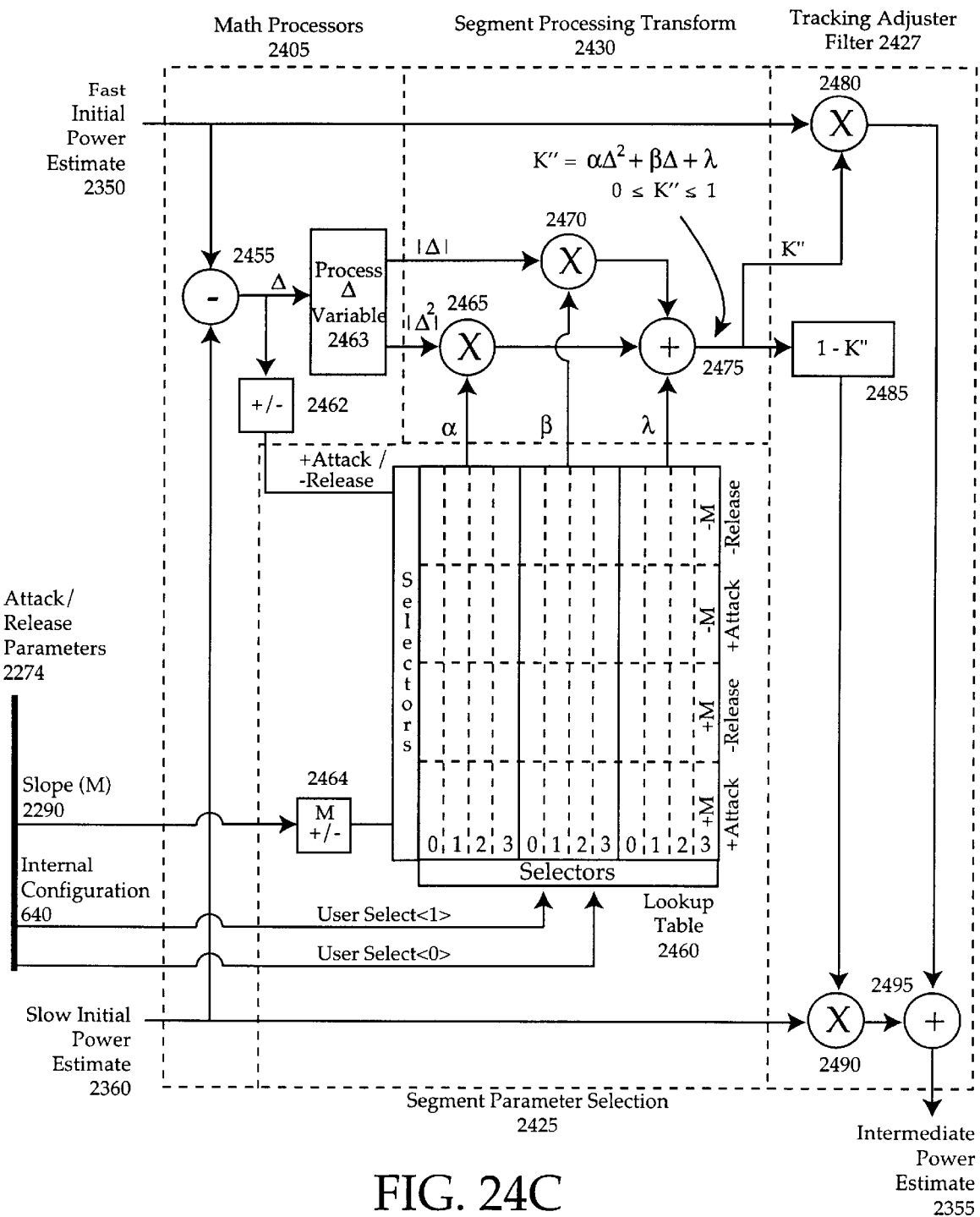
FIG. 24C shows an exemplary Embodiment of an Attack/Release Processor Using a Single Segment Nonlinear Adjuster Coefficient K".
Figure 24D:
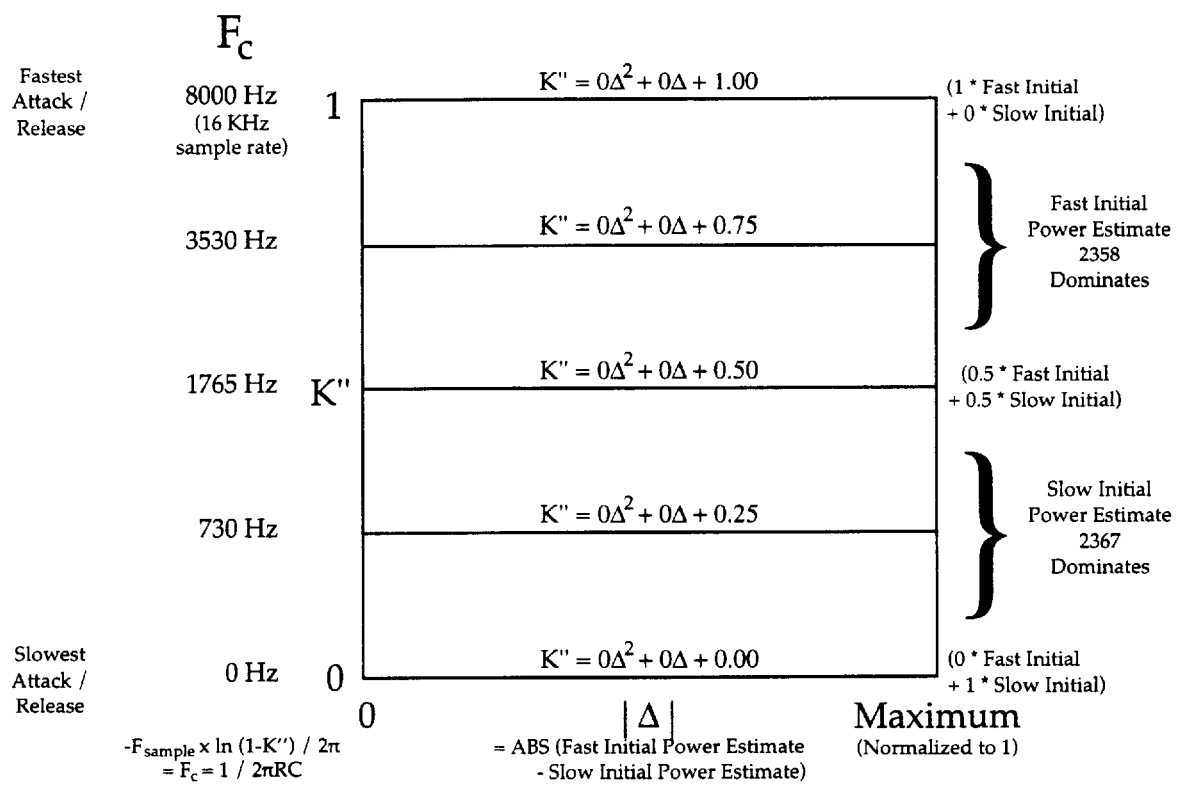
FIG. 24D shows a Fixed Tracking Adjuster Filter Coefficient K" Graph.
Figure 24E:
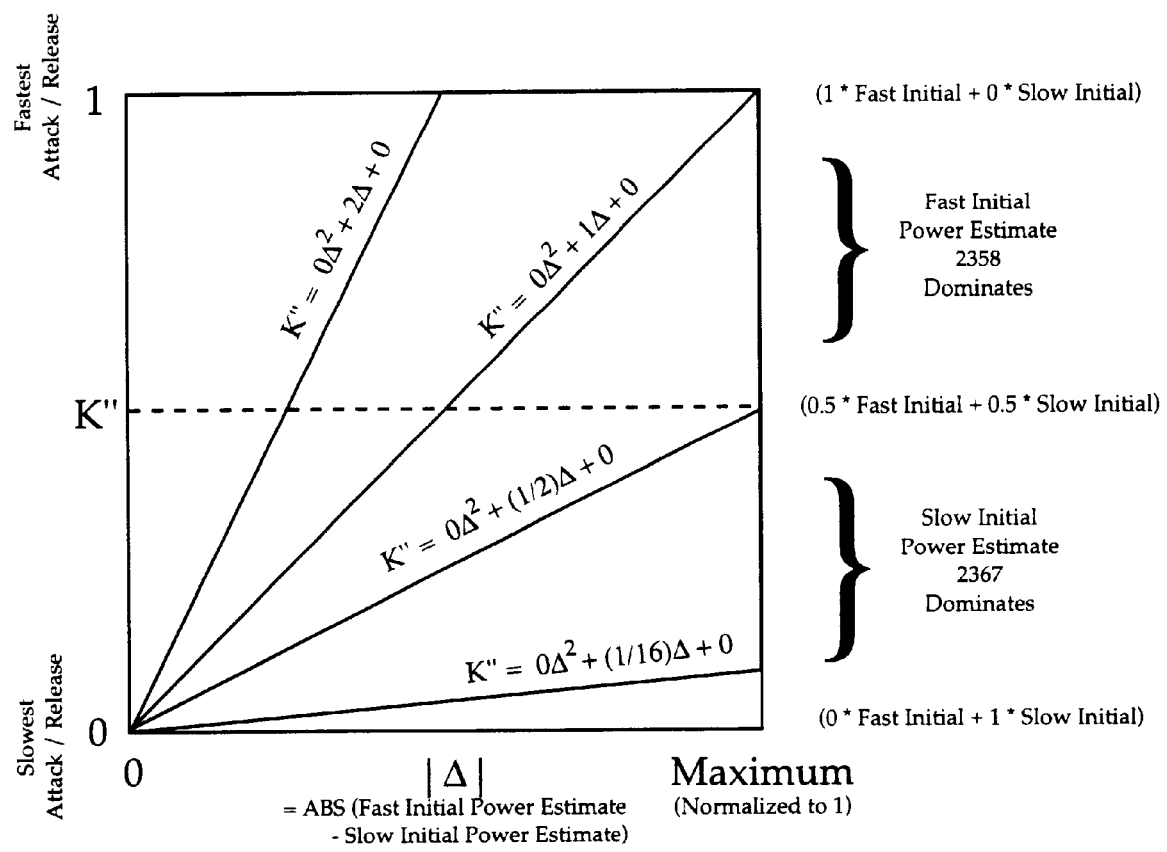
FIG. 24E shows a One Segment Linear Variable Attack/Release Graph Using K"=B*Δ+A Segment Processing Transform.
Figure 24F:
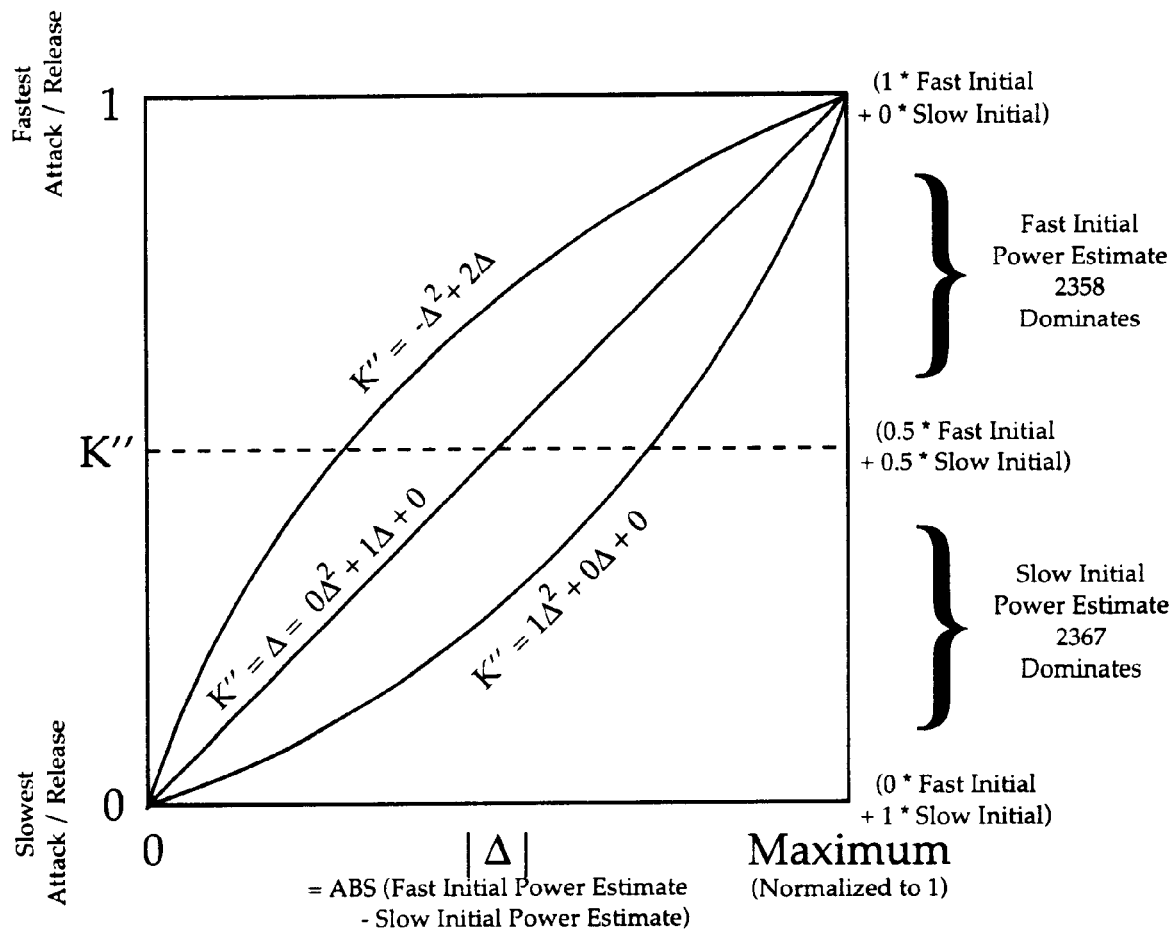
FIG. 24F shows a One Segment Nonlinear Variable Attack/Release Graph Using K"=A*Δ**2+B*Δ+C Segment Processing Transform.
Figure 24G:
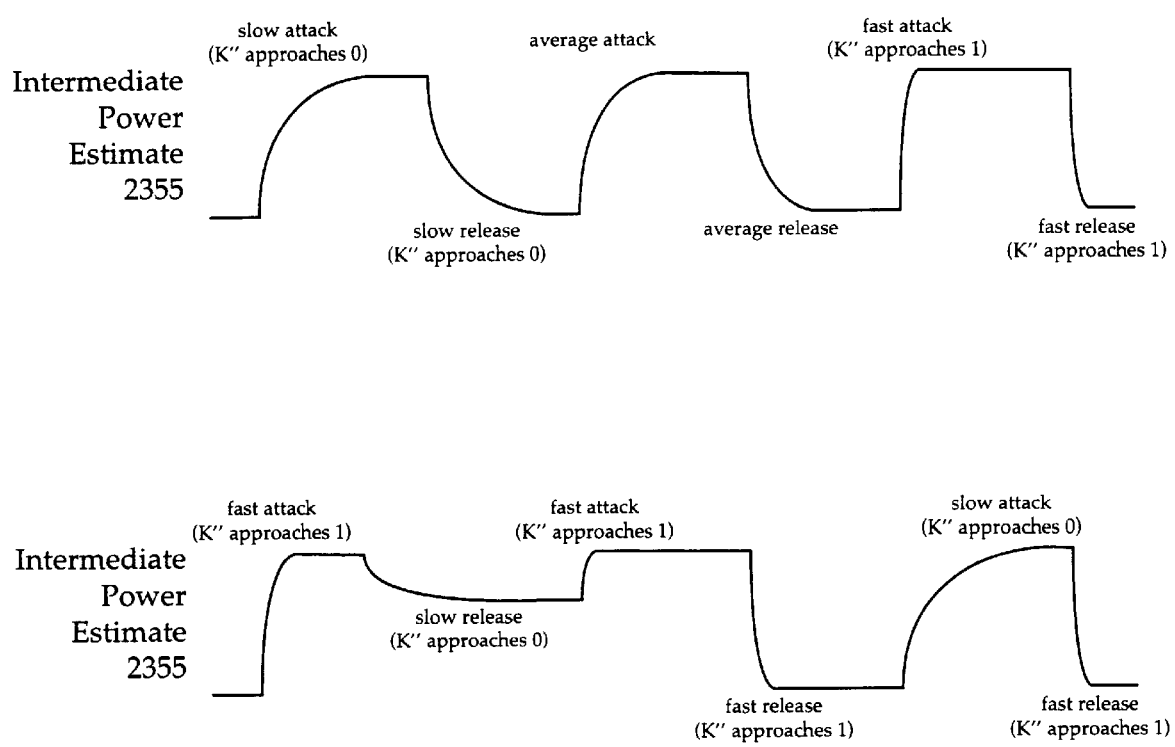
FIG. 24G shows examples of Intermediate Power Estimates for Compander Use.

Referring next to FIGS. 24A–24G, which show in greater detail the variable attack and release portion 2275, FIG. 24A can be seen to show logic for a generalized variable attack and release portion 2275 which may include multiple linear or non-linear segments. FIG. 24B shows an example of a single segment variable attack and release portion which can be either linear or non-linear. FIG. 24C shows a preferred embodiment of a single segment nonlinear attack and release module with a filter coefficient K". FIG. 24D shows the relationship between various fixed attack and release values of K" ranging from 0 (slowest attack and release) to 1 (fastest attack/release) for the preferred embodiment of FIG. 24C. FIG. 24E shows a plot of one segment linear transforms for varying values of B where K" is defined by the relationship BΔ. The delta variable is the absolute value of the difference (typically linear or log based) between a fast initial power estimator 2350 and a slow initial power estimator 2360. The difference represents the error between the fast tracking (more realistic) and the slow tracking (for low distortion) filter outputs. This error can be applied to a variety of math functions, in this case a simple linear equation, to produce varying degrees of perturbation of the slow filter to more accurately track the input signal while still providing low distortion. It will be appreciated that fast initial power estimates dominate at the upper range of the plot, while slow initial power estimates dominate at the lower range of the plot. FIG. 24F shows a plot of non-linear single segment transforms where K" is defined by the equation K"=$\alpha\Delta^2+\beta\Delta+\lambda$, while FIG. 24G shows the variable attack and release output waveforms which result from various values of K".

With specific reference first to FIG. 24A, a plurality of inputs 2400A-n (which may, for example, be the initial power estimates 2273, or noise floor value 5417, or volume control offsets 5419) are supplied to a plurality of math processors 2405A-n. The math processors, which may be broadly thought of as a comparison stage, include both linear and non-linear processing functions, can exchange calculation results over the $\Delta$ Value bus, and also receive feedback inputs from a feedback bus 2415. The math processors output functional expressions on a math control bus 2420A and a math function bus 2420B. The math processors 2405 perform calculations on the external, feedback, and $\Delta$ value inputs to provide the variables for the segment parameter selectors 2425A-m, segment processing transforms 2430A1-mq and tracking adjusting filters 2427A-o which are provided via the math function bus 2420B. The math processors can also contain state machines and logic, the results of which are provided to the segment parameter selectors 2425A-m and tracking adjusting filters 2427A-o via math control bus 2420A. Segment parameter selectors 2425 are used to facilitate the approximation of complex segment processing functions by the use of a plurality of segments of simpler functions. Redundant hardware or computations can be eliminated by the ability of each segment parameter selector to provide inputs to many segment processing transforms. The segment parameter selectors 2425 may be broadly thought of a first stage that operates on math processor outputs which may be modified by a second stage responsive to user preference signals, feedback signals, etc. A plurality of segment parameter selectors and associated segment processing transforms can be used for processing different math function inputs or implementing different attack and release behaviors, for example linear difference processing and logarithmic difference processing. The segment parameter selectors 2425 also receive as inputs various attack/release parameters 2274, typically internal configuration parameters 640 or gain calculate parameters 2290, which can be supplied either from the user interface 405 or the transform engine 410, both of which were discussed in connection with FIG. 4. The outputs of the segment parameter selectors 2425A-m provide a plurality of coefficients to an associated plurality of segment processing transforms 2430; thus, segment parameter selector 2425A has associated therewith segment processing transforms 2430A1–2430An, while segment parameter selector 2425m has associated therewith segment processing transform 2430m1 through 2430mq. The segment processing transforms 2430 each receive as an additional input the function bus outputs from the math processors 2405A-m via the function bus 2420B.

The output of each of the segment processing transforms 2430, which may be broadly thought of as a transform stage, is a segment filter coefficient, which is supplied to an attack/release segment combiner 2440, which may be broadly thought of as a combiner stage. Here the segment filter coefficients can be blended or the appropriate one selected for use on the various tracking adjusting filters. The attack/release segment combiner 2440 generates a plurality of final filter coefficients and supplies them to the tracking adjusting filters 2427A-o, which may be broadly thought of as a tracking filter and can be a low pass filter similar to the low pass filters 2340 and 2345 (discussed in greater detail in connection with FIGS. 24B–24F), or can be more complicated such as will be discussed in connection with FIG. 57A and 57B. The output of the filters 2427 are supplied as the local intermediate power estimates 2279, or noise signals 5425 and 5427, and are also supplied to the math processors 2405A-n via the feedback bus 2415, as discussed previously. The operation of the math processors 2405A-m, segment selectors 2425A-m, transforms 2430, combiners 2435 and 2440 and filter 2430 will each be discussed in further detail hereinafter.

With specific reference to FIG. 24B, a single segment transform can be better appreciated. External inputs 2400, in this example the fast initial power estimator signal 2350 and the slow initial power estimator signal 2360, are provided to the math processor 2405, which provides both a set of attack and release parameters (bus 2420A) and difference and difference squared variable values (bus 2420B) to a segment parameter selector 2425. The segment parameter selector 2425 also receives inputs 640 consisting of compander slope and user selects information. The selector 2425 outputs a plurality of segment filter coefficients to a segment processing transform 2430, which also receives the difference variables via the bus 2420B and in turn generates a final filter coefficient K". The final filter coefficient K" is supplied to the tracking adjusting filter 2427, which also receives the fast initial power estimator signal 2350 slow initial power estimator value 2360. The tracking adjusting filter 2427 outputs an intermediate power estimate 2355, which is an element of bus 2279.

Next referring to FIG. 24C, there is shown therein a preferred embodiment of a single segment attack and release module with a nonlinear filter coefficient K". The configuration of elements from FIG. 24B is shown in dashed lines in FIG. 24C, including the math processor portion 2405, the segment parameter selector 2425, the segment processing transform 2430, and the tracking adjusting filter 2427. In particular, the fast initial power estimate 2350 and slow initial power estimate 2360 (e.g., FIG. 23A) are provided to a difference calculation 2455. The difference 2455 is provided to logic 2462 which generates an attack and release logic signal for addressing a lookup table 2460. Lookup table 2460 is also addressed by compander slope 2290, which is converted to a positive/negative slope logic signal by element 2464, and one or more user interface internal configuration parameters 640. The lookup table generates the $\alpha$, $\beta$, and $\lambda$ values in response to the inputs, and supplies them to, respectively, multipliers 2465 and 2470 and adder 2475. The remaining inputs to the multipliers 2465 and 2470 are provided by the process $\Delta$ variables block 2463, which can perform additional computations (such as the difference squared) and can also perform numeric conversions on any input values or calculation results (e.g. linear to logarithmic conversions). The outputs of the multipliers 2465 and 2470 are combined with the value in adder 2475 to establish the value K". The results from the adder 2475 are supplied to tracking adjusting filter 2427, in this example to a multiplier 2480 and to a subtractor 2485 which determines the values of 1-K". The value of 1-K" is then combined in a multiplier 2490 with the slow initial power estimate 2360. The value K" is combined with the fast initial power estimate 2350 in the multiplier 2480, the output of which is added to the output of the multiplier 2490 in adder 2495 to yield the intermediate power estimate 2355 (part of intermediate power estimators 2279).

The transform characteristics of attack and release portion can thus be seen to depend in large measure on the values used in establishing the value of K". Shown in the table below are various considerations for combinations of fast or slow attack and fast, moderate or slow release. The results of the varying attack and release values on the intermediate power estimates 2279 can be seen graphically from FIG. 24G. The compress and expand tables shows how different $K''=\alpha\Delta^2+\beta\Delta+\lambda$ equations are used for compressing or expanding signals and different user selectable attack/release responses. The slope=+/−M, +attack, −release, and user select signal can be found in FIG. 24C example.

Compress Table

| Compress (Slope = +M) | +Attack (Δ = Positive) | −Release (Δ = Negative) | Comment |
|---|---|---|---|
| User Select 0 | $K'' = 0\Delta^2 + 1\Delta + 0$ (fast linear attack) | $K'' = 1\Delta^2 + 0\Delta + 0$ (moderate non-linear) | Maximum linear attack, good compromise between fast transient response & "breathing", for compression ratios: 1:1 to 10:1 |
| User Select 1 | $K'' = 0\Delta^2 + 1\Delta + 0$ (fast linear attack) | $K'' = 0\Delta^2 + 1\Delta + 0$ (fast linear release) | Linear maximum attack & release, provides good transient response, good for data signal capture, but not for voice. Pumping and warble problems. |
| User Select 2 | $K'' = 0\Delta^2 + 0\Delta + 0\Delta$ (slowest attack) | $K'' = 0\Delta^2 + 0\Delta + 0$ (slowest release) | Slowest response, lowest distortion, worst transient response |
| User Select 3 | $K'' = 0\Delta^2 + 1\Delta + 1$ (fastest attack) | $K'' = 0\Delta^2 + 0\Delta + 0$ (slowest release) | Peak detect, never >0 dB, no crest factor problem. Good for compression ratios >10:1. Worst release response which can cause under amplification of weak signals. |

Expand Table

| Expand (Slope = −M) | +Attack (Δ = Positive) | −Release (Δ = Negative) | Comment |
|---|---|---|---|
| User Select 0 to 3 | $K'' = 0\Delta^2 + 1/16\Delta + 0$ (slow linear attack) | $K'' = 0\Delta^2 + 0\Delta + 0$ (slowest release) | Preferred, causes lowest amount of "breathing effect" distortion |

Figure 25A:
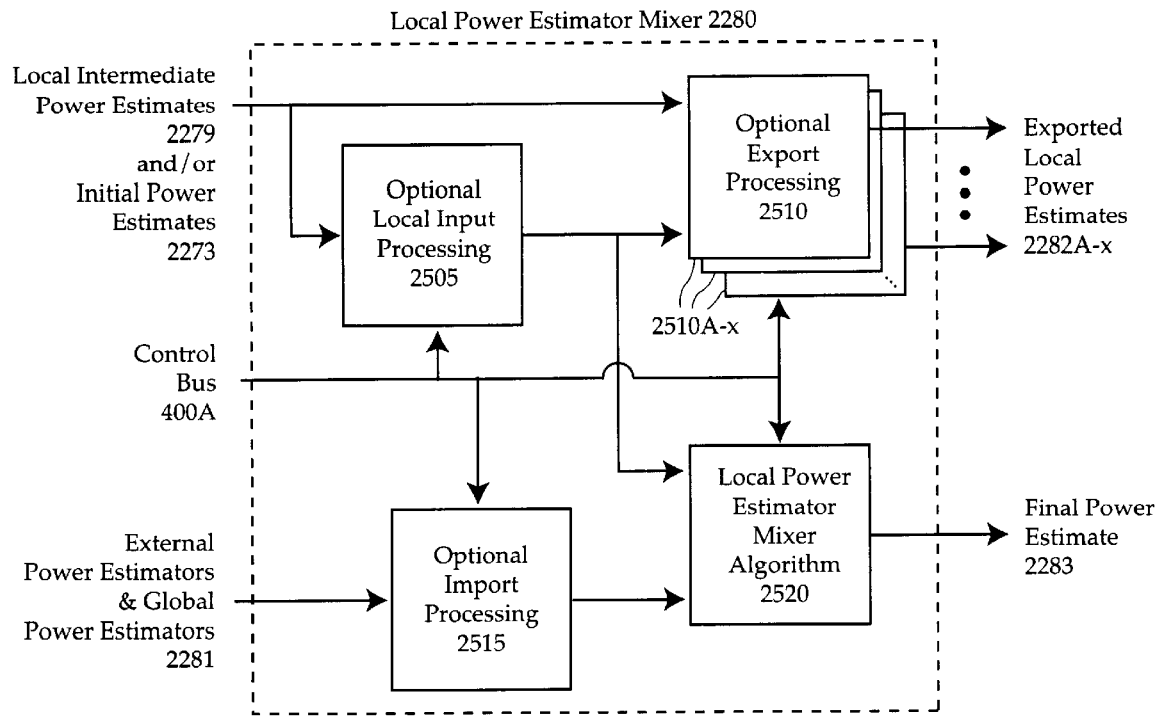
FIG. 25A shows a Local Post Power Estimator Mixer Found in Each Compander.

Referring next to FIG. 25A, the operation of the local power estimator mixer 2280 may be better appreciated. The local intermediate power estimates 2279 or initial power estimates 2273 from each local channel/band input power estimate may, if desired, be supplied to a local input processing function 2505 and export processing functions 2510A-x. The local input processing function also receives control inputs from the bus 400A, which likewise supplies control signals to the export processing functions 2510A-x as well as an import processing function 2515 and a local power estimator mixer function 2520. The import processing function operates on the external powers estimates and global power estimates 2281 and provides its output to the local power estimator mixer function 2520, which receives the output of the local input processing function 2505 as another input. The local input processing function 2505, export processing functions 2510A-x, and import processing function 2515 are each optional, depending on the particular implementation desired; one or all may be eliminated in specific implementations of the present invention, yet provide more robust functionality when implemented. Examples of local input processing are combining a plurality of local power estimates into a single local estimate or selecting the appropriate input such as the largest or smallest input value. An example of export processing is the modulation of a carrier wave for transmission to a central or another local power estimator. Import processing would then demodulate the signal. The primary output of the mixer 2280 is supplied by the local power estimator mixer 2520 and forms the final power estimate 2283. The local power estimator mixer 2520 combines the internal and external power estimates or selects the appropriate one.

Figure 25B:
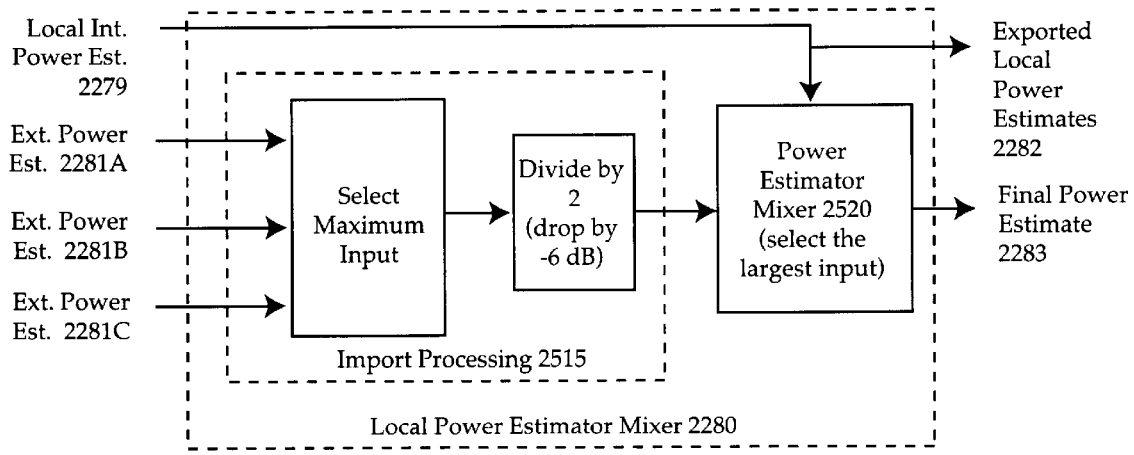
FIG. 25B shows a Local Post Power Estimator Mixer example with multiple external inputs.

FIG. 25B shows an example of a local power estimator with one local power estimate and three external power estimates. A local power estimate signal 2279 is supplied to power estimator mixer 2520 and is also provided as an exported power estimate signal 2282. There is no optional export processing in this example. External power estimates 2281A,B,C are provided to import processing logic 2515 where the maximum external power estimate value is selected, divided by a factor of two and supplied to power estimator mixer 2520. Power estimator mixer 2520 then selects the larger of the local or import processed external power estimate for use as a final power estimate signal 2283. The import processed power estimate signal is divided by two so that if all bands or channels are close to the same power estimate value, the local power estimate value has priority and thus reduces distortion.

Figure 26A:
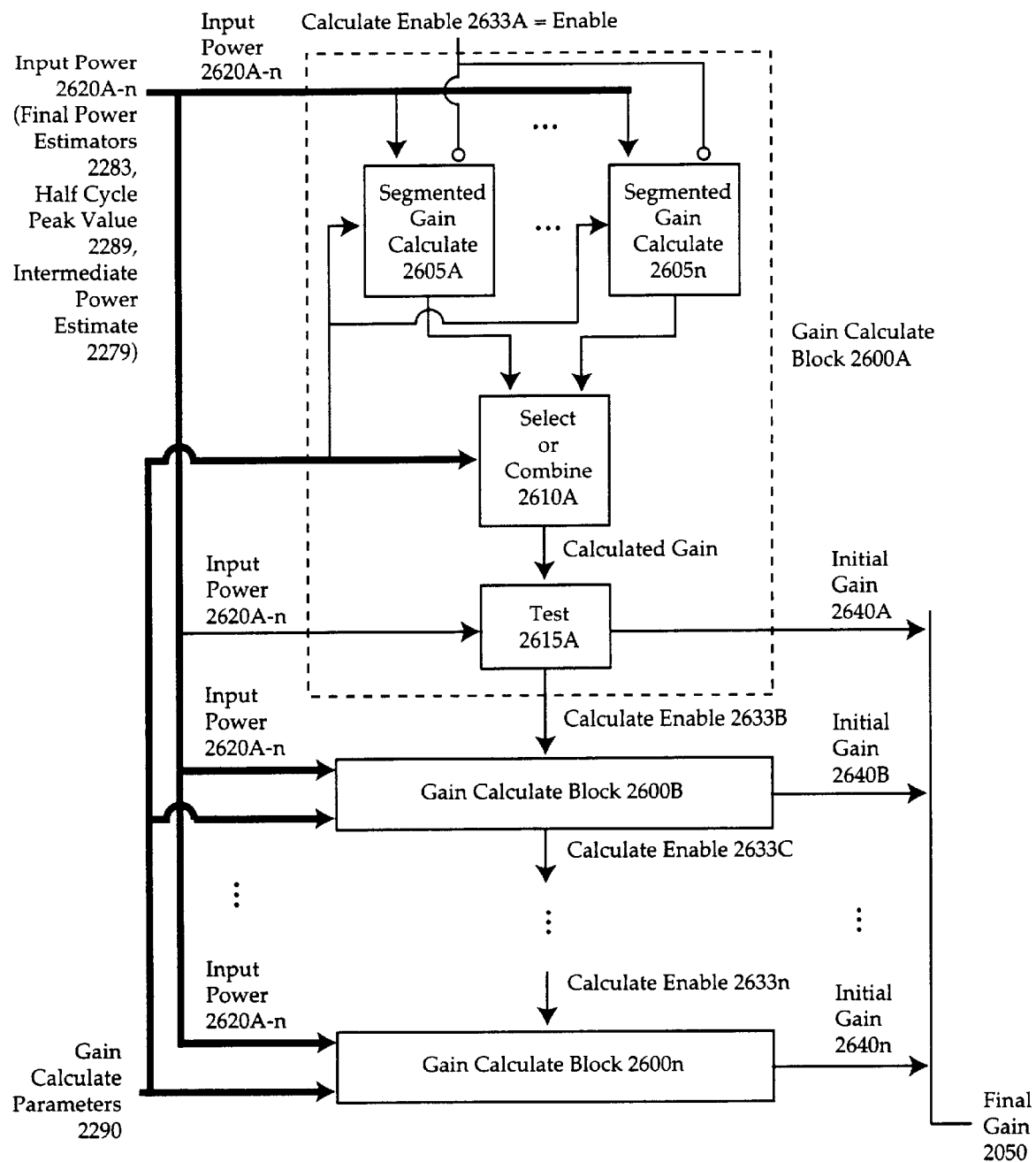
FIG. 26A shows a Generic Gain Calculate Block Diagram example of a Segmented Mapping Converter.

Referring next to FIG. 26A, a generic example of a Segmented Mapping Converter to perform the gain calculate 2285 portion of FIG. 22 can be better appreciated. The gain calculate portion shown in FIG. 26A can be seen to include a plurality of gain calculation blocks 2600A-n, each of which receives an associated input power signal 2620A-n, a daisy-chained calculate enable signal 2633A-n, which may be broadly thought of as command enable signals, and gain calculate parameters 2290, which may be broadly thought of as transform parameters. The input power signals 2620A-n can be received from the final power estimators 2283, half cycle peak values 2289, or the intermediate power estimates 2279. Each gain calculate block 2600A-n comprises segmented gain calculate logic block 2605A-n, which may be broadly thought of as segmented transform processors, where each such logic block 2605A-n receives both the associated input power signal, e.g. 2620A, the associated calculate enable signal, e.g. 2633A, and gain calculation parameters 2290. The output of the segmented gain calculate logic blocks 2605A-n are selected or combined in select or combine logic block 2610A, the calculated gain output (also referred to as a select/combine output) of which is then provided to test logic 2615A. This allows for parallel gain computations, with the gains being combined or the appropriate gain being selected in block 2610A, the combining or selection parameters being provided by gain calculate parameter 2290. Each gain calculate block 2600A-n generates as an output signal an initial gain signal 2640A-n, which can be seen from gain calculate block 2600A to be taken from the associated test logic, e.g. 2615A. Each test logic block 2615A-n can also be seen to provide the calculate enable signal 2633B-n to the next successive gain calculate block 2600B-n. Since there is at least one gain calculate block, the first block 2600A has as a default the Calculate Enable 2633A always true or enable. Test logic block 2615A tests the Calculated Gain signal provided by select or combine block 2610A and if useable (test passes) passes the 2610A Calculated Gain to become the Initial Gain 2640A and sets Calculate Enable 2633B to "false" to disable any further calculations by subsequent 2600B-n Gain Calculate blocks. If test logic block 2615A determines that the gain signal provided by select or combine block 2610A is not useable (test fails) then the Calculated Gain is not passed to Initial Gain 2640A and calculate enable 2633B is set to "true" to enable subsequent gain calculation blocks. The Calculate Enable can also include additional information, such as a command, that the segmented gain calculate blocks 2605 can use in gain calculation. The 2615 test block testing allows for serial gain calculations to be performed until a useable gain has been calculated. Note that the last gain calculate block need not include test block 2615. The initial gain signals 2640A-n are made available for subsequent processing as final gain signal 2050.

Figure 26B:
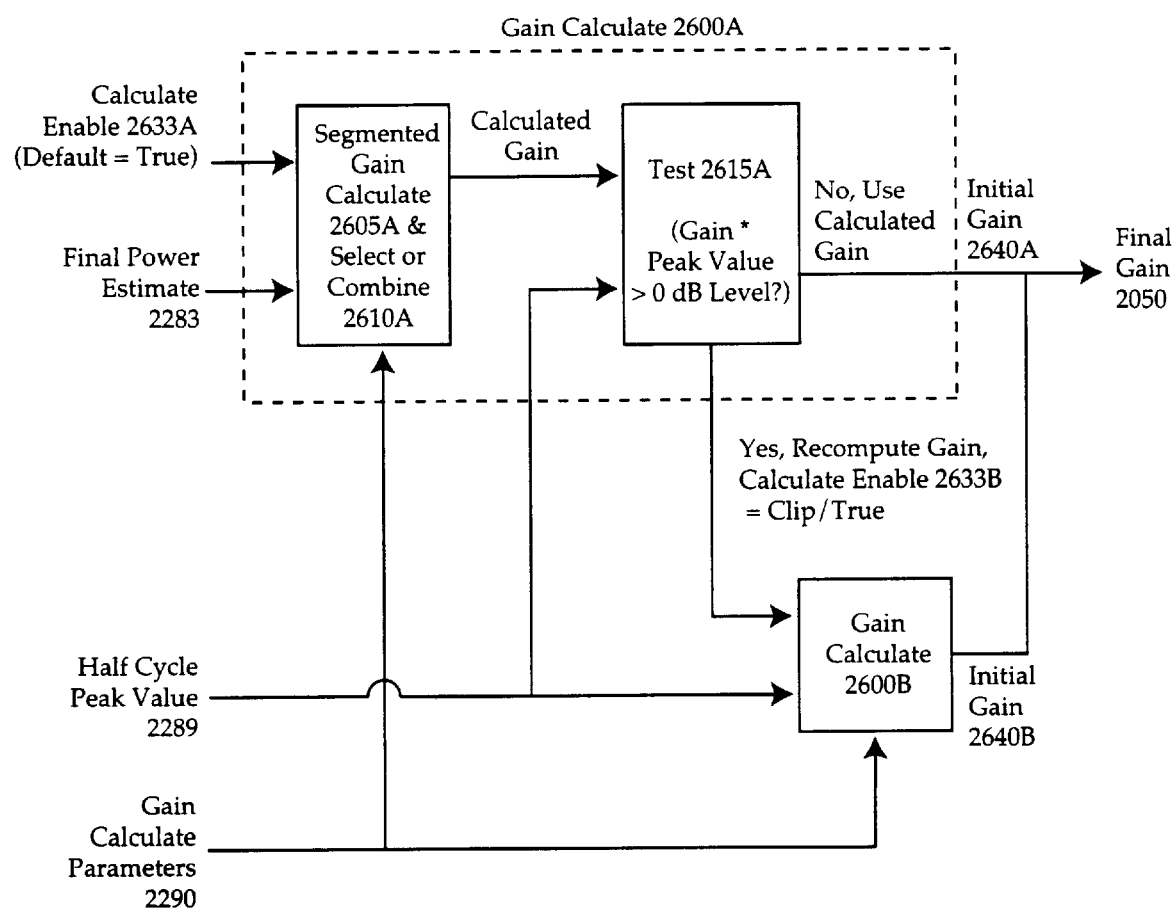
FIG. 26B shows an exemplary Serial Gain Calculate Embodiment with Predictive Clip Detection and Gain Correction.

While FIG. 26A shows a generic form of gain calculate block, FIG. 26B illustrates a particular embodiment in which a serial implementation is used, where the gain calculation is combined with a predictive clip detection and gain correction function. In particular, gain calculate block 2600A is provided with the calculate enable signal 2633A, set to a true default setting since it is the first gain calculate block, and the power estimate signal 2620, in this example final power estimate 2283. Those signals are used by segmented gain calculate block 2605A and select or combine block 2610A, together with gain calculate parameters 2290, to perform the gain calculation portion of the gain calculate block 2600A, which results in the calculated gain value. The calculated gain value is then tested (as shown at 2615A) to determine whether the resulting gain will result in signal clipping (compander output exceeds the 0 dB level) by multiplying the half cycle peak value 2289 by the calculated gain and comparing the result to the 0 dB level. If no, the calculated gain is acceptable and is provided as initial gain 2640A and ultimately as the final gain signal 2050 for the stage. If, however, the computed gain multiplied by the half cycle peak value exceeds the 0 dB level, the clipping indication and enable is provided by the Calculate Enable 2633B signal to the next gain calculate stage 2600B, which also receives the half cycle peak value signal 2289 and the gain calculate parameters 2290. The gain calculate block 2600B then recalculates a corrected gain which will not produce a compander output that exceeds the 0 dB level, which is provided as initial gain 2640B and ultimately provided as the final gain 2050. It can be appreciated that, while FIG. 26B shows only two gain calculate stages 2600, multiple such stages may be used.

An alternative parallel implementation can be realized by computing the gain based on the final power estimate and half cycle estimates in parallel segmented gain calculate blocks 2605A,B and then selecting the non-clipping gain in the select or combine block 2610A. In this case, test 2615A is not required since the correct gain was previously selected by block 2610A.

Figure 26C:
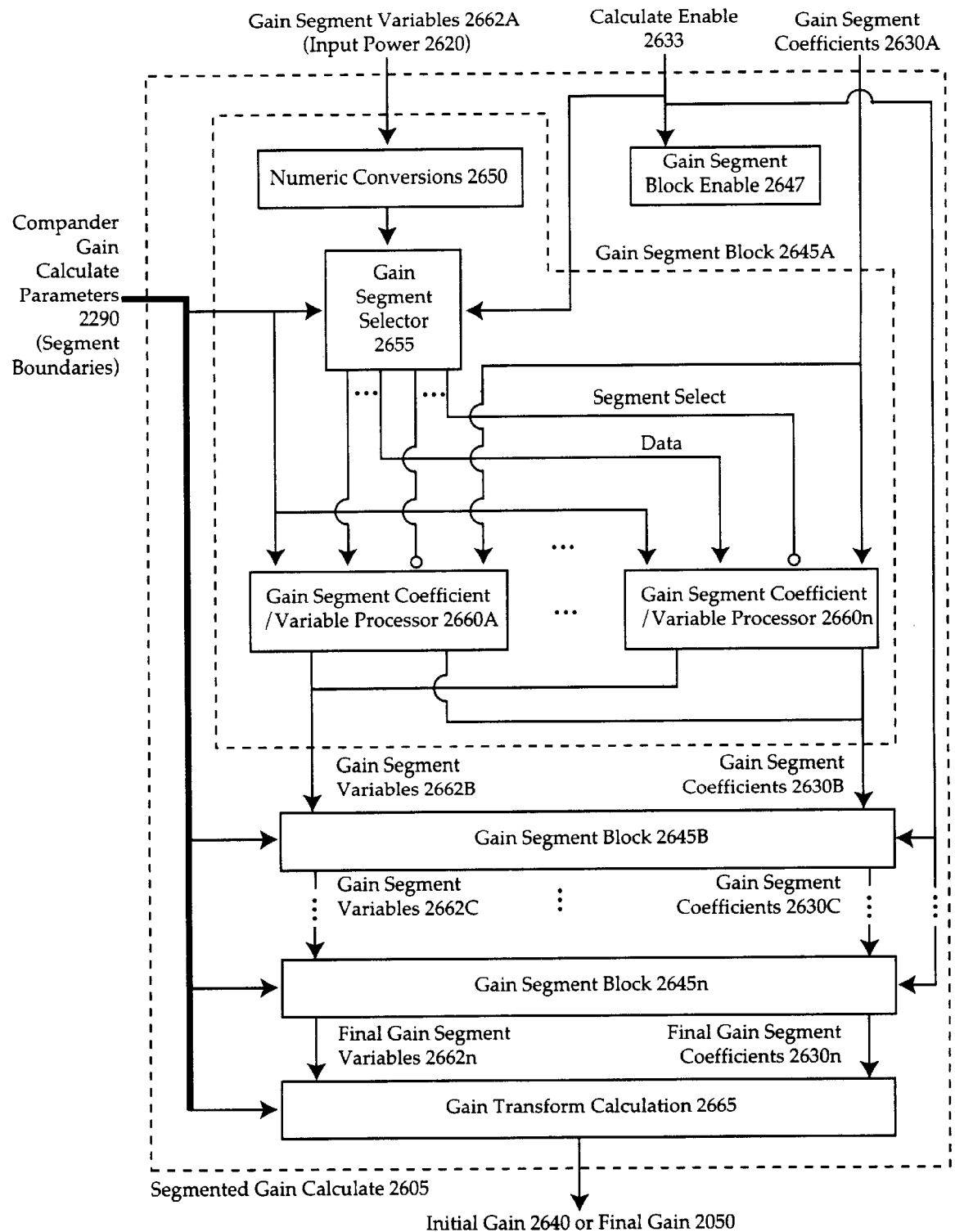
FIG. 26C shows a Generic Segmented Gain Calculate Block Diagram.

Referring next to FIG. 26C, the segmented gain calculate block 2605 of FIG. 26A may be better appreciated. In particular, FIG. 26C shows the gain segment variables 2662A, typically for the first gain segment block 2645A being the input power signal 2620, being provided to a gain segment block 2645A, which may be broadly thought of as a segment selection processor, and in particular to a numeric conversions logic block 2650 within the block 2645A. The numeric conversions block may be used to perform, for example, a linear-to-logarithmic conversion to simplify subsequent calculation, although such conversion is not required in all instances. The calculate enable signal 2633 is provided to gain segment block enable logic 2647 which allows overall processing in this block to occur and to gain segment selector 2655 for use in determining which gain segment/variable processor 2660A-n to use. The output of the numeric conversions logic 2650, if used, is provided to a gain segment selector 2655, which also receives as an input the gain calculate parameters 2290, which includes definition of the segment boundaries. While complicated non-linear gain calculations can be used, it is sometimes desirable to divide the input power 2620 range into segments, where each segment uses a less complicated calculation, to emulate the more complicated calculation. The gain segment selector logic 2655 basically divides the input power range into appropriate segments, and selects and passes data to the gain segment/variable processor 2660A-n appropriate for the current input power 2620 value. Each of the processors 2660A-n receives the gain calculate parameters 2290, and from the gain segment selector 2655 receives data and a segment select signal. In addition, the processors each receive a gain segment coefficients signal 2630. Typically, the first gain segment block 2645A does not require any gain segment coefficients 2630A. Each processor thereupon develops a gain segment variable 2662 and a gain segment coefficient 2630, which can be provided to subsequent gain segment blocks 2645B-n. The use of multiple levels of gain segment blocks allows for serial segmenting of the input power range. For example, the first gain segment block may divide the input power range into two segments, one if the input power is greater than 0 dB and one if less, and may do the selection using linear input values while the second gain segment block may further segment the less than 0 dB segment into a middle and lower segment using logarithmic converted input power values, the input power being passed through the first gain segment block via gain segment variables 2662. Following processing of the various gain segment blocks 2645A-n, the final gain segment variables $2662n$ and final gain segment coefficients $2630n$ are provided to a gain transform calculation 2665, which may be broadly thought of as a transform processor, which outputs an initial gain value 2640 or, if appropriate, a final gain value 2050.

Figure 26D:
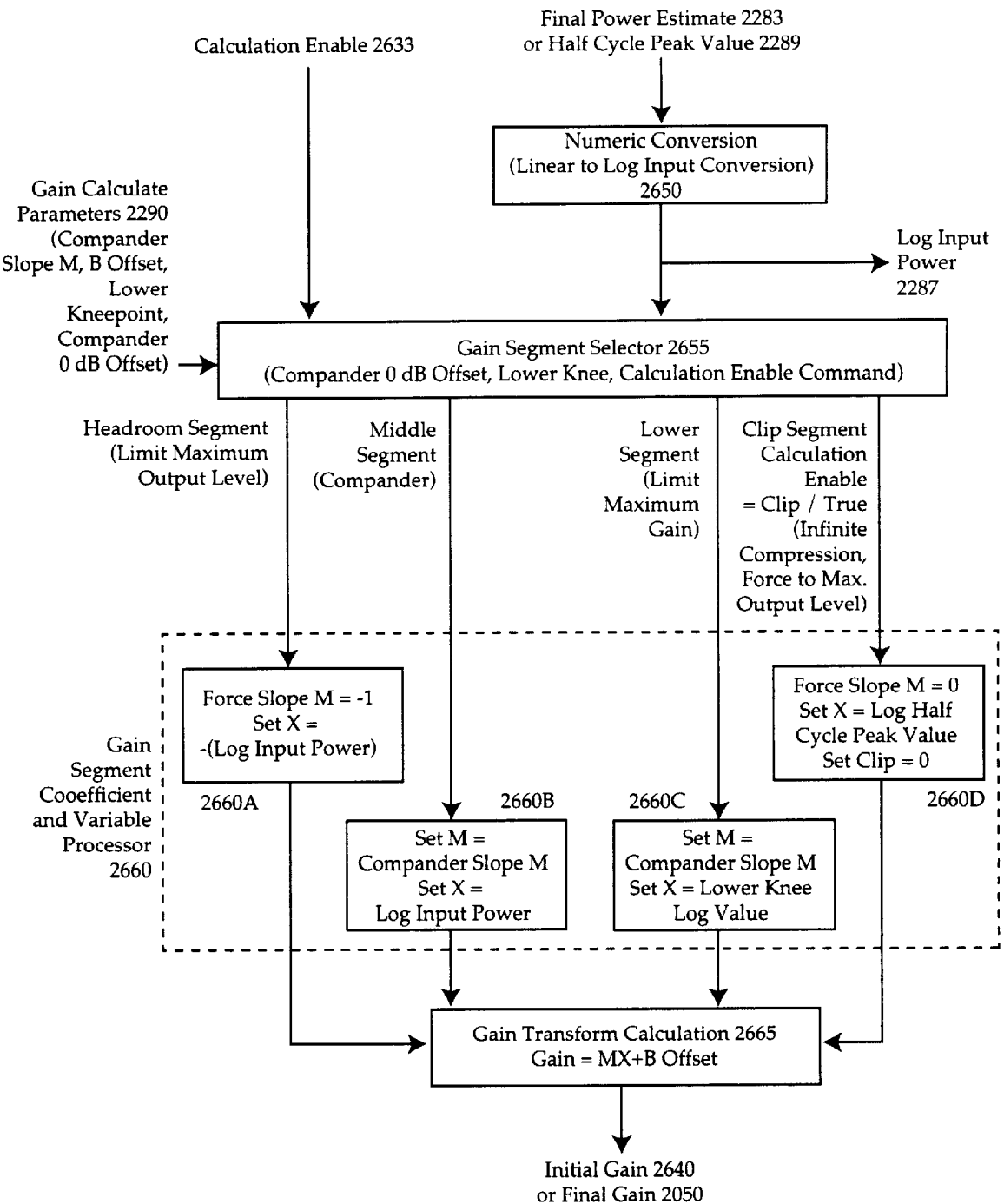
FIG. 26D shows a Gain Calculate Example Using Four Segments.

The segmented gain calculation function can be better appreciated from FIG. 26D, in which an exemplary implementation of the segmented gain calculate function of FIG. 26C is shown using one gain segment block of four segments. This exemplary implementation can also be used in gain calculate blocks 2600A and 2600B of FIG. 26B, the calculate enable 2633A and 2633B signals being used to select and enable the proper gain calculation. The first time through the gain segment block (e.g. block 2600A), the calculate enable 2633 is always enabled and indicates non-clipping and there are no coefficients 2630. The initial step is to perform a linear to logarithmic input conversion of the final power estimates 2283 as shown at numeric conversions block 2650, since this reduces the complexity of subsequent calculations. The gain segment selector 2655 then subtracts the compander 0 dB offset 2290 from the log input power 2287. The compander 0 dB level, which is based on a filtered long term average of the peak input power, can be different from the input level adjuster 0 dB level, which is based on peak input levels, due to the crest factor of the input source signal. If the resultant value is negative, then headroom segment 2660A is selected, causing the maximum output level to be limited. If, however, the gain segment selector resultant value is less than a lower kneepoint as specified by the compander gain calculate parameters 2290, then lower segment 2660C is selected, causing the maximum gain to be limited. Otherwise, the middle segment 2660B is selected, allowing normal compander operation. Note that the clip segment 2660D will never be selected due to calculate enable 2633 indicating a non-clipping state.

After the appropriate segment has been executed by the gain segment coefficient and variable processors 2660, the gain transform calculation 2665 computes the actual gain, in this example by use of a simple line equation, providing the calculated gain, initial gain 2640 or final gain 2050.

If predictive clipping is implemented, as in FIG. 26B, the clipping test would be performed and if clipping were to occur, gain calculate block 2600A would set the calculate enable 2633B signal to clipping and enable gain calculate block 2600B. The half cycle peak value 2289 is converted to a logarithmic value 2287 by numeric conversion block 2650. The gain segment selector 2655 then subtracts the compander 0 dB offset 2290 from the log input power 2287. Since the calculate enable signal indicates clipping, the clip segment 2660D is selected, the output used by gain transform calculation 2665 to compute a non-clipping gain value.

As an alternative implementation of FIG. 26B, the example of FIG. 26D can be split into two segmented gain calculate blocks. Gain calculate block 2600A would use a three segment segmented gain calculate block using gain segment coefficient and variable processor blocks 2660A, B,C, and Gain Calculate block 2600B would use a one segment segmented gain calculate block using gain segment coefficient and variable processor block 2660D. The calculate enable signal 2633 then does not require clipping information but additional software code or hardware is required.

Figure 26E:
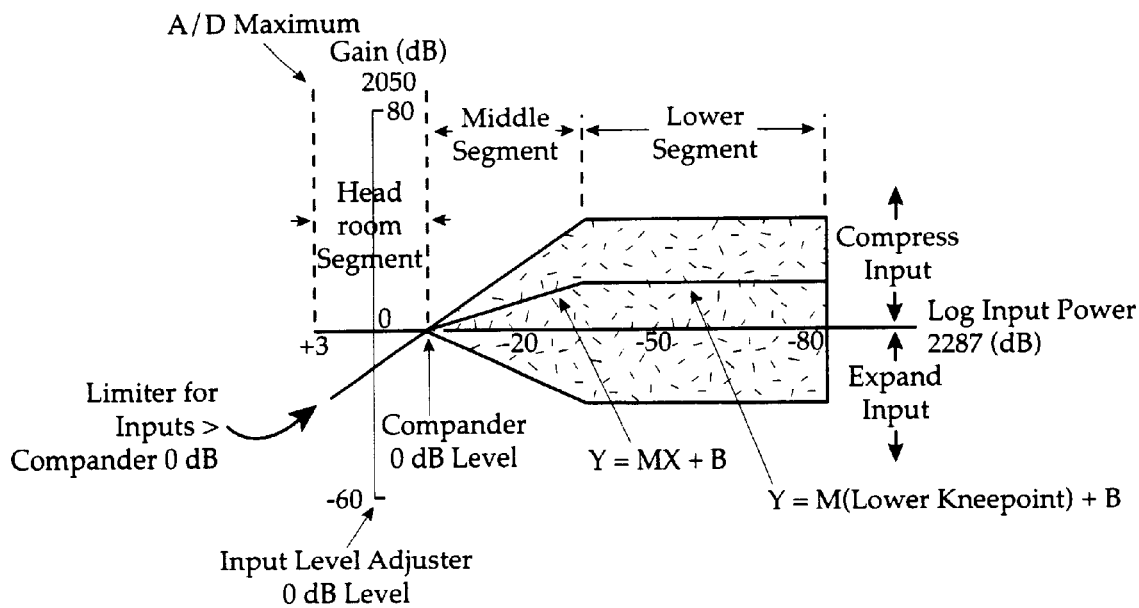
FIG. 26E shows an Input Power to Gain Transform Graph Using Three Logarithmic Segments.

Referring next to FIG. 26E, how each segment calculates gain may be better appreciated. In particular, the gain 2050 is shown on the vertical axis, ranging from 80 dB gain to −60 dB attenuation, and the log input power 2287 is along the horizontal axis. The hashed area shows the maximum gain or attenuation that can typically be realized. Typical operation will be within this area as shown by the solid lines representing the Y=MX+B and Y=M (lower kneepoint)+B equations. The headroom segment acts as a limiter as shown by the line sloping down to the left of the compander 0 dB point. The middle segment performs companding and is realized by the equation, gain=compander slope M (log input power)+B. The lower segment limits the maximum gain by fixing the log input power value to that of the lower kneepoint log value. The clip segment forces the output to the compander 0 dB level by using infinite compression. This is shown as the maximum upper boundary of the middle segment. Conversion of the input power to a logarithmic value allows the use of simple line equations.

Figure 26F:
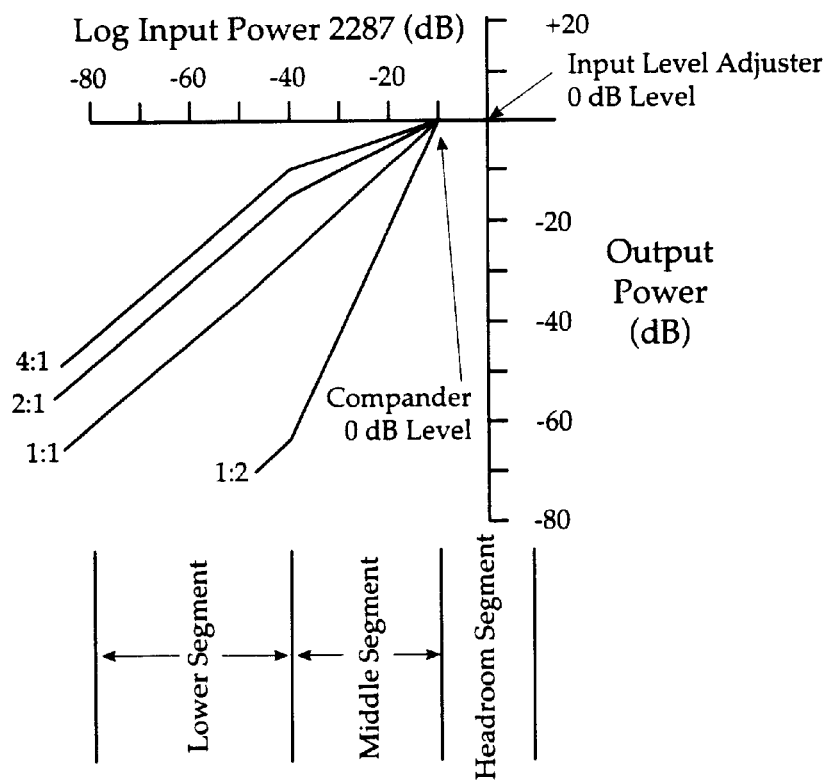
FIG. 26F shows a Three Segment Input Power to Output Power Graph for Various Companding Ratios.

FIG. 26F shows the output power resulting from various amounts of companding. The log input power 2287 is shown along the horizontal axis and the output power (log [companded signal 2015]) is shown along the vertical axis. The headroom segment is for inputs larger than the compander 0 dB point. They are limited to the maximum 0 dB output level shown by the horizontal line to the right of this point. Inputs less than the compander 0 dB point but greater than the lower kneepoint are compressed or expanded as shown in the middle segment. Inputs less than the lower kneepoint have their gain fixed at the lower kneepoint gain as shown in the lower segment. The clip segment 2630B forces the input to 0 dB output level and would appear as a line on the horizontal axis.

Figure 26G:
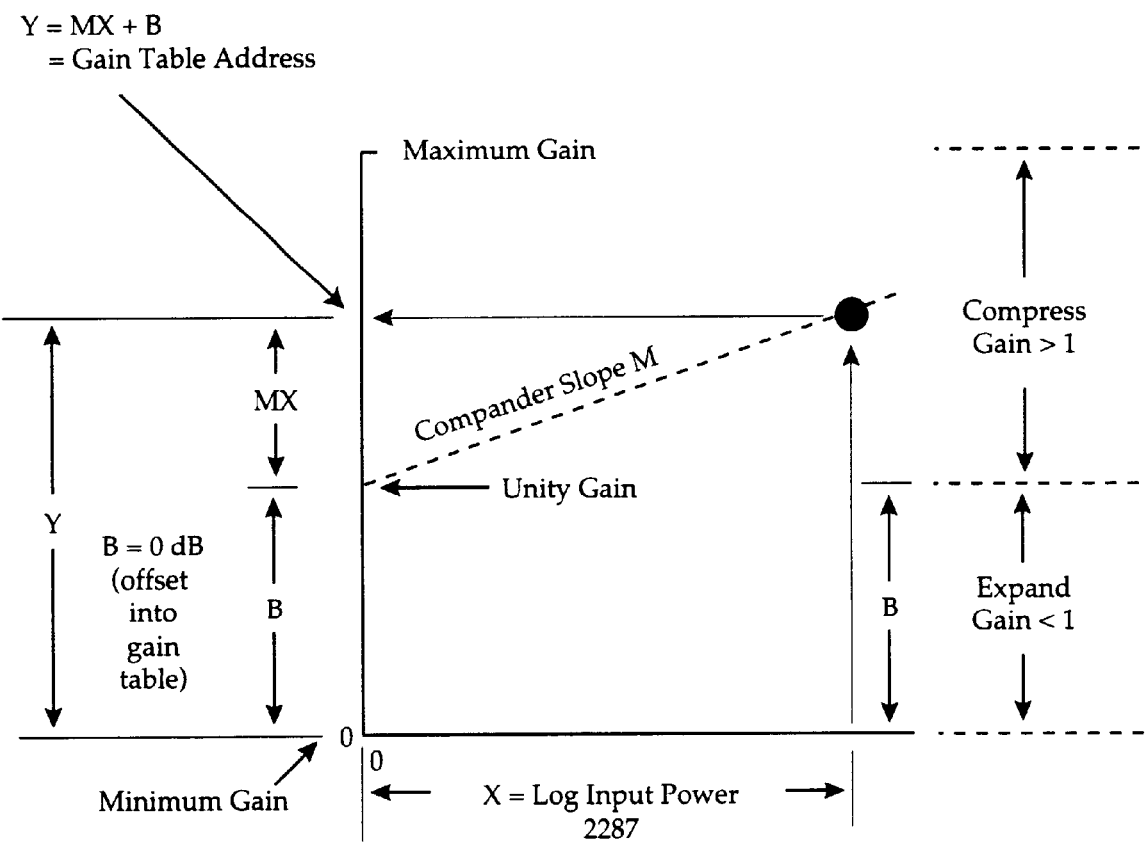
FIG. 26G shows a MX+B Line Gain Transform.

Referring next to FIG. 26G, illustrates how the log input power 2287 and MX+B linear gain transform may be used to access the final gain value 2050 from a lookup table. First, compander slope M (one of the values 2290 provided by the transform engine 410) is multiplied by log input power 2287. This results in positive values for compression and negative values for expansion. To convert this to a value suitable for table lookup, typically a positive only value, an offset value B is added. B is typically an offset value to the unity gain 0 dB gain value in the table. The gain table contents are typically linear multiplier values for compander gain cell use. The log to linear gain transformation is accomplished in the lookup table.

Figure 26H:
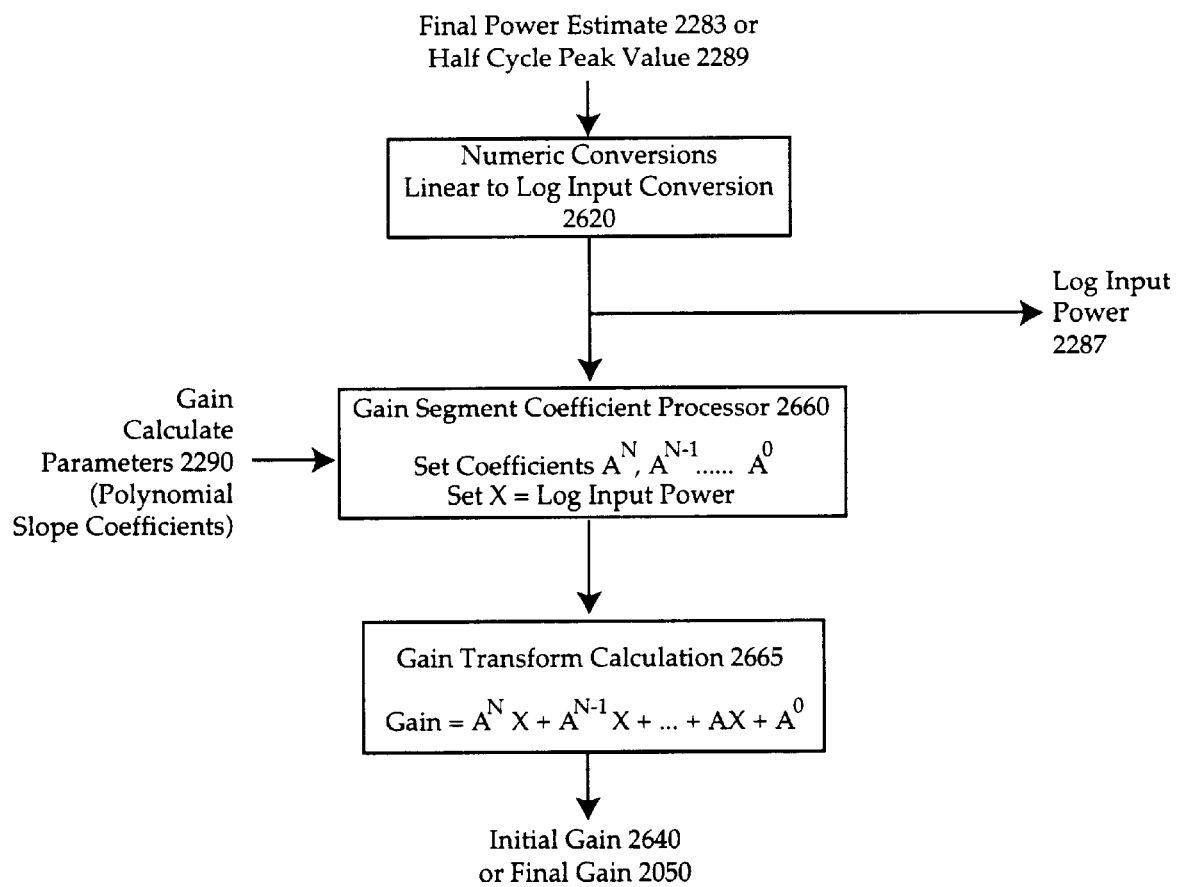
FIG. 26H shows a Single Segment Curvilinear Gain Calculate Block Diagram Example.
Figure 26I:
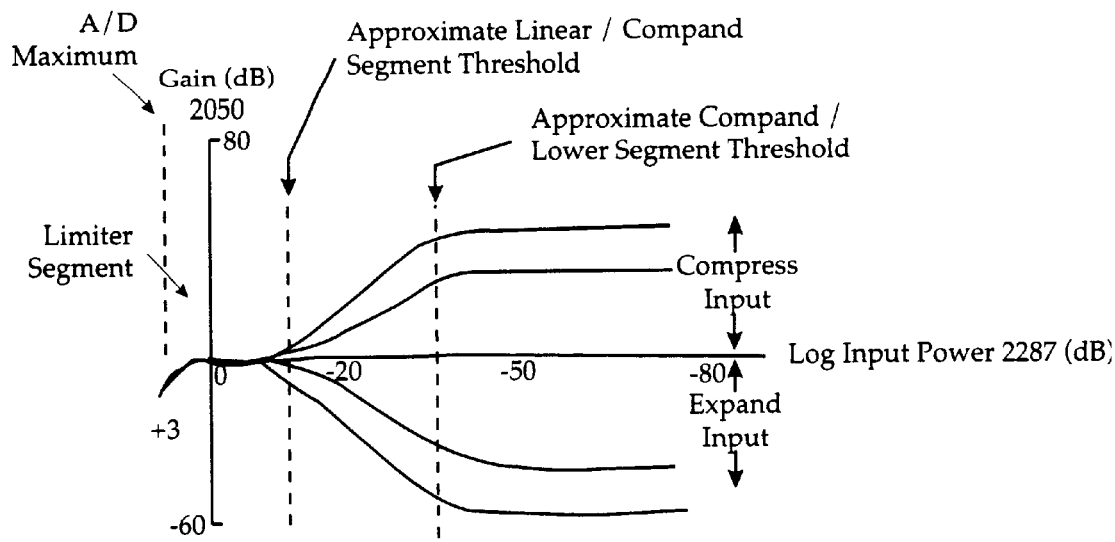
FIG. 26I shows a Graph of a Curvilinear Input Power to Gain Calculation Example Using Single Segment Non-Linear Computation Acting as Four, Smoothly Connected Pseudo Segments.
Figure 26J:
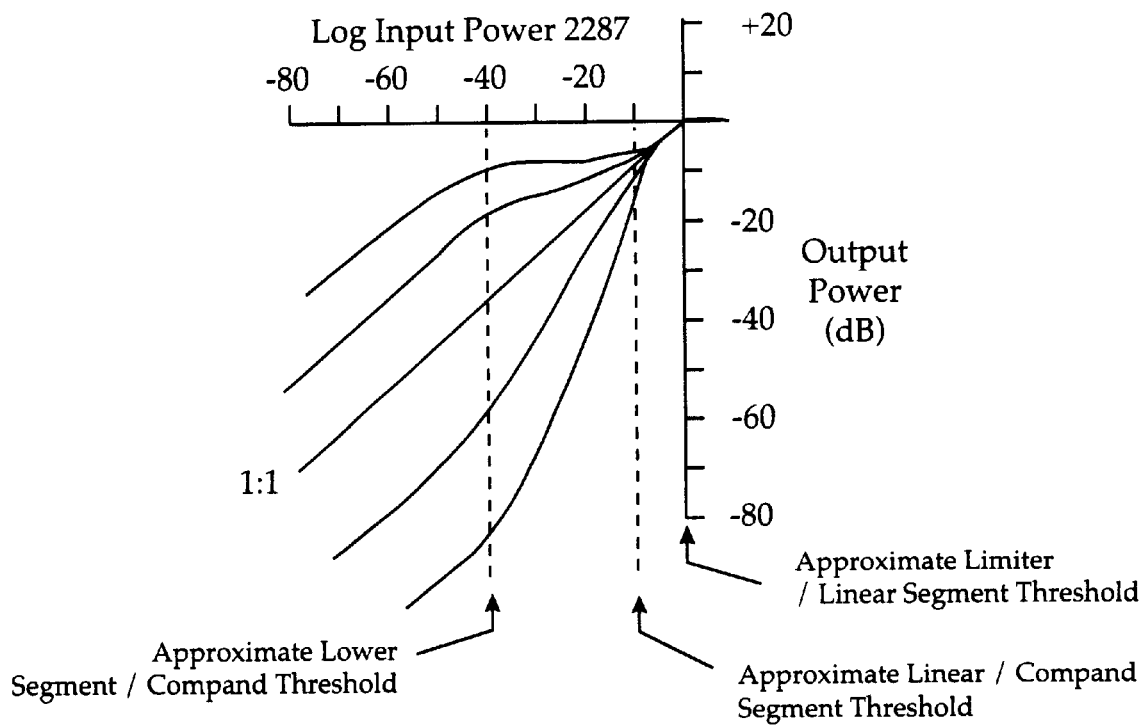
FIG. 26J shows a Curvilinear Input Power to Output Power Graph for Various Companding Ratios.

Turning next to FIGS. 26H–J, an example is shown in FIG. 26H of a gain calculation using a non-linear gain transform function, in this case a high order polynomial equation. Unlike the multiple linear segments used in FIG. 26B, only a single nonlinear segment is necessary in this example because of the curve fitting possible with the nonlinear segment. The polynomial variable is set to the log input power value and the polynomial coefficients are calculated by the gain segment coefficient processor 2660 according to the amount of compression or expansion required, as specified by the compander gain calculate parameters 2290. These are then used in the gain transform calculation 2665. It will be appreciated that gain segment processor 2660 could include a plurality of equations, and the gain transform calculation 2665 could be implemented to select one of such plurality, or to provide curve fitting. If a selection method is implemented, the selection could be any of a variety of choices, including selecting the minimum or maximum. FIG. 26I shows how the polynomial equation calculates the gain smoothly as the log input level changes. This curvilinear approach avoids the distortion that can occur at abrupt segment boundaries. In this example, four pseudo segments are smoothly realized. A linear section allows compensating for the input signal crest factor. FIG. 26J shows how the non-linear polynomial gain calculation smoothly varies the compander output level for several compression and expansion settings.

Figure 27A:
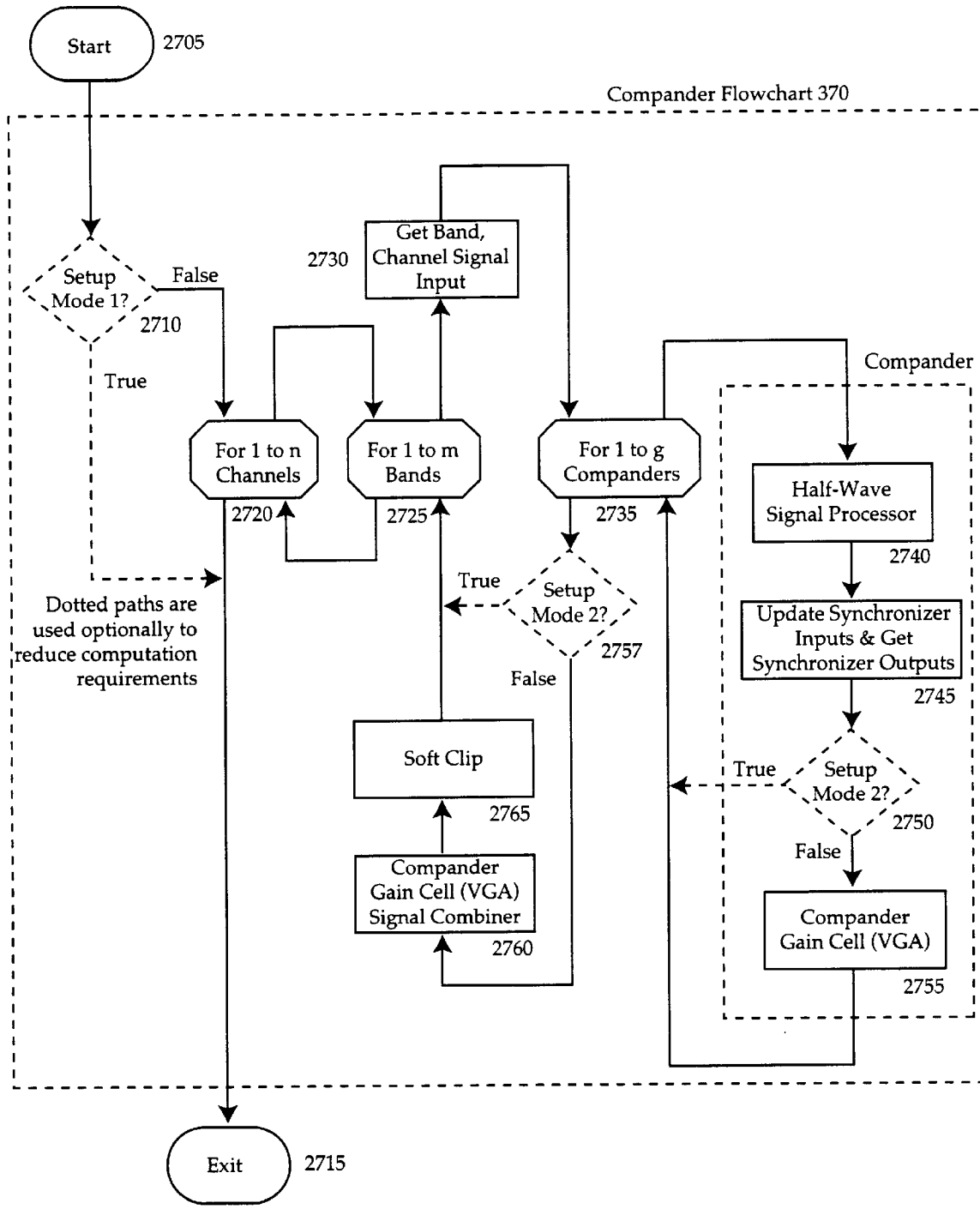
FIG. 27A shows a Companderflow diagram.

Having described the logic by which the compander and its various elements are implemented, the process of operation for the compander can be better appreciated by FIGS. 27A et seq. Referring first to FIG. 27A, the overall operation of a generalized form of compander function as at shown 370 of FIG. 3B, and in FIGS. 20A–C, may be better appreciated. The process begins at step 2705, and advances to optional step 2710 where a check is made to determine if the system is in setup mode. If so, the process bypasses the remaining steps and advances to exit 2715. If false, as will usually be the case, the process advances to step 2720, where a loop is initiated for 1-n channels. The loop at step 2720 calls a sub-loop at step 2725, for 1-m bands. For each of the m bands, the process advances to step 2730 where the input signal for that band and channel is obtained. The process then advances to a further sub-loop at step 2735, for 1-g companders, where each loop includes a half-wave signal processing step 2740, followed by updating the synchronizer inputs and getting the synchronizer outputs at step 2745. Then, at step 2750, an alternative check to 2710 can be made to determine whether the system is in setup mode, or what may be thought of as setup mode check 2; if so, the loop jumps to its end by returning to step 2735. If not, the process advances to a gain cell routine at step 2755, after which that loop completes and returns to step 2735. This alternative setup mode check 2 will allow the channels and bands to complete the halfwave signal processor 2740 and synchronizer block 2745 so that when setup mode exits, a smoother return to normal companding will result. However, additional processing is required compared to setup mode check 1. Both setup check mode 1 and 2 are optional, the disadvantage being that all of the compander steps will execute unnecessarily since in setup mode a calibration signal is typically output instead of the compander output.

When all companders have been processed, step 2735 proceeds to the second optional setup mode check 2 test at step 2757 to determine whether the system is in setup mode 2. If so, the process jumps to step 2725; if not, the process advances to step 2760, where the signal combiner function is performed which combines all of the compander gain cell results from compander loop 2735. The process then advances to the soft clip step 2765, after which the process loops back to step 2725 for the next band. The signal combiner is not required unless there is more than one compander per band. The soft clip function may also not be required in all implementations. The process repeats for the remaining bands, after which the process returns to step 2720 for the remaining channels and their associated bands and companders. Ultimately, after the $n^{th}$ channel is processed, the process exits at step 2715.

Figure 27B:
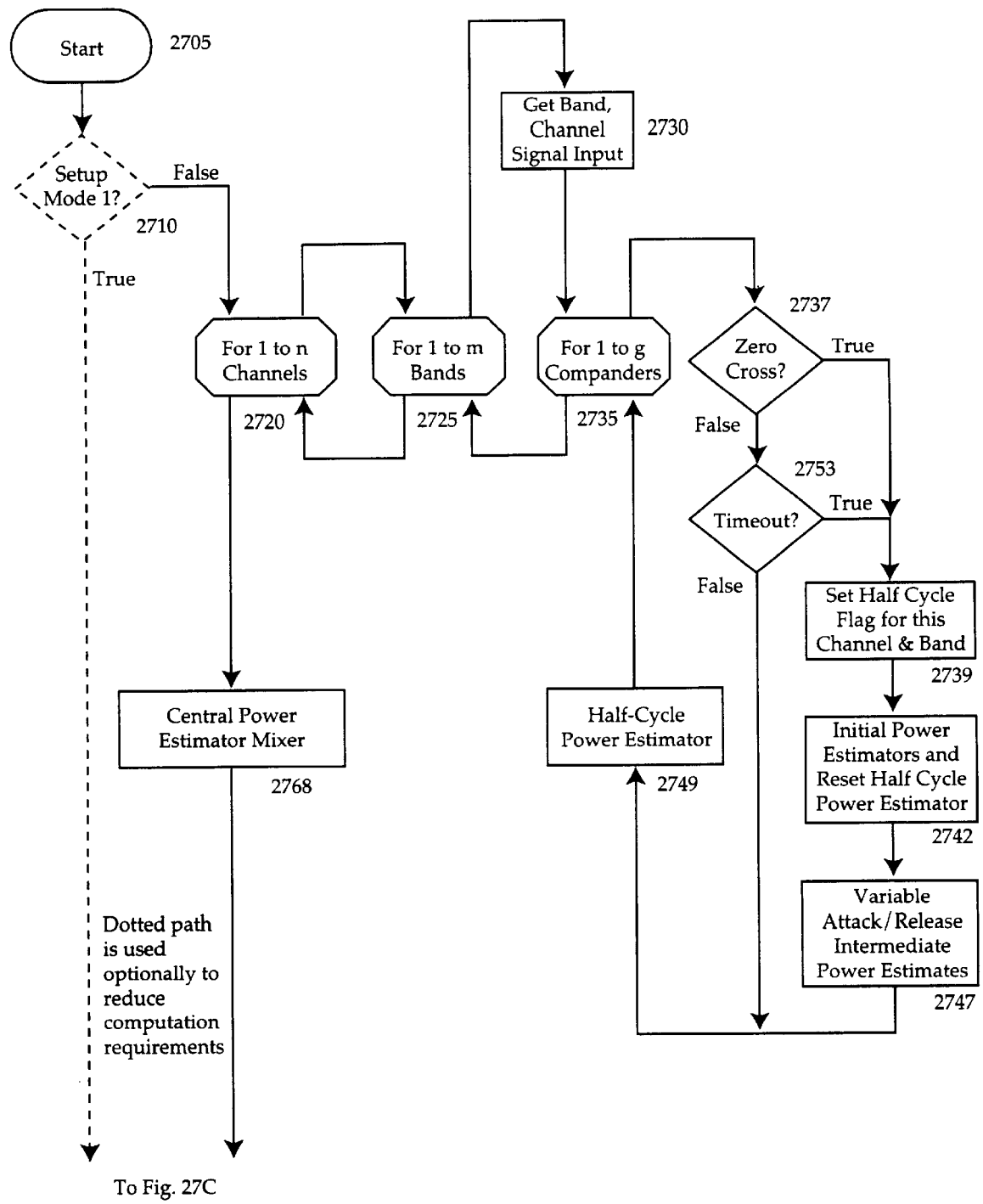
FIG. 27B shows a Split Compander—Part Aflow diagram.
Figure 27C:
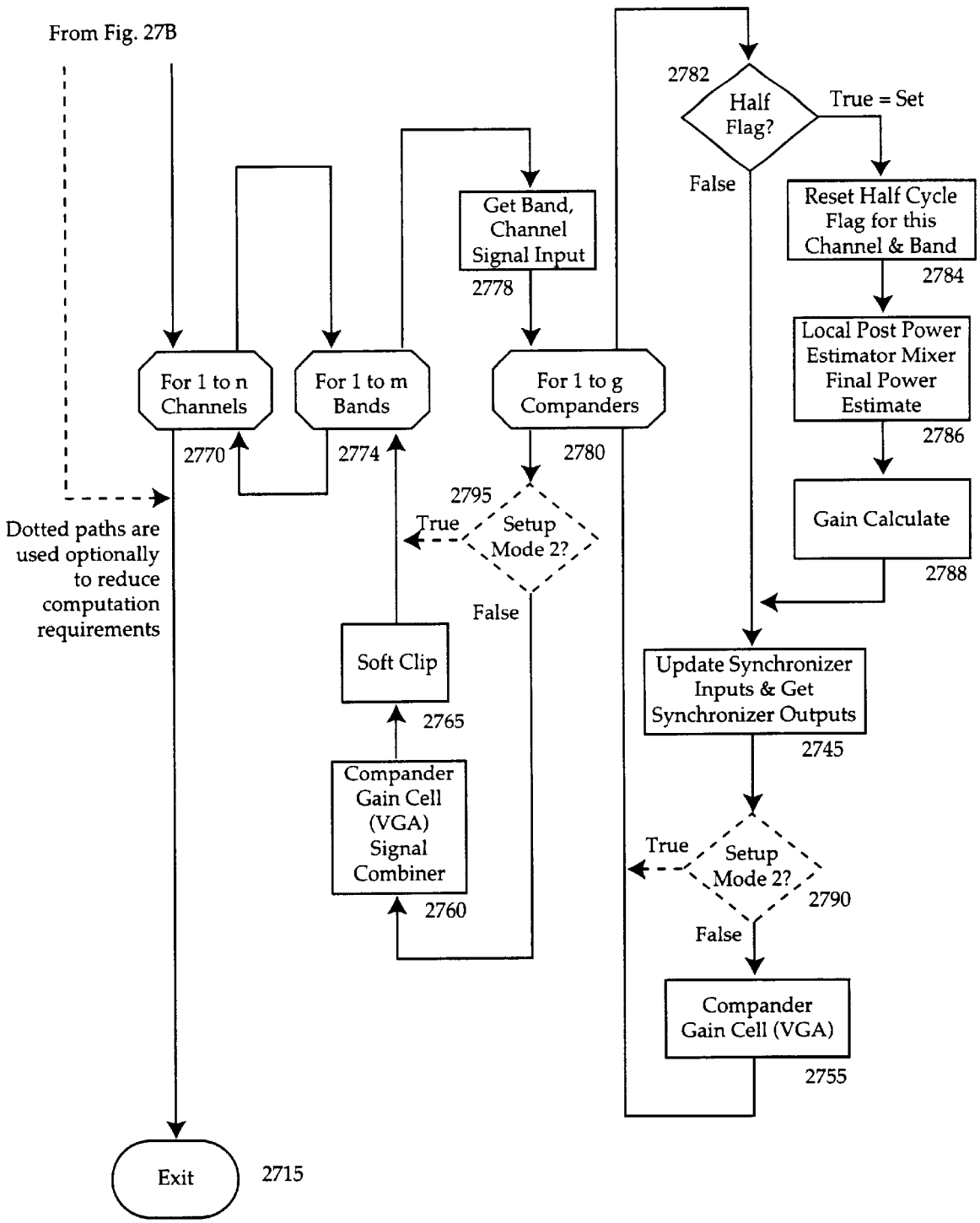
FIG. 27C shows a Split Compander—Part Bflow diagram.

Taking next FIGS. 27B and 27C together, the operation of a split compander arrangement is shown in process flow diagram form. For simplicity, like elements with respect to FIG. 27A have been shown with like reference numerals. In general, the split compander process of FIGS. 27B–C differs from the compander process of FIG. 27A in that the central power estimator step 725 of FIGS. 7 and 19 occurs in the middle of half-wave signal processing step 2740 of FIG. 27A. This guarantees that the central power estimator results are computed with the initial, intermediate, or final power estimates from all companders for the current input signal sample so that the central power estimator results are in sync with the input samples. Computing the central power estimator results before or after the compander shown in FIG. 27A will typically result in a one sample delay, which is typically acceptable to the listener. The process begins at step 2705 and advances to step 2710, where a check is made to determine whether the system is in setup mode. If so, the system bypasses the remainder of the process show in FIGS. 27A and 27B, and advances to an exit at step 2715. If not (as will usually be the case), the system branches to step 2720, where a loop is begun for 1 through n channels. That loop in turn calls another loop at step 2725, for one through m bands per channel.

In turn, that loop advances to step 2730, where the band and channel signal input are retrieved and the process then advances to step 2735, where another loop is begun to process each of one through g companders. From step 2735, the process advances to step 2737, where a check is made to determine whether the sample indicates a zero crossing. If so, the process advances to step 2739 where the half cycle flag is set for the particular channel and band being processed. The initial power estimator process is then performed at step 2742, where the half cycle power estimator is also reset, followed by processing the variable attack and release intermediate power estimates at step 2747. The process then advances to the half-cycle power estimator process at step 2749.

If the test at step 2737 had determined that the sample being processed was not a zero crossing, the process would have advanced to step 2753, where a timeout test is performed to ensure that a zero crossing has occurred within a predetermined period. If the timeout test shows that no zero crossing has occurred within the required time, the process branches to step 2739 just as discussed above. However, in most cases the timeout test will be false, and the process will advance immediately to step 2749. From step 2749, the process advances to step 2735 and the remaining companders are processed. Once all the companders for a given band have been processed, the system returns to step 2725, and the next bands in sequence are processed. Eventually all the bands for a given channel will have been processed, after which the process returns to step 2720; at this point the bands and companders associated with the next channel are processed. Eventually all channels will have been processed, and the overall process advances from step 2720 to step 2768 where the central power estimator mixer process is called. Following completion of the central power estimator mixer, the process advances to step 2770, where a loop is begun for 1 through n channels. That loop in turn calls another loop at step 2774, for one through m bands per channel.

In turn, that loop advances to step 2778, where the band and channel signal input are retrieved and the process then advances to step 2780, where another loop is begun to process each of one through g companders. From step 2780, the process advances to step 2782 where a check is performed to see if the half flag is set for this channel/band. The half flag would have been set if a zero crossing or timeout occurred at step 2737 or 2753 for this band or channel, to indicate at this point that the half wave signal processing should be completed. If the half flag is not set, then the process proceeds to step 2745. If the half flag is set, then the process proceeds to the reset half flag step 2784, local post power estimator mixer step 2786, gain calculate step 2788, and then update synchronizer inputs and get synchronizer outputs step 2745. Then, at step 2790, an alternative check to 2710 can be made to determine whether the system is in setup mode, or what may be thought of as setup mode check 2; if so, the loop jumps to its end by returning to step 2780. If not, the process advances to a gain cell routine at step 2755, after which that loop completes and returns to step 2780.

When all companders have been processed, step 2780 proceeds to the second optional setup mode check 2 test at step 2795 to determine whether the system is in setup mode 2. If so, the process jumps to step 2774; if not, the process advances to step 2760, where the signal combiner function is performed which combines all of the compander gain cell results from compander loop 2780. The process then advances to the soft clip step 2765, after which the process loops back to step 2774 for the next band. The signal combiner is not required unless there is more than one compander per band. The soft clip function may also not be required in all implementations. The process repeats for the remaining bands, after which the process returns to step 2770 for the remaining channels and their associated bands and companders. Ultimately, after the $n^{th}$ channel is processed, the process exits at step 2715.

Figure 28:
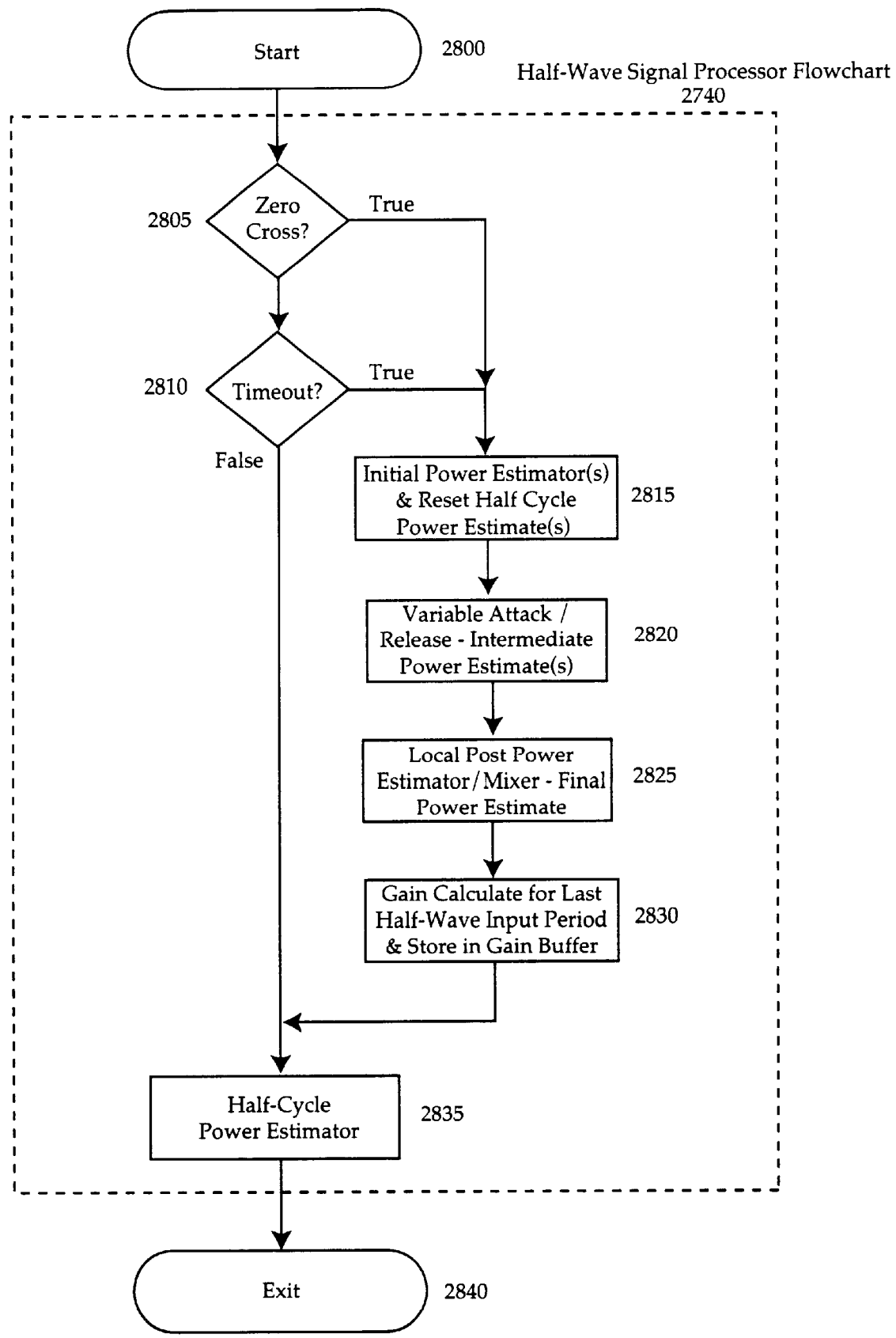
FIG. 28 shows a Half-Wave Signal Processor flow diagram.
Figure 29:
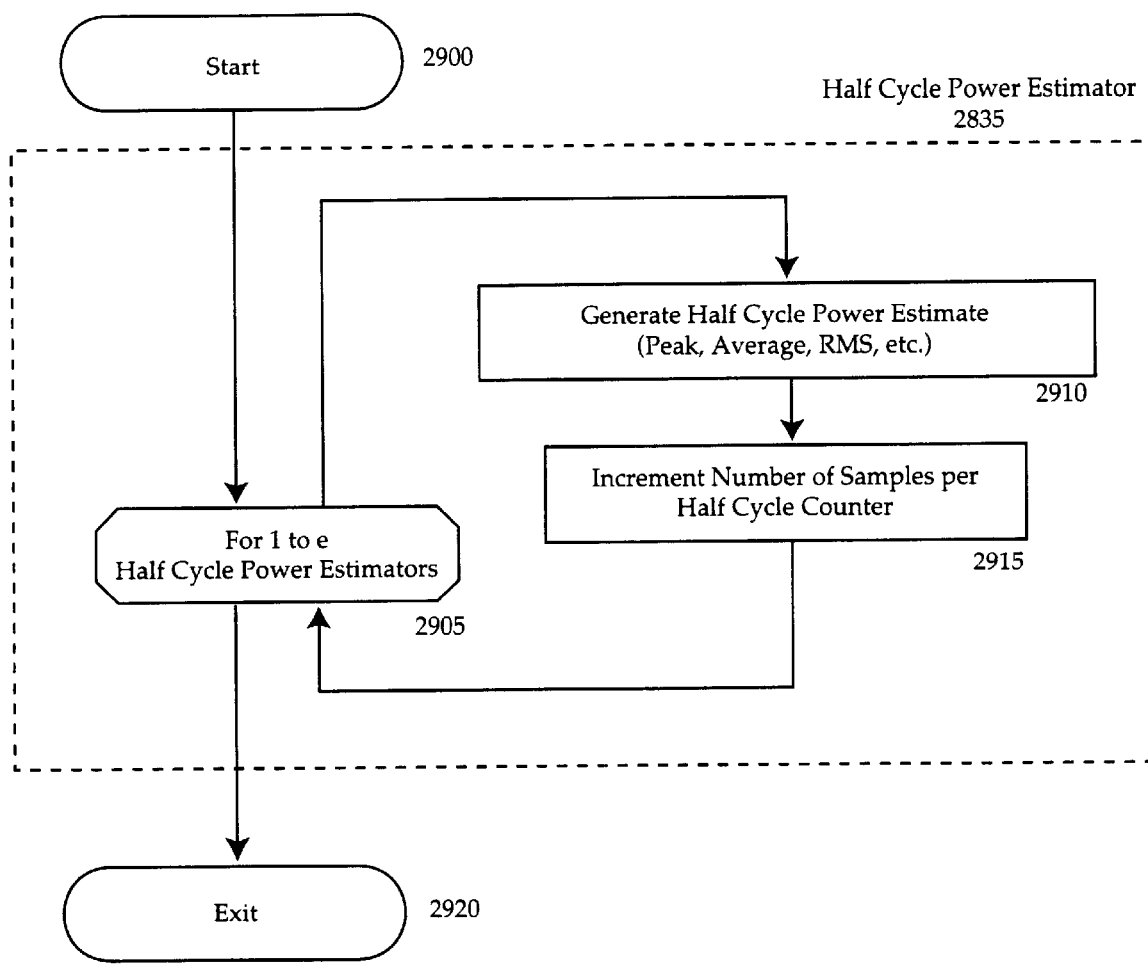
FIG. 29 shows a Half Cycle Power Estimate flow diagram.

Referring next to FIG. 28, the half-wave signal processing shown generally at step 2740 in FIG. 27A can be better appreciated. The process starts at step 2800, and advances to step 2805 where a check is made to determine whether the signal is at a zero crossing. If not, the process advances to a timeout check at step 2810, in case an unexpected event has caused the signal to be lost such that no zero crossings occur or the length of a half cycle exceeds the length of the synchronizer block 2045 buffers. If the check at step 2805 is true—that is, the signal is at a zero crossing, or if a timeout has occurred as determined by the check at step 2810, the process branches to step 2815, where the initial power estimator values are processed, and the half cycle power estimates are reset. The initial power estimator values may be better understood from FIG. 30, discussed hereinafter. The process then advances to step 2820, where the variable attack/release values are processed and the intermediate power estimates are generated, as discussed in connection with FIG. 31 et seq., hereinafter. The process then advances to step 2825, where the multi-band/channel power estimates are generated. Then, at step 2830, the gain values are calculated. If the check at step 2810 was false, or upon completion of the gain calculation at step 2830, the process advances to step 2835, where the half-cycle power estimator process is performed, as better explained in connection with FIG. 29. The process then exits at step 2840.

As noted above, FIG. 29 shows in greater detail the process of the half cycle power estimator, which begins at step 2900 and advances to step 2905 where a loop is begun for each of a plurality of half cycle power estimators, for example 1-e. The loop includes step 2910, where a half cycle power estimate is generated; the power estimate may be based on any convenient indicia, including peak, average, RMS, and so on. The loop then advances to step 2915, where the number of samples per half cycle counter is incremented. The loop then returns to step 2905 for processing of the next half cycle power estimator; after the last such power estimator is processed, the process exits at step 2920.

Figure 30:
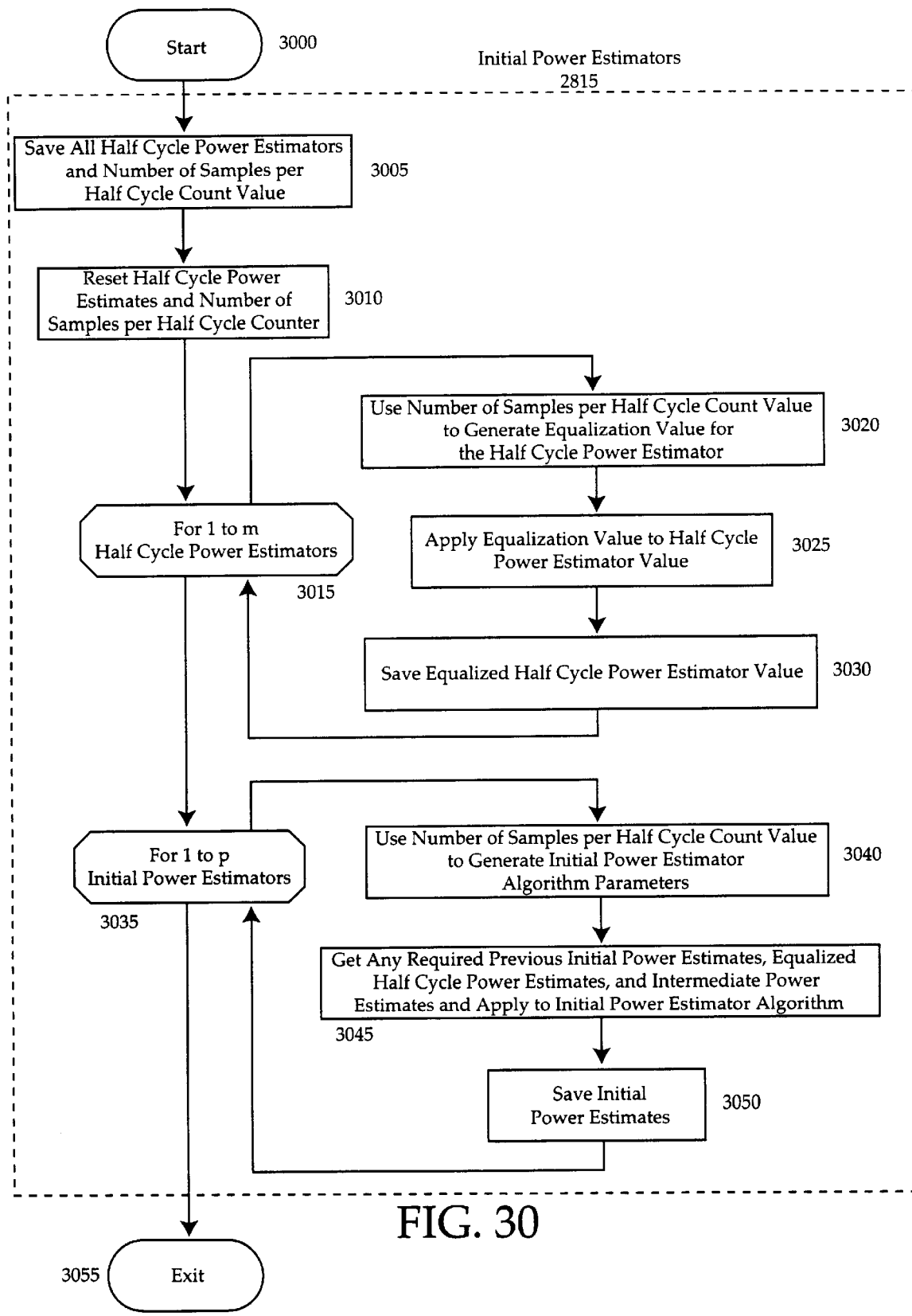
FIG. 30 shows an Initial Power Estimators flow diagram.

Referring next to FIG. 30, the initial power estimates of step 2815 (FIG. 28) may be better appreciated. The process begins at step 3000, and advances to step 3005 where all half cycle power estimator values and all values for the number of samples per half cycle count are saved. Then, at step 3010, the half cycle power estimates and the number of samples per half cycle are reset for the next half cycle, after which the process advances to step 3015. At step 3015, a loop is called for each of 1-m half cycle power estimators, with each loop including, at step 3020, generating an equalization value for the half cycle power estimator using the count value from the number of samples per half cycle, followed by applying that equalization value to the half cycle power estimator value at step 3025, and saving the equalized half cycle power estimator value at step 3030 after which the loop returns to step 3015 for processing of the next power estimator. Following completion of the loop for each of the half cycle power estimators, the process advances from step 3015 to step 3035.

Step 3035 calls a second loop for processing 1-p Initial Power Estimators, which begins at step 3040 by using (step 3005) the count value for the number of samples per half cycle to generate algorithm parameters for the initial power estimators. Then, at step 3045, the process gets any required previous initial power estimates, equalized half cycle power estimates, and intermediate power estimates and applies them to the initial power estimator algorithm. The initial power estimates are then saved at step 3050, after which the loop returns to step 3035 for processing of the next power estimator. Once all initial power estimators are processed, the process exits at step 3055.

Figure 31:
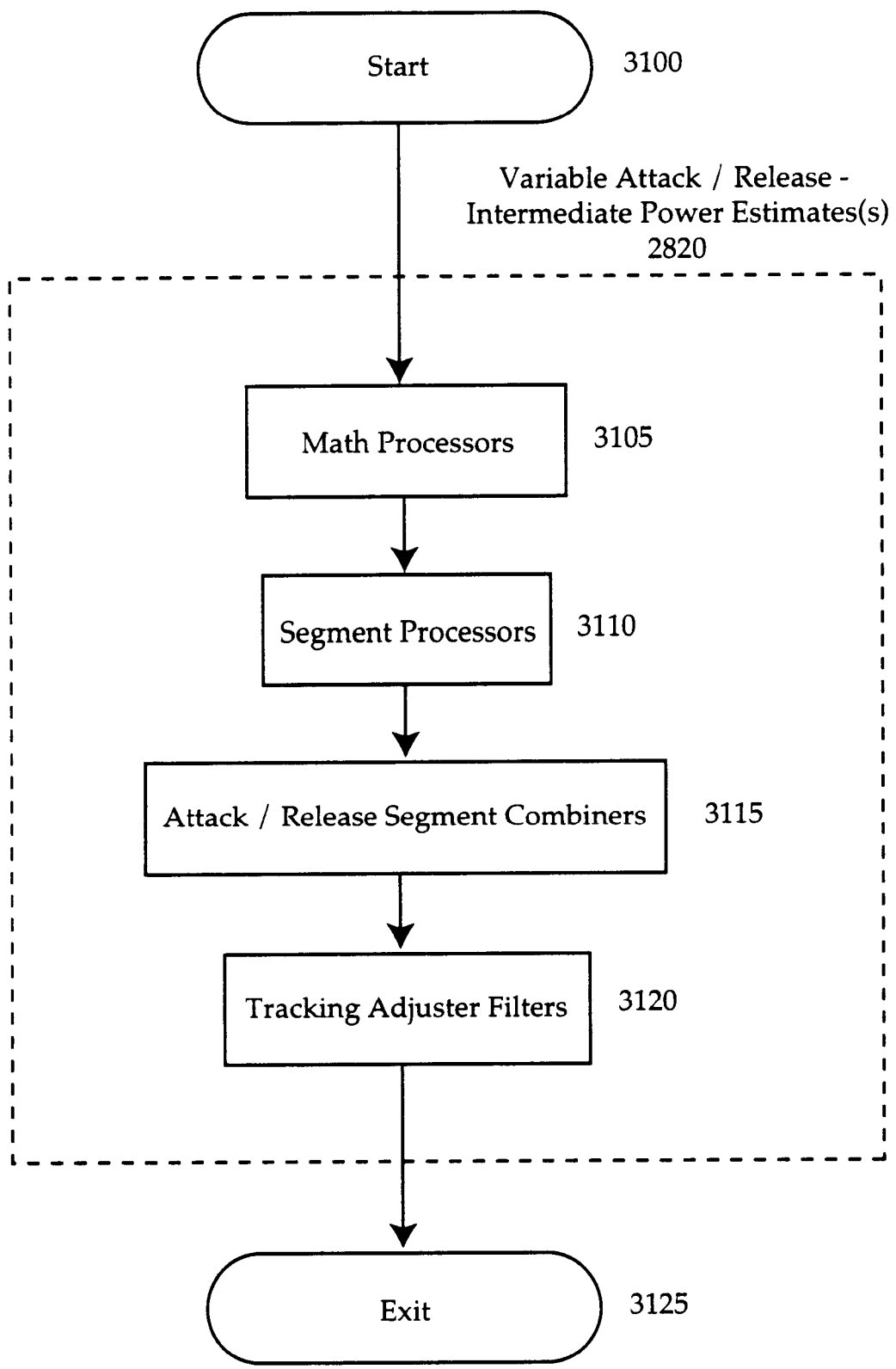
FIG. 31 shows an Attack/Release flow diagram.

Referring next to FIG. 31, the variable attack and release process, shown as step 2820 in FIG. 28 and associated with the exemplary system discussed in connection with FIGS. 24A–24G, may be better appreciated. The process starts at step 3100, and advances to the math processors function (further described in connection with FIG. 32, hereinafter) at step 3105. Following the math operations, the process advances to the segment processor step at 3110 (described in greater detail in connection with FIG. 33), followed by the segment combiner step 3115 for the attack and release function (described in more detail in connection with FIG. 34.) Thereafter, the tracking adjuster filters step is performed at 3120 (treated in more detail in connection with FIG. 35), after which the process exits at 3125.

Figure 32:
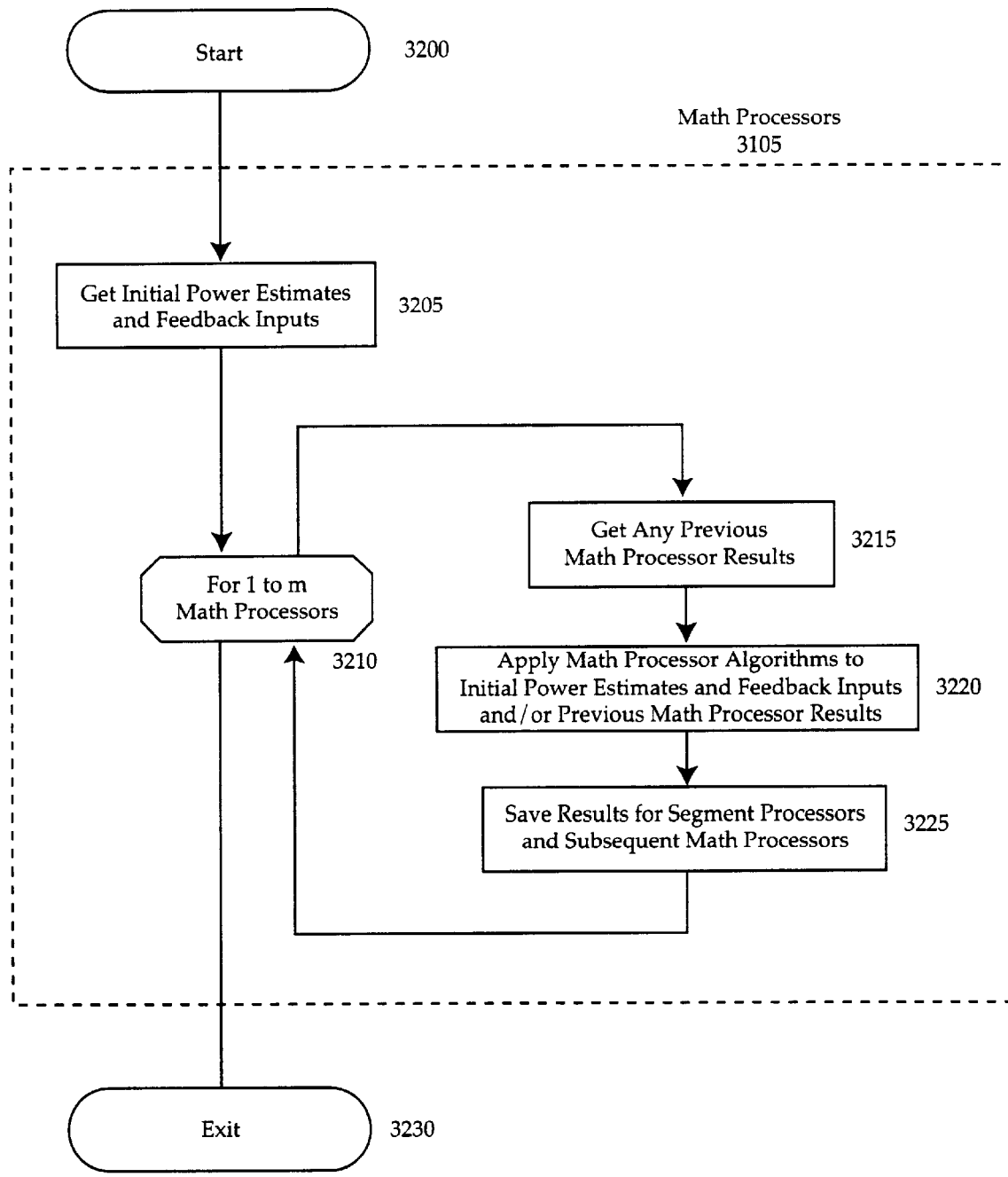
FIG. 32 shows a Math Processors flow diagram.

With reference next to FIG. 32, the math processors step of FIG. 30 can be better appreciated. The process starts at step 3200 and advances to step 3205, where the initial power estimates and feedback inputs are obtained. The process then advances to step 3210, where a loop is called to process each of a plurality of 1 to m math processors. The loop includes step 3215, where previous math processor results are obtained, followed at step 3220 by applying the selected math processor algorithms to the initial power estimates and feedback inputs as well as previous math processor results. Math processors typically perform math functions such as but not limited to input differences, squares, cubes, etc. of the difference, absolute value operations, as well as state machine and logic functions such as but not limited to input difference positive or negative, or input difference polarity change indication. The results are then saved at step 3225 for use by the segment processors and subsequent math processors, after which the loop returns to step 3210. After each of the math processors has been processed, the process exits at step 3230.

Figure 33:
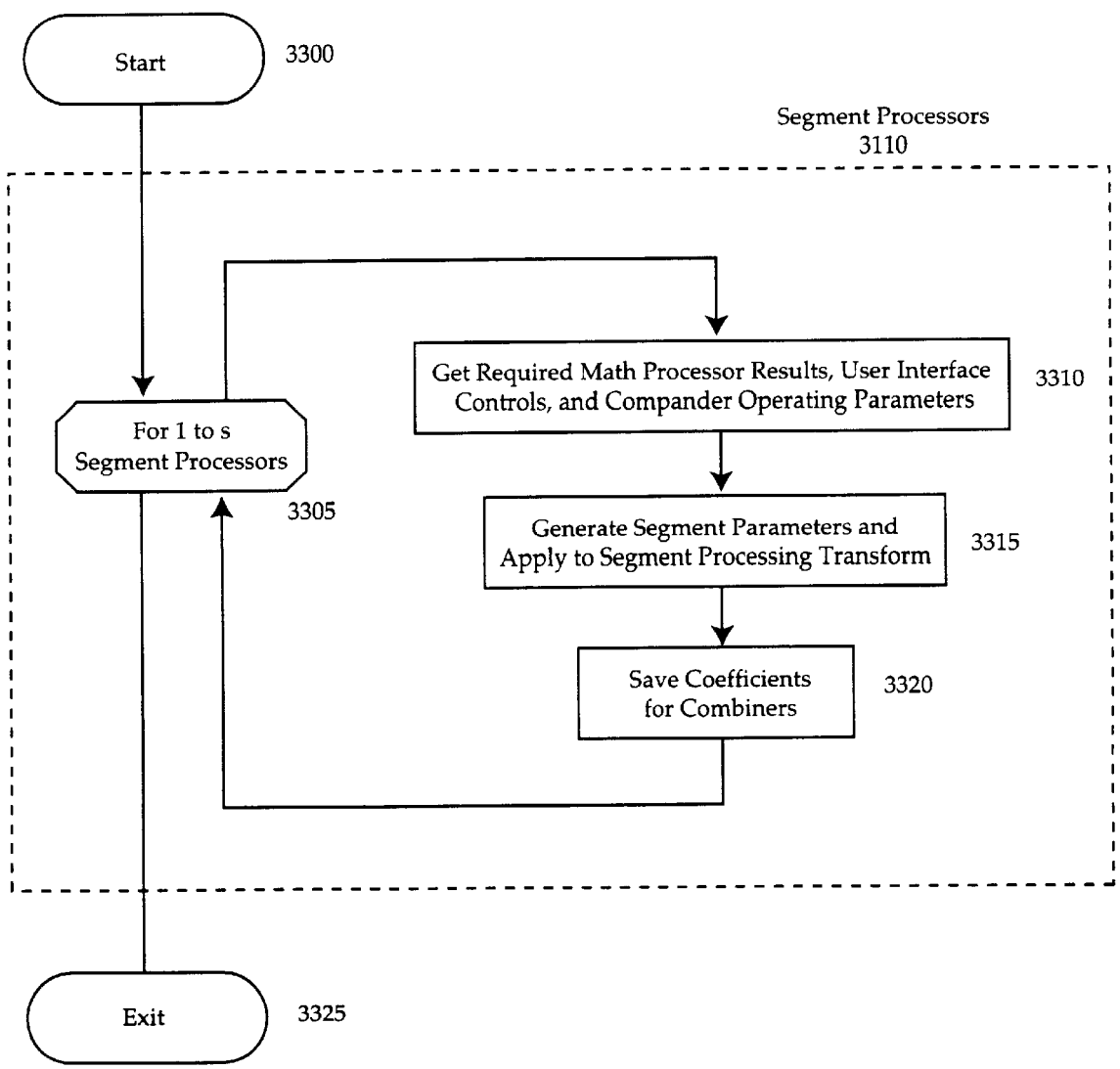
FIG. 33 shows a Segment Processors flow diagram.

Referring next to FIG. 33, the processing step involving the segment processors (step 3110 in FIG. 31) can be better appreciated. The process starts at step 3300 and advances to step 3305, where a loop is called for processing 1 through s segment processors. The loop initially gets, at step 3310, the required math processor results together with the user interface controls and compander operating parameters, which are then used to generate, at step 3315, the segment parameters and apply the same to the segment processing transform. The process then advances to step 3320 where the coefficients are saved for use by the combiners. The loop then returns to step 3305, and after processing the last segment processor, the process exits at step 3325.

Figure 34:
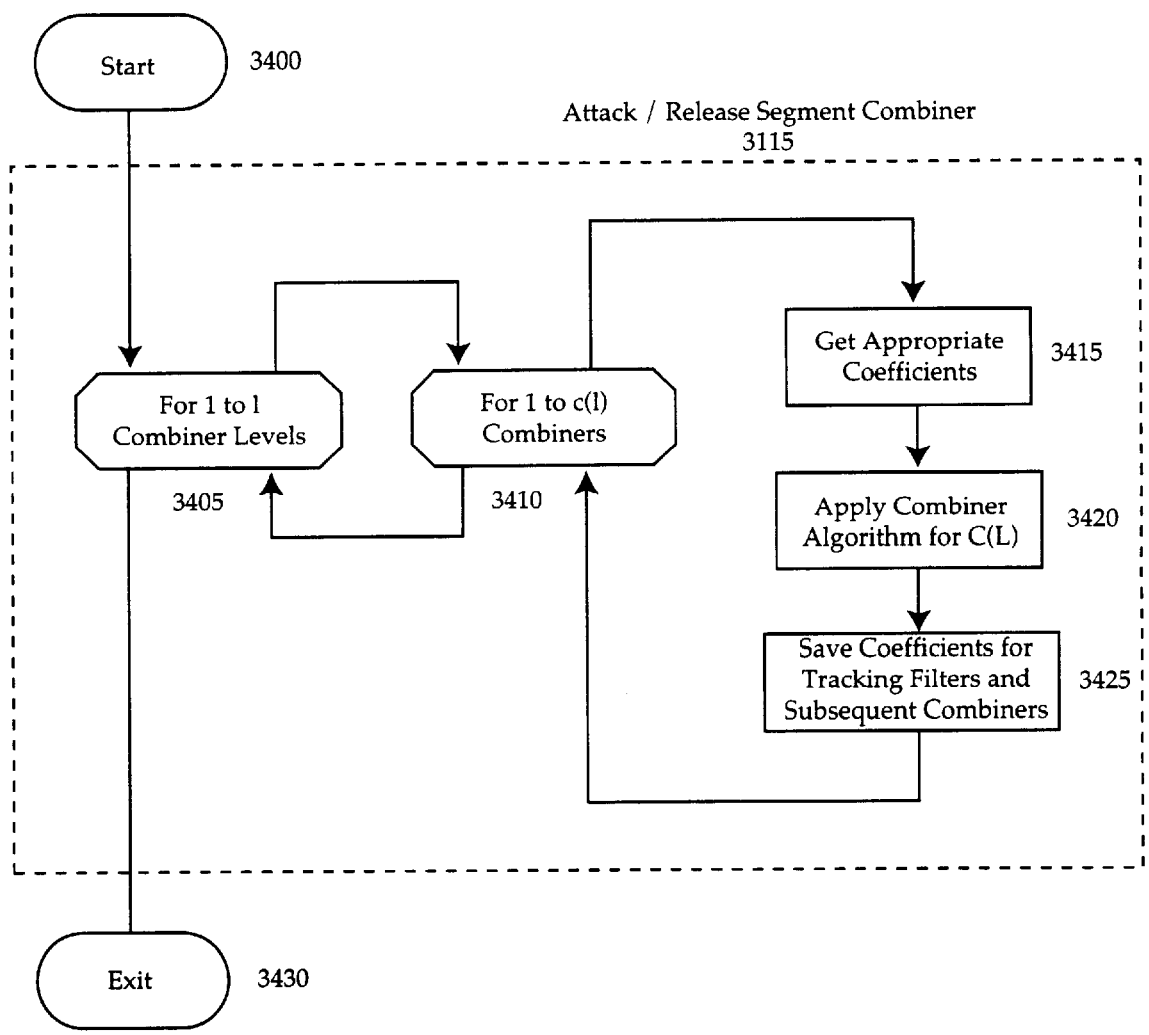
FIG. 34 shows an Attack/Release Segment Combiner flow diagram.

The attack and release segment combiner process, shown in FIG. 31 at step 3115, can be better appreciated from FIG. 34. The attack and release segment combiner process begins at step 3400 and advances to a first loop at step 3405, for 1 to I combiner levels. The loop from step 3405 calls a second loop initiated at step 3410 for each of 1 to c(I) combiners, where the loop includes getting, at step 3415, the appropriate coefficients (stored at step 3320). The coefficients are then used in applying the combiner algorithm for the particular combiner, after which the derived coefficients are stored at step 3425 for use with the tracking filters and subsequent combiners. After each combiner has been processed, the loop called at 3410 returns to step 3405, and the next combiner level is processed. Once all combiners of each of the combiner levels have been processed, the process exits at step 3430.

Figure 35:
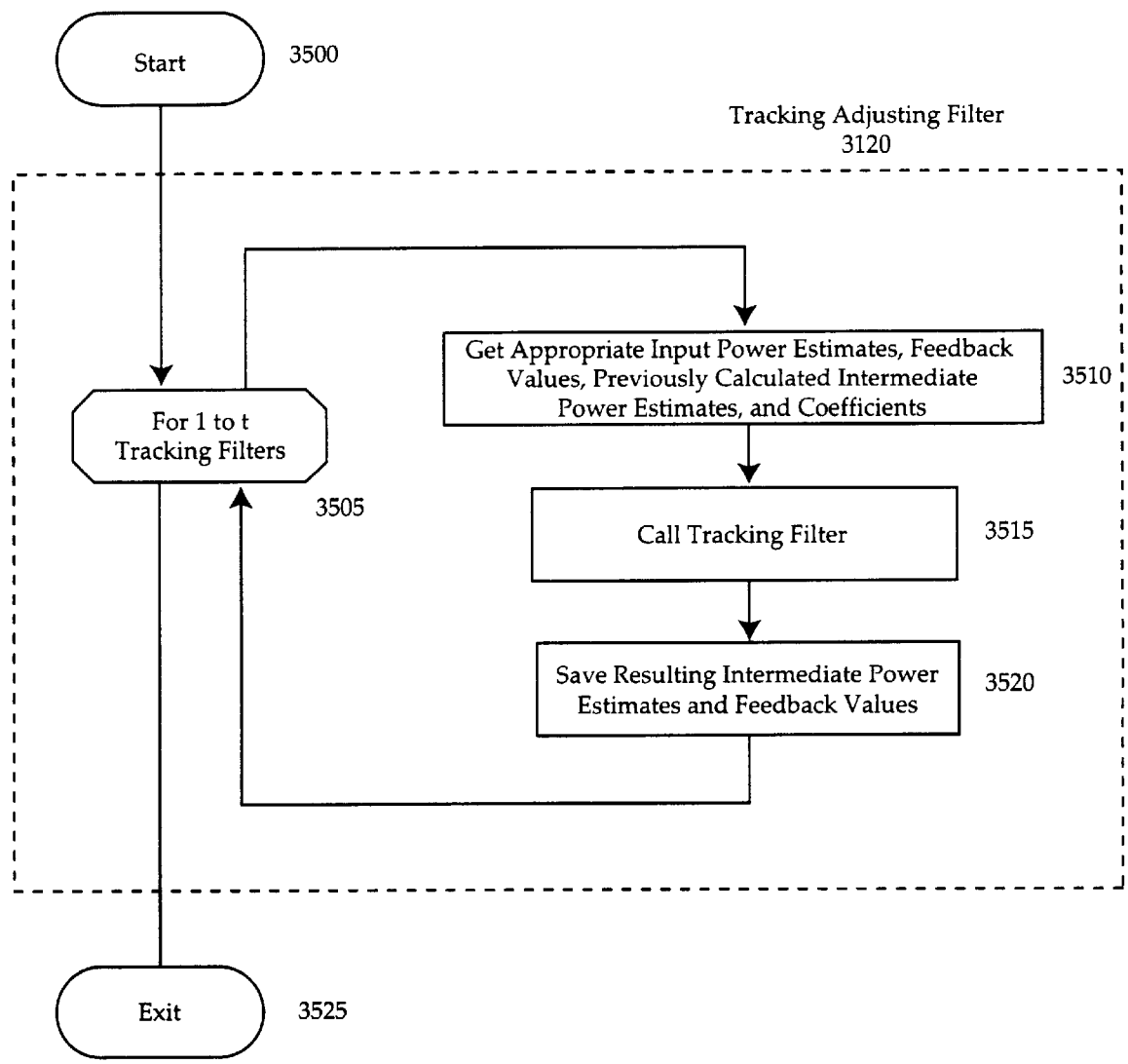
FIG. 35 shows a Tracking Adjuster Filter flow diagram.

The tracking adjuster filters process, shown summarily in FIG. 31 as step 3120, can be better appreciated from FIG. 35. The process starts at step 3500 and advances to step 3505 where a tracking filter loop is called, for processing 1 through t tracking filters. The loop includes getting, at step 3510, the appropriate input power estimates, feedback values, previously calculated intermediate power estimates, and (from step 3425) the appropriate coefficients. The tracking filter algorithm is then applied at step 3515, after which the resulting intermediate power estimates and feedback values are saved at step 3520. Tracking filters for companders typically implement some form of variable low pass filter while other uses, such as for noise compensation, may use integrators, low pass filters, and non-linear filters separately or in combination. Following completion of all loops for 1 through t tracking filters, the process exits at step 3525.

Figure 36:
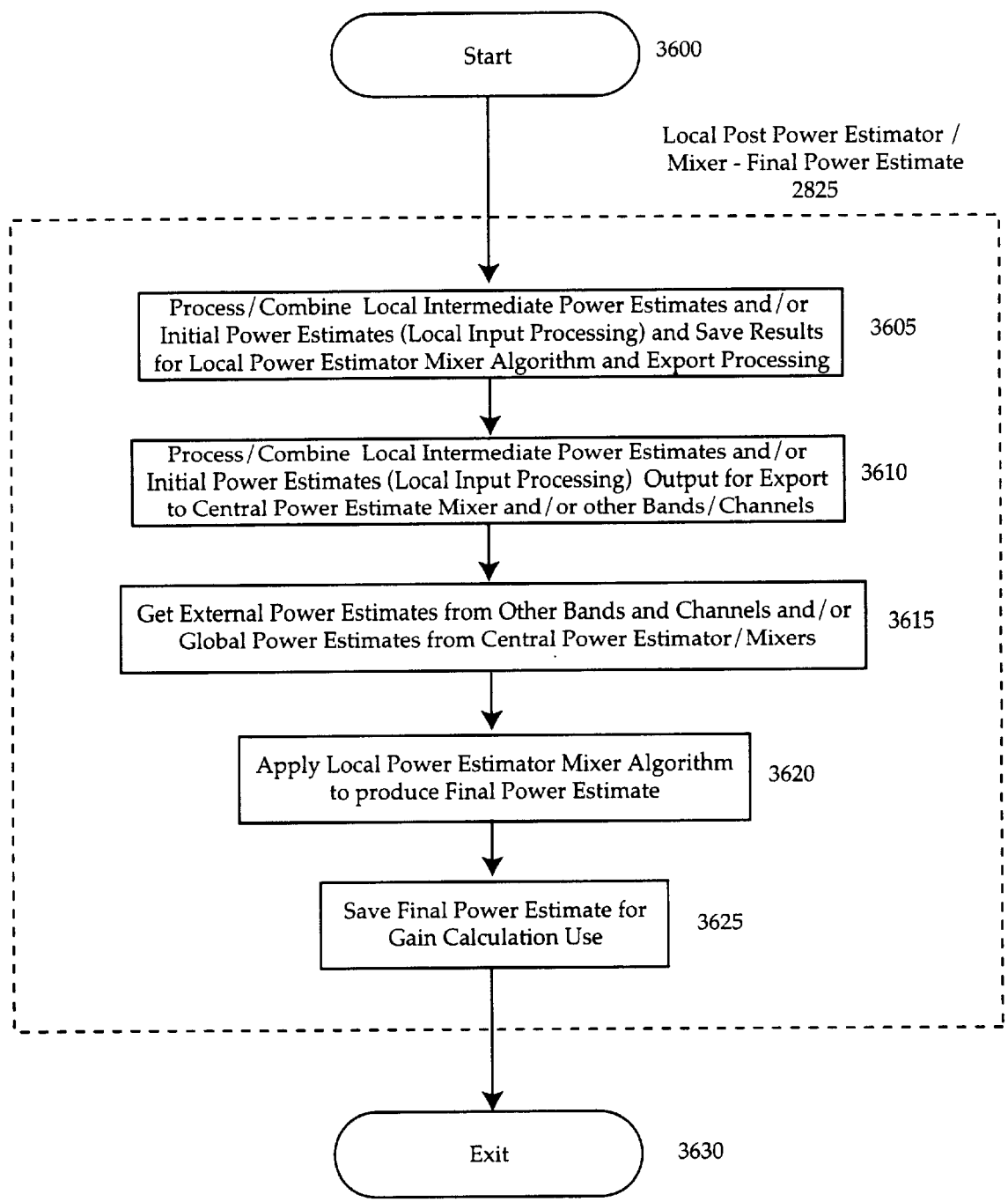
FIG. 36 shows a Local Post Power Estimator/Mixer flow diagram.

With reference next to FIG. 36, the process of the local post power estimator/mixer as previously discussed in connection with FIG. 25 may be better appreciated. It will be appreciated that the local post power estimator mixer is shown simply in FIG. 28 at step 2825. The local post power estimator/mixer process initiates at step 3600 and advances to step 3605 where the appropriate power estimates (either local intermediate or initial) are processed and/or combined, and the results are saved for the use with the local power estimator mixer algorithm and export processing. The process advances to step 3610 where the power estimates are processed and/or combined for export to the central power estimator mixer and, as appropriate for the particular implementation, other bands or channels.

The process then advances to step 3615 where the external power estimates from other bands/channels and/or global power estimates from the central power estimator mixer are obtained, for use at step 3620 in applying the local power estimator mixer algorithm to produce the final power estimate. The final power estimate is then saved at step 3625 for gain calculation use, after which the process exits at step 3630.

Figure 37A:
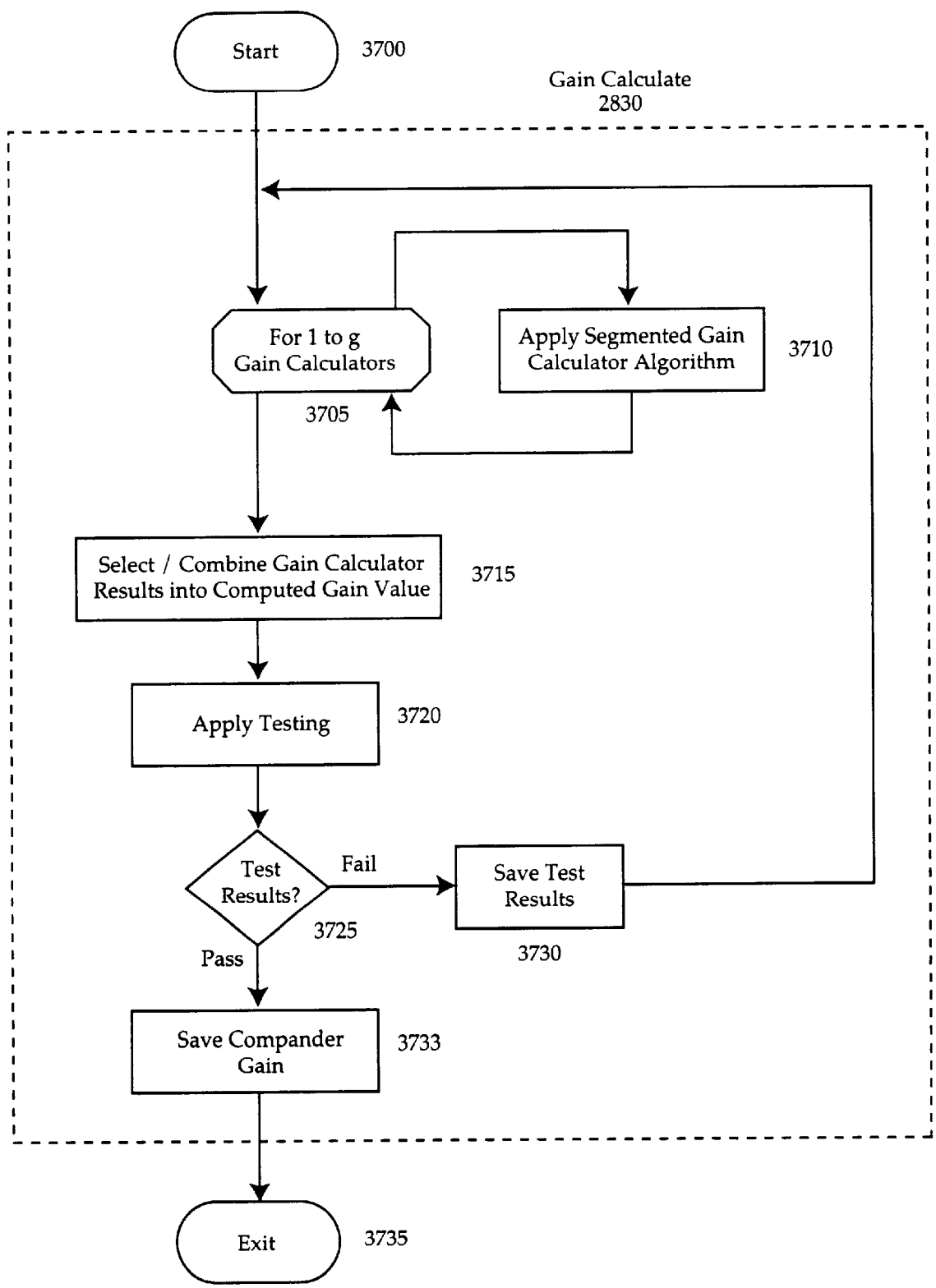
FIG. 37A shows a Gain Calculate flow diagram.

Referring next to FIG. 37A, a generic example of a Segmented Mapping Converter to perform the gain calculate process, shown at step 2830 in FIG. 28, may be better understood. In particular, the process starts at step 3700 and advances to step 3705, where a loop is called for 1 through g gain calculators. The loop includes the step of apply a segmented gain calculate algorithm, shown at step 3710, which may be broadly thought of as a segment transform processor algorithm. After the last relevant segmented gain calculator has been processed, the loop returns and the system advances to step 3715 where the gain calculator results are selected or combined to form the computed gain value (also referred to as a select/combine output value). The output is then tested at steps 3720 and 3725, for example to ascertain whether clipping occurs (e.g., exceeds the 0 dB level) by multiplying the half cycle peak value by the calculated gain. If the test fails (e.g. signal clipping will result), the process branches to step 3730, where the test results are saved, which may be broadly thought of as the command enable signal generation, and the process loops back to step 3705 to compute a more appropriate gain value (e.g. one that will not result in signal clipping). The test results are typically the equivalent of the calculate enable 2633. Once a gain is determined which passes the test 3720 (e.g. no clipping occurs), the process advances from the test conducted at step 3725 to step 3733, where the gain value is saved, and then exits at step 3735. If a synchronizer 2045 is used, then the save step 3733 may not be required since typically the gain will be stored in the synchronizer.

Figure 37B:
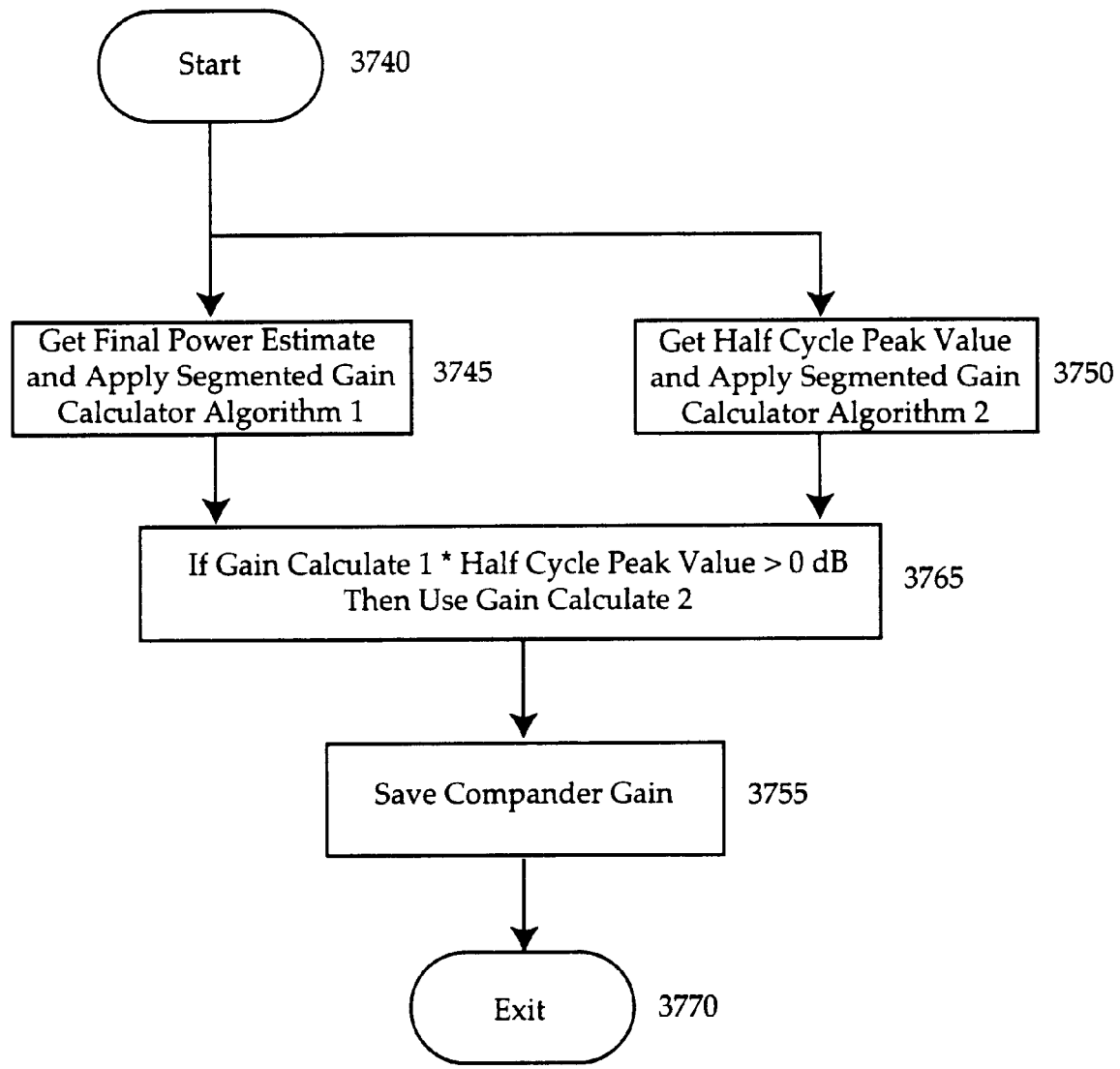
FIG. 37B shows an exemplary Embodiment of Gain Calculate flow diagram for Parallel Implementation.

A presently preferred embodiment of a gain calculate process can be better appreciated from the flow diagram of FIG. 37B, which is particularly suited to a parallel processing implementation. The process starts at step 3740 and advances simultaneously along two branches: to step 3745 where a first segmented gain calculator algorithm is applied to the final power estimate and to step 3750, where a second segmented gain calculator algorithm is applied to the half cycle peak value. As noted for step 3710, above, the segmented gain calculator algorithm of steps 3745 and 3750 will be discussed in greater detail in connection with FIG. 38. Both branches then supply their results to a select or combine step 3765, in this example a select step, where the first segmented gain calculator algorithm result is applied to the half cycle peak value. If the result exceeds the 0 dB level, the second segmented gain calculate algorithm is selected to avoid clipping. Otherwise, the first segmented gain calculation result is selected. Once the appropriate segmented gain calculator algorithm result is selected, it is saved at step 3755 and the process exits at step 3770.

Figure 37C:
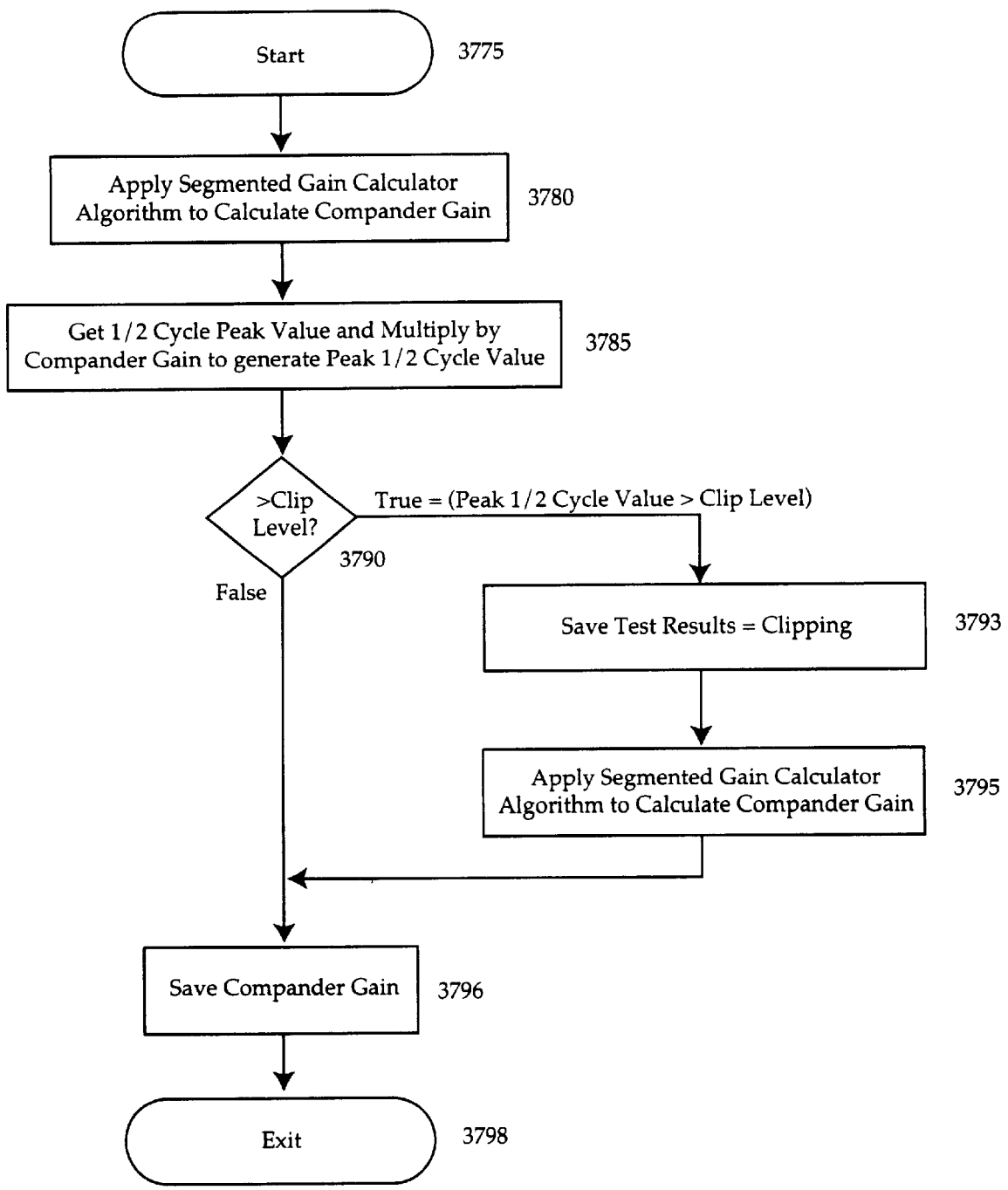
FIG. 37C shows an exemplary Embodiment of an Optimized Two Pass Gain Calculate flow diagram with Predictive Clip Detection and Gain Correction.

Referring next to FIG. 37C, an alternative serial embodiment of gain calculator process is shown, wherein both predictive clip detection and gain correction are implemented. The process starts at step 3775 and advances to step 3780 where the segmented gain calculator algorithm is applied to the final power estimate to calculate compander gain. In this example, since there is only one segmented gain calculator 3710, loop 3705 and select or combine step 3715 are not required. Then, at step 3785, the half-cycle peak value is multiplied by the compander gain to generate the peak half-cycle value. At step 3790, the result from step 3785 is compared to a predetermined clipping threshold, typically the 0 dB level. Steps 3785 and 3790 comprise the apply testing steps 3720 and 3725. If the peak half-cycle value exceeds the clipping threshold, then the test results are saved (clipping=true) at step 3793 and the compander gain calculation is repeated at step 3795 by applying the segmented gain calculator algorithm to the half-cycle peak value and test results. Either after getting a false result at step 3790, or completing the gain recalculation at step 3795, the compander gain is saved at step 3796 and the process exits at step 3798. In this example, since the second pass through gain calculate 2830 for gain recalculation guarantees an acceptable gain value, loop 3705, select or combine 3715, test application 3720, and test 3725 are not required.

Figure 38:
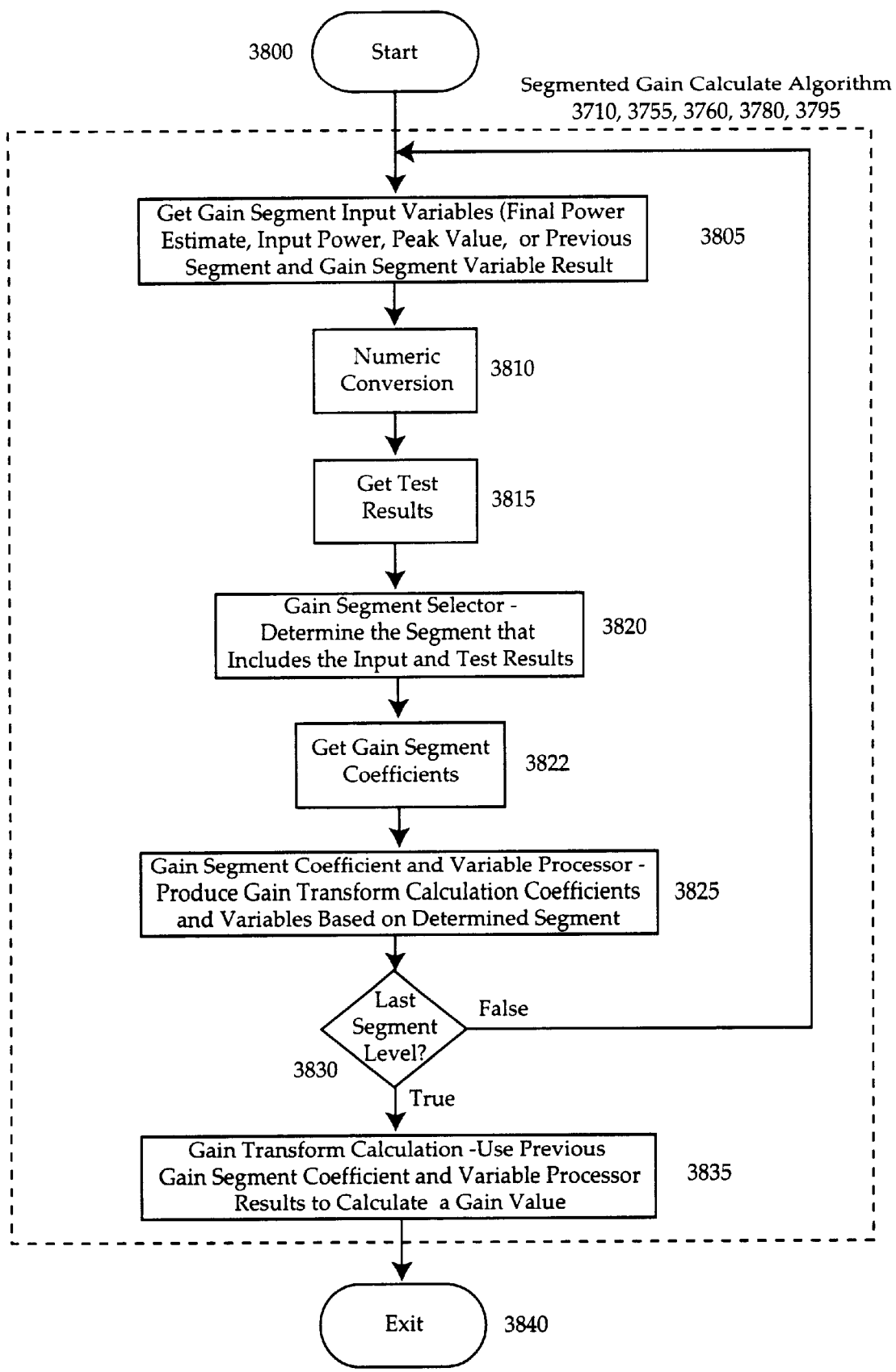
FIG. 38 shows a Segmented Gain Calculate flow diagram.

As with the gain calculate algorithm steps of FIGS. 37A and 37B, the segmented gain calculate process of step 3710 can be better understood from the following discussion of FIG. 38. The process starts at step 3800 and advances to step 3805, where, depending on the implementation, test results 3730, or a loop from step 3830, the gain segment input variables (typically one of the input final power estimates or half cycle peak value) or previous gain segment variables results are obtained. Optionally, the values from step 3805 undergo a numeric conversion such as a linear to log conversion at step 3810, followed by retrieval of test results 3730 at step 3815, for use in the gain segment selector process at step 3820. The gain segment selector, which may be broadly thought of as a segment selection processor, determines which segment includes the input value and accommodates the test results. The process then advances to step 3822, where the gain segment coefficients are obtained, typically the result of a previous segment loop 3805 through 3830, the first time through the loop the coefficients typically being null values. The process then advances to step 3825, where the gain segment coefficients and variables for the particular segment are generated. The process then advances to step 3830, where a check is made to determine whether the segment being processed is the last segment. If not, the process loops back to step 3805 and the next segment is processed as above. Once the last segment has been processed the check at step 3830 yields a true result and the results from the gain segment processor step 3825 are used to generate a gain value at step 3835, which may be broadly thought of as a transform processor step. The process then exits at step 3840.

Figure 39:
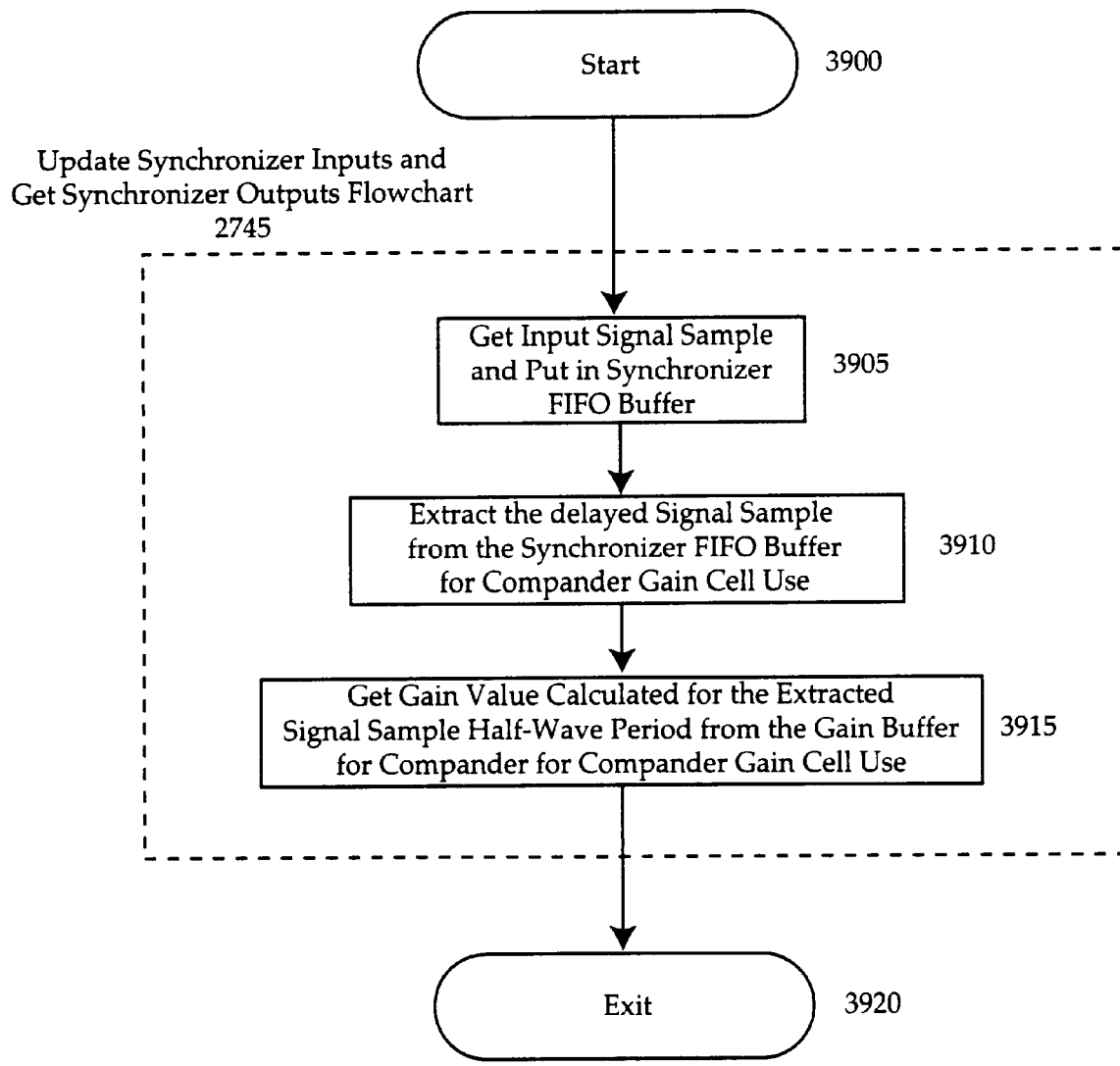
FIG. 39 shows an Update Synchronizer Inputs and Get Synchronizer Outputs flow diagram.

Turning next to FIG. 39, the process step shown at 2745 in FIGS. 27A and 27C can be better appreciated. The process, which updates the synchronizer inputs and gets the synchronizer outputs, starts at step 3900 and advances to step 3905, where the input signal sample, typically adjusted to 0 dB, is retrieved and placed in the synchronizer FIFO buffer. Then, at step 3910, the delayed signal sample, also typically adjusted to 0 dB, is extracted from the synchronizer FIFO buffer so that the sample can be used by the compander gain cell. At step 3915, the gain value calculated for the extracted signal sample is obtained from the gain buffer and made available to the compander for compander gain cell use. The process then exits at step 3920.

Figure 40A:
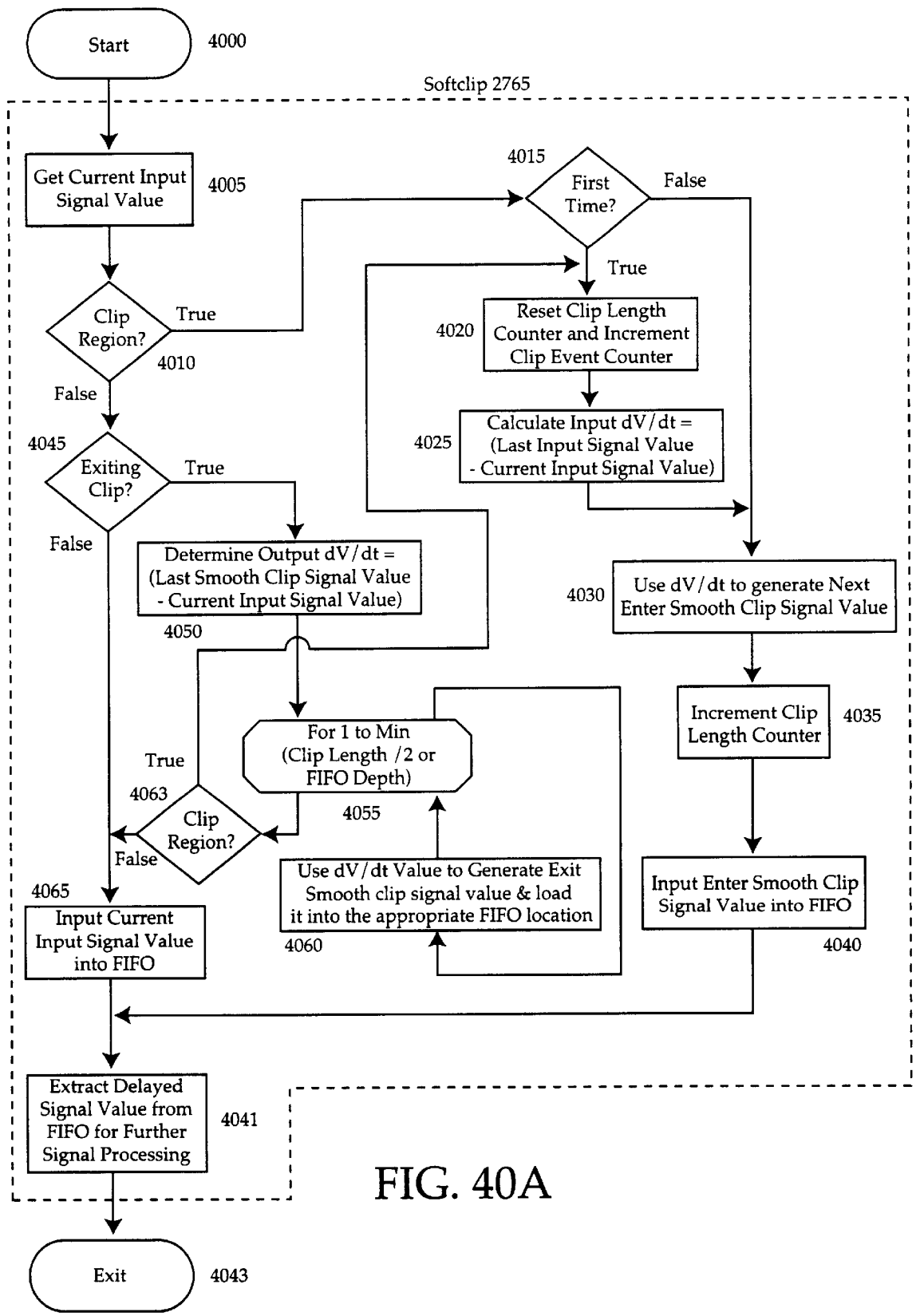
FIG. 40A shows a Softclip Algorithm flow diagram.
Figure 40B:
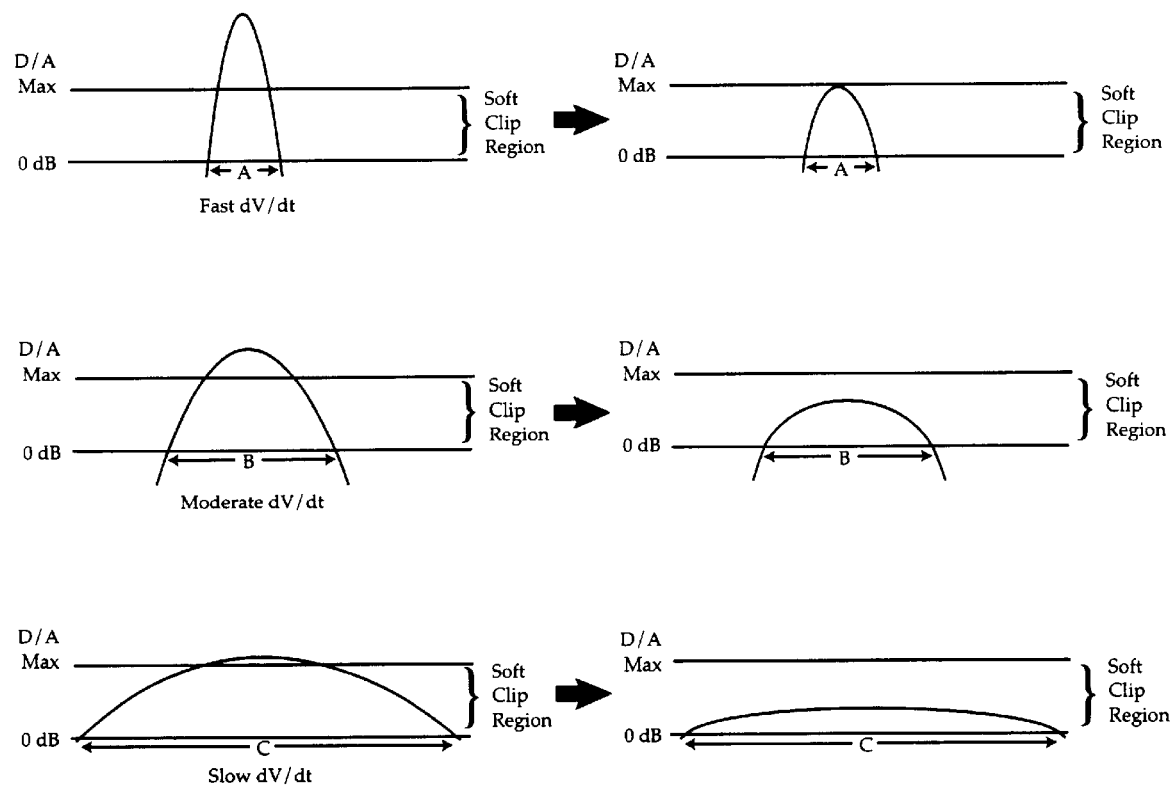
FIG. 40B shows Soft Clip Waveform Examples.
Figure 40C:
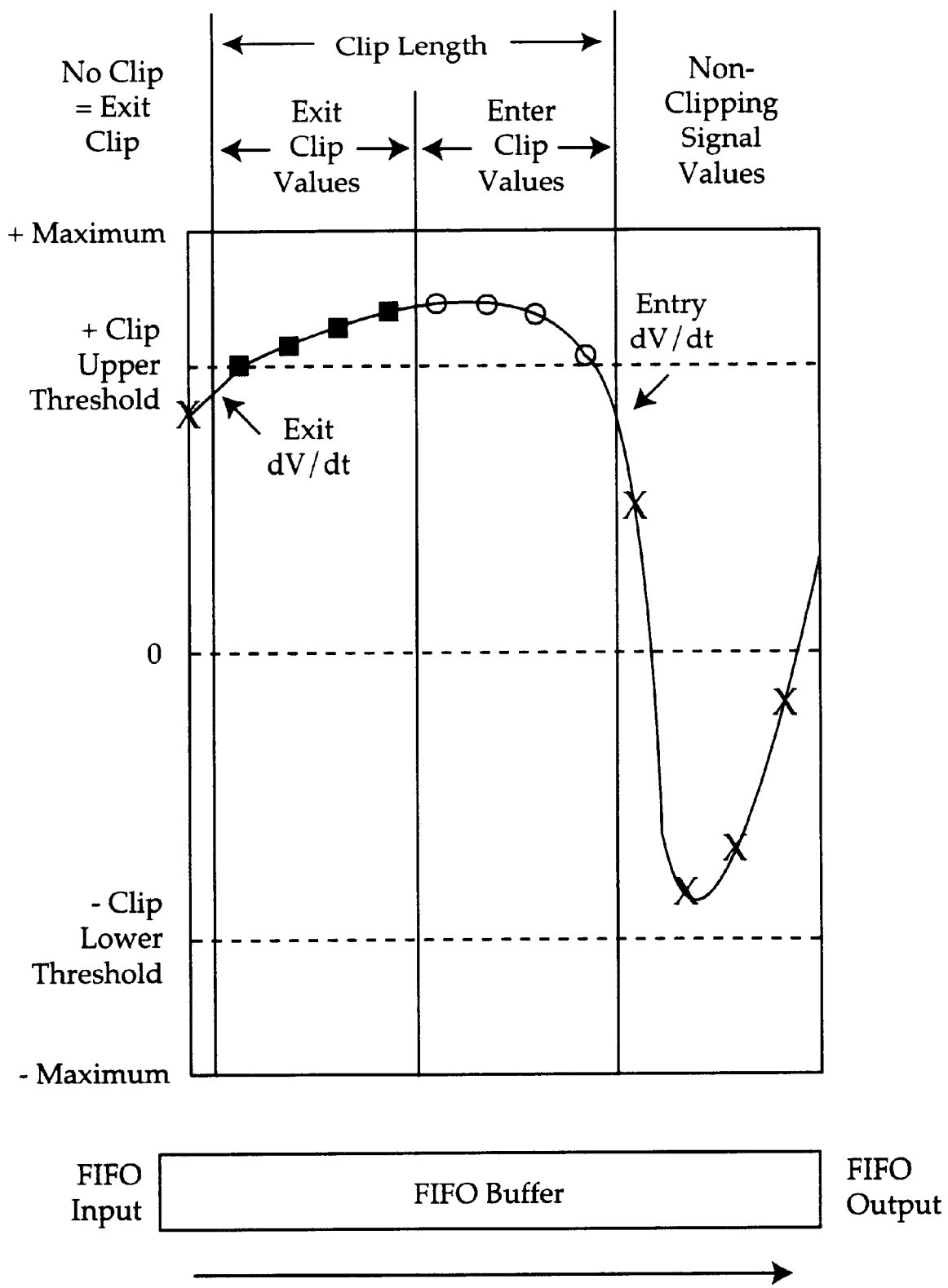
FIG. 40C shows a Softclip FIFO Buffer Usage.

The soft clip process, shown in summary form at step 2765 of FIG. 27A, can be better appreciated from FIGS. 40A, 40B and 40C. As noted in connection with FIG. 27A, the purpose of the soft clip process is to manage the distortion that can result when the input signal and the gain result in an output signal above an acceptable threshold. While FIG. 40A shows the process for application of a soft clip, examples of the various types of signals which might lead to clipping are shown on the left side of FIG. 40B, while the associated signal resulting after application of the soft clip process is shown on the right side of FIG. 40B. It will also be appreciated that the "entry" portion of the soft clip process differs from the "exit" portion of the process, where the positive or negative values greater than the positive or negative clipping thresholds separates the entry from the exit portions.

The process of FIG. 40A starts at step 4000 and advances to step 4005, where the current input signal value is retrieved. A test is made at step 4010 to determine whether the sample is within the clip region. This is typically done by comparing the magnitude of the input signal and a clipping threshold or by comparing the input signal to an upper threshold and a lower threshold. If so, the process branches to the "clip entry" path, which begins at step 4015, where a check is made to determine whether this is the first sample within the clip region. If so, the clip length counter is reset, the clip event counter is incremented and a clip signal may be generated for use by other processes at step 4020, followed by calculating the slope of the curve defined by the previous and current samples—or dV/dt, at step 4025. The clip event counter may be reset at any time. After calculation of dV/dt, or if the test at step 4015 turns out false (which means simply that a prior sample was in the clip region), the calculated dV/dt is used to generate smooth clip value for the current sample during the "entry" portion of the process, typically by use of a look-up table. The clip counter and dV/dt values can be used as pointers to address a lookup table that contains the smoothed clip output value. Different dV/dt values can be used to access sections of the lookup table appropriate for the amount of smoothing required. As shown in FIG. 40B, the fast dV/dt inputs require more amplitude to smooth the signal versus the slow dV/dt inputs and different lookup tables (or portions thereof) used to generate the different outputs shown on the right side of FIG. 40B. Alternatively, the clip counter and dV/dt values can be used to directly calculate the smoothed clip output values. The dV/dt value may also be continually calculated between samples while in the clip regions. The clip length counter is then incremented at step 4035, followed at step 4040 by placing the smooth clip signal value generated in step 4030 into the FIFO buffer. The process then advances to step 4041 where the delayed signal value is extracted from the FIFO buffer for further processing, after which the process exits at step 4043.

If, however, the test at step 4010 yields a false result, the process advances to a test at step 4045 to determine whether the current input signal value obtained at step 4005 is exiting the clip region. Exiting the clip region occurs when the current input sample value is not in the positive or negative clip regions or transitions from the current polarity clip region to the opposite polarity clip region. If so, the process branches to step 4050 and the output dV/dt is determined, using the last smooth clip signal value less the current input signal value. The process then advances to step 4055, where a loop is called for N samples, typically the lesser of the clip length divided by two or the FIFO buffer depth for example although other values can be used. The loop advances to step 4060 where the dV/dt value and clip length divided by two or the FIFO buffer depth (whichever is smaller) are used to generate the exit smooth clip value, typically from a lookup table or computation, and load it into the appropriate FIFO location for each sample. Once the last sample is processed, the loop at 4055 exits and executes the check at step 4063. This check tests for the case where the current input sample value transitions from the current polarity clip region to the opposite polarity clip region and if true branches to step 4020 to generate "entry" smoothed clip output values. If false, then the process then returns to the same point as though the test at step 4045 had returned a false (i.e., no clipping and not exiting a clip, or what will be the most common process in response to a sample), and advances to step 4065 where the current input signal—either the actual sample or adjusted for clipping—is input into the FIFO buffer. The process then advances to step 4041 as described above, followed by an exit at step 4043.

Referring to FIG. 40C, the entry and exit process may be better understood. The input signal waveform can be observed from right to left, with the initial portion not exceeding either the positive upper or negative lower clipping thresholds. The samples which form the digital representation of the signal are indicated by X, circles and, later, squares. Eventually the signal enters the clipping region by exceeding the clip threshold, the circles indicating the "entry" smoothed clip output values generated by the soft-clip algorithm. Eventually the sample drops below the clip threshold at which point the output dV/dt is determined and the FIFO is backfilled with "exit" smoothed clip output values (squares), in this example for half of the length of the FIFO buffer to produce smooth "entry" and "exit" curve. While bipolar operation is shown, the same method applies to unipolar inputs.

The various elements which comprise the compander portion of the present invention can thus be understood. Following the compander function, the volume control 445 portion of the system of FIG. 4 can be better appreciated. A generalized view of the multi-module volume control arrangement in accordance with the present invention can be better appreciated from FIG. 41A, in which the signal input and output to the volume control stages is provided via the signal bus 400B, comprising particularly multi-channel/multi-band signals 4125A through 4125n and calibration signals 5010A-n, which are supplied to volume control and pre-mixer modules 445A-v. The various modules 445 each receive control signals from the control bus 400A, while the output of the volume control stage is provided as one or more single/multi-band signals 4130A–4130n, which are then distributed via the signal bus 400B. Thus FIG. 41A illustrates the use of multiple volume control and pre-mixers to implement one level of a multi-band and/or multi-channel volume control.

Figure 41A:
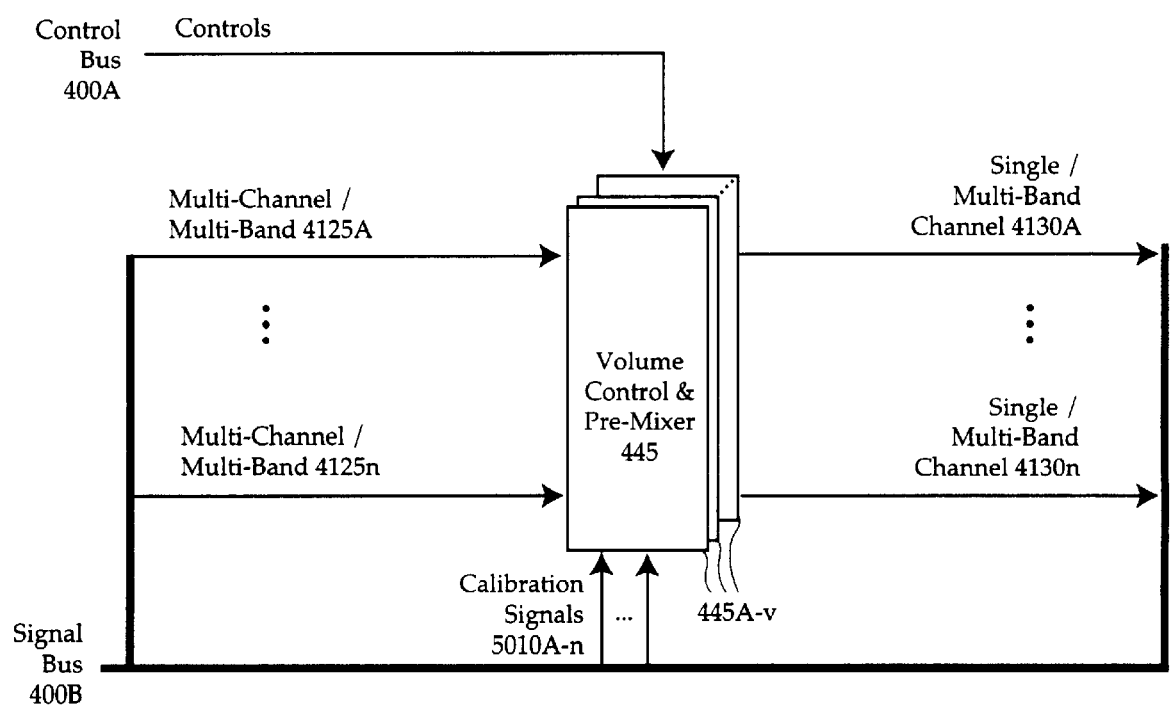
FIG. 41A shows a Volume Control Multi-Module Diagram.
Figure 41B:
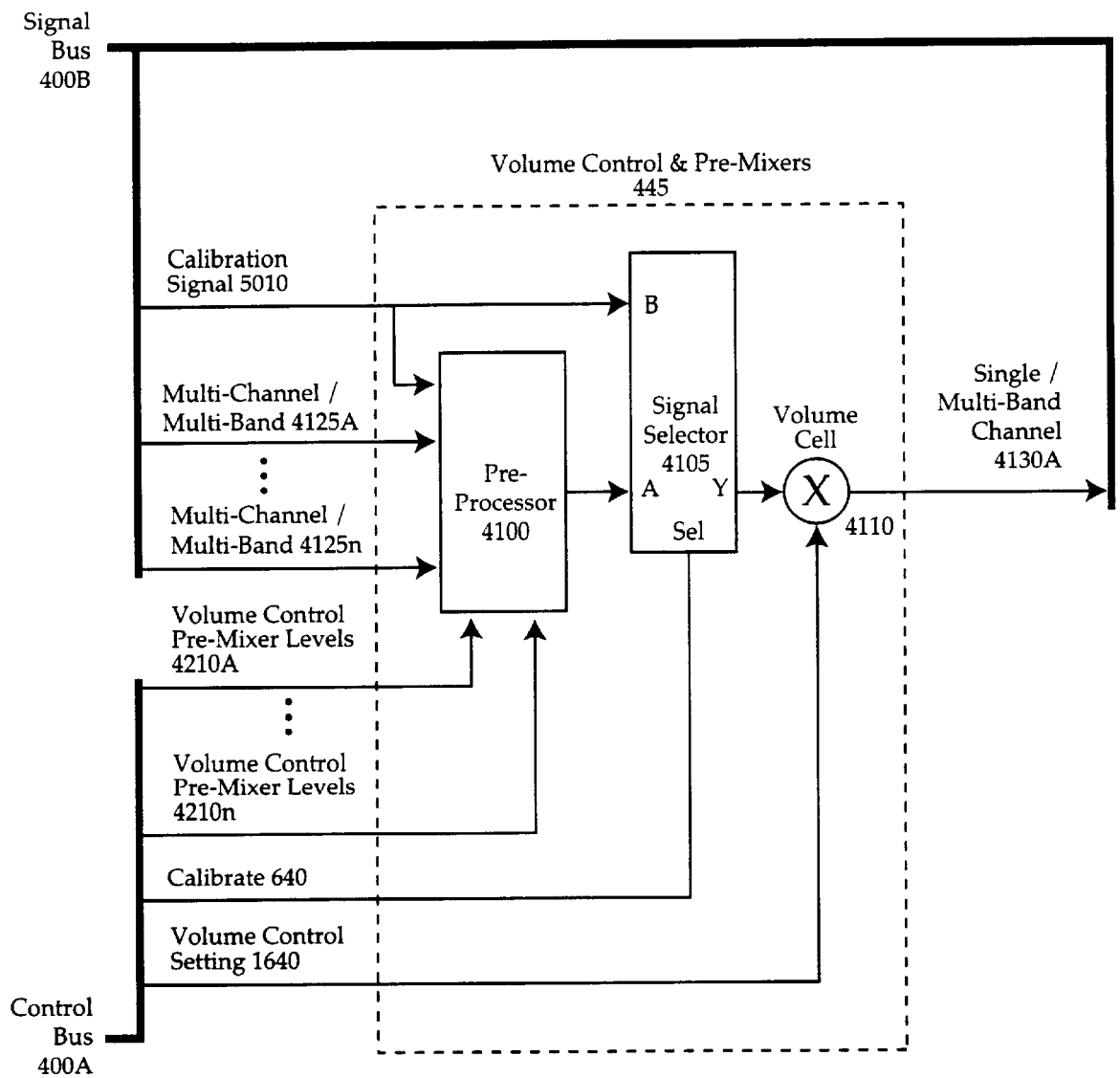
FIG. 41B shows a Volume Control and Preprocessor Block Diagram.

Turning to FIG. 41B, the volume control and pre-mixer 445 of FIG. 41A may be appreciated in greater detail. The signal bus 400B provides a calibration signal 5010 together with the multi-channel/multi-band signals 4125A–4125n. The multi-channel/multi-band and calibration signals are provided to a pre-processor 4100 which also receives control signals from the control bus 400A in the form of volume control pre-mixer levels 4210A through 4210n. Typically the preprocessor 4100 is a signal mixer with input scaling. The resulting signal is provided as the "A" input to a signal selector function 4105 while the calibration signal 5010 provides a "B" input thereto. In addition, the signal selector function 4105 also receives a calibrate 640 signal to select the A or B inputs. The output of the signal selector function 4105 is provided to a volume cell 4110, which applies to the input signal a volume setting control signal 1640 and outputs a single/multi-band channel signal 4130A.

Figure 42A:
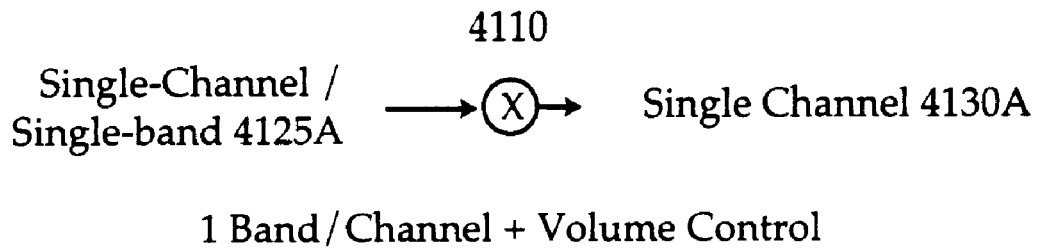
Figure 42B:
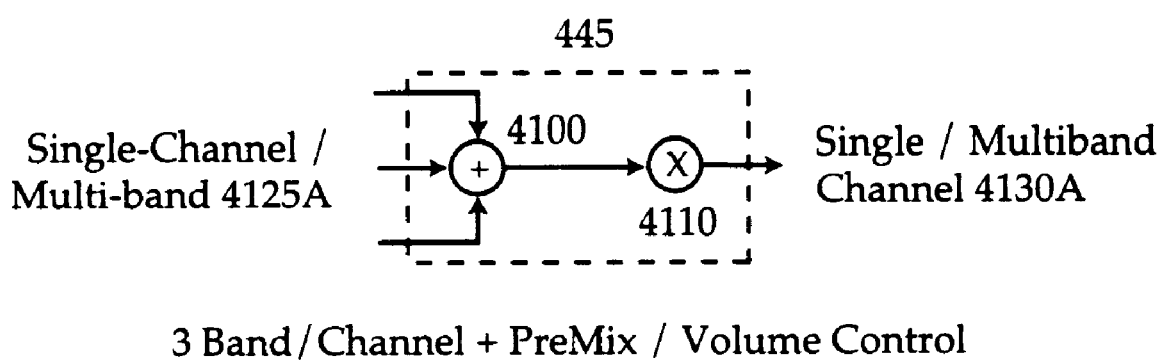
Figure 42C:
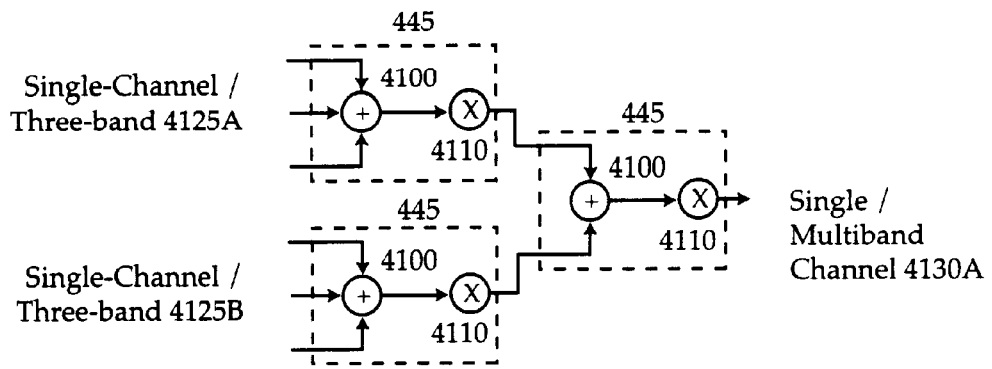

Turning next to FIGS. 42A–42D, examples of a variety of volume control configurations may be better appreciated. FIG. 42A shows a single band/channel input plus volume control, where the signal 4125A is supplied to the volume control function 4110, resulting in a single band/channel output signal 4130A. FIG. 42B shows three bands of a single channel for the input signal 4125A, requiring a pre-mix function 4100 together with the volume control 4110 function in the volume control/premixer 445. FIG. 42C shows two channels, each with three bands, as inputs, with a single band, single channel out. Thus, two three-input premixers 4100 are provided, one for each channel, together with a premix-volume control 4110. The outputs of the pre-mix volume control are provided to a mixer 4100, which is then supplied to the volume control function as described for FIG. 42B. It will be appreciated that each pre-mix and volume control combination can be configured from the function 445 described previously.

Figure 42D:
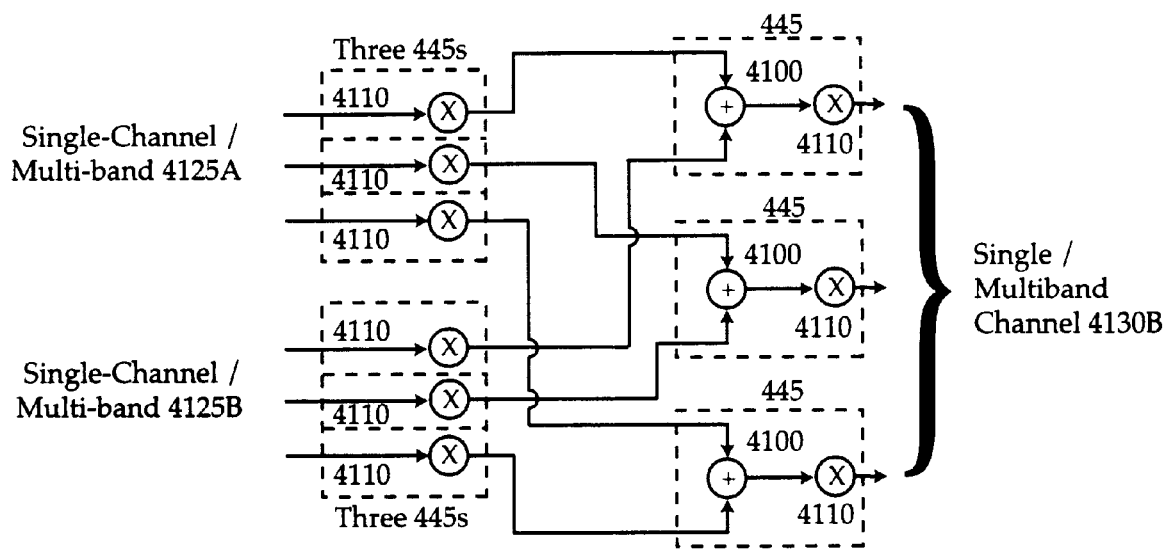

FIG. 42D shows a volume control configuration in which two channels groups, each with three bands per channel, are scaled and mixed with volume control applied to yield a single channel of three bands. Like FIG. 42C, the configuration is a matrix of volume control/pre-mix functions 445. Thus, each channel group is supplied to a premix volume control 4110, with appropriate pairings (first with first, second with second, third with third, in the example shown) of the premix volume control outputs to the premix portion 4100 of a second function 445, followed by a volume control function 4110, yielding three output signals. It will be appreciated that many alternative configurations are possible, and these examples are provided only to show a framework for the manner in which such signals might be combined.

Referring next to FIG. 43A, the output signal processing function (shown as 475 in FIG. 4) is represented in block diagram form. The signal bus 400B provides a plurality of single/multi-band channel signals 4330A through 4330n, each of which is provided to the output signal processor block 475, and in particular to an associated channel processing function 4300A–4300n. The output signals from each of the blocks 4300A is a channel band group 4335A–4335n, and is provided to an associated band group output processor 4305A through 4305n (discussed in greater detail in connection with FIG. 43B). Control signals for each of the functions 4300 and 4305 are provided from the control bus 400A. Control signals to block 4300 typically consist of bandsplit and scaling parameters and to block 4305 typically consist of signal combiner, softclip, bandsplit filter/scaling and output conversion parameters and are listed in table A. In turn, each of the output processors 4305A–4305n provide a channel reference out signal 4310A–4310n to the control bus 400A, and also provide analog or digital outputs for their respective group. The output signals include signals 480, 482 and 485 in FIG. 4.

Next referring to FIG. 43B, the band group output processor 4305 can be better appreciated. Each of the signals 4335A-n, which may be a plurality of signals, is provided to an associated one of a plurality of function blocks 4315A-n which serve as signal combiners, softclip, and bandsplit filters. The control bus 400A typically provides signal combiner, softclip, bandsplit filter/scaling and output conversion parameters to the function blocks 4315A-n as well as output conversion blocks 4320A-n. The output signals from blocks 4315A-n are band group signals 4340A-n, and are supplied to respective ones of the output conversion blocks 4320A-n (better explained in connection with FIG. 44.) Each of the output conversion blocks provides an associated output conversion reference 4345A-n, all of which are provided to a reference combiner block 4350 which may be broadly thought of as a reference signal generator. The output conversion blocks 4320A-n also provide appropriate analog or digital output signals 480, 482 and 485. The reference combiner 4350 provides the channel reference output signal 4310 for that output processor.

As noted above, FIG. 44 describes in greater detail the output conversion block 4320. As shown in FIG. 43B, the band group signal 4340A, which may be a plurality of signals are provided as the signal inputs to an input summation processor 4400, which also receives control signals from control bus 400A as discussed previously. The Input Summation Processor 4400 provides as one output the output conversions reference signal 4345, and in addition provides an output signal to analog output processing block 4405 and to digital output processing block 4430. The control bus 400A also provides command signals to the output processing blocks 4405 and 4430. The analog output processing block 4405 provides discrete sound outputs 480 as well as output 485 for other analog signal-accepting devices. The digital output processing block 4430 provides digital outputs 482, typically in the form of packets or other digital format.

Figure 45A:
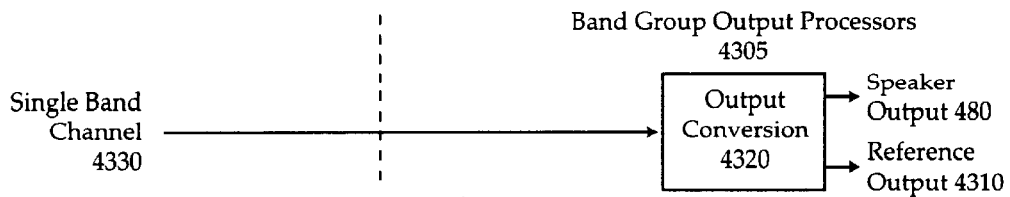

Turning next to FIGS. 45A–45G, exemplary arrangements for single and multiple channel outputs are shown. A simple single band channel arrangement is shown in FIG. 45A, where channel input signal 4330 is supplied as an input signal to output conversion block 4320 as the requisite component of the band group output processor 4305 without any channel processing 4300. The output conversion block provides a single speaker output 480 together with a reference output 4345 that may be used as a channel reference output 4310.

Figure 45B:
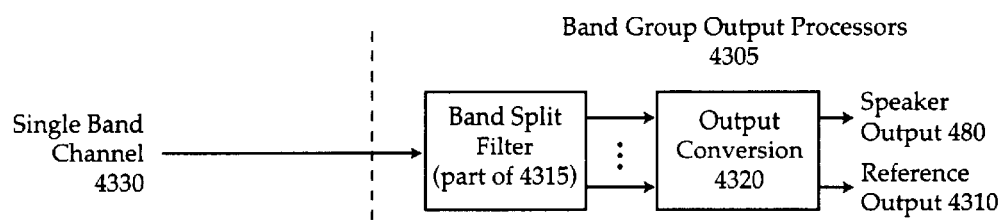
Figure 46:
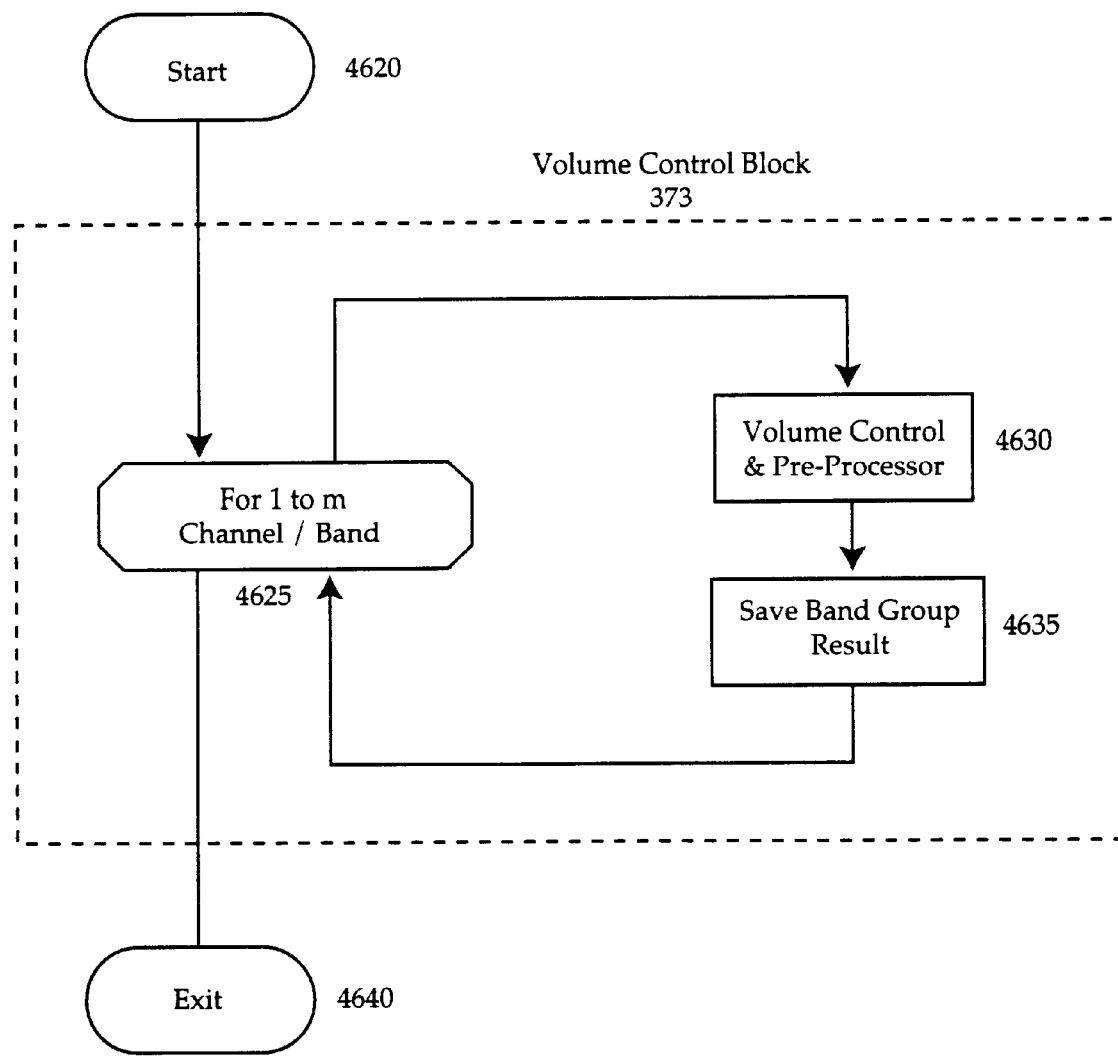

A single band channel with speaker equalization is shown in FIG. 45B. Input signal 4330 is supplied to band group output processing block 4305, the first element being a bandsplit filter which comprises part of the block 4315. The bandsplit filter 4315, typically similar to process 1178 of FIG. 10E, operates to provide speaker equalization, and outputs a plurality of signals to the output conversion block 4320, which in turn output the speaker output 480 as well as the reference output 4345 that may be used as a channel reference output 4310.

Figure 45C:
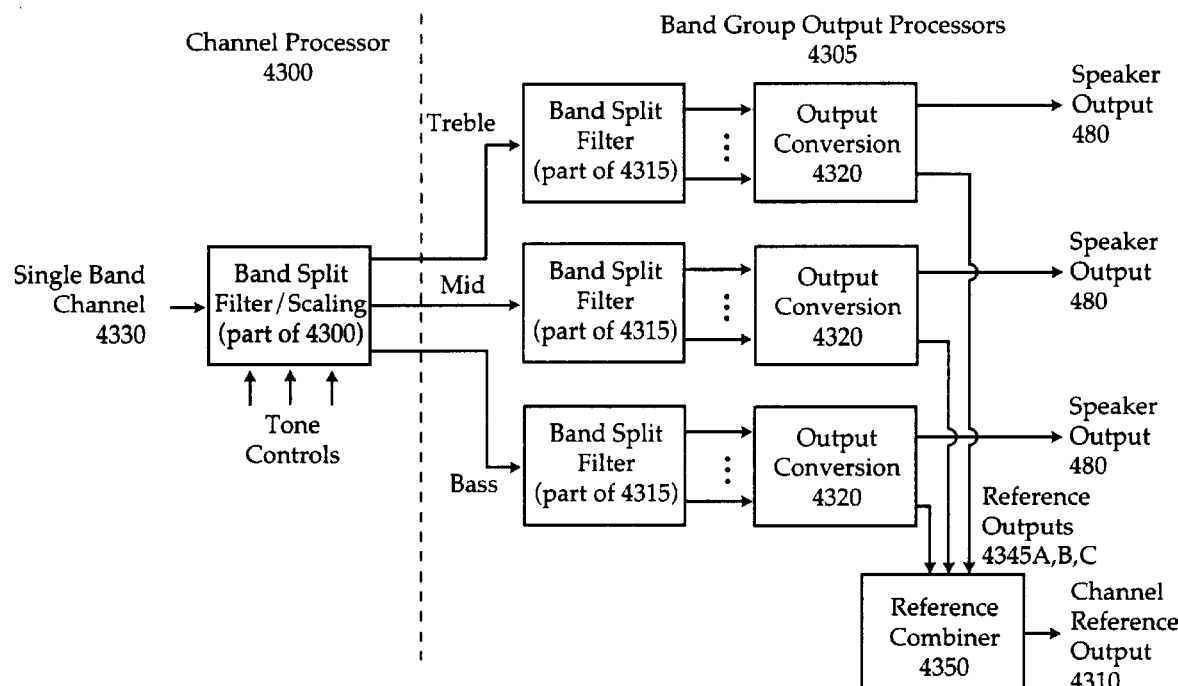

A somewhat more robust single band channel is shown in FIG. 45C, this time with tri-amped output and speaker equalization combined. The input signal 4330 is supplied to a bandsplit filter and scaling block, which is part of channel processor 4300 of FIG. 43A and typically similar to process 1178 of FIG. 10E. A plurality of tone controls is supplied by control bus 400A as bandsplit scaling coefficients. The bandsplit filter 4300 outputs bass, midrange and treble signals to a trio of bandsplit filters, parts of blocks 4315 of band group output processor 4305. Each of the bandsplit filters 4315 operates to provide speaker equalization, and provides a plurality of bandsplit outputs to associated output conversion blocks 4320, each of which in turn provides a speaker output 480 and a reference output 4345A–C. The reference outputs 4345A–C are then combined in the reference combiner 4350, which outputs the channel reference output 4310.

Figure 45D:
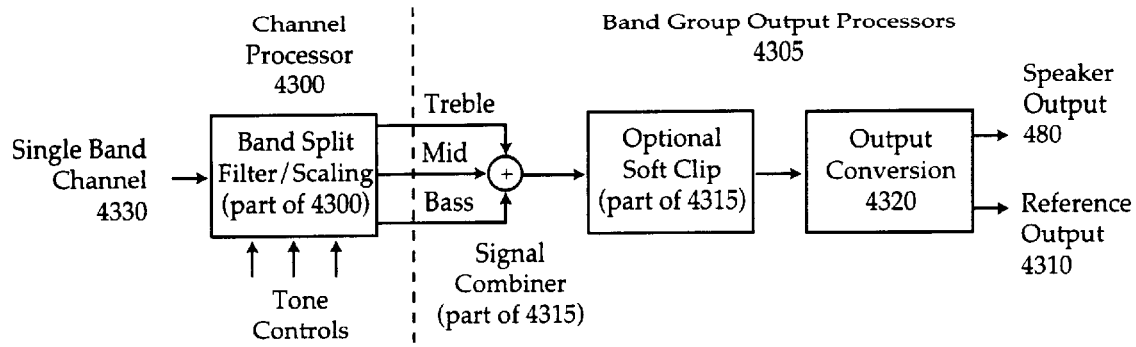

Referring next to FIG. 45D, an exemplary arrangement of a single band channel with tone control can be better understood. The single/multiband channel input signal 4330 is provided to a channel processor 4300, which also receives a plurality on tone control signals (bandsplit scaling coefficients) via the bus 400A. The channel processor 4300 particularly includes, for this example, the bandsplit filter/scaling function, typically similar to process 1178 of FIG. 10E, which output treble, bass and midrange signals. The three band signals are combined in a signal combiner (part of 4315), in this example a simple adder, the result of which is supplied to a soft clip portion of the functional block 4315. The soft clip output is provided to the output conversion block 4320 as discussed previously, which in turn provides the speaker output 480 and reference output 4345 which may be used as a channel reference output 4310.

Figure 45E:
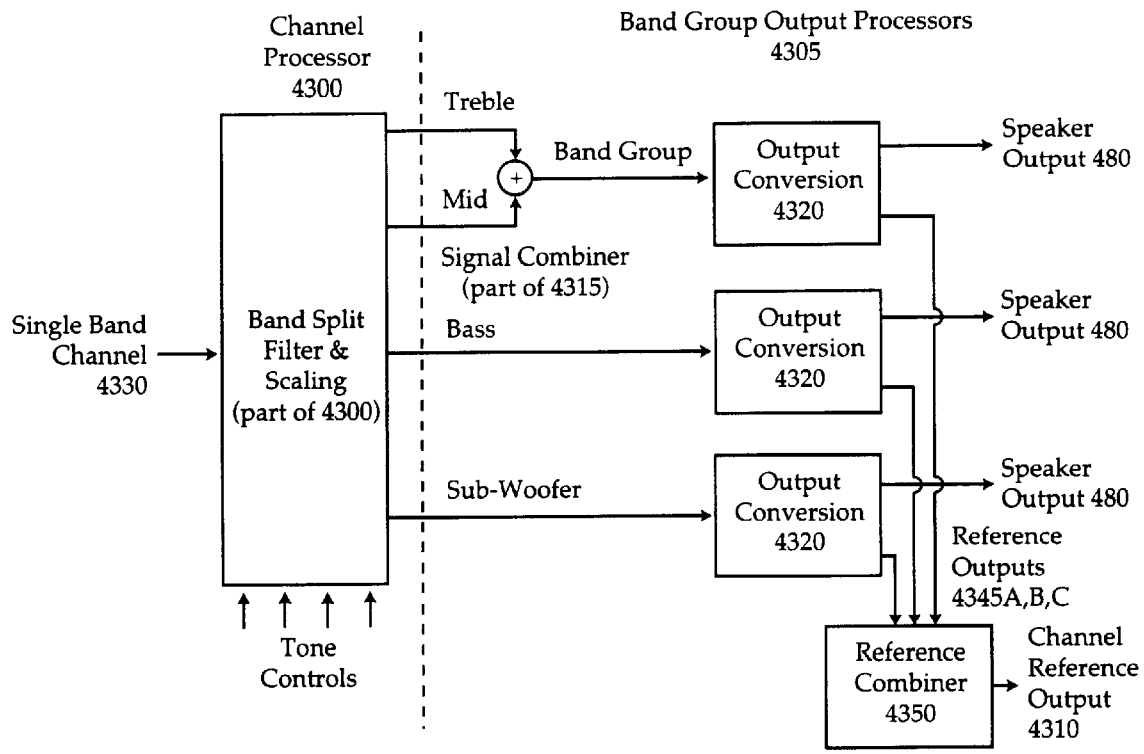

Turning next to FIG. 45E, an example is shown of a single band channel with tone controls and three multi-amped speakers. The signal 4330 is supplied to a bandsplit filter and scaling block, part of the channel processor 4300. The bandsplit filter block 4315 outputs in this example, bass and sub-woofer outputs directly to output conversion blocks 4320 (part of the output processor 4305), while the treble and mid-range signals are combined in an adder which comprises the signal combiner part of 4315. As with the other examples, the output conversion blocks 4320 each outputs a speaker output signal 480 as well as a reference signal 4345A–C. The reference signals are combined in a reference combiner 4350, which in turn outputs a channel reference output 4310.

Figure 45F:
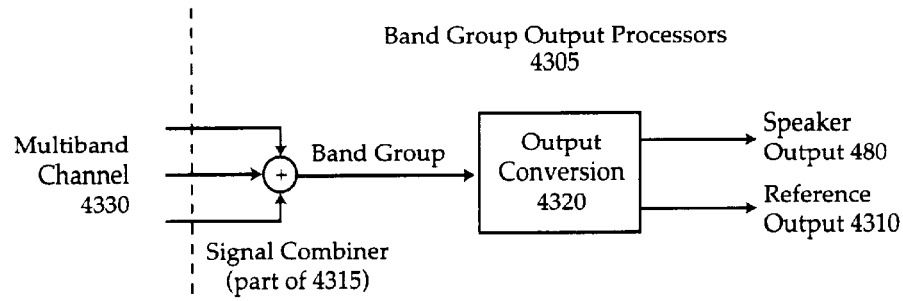

FIG. 45F illustrates an exemplary multi-band channel implementation, in which a three band signal 4330 is supplied directly (i.e. no channel processing 4300) to the band group output processor 4305, and more specifically to a signal combiner (part of 4315), from which the band group signal is supplied to an output conversion block 4320. The output conversion block then output the appropriate speaker output 480, as well as a reference output 4345 which may be used as a channel reference 4310.

Figure 45G:
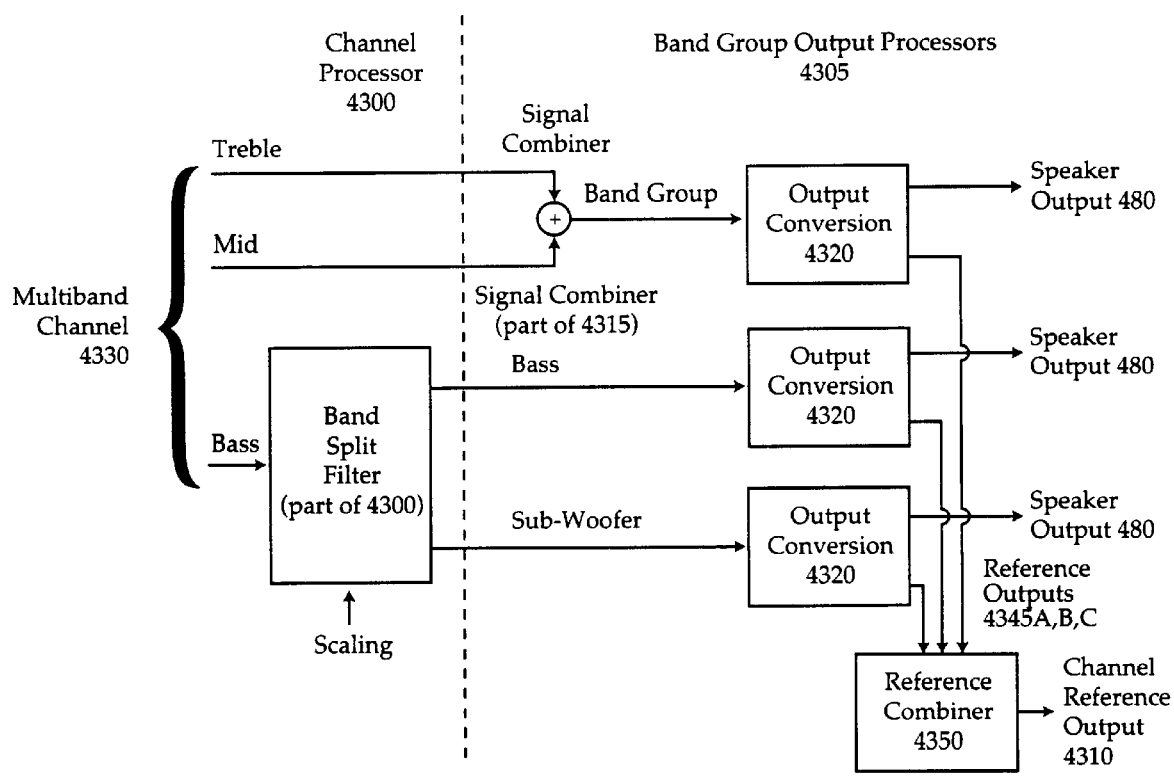

A more robust implementation, suitable for use with a multiband channel and including a sub-woofer, can be seen in FIG. 45G. A multiband channel 4330 supplies a treble, midrange and bass signal to a channel processor stage 4300, and the bass signal particularly to a bandsplit filter portion of 4300. The bandsplit filter portion splits the bass signal into a bass and sub-woofer signals. The treble and mid-range signals are combined in a signal combiner which is part of a block 4315, and the resulting band group is supplied to the output conversion block 4320. Similarly, the bass and sub-woofer signals are provided to associated output conversion blocks 4320. As with the other examples, the reference outputs 4345A–C of the conversion blocks 4320 are each provided to a reference combiner 4350. The output conversion blocks also generate a speaker output 480, while the reference combiner 4350 generates a channel reference output signal 4310.

The foregoing examples provide some indication of the versatility of the functional aspects of the output processing portion of the present invention. It will be appreciated that the previous example designs can be expanded to multiple channels.

Referring next to FIG. 46, the volume control block 373 process may be better appreciated which generally corresponds to the logic of the multi-module volume control and pre-mixer modules 445 as previously discussed in connection with FIG. 41A. The process starts at step 4620 and advances to step 4625, which calls a loop for one to m channel and bands. For each channel and band, the loop advances to a volume control and pre-processor process 4630, after which the result of the process 4630 is saved at step 4635. The loop then returns to the step 4625 for processing of the next band or channel. After all of the bands and channels have been processed, the loop returns and exits at step 4640.

With reference next to FIG. 47, an exemplary version of the volume control and pre-processor process 4630 may be better appreciated. the process starts at step 4700, and advances to a check at step 4705, where a determination can be made whether the system is in setup mode. In those instances where the system is in setup mode, such as during calibration, the process branches to get step 4710, where a calibration signal input sample is obtained. If, as will usually be the case, the test at step 4705 confirms that the system is not in setup mode, the process advances to step 4715, where the relevant compander outputs or other signal values, for example the previous level volume control 4635 results, are obtained. Those outputs are then applied at step 4720 to a pre-processor combiner/mixer algorithm, which may for example simply add the signals together or may split or scale the particular input signals. Whether as the result of step 4720 or getting the calibration signal input sample of step 4710, the process then advances to step 4725 where the volume control setting is obtained, typically from the transform engine 720 or user interface 360, and applied to the signal, typically by use of a multiplier, after which the process exits at step 4730.

FIG. 48 illustrates an exemplary form of robust output signal processing, which generally corresponds to the logic of FIG. 43B, and which covers many of the output processing permutations for producing both an output signal and a reference signal for use in noise compensation or other purposes, such as an intelligent user interface. The process starts at step 4800, then advances to what was generally shown as the output signal processor step 375 in FIG. 3B, and more specifically to step 4805 where a loop is called for one to n channels. The loop begun at step 4805 calls another loop at step 4810 for one to m bands; the loop may generally be thought of as the channel processing portion 4811, in this example a bandsplit function. The loop advances to step 4815, where a test is made to determine whether the signal is to be split into sub-bands. If so, the process advances to step 4820 where the input signal to be bandsplit is retrieved, and then advances to step 4825 where the bandsplit filter and scaling process, typically similar to process 1178 of FIG. 10E, is executed. Then, whether as the result of a false return at step 4815 or the bandsplit filter process at step 4825, the process advances to step 4830 where the results are saved for band group output processing. The loop then returns to step 4810 for processing the next band. Once the last of the bands have been processed, the process advances from step 4810 to a band group output processing loop at step 4835 for 1 to p bands or band groups. The loop includes a signal combiner step 4840, followed by a soft clip process 4845, and then a bandsplit filter and scaling process at step 4850. The results then undergo an output conversion step 4855, after which the process returns to step 4835 for processing of the next band group of the channel. Once the last band group has been processed, the loop returns and the process advances from step 4835 to step 4860 where all the output conversion reference values are obtained and combined into a channel reference value which may be broadly thought of as a reference signal generator. The process then returns to step 4805 where the next channel is processed. Once the last channel is processed, the process advances from step 4805 to exit at step 4865. Not all processing steps need to be executed, depending on the implementation, examples of which are shown in connection with FIGS. 45A–G.

Turning next to FIG. 49, an exemplary output conversions process 4855 is illustrated in flow diagram form. The process, which generally corresponds to the logic of FIG. 44, starts at step 4900 and advances to step 4905 where all appropriate inputs are retrieved and combined together. The inputs are typically generated by bandsplit step 4850 for use in speaker equalization and the combining is typically achieved by, for example, scaling each input and summing together although other arithmetic functions may be appropriate in particular embodiments. The summed inputs are used to generate the output conversion reference signal (4345A-n, FIG. 43B) which is saved at step 4910 for later use by the channel reference generator 4860. The process then advances to step 4915 where a test is made to determine whether analog outputs are needed. If so, the process advances to step 4920 where a signal processing step is implemented, typically to allow for scaling of the data word length. The maximum output gain value is then retrieved at step 4925 and applied to the linear power amplifier in step 4925, followed by a D/A conversion and linear power amplification step 4930.

After converting and amplifying the analog signal at step 4930, or if no analog signal was needed as determined at step 4915, the process advances to step 4935 where a test is made to determine whether digital outputs are needed. It should be noted that both analog and digital outputs may be generated substantially simultaneously, allowing for maximum flexibility. If digital outputs are needed for the particular system implementation, the process advances to step 4940 for signal processing, which typically allows for data word length scaling. The process advances to step 4945 where the output sample is placed into the output FIFO buffer, and then progresses to step 4950 where a test is made to determine whether the digital outputs need to be packetized for the particular implementation. If so, the process advances to step 4955, where a test is made to determine whether the next packet is ready. If so, the packet is generated at step 4960 otherwise the cycle is skipped until enough data has been processed into the FIFO to make a packet and test 4955 becomes true Once the packet is sent, or if no packet is ready, the process advances to step 4970 and exits, which also occurs at step 4935 if no digital outputs are required. If a false result occurs at test 4950 (i.e., no packets needed), the process advances to step 4965 where the next sample is output from the FIFO, typically for constant rate devices such as digital tape recorders, after which the process advances to exit step 4970.

Turning to FIG. 50, the calibrator/annunciator 420 of FIG. 4 can be better appreciated. The calibrator annunciator performs two general functions: first, it provides calibration signals for several purposes, and second it provides annunciator functions to the user. In particular, the calibrator provides calibration signals for noise compensation loop balancing, as discussed hereinafter, provides calibration signals for automatic channel/band balancing of the system, and can download new calibration signals. The annunciator portion functions to provides voice feedback to the user including instructions to the user to change settings. The annunciator can include a variety of techniques from voice synthesis to voice compression, and can digitally record a message. The calibrator/annunciator 420 can perform arbitrary waveform generation, white noise generation, Fourier synthesis, computed noise, and/or AM/FM/PM signals to produce output calibration signal 5010, which is provided to the signal bus 400B for dissemination through the system. Control Bus 400A may be used to select the annunciator message, select the calibration generation method, and record input signals from Signal Bus 400B.

Turning to FIGS. 51 through 64, the noise compensation aspect of the overall system of the present invention may better appreciated beyond the discussion provided in connection with FIG. 4, above. In general, the ambient environmental noise portion of total environmental input 470 is detected with compensation for the sound signal of the system, and is used to increase the system outputs to overcome such ambient noise or, depending on the user's preferences, to allow the system output to be reduced to give the ambient noise (such as a conversation) priority over the system outputs. In general, there are three variations of noise compensators, i.e. closed loop, leakage loop, and open loop. The closed loop is the most robust, while the other variations trade off increased acoustic restrictions for reduced processing requirements.

In a closed loop noise compensator, the environmental sensors, typically microphones, that detect the environmental signal 470 (from FIG. 4, above and FIG. 51) is assured of detecting the entire sound signal produced by the speakers 480. Since all of the sound generated by the speakers is detected by the microphone, it is possible to calibrate the response of the loop processor 1200 and 1205 (FIG. 11, above and FIG. 51) to a given or plurality of channel reference outputs 4310 (FIGS. 11 and 43, above) by "system" or "loop" balancing. For optimal noise compensation, negative loops are used in the loop processor 1200/1205 to ensure stability in any acoustic environment, in particular, to avoid a gain chase problem that results from a changing acoustic environment due to variations in room acoustics and resonances.

In a leakage loop noise compensator, the loop processor 1200 and 1205 obtains a partial signal 470 from the speakers 480, typically the result of sound leakage from a headphone or handset, and the remainder of signal 470 from environmental noise. A negative loop 1205 is required in the loop processor to compensate for variations in the amount of sound leakage. Calibration of an open/closed loop noise compensator may, in some embodiments, be avoided by proper design, or by a one time factory calibration that matches environmental noise levels to the output signal levels; e.g. that produced by a headphone's speakers.

An open loop noise compensator has no acoustic coupling between the speakers 480 and the environmental sensors that detect environmental input signal 470, thus no negative loop is needed to obtain stable operation. Examples of environmental sensors without acoustic coupling include speedometers, accelerometers, tachometers, and status indicators such as window up or down. Calibration of an open loop noise compensator can be avoided by proper design.

With the foregoing in mind, the exemplary arrangements shown by the figures may be better understood. Referring first to FIG. 51, there is shown therein a generalized noise compensation loop using various components of the partitioned signal processing system. To simplify the conceptual noise compensation loop example of FIG. 51, a single band, single channel compander and a single environmental sensor (microphone) are shown from which it will be apparent to those skilled in the art, given the other teachings herein, that multiband, multichannel compander, multiple environmental sensor, systems using open and closed loops simultaneously, and volume control only systems can also be realized. The loop, also referred to as the positive loop, begins with an input signal 2005, typically 0 dB adjusted signal 860, being supplied to compander 450, the output of which is supplied to volume control 445 and to the output signal processor 475, which in turn provides the amplified signal that drives speaker 480 and produces a channel reference out signal 4310.

The noise extractor 465 is comprised of two parts, loop processor 1200 and 1205, and a noise processor 1210. The total environmental input 470 supplied to the loop processor 1200 and 1205 is processed with the channel reference out 4310 signal to provide positive loop outputs 5100 supplied to the noise processor 1210. The negative loop processing is typically performed locally in loop processor 1200 and 1205 or in connection with noise processor 1210 via the use of noise feedback 5105. The noise processor 1210 in turn generates a compander noise floor 5110 or volume control noise offset 5115 signal which are supplied to the transform engine 410. The transform engine 410 in turn controls the function of the compander 450 and volume control 445, as a function of signals 5110 or 5115 and user interface 405.

FIGS. 52A,B,C show block diagrams of loop processor 1200, positive/negative loop comparisons 1205, and noise processor 1210. Not all elements shown in the block diagrams are required in every embodiment. Exemplary implementations and the elements used therein are described in greater detail in connection with FIGS. 53A,E,F and 54A–F.

FIG. 52A shows the Loop Processor block diagram comprising three major sections. The first section processes the environmental signals 470 and may include the input adjust blocks 5300A-e, negative loop feedback 5305A-f, signal conditioning and delay blocks 5310A-k, combiners 5325A-t, and negative loop feedback control block 5302A. The second section processes the reference signals 4310 and may include the input adjust blocks 5300B-j, negative loop feedback 5305B-g, signal conditioning and delay blocks 5310C-m, combiners 5325B-v, and negative loop feedback control block 5302B. The third section is the loop balance processor 5360.

At calibration time, when there is a minimum of environmental noise, the acoustic loop balancing processor 5360 receives inputs from the environment power estimate bus 5220 and the reference power estimator bus 5215 and adjusts the environment balance gain 5364A-h, environment fine adjust values 5362A-h, reference balance gain 5364B-j, and reference fine adjust values 5362B-j supplied to the input adjust blocks 5300A-e,B-j and negative loop feedback control blocks 5302A,B, until the environment power estimate bus values are the same as the reference power estimator bus values. Input adjust block 5300 typically consists of one or more multipliers controlled by a balance gain signal 5364 and fine adjust signal 5362 to increase or decrease the signal values 470 or 4310. An alternate method of fine input adjustment uses the negative loop feedback control 5302, negative loop feedback 5305 and fine adjust 5362 to adjust the input signal amplitude. Loop balance processor 5360 may also provide environment delay constants 5313A-k to signal conditioning and delay blocks 5310A-k, and reference delay constants 5313C-m to signal conditioning and delay blocks 5310C-m, to compensate for system or acoustic propagation delays. Loop balancing may not be required for all embodiments; for example, such loop balancing may not be required for leakage loop or open loop system implementations.

An alternative to loop balance processor 5360 is to achieve user balancing via the user interface 405 and control bus 400A, connected to input adjust blocks 5300A-e and 5300B-j (shown in FIG. 52A.) By this approach, the user may manually adjust the gain of input adjust block 5300 until subjectively satisfactory noise compensation is achieved, with the gain value being sent to the input adjust block 5300 via the control bus 400A. It will be appreciated that this approach could also be implemented in combination with the loop balance processor 5360; the two approaches need not be mutually exclusive.

In the first section, which processes the environmental signals, environmental inputs 470 are processed into environment power estimator bus values 5220 which are supplied to the positive loop 5210A-n and negative loop 5205A-m comparison blocks of FIG. 52B. Input adjusted signals from input adjust blocks 5300A-e may be supplied to environmental power estimate bus 5220 or supplied to the negative loop feedback blocks 5305A-f. Negative loop feedback blocks 5305A-f may also receive inputs from the environment power estimator bus 5220, for example to process outputs from combiners 5325A-t. The negative loop comparison signals from 5205A-m may be used by negative loop feedback control 5302A to generate a loop gain value 5347A-f, for negative loop feedback blocks 5305A-f, which typically consist of a multiplier or other gain element controlled by the gain value, to implement primary negative loops. It will be appreciated that the negative loop comparisons counteract the differences between the environmental inputs and the reference signals up to various limits, typically determined by the particular implementation. Beyond these limits, the positive differences are assumed to be due to noise, and the positive loops are used to generate the apparent noise floor. Typically the negative loops have a faster response rate than the positive loop comparisons. Secondary negative loops, which typically respond slower than the primary negative loops, can be implemented by using reference power estimator bus signals 5215 or noise processor bus signals 5240 in negative loop feedback control. Secondary negative loops are typically used to limit the amount of compression or prevent severe gain chase problems. Signal conditioning and delay blocks 5310A-k may receive input signals from the negative loop feedback blocks 5305A-f, input adjust blocks 5300A-e, and combiners 5325A-t via environmental power estimator bus 5220. Typical signal conditioning involves, for example, bandpass or lowpass filtering, Fourier transforms, and/or decimation to reduce digital processing requirements. The input signals may also be delayed to compensate for acoustic or processing delays, the delay value being determined by design or provided by loop balance processor 5360. Combiners 5325A-t may receive input signals from the signal conditioning and delay blocks 5310A-k, negative loop feedback blocks 5305A-f or input adjust blocks 5300A-e via environmental power estimator bus 5220. Two or more of these signals may be combined into a single value, typically by a mixer function or a selection function where the appropriate signal is selected (e.g. the largest value signal). The output of combiners 5325A-t are provided to the environmental power estimator bus 5220.

The functions of the second section are similar to the first except that reference inputs 4310 are processed into reference power estimator bus values 5215 which are supplied to the positive loop comparison blocks 5210A-n and negative loop comparison blocks 5205A-m of FIG. 52B. Input adjusted signals from blocks 5300B-j may be supplied to reference power estimate bus 5215 or supplied to the negative loop feedback blocks 5305B-g. Negative loop feedback blocks 5305B-g may also receive inputs from the reference power estimator bus 5215, for example to process outputs from combiners 5325B-v. The negative loop comparison signals from blocks 5205A-m may be used by negative loop feedback control 5302B to generate a loop gain value 5347B-g for negative loop feedback blocks 5305B-g, which typically consist of a multiplier or other gain element controlled by the gain value, to implement primary negative loops. Secondary negative loops, which typically respond slower than the primary negative loops, can be implemented by using environment power estimator bus signals 5220 or noise processor bus signals 5240 in negative loop feedback control. Signal conditioning and delay blocks 5310C-m may receive input signals from the negative loop feedback blocks 5305B-g, input adjust blocks 5300B-j, and combiners 5325B-v via reference power estimator bus 5215. Typical signal conditioning involves bandpass or lowpass filtering, Fourier transforms, and/or decimation to reduce digital processing requirements. The input signals may also be delayed to compensate for acoustic or processing delays, with the delay value being determined by design or provided by loop balance processor 5360. Combiners 5325B-v may receive input signals from the signal conditioning and delay blocks 5310C-m, negative loop feedback blocks 5305B-g or input adjust blocks 5300B-j via reference power estimator bus 5215. Two or more of these signals may be combined into a single value, typically by a mixer function or a selection function where the appropriate signal is selected (e.g. the largest value signal). The outputs of combiners 5325B-v are provided to the reference power estimator bus 5215.

FIG. 52B shows the positive and negative loop comparisons block diagram. Environmental power estimator bus 5220 and reference power estimator bus 5215 are provided to negative loop compare blocks 5205A-m and positive loop compare blocks 5210A-n. Negative loop compare blocks provide signals to negative loop outputs bus 5225 for negative loop nulling purposes. Negative loop compare blocks typically include processing of the environment and reference power estimate values by a low pass filter for loop stability and/or decimator to reduce processing requirements, a subtractor to calculate the difference between the filtered/decimated reference and environment power estimator bus values, and a difference-to-gain converter and limiter to convert and limit the difference into a negative loop gain offset value which is provided to negative loop output bus 5225. The filtered and/or decimated environment and reference signals may also be provided to the environment power estimator bus 5220 and reference power estimator bus 5215 for use by other positive and negative loop compare blocks to implement serial filtering of the power estimation signals. The positive loop compare blocks typically include processing of the environment and reference power estimate values by a low pass filter for loop stability and/or decimator to reduce processing requirements, a subtractor to calculate the difference between the filtered/decimated environment and reference power estimator bus values, and an absolute value function so that only positive values representing a noise floor signal are generated and provided to positive loop outputs bus 5100. The filtered and/or decimated environment and reference signals may also be provided to the environment power estimator bus 5220 and reference power estimator bus 5215 for use by other positive and negative loop compare blocks to implement serial filtering of the power estimation signals.

FIG. 52C shows an exemplary embodiment of the noise processor in block diagram form. The positive loop outputs 5100 and reference power estimator bus 5215 provide input signals and internal configuration bus 640 provides user settings to noise processor bus 5240. For the embodiment shown, there are four processing sections that receive inputs and commands from and provide outputs to the noise processor bus 5240. This allows for the sections to be serially connected in a variety of ways, examples of which are provided in connection with FIGS. 54A–F. Noise processor bus 5240 also provides the section outputs eternally, for example as the noise feedback and noise compensation signals 5235. It will be apparent from that discussion that not all sections are required for various implementations.

The first section is the corrections blocks 5227A-n which comprises differential error eliminator 5400 and negative loop correction 5405. In general, the eliminate differential error function 5400 and negative loop error correction 5405 modules compensate for errors introduced by negative loop nulling, typically with one set of elements 5400 and 5405 per negative loop. Differential error eliminator 5400 and negative loop correction 5405 are discussed in more detail in connection with FIG. 54A, hereinafter.

The second section is the sensitivity control which consists of sensitivity control block 5430A-m and signal combiner block 5230A-m. The sensitivity control block 5430 allows the user to alter the system signal-to-noise ratio by changing the noise floor signals 5110 and 5115. The sensitivity control is discussed in more detail in connection with FIGS. 54A,B,C. A signal combiner 5230 may be used to combine multiple inputs from positive loop outputs 5100, corrections block 5227, volume control offset block 5445, and variable attack/release block 2275 into one signal provided to a sensitivity control block 5430. Typical combiner functions include mixing together two or more inputs or selecting the appropriate input (e.g. maximum value input).

The third section is the volume control offset which consists of volume control offset block 5445A-o and signal combiner block 5230B-o. The volume control offset block 5445 calculates the additional volume control gain required to compensate for environmental noise in volume control only systems. The volume control offset block 5445 is discussed in more detail in connection with FIGS. 54B,C. A signal combiner 5230 may be used to combine multiple inputs from positive loop outputs 5100, corrections block 5227, sensitivity control block 5430, and variable attack/release block 2275 into one signal provided to a volume control offset block 5445. Typical combiner functions include mixing together two or more inputs or selecting the appropriate input (e.g. maximum value input).

The fourth section is the variable attack/release which consists of variable attack/release block 2275A-p and signal combiner block 5230C-p. The variable attack/release function produces a long duration noise floor. The variable attack/release function is discussed in more detail in connection with FIGS. 22, 24A–G, 54A, 55A–C, 56, and 57A,B. A signal combiner 5230 may be used to combine multiple inputs from positive loop outputs 5100, corrections block 5227, sensitivity control block 5430, and volume control offset block 5445 into one signal provided to a variable attack/release block 2275. Typical combiner functions include mixing together two or more inputs or selecting the appropriate input (e.g. maximum value input).

Turning to FIG. 53A, there is shown therein an example of how a loop processor may be implemented using a loop input processor 1200, a single negative loop comparison 5205 and a single positive loop comparison 5210. The control bus 400A provides control signals to an acoustic loop balancing processor 5360, which also receives a plurality of other inputs which will be discussed hereinafter. The acoustic loop balancing processor 5360 generates a microphone balance gain signal 5364A and microphone fine adjust signal 5362, which are determined during the calibration of the noise loop and represent the amount of gain necessary to balance the total environment input 470 with the channel reference out signal 4310, as will be discussed hereinafter in connection with FIGS. 62 and 63.

The environmental input 470 is supplied by a microphone and amplified by input level adjuster 5300A using the microphone balance gain signal 5364A. In this example, adjuster block 5300A is a coarse gain adjustment, typically included in commercially available codecs. The signal from adjuster block 5300A is then supplied to the negative loop feedback 5305 which is provided with an environmental negative loop gain value 5347 by negative loop feedback control 5302. Processor 5360 supplies microphone fine adjust signal 5362 (which in conjunction with microphone balance gain 5364A provide accurate microphone gain adjustment), and a negative loop gain offset signal (negative loop outputs bus) 5225 to feedback control block 5302 to effect negative loop nulling. Negative loop feedback 5305 typically consists of multipliers or other gain elements. The signal from 5305 undergoes signal conditioning 5310A, typically lowpass or bandpass filtering, resulting in fast environment power estimator signal (environment power estimator bus signal) 5220, which is part of the negative loop comparison 5205. The signal 5220 is supplied as the minus signal to a subtractor 5315 which is the negative loop comparison element. The signal 5520 is also supplied to another signal conditioning block 5310B, typically additional lowpass filtering and/or decimation to reduce processing requirements, as part of positive loop comparison 5210. The output of the second signal conditioning block 5310B is slow environment power estimator signal 5335 of environment power estimator bus 5220, and is supplied back to the acoustic loop balancing processor 5360 for loop balancing as well as being supplied to another subtractor 5350 which is the positive loop comparison element. The signal 5335 is also supplied as an apparent noise floor output for leakage and open loop systems from FIG. 53A as shown at the bottom of the Figure.

The channel reference out 4310, which may be multiple signals, provides the other side of the comparison developed by FIG. 53A. The signal(s) 4310 are supplied from the control bus 400A to input adjust blocks 5300B-k, which each receive a control signal in the form of negative loop bias signal 5365 and reference balance gain signal 5364B-k to determine the amount of input gain. The signal 5365, which is determined by design, is also provided to the processor 5360. The bias signal 5365 allows for positive gain that is typically required for the negative loop. The output of input adjust blocks 5300B-k is provided to further signal conditioning blocks 5310C-k, the output of which forms the fast channel reference power estimates signals 5312 of reference power estimator bus 5215 which is supplied to combiner block 5325 to convert the multiple inputs into a single output, typically by use of a multiple input mixer with input scaling. The output of the block 5325 forms a fast system reference power estimator signal on reference power estimator bus 5215, which is supplied to the positive side of the negative loop comparison subtractor 5315, a further signal conditioning block 5310D which forms part of the positive loop comparisons, and finally is supplied as one input to the negative loop comparison Δ-to-Gain converter 5345. The output of the signal conditioning block 5310D, typically additional lowpass filtering and/or decimation to reduce processing requirements, forms a slow system reference power estimator signal 5340 on reference power estimator bus 5215 and is supplied as the negative side input to the positive loop comparison subtractor 5350, is also fed back to the processor 5360 for loop balancing and forms an output from the function of FIG. 53A. The output of the subtractor 5350 is typically zero if there is no environmental noise or positive if there is noise so negative values are removed by element 5355, typically an analog rectifying diode or absolute value calculation, to form an apparent noise floor for closed loops signal 5395. Finally, the output of the Δ-to-Gain converter 5345 forms a negative loop gain offset signal on negative loop outputs bus 5225 and is provided to the negative loop feedback control block 5302. The block 5302 also receives a microphone fine adjust signal 5362 from the processor 5360.

At calibration time, when there is a minimum of environmental noise, the acoustic loop balancing processor 5360 determines the proper closure coefficient constants (microphone balance gain 5364A, microphone fine adjust 5362, and reference balance gains 5364B-k) necessary to balance the signals from the microphone(s) 470 with the channel reference(s) out 4310 signals. This processor can use any signals from the environment and reference power estimator busses 5215 and 5220 in determining these constants. In the example of FIG. 53A, the slow environment and slow system reference power estimates (5335, 5340) of the environment and reference power estimator busses are used for balancing.

The negative loop comparison 5205 computes the difference 5315, and provides this value with the fast system reference power estimator 5215, to the Δ to gain converter 5345. The Δ to Gain converter 5345 generates a limited negative loop gain offset 5225 that is provided to negative loop feedback control 5302 to null out any differences between the fast environment power estimator signal 5220 and the fast system reference power estimator 5215 (which is composed of a plurality of channel reference out 4310). The negative loop comparisons 5205 optionally perform additional signal processing on the fast environment power estimator and fast system reference power estimator signals, the signal processing typically being lowpass filtering.

The positive loop comparison 5210 includes performing signal conditioning 5310B and D on the fast environment power estimator 5220 and the fast system reference power estimator signal 5215 to produce the slow microphone power estimator signal 5335 and slow system reference power estimator signal 5340 which are included in the environment and reference power estimator busses 5220 and 5215. The positive loop comparisons 5210 computes the difference 5350 of these signals, and selects positive values only at 5355, resulting in the apparent noise floor for closed loops 5395. If a leakage or open loop configuration is to be used, then the apparent noise floor for leakage/open loops 5335 is obtained from the slow microphone power estimator 5335 since the system reference need not be subtracted out. Signals 5335 and 5395 are provided to the positive loop outputs bus 5100.

It will be appreciated from the foregoing that many other variations are possible. For example, the input to the positive loop signal conditioning can come from the negative loop input or output of the negative loop signal conditioning for serial or parallel loop use. Also the negative loop may be included in the reference signal processing loop.

Referring next to FIGS. 53B and C, there are shown therein detailed implementation examples of the negative loop feedback control block 5302 and negative loop feedback block 5305. FIG. 53B shows the "sum of offsets" implementation where all inputs contributing to the negative loop feedback 5305 multiplier gain control are summed together to produce negative loop gain signal 5347. FIG. 53C shows the "product chain" where each input contributing to the negative loop is provided to a multiplier in the negative loop feedback block 5305. Hybrid implementations where a combination of the "sum of offsets" and "product chain" implementations are also possible.

Referring next to FIG. 53D, there is shown therein a detailed implementation example of the negative loop comparison 5315 and Δ-to-gain converter 5345. The negative loop nulls the difference between the fast environment power estimator 5220 and fast system reference power estimator 5215 signals over a limited range (negative loop width=+/−N) to compensate for minor variations in the environmental signal caused by changes in room acoustics and room resonances. This loop is implemented as a standard differential negative loop.

Loop gain is required to optimize the nulling effect. It is important to calculate the optimal loop gain value. If the loop gain is excessive, the negative loop oscillates. If the loop gain is too small, it results in a larger differential error, making the negative loop less effective. Multiplying the reference-microphone difference 5315 by the negative loop gain in multiplier 5394 provides the Δ loop signal.

A negative loop limit value is generated to establish the limited range over which the negative loop operates. This limit may be calculated by multiplying the fast system reference power estimator 5215 with a negative-loop width signal (normally set at a constant value based on the negative loop width "N") in multiplier 5396. If the negative loop width signal is varied, it acts as a variable negative loop control, such as when supplied by noise feedback 5105, which may be used as a secondary negative loop along with a primary fixed width loop.

The negative loop gain offset calculator 5398 of Δ to gain converter 5345 computes the ratio of the Δ loop 5394 to the negative loop limit 5396 and uses that ratio to compute the percentage of maximum or minimum negative loop gain offset 5225 required to null the loop. This percentage gain can be discretely quantified. In the extreme case of 100% quantization, the negative loop gain offset 5225 is the maximum or minimum if it exceeds the negative loop limit or zero. With subsequent low pass filtering, this effectively implements a pulse width modulated negative loop.

In situations where there are long acoustic propagation delays from speakers 480 to environmental input microphones 470, such as in a stadium, acoustic delay compensation may be used to increase the stability of the system as shown in FIGS. 53E and 53F. In both figures, acoustic loop balancing processor 5360 supplies reference delay constants 5313, which indicates the length of the delay, to delay compensation elements of signal conditioning and delay compensation 5310, typically composed of acoustic delay lines or digital FIFO buffers. Acoustic loop balancing processor 5360 may generate delay constants during loop balancing or they may be determined by design. FIG. 53E shows an example of a robust implementation where each channel reference out 4310 has a delay compensation element 5310D-k. This is useful in situations where the distance (and acoustic delay) from the various speakers to the environmental input microphones varies over a wide range and individual compensation of each reference provides the best results. For situations where the distance (and acoustic delay) from the various speakers to the environmental input microphones varies little, a reduction in delay compensation elements 5310 and processing requirements can be obtained by applying the delay compensation 5310D only to the system reference signal generated by combiner block 5325 as shown in FIG. 53F.

Turning next to FIG. 54A, an exemplary embodiment of the noise processor 1210 is shown when used with a compander. In general, the logic of FIG. 54A is intended to permit the noise processor 1210 to take the apparent noise floor signals, which may originate as either signals 5335 or 5395 provided by the positive loop output bus 5100, and correct them into a compander noise floor 5110, thus enabling more accurate and effective noise compensation. These noise floors can be made to appear larger or smaller than the actual value by a noise sensitivity control 5440 and sensitivity control block 5430. In the example of FIG. 54A, the apparent noise floor signals are provided to block 5400 which functions to eliminate any differential error introduced by negative loops. The output of the block 5400 is a differential corrected noise floor signal 5402, which is supplied to a negative loop error correction block 5405. A correction convergence factor 5407, determined by design and discussed later in connection with FIGS. 54G and 54H, as well as the slow system reference power estimator signal 5340 also serve as inputs to the negative loop error correction block 5405. The output of the correction block 5405 is a corrected noise floor signal 5417, and is supplied to the variable attack and release block 2275, the output of which is a long duration noise floor 5425. The long duration noise floor signal 5425 as well as noise sensitivity control signals 5440 from the control bus 400A serve as inputs to a sensitivity control adjuster 5430, which outputs the compander noise floor signal 5110.

The eliminate differential error function 5400 eliminates the error due to the differential nature of the primary negative feedback loop. Increasing the negative loop gain minimizes this error. To eliminate this error, typically the maximum calculated error is subtracted from the apparent noise floor. The negative loop error correction 5405 (discussed in greater detail in connection with FIG. 54G) eliminates the error in the differential corrected noise floor 5402 caused by the width of the negative loop in the negative loop comparisons 5205. The decimator/low-pass filter of 5405 can be used to reduce the amount of subsequent computation and provide low-pass filtering. The variable attack and release 2275 allows ignoring short duration, transient noises, while responding to longer duration noises. It also enables faster response to large, long duration noises, than to lower amplitude long duration noises. The sensitivity control adjuster 5430 allows the noise sensitivity control 5440 to alter the system signal to noise ratio by changing the compander noise floor 5110 signal. The sensitivity control adjuster 5430 may convert the long duration noise floor 5425, for example, into a logarithmic value to simplify subsequent processing in which case the sensitivity control 5440 can be a logarithmic value and added or subtracted from the long duration noise floor to increase or decrease the system signal to noise ratio.

Turning next to FIG. 54B, an example is shown of how a noise processor 1210 could be implemented to control a volume control. Like elements have been assigned like reference numerals and will not be described further except as necessary for the example. The apparent noise floor 5335 or 5395 is transformed into a corrected noise floor 5410 by the differential error eliminator block 5400 together with the negative loop error correction 5405. The corrected noise floor signal 5410 is supplied to the sensitivity control adjuster block 5430, in this example typically a multiplier with the noise sensitivity control 5440 value being a linear quantity. The output of the sensitivity control adjuster block 5430 supplies the positive input to a subtractor of volume control offset calculator 5445, with the slow reference power estimator 5340 supplying the negative input. The output of the subtractor is limited to positive values, typically by use of a diode or absolute value function, for use as a volume control offset signal 5419 and may be supplied to a decimator/low pass filter block. This output, in turn, is supplied to a variable attack and release block 2275 which outputs volume control noise offset signal 5115, typically used to increase the volume control level to compensate for ambient noise. Optional linear to log conversion may be performed in block 2275 which may be used to simplify subsequent processing.

Turning next to FIG. 54C, an example is shown of how minimal noise processor 1210 with sensitivity control could be implemented to control a volume control. Here the slow environment power estimate 5335 (an uncorrected positive loop output 5100) is multiplied with noise sensitivity control 5440 to implement the sensitivity control, which then has the slow system reference power estimate 5340 subtracted from it to produce the volume control offset 5115. The volume control offset 5115 is typically limited to positive values, for example by use of a diode or absolute value function.

FIGS. 54D,E,F show examples of how the elements described in connection with FIG. 52C can be configured to accommodate multiple positive loop inputs and compander noise floor outputs. Like elements have been assigned like reference numerals and will not be described further except as necessary for the example. FIG. 54D shows an example of how multiple positive loop outputs 5100 can be processed by corrections blocks 5227A-n, Variable attack/release blocks 2275A-n, and sensitivity controls blocks 5430A-n to provide "n" independent compander noise floor signals 5110 A-n. FIG. 54E shows an example of how three positive loops can be used to produce a single compander noise floor 5100. Each positive loop output 5100 is corrected (blocks 5227A, B,C) and combined in signal combiner 5230 to provide a single signal to variable attack/release and sensitivity control blocks 2275 and 5430 to produce compander noise floor signal 5110. FIG. 54F shows an example of how a single positive loop output can be used to control two companders with different attack/release and sensitivity settings.

Turning next to FIG. 54G, an exemplary arrangement of a negative loop error correction 5405 may be better appreciated. In general, the eliminate differential error function 5400 and negative loop error correction 5405 modules compensate for errors introduced by negative loop nulling, typically with one set of 5400 and 5405 per negative loop. The negative loop error correction 5405, shown in FIG. 54G, corrects for an underestimation of the actual noise floor due to the negative loop width. Environmental noise is detected when the microphone signal is greater than the reference signal, but due to the negative loop nulling, the noise is not detected until the microphone signal is greater than the reference signal plus the negative loop width "N." This results in an underestimation of the noise floor.

The amount of underestimation can be calculated and corrected, an exemplary arrangement of which is discussed in connection with FIG. 54G and 54H. In FIG. 54G, the slow system reference power estimator 5340 is multiplied at multiplier 5460 by a negative loop width correction value, typically a linear constant, to produce the underestimation correction limit value 5462. Alternatively, a logarithmic negative loop width correction value may be used after conversion to a linear value by module 5455. For implementation of an alternative sensitivity control, a variable negative-loop width correction value may be used to over or under correct the apparent or differentially corrected noise floor. The partially corrected noise floor signal 5452 is generated by multiplying the uncorrected noise floor, typically the differential corrected noise floor 5402, by a correction convergence factor 5407 in multiplier 5450. The correction convergence factor determines how quickly the corrected noise floor 5410 becomes fully corrected. The partially corrected noise floor signal 5452 and the correction limit 5462 both serve as inputs to a select minimum value function 5465, which is added in adder 5470 to the differential corrected noise floor signal 5402. The output of the adder 5470 is corrected noise floor signal 5410.

Referring next to FIG. 54H, a graphical analysis of the FIG. 54G negative loop error correction example is discussed. Stated otherwise, the apparent noise floor can be seen to be the difference between the microphone power estimate and the system reference power estimate. The horizontal axis represents the difference between the microphone power estimate and the system reference power estimate and the vertical axis is the indicated noise floor value. Without any negative loops, the microphone power estimate and the system reference power estimate difference is the actual noise floor value as indicated by the "actual noise floor" line on the graph. Due to the use of negative loops, the microphone power estimate and the system reference power estimate difference will underestimate the noise floor as represented by the "apparent or differential corrected noise floor" line on the graph which may be corrected to the actual noise floor value by various methods described below.

Always adding correction limit 5462 to the noise floor results in a minimum noise floor always being detected. Adding the correction upon noise floor detection causes an undesirable discontinuity, as indicated by the infinite correction gain in FIG. 54H.

To obtain a more gradual correction, the apparent noise floor 5335 or 5395 can be multiplied by the correction convergence factor 5407 to generate a partially corrected noise floor 5452, which is added to the apparent noise floor 5335 or 5395 to produce corrected noise floor 5410 until the partially corrected noise floor 5452 value exceeds the correction limit 5462 at which point the correction limit is added. The resulting corrected noise floor value 5410 is indicated in the graph as the two bold lines labeled "partially corrected noise" and "fully corrected noise". The correction convergence factor controls the slope of the "partially corrected noise" line. The select minimum value 5465 selects the partially corrected noise floor 5452 value or the correction limit 5462, producing the two lines.

In the example shown in FIG. 54H, the correction limit can be computed as shown in the following example using a negative loop width=+/−2 dB.

The start of noise floor detection is when:

microphone−reference=2 dB

Rewriting this equation provides:

microphone=2 dB+reference.

By substitution, the correction limit shown in the graph may be computed as:

correction limit=(2 dB+reference)−reference correction limit=(10**(2 dB/20))*reference−reference correction limit=1.26*reference−reference correction limit=0.26*reference In general:

correction limit=(10**(N dB/20)−1)*reference

Note that an alternative noise sensitivity control method to that previously described in connection with module 5430 may be implemented by increasing the correction limit above that calculated which results in an overestimation of the noise floor and increases noise sensitivity while decreasing the limit results in an underestimation of the noise floor which decreases noise sensitivity.

Referring next to FIGS. 55A and 55B, various examples of the variable attack and release portion of the noise compensation function can be better appreciated. In a noise processor 1210, the variable attack/release function 2275 may be configured to provide minimal response to short duration periods of noise (such as door slams, short burst of speech, and transient sounds), while also providing rapid response to long duration noises such as machinery or road noise.

For at least some embodiments, the characteristics of a useful response to changes in the noise floor signal are as follows: When changes in the noise signal occur, the initial response should be to delay, typically by a delay timer or by integrating the signal. If the change in the noise signal is longer lasting, then there should be a quick convergence on the proper noise floor, preferably with increasing exponential response for attack, and decreasing exponential response for release.

This response is often desirable because the ear responds to sound in a non-linear manner, so these exponential responses sound linear to the ear. Once the response has converged on the noise signal, signal distortion is minimized by having a slow response, such as obtained using a conventional low-pass filter. In addition, it is desirable to have an asymmetric response, with a slower attack and faster release.

FIGS. 55A and 55B illustrates the differences between the response to a change in the noise floor by a prior-art low pass filter and the filter response provided by the noise compensator's variable attack/release processor. It is not possible to obtain the desired signal response using a prior-art low pass filter due to the decreasing exponential attack response that causes it to respond too quickly to the initial change in the noise floor. Increasing the prior-art low pass filter delay causes an increase in closure error on the actual noise floor due to the decreasing exponential response. In contrast, the preferred attack/release processor uses an increasing exponential signal to eliminate closure error.

Turning to the next figure, FIG. 55C is a block diagram showing an exemplary embodiment of the variable attack/ release function 2275 in a noise processor 1210. A math processor 2405 is used to dynamically calculate the positive loop differential signal 5620 as a function of the external inputs 2400, typically a signal from noise processor bus 5240 such as the processed corrected noise floor 5417 or volume control offset 5419, together with feedback bus values 2415, typically the long duration noise floor 5425.

The math processor 2405 also generates a differential polarity change signal 5625 whenever the polarity difference between the processed corrected noise floor 5417 and long duration noise floor 5425 occurs (i.e. between the external inputs and feedback bus values).

The signals 5620 and 5625, along with internal configuration signals 640, are supplied to a segment parameter selector 2425, which generates the final filter coefficients 2440, in this example KI 5635, KF 5640, Accelerate Limit 5645, that are supplied to the tracking adjusting filter 2427 (shown in greater detail in connection with FIG. 57A), which produces the desired filter response in the form of the long duration noise floor 5425 which may be on noise processor bus 5240. The JK integrate signal 5725 and long duration noise floor signal 5425 are fed back to the segment parameter selector 2425 and math processor 2405 via feedback bus 2415.

Referring next to FIG. 56, an exemplary embodiment of the math processor 2405 and segment parameter selector 2425 of the variable attack/release function 2275 for a noise processor 1210 enables forming a composite of different signal responses to provide the desired signal response shown in FIGS. 55A and 55B. In particular, this embodiment uses a delay integrator, convergence, and low pass filters. In particular, the functions of the math processor 2405 (shown by dashed lines) are implemented by subtractor 5600 operating on the external input 2400, in this example a signal from noise processor bus 5240 such as the processed corrected noise floor signal 5417, as the positive signal, and a feedback bus signal 2415, the current long duration noise floor signal 5425, as the negative input. This provides a positive loop differential 5620 that can be either positive or negative, and is supplied to the differential polarity change state machine 5605 that indicates when this signal changes polarity.

The functions of segment parameter selector 2425 (also shown by dashed lines) are implemented by segment selector 5610 and lookup table 5615. The segment selector uses positive loop differential 5620, differential polarity change 5625, JK integrate 5725, slow response limit 5650, and delay time limit 5655, to select a particular segment (slow response, converge, or delay). User select 5660 and 5665 can be used to provide user selectable different segment responses, for example to allow the user to select different delay times, short delays for sporting events and longer ones for more typical use. The lookup table 5615 produces the final filter coefficients 2440 (KI 5635, KF 5640, and acceleration limit 5645) as selected by these inputs.

Turning next to FIGS. 57A and 57B, FIG. 57A shows in block diagram form a tracking adjusting filter 2427 as might be used in an exemplary embodiment of a noise compensator variable attack/release function 2275 for a noise processor 1210. FIG. 57B shows exemplary tracking adjusting noise filter signals as might be generated by the various configurations of the tracking adjusting filter of the attack and release module of FIG. 57A. The arrangement of FIG. 57A enables forming a composite of different signal responses to provide the desired long duration noise floor 5425 response, in this case by using a delay integrator, convergence, and low pass filters. These responses are controlled by the final filter coefficients 2440 (acceleration limit signal 5645, KI signal 5635, and KF signal 5640) supplied to it, and may be modified as desired.

The delay integrator is implemented when the KF signal 5640 equals one causing multiplier 5700 to pass unaltered the value of JK integrate 5725 to adder 5710. The other input to adder 5710 is the input step size generated by multiplying KI 5635 with positive loop differential 5620 at multiplier 5705. Typically KI value 5635 is between 0 and 1 with larger values of KI accumulating faster resulting in shorter delays. Delay integrator mode is exited when the value of JK integrate 5725 exceeds the delay time limit 5655 as determined by segment selector 5610. The acceleration governor, composed of multiplier 5700, subtractor 5715, adder 5720, and minimum input difference selector 5717, is not required in delay integration mode. The Acceleration governor may be disabled by use of a larger acceleration limit value 5645 and non-zero positive loop average 5740 multiplied by 5750 which will result in an input to minimum input difference selector that is always larger than the input difference generated by subtractor 5715 so that the subtractor value is always selected. Adder 5720 then adds back the JK integrate value that was subtracted at subtractor 5715 and supplies the input value to JK integrate 5725. Alternatively, the outputs of segment selector 5610 can be used to disable the acceleration governor for modes that do not require the function.

The operation of a low pass filter is similar to the previously described delay integrator except that the KF value 5640=1−KI 5635, where KI is between 0 and 1. Since KF is less than 1, multiplier 5700 passes a percentage of the value of the JK integrate register 5725, resulting in a steady state condition when KF*JK integrate=KI*positive loop differential. The acceleration governor is also not required in low pass filter mode and may be disabled by the methods previously described for the delay integrator.

The function of an accelerating integrator or converge are obtained when the value of KF>1. In this situation, input difference step size 5715 begins small, and starts to become larger. If not limited, the step size will become so large that over and undershoots of the long duration noise floor 5425 will result.

Acceleration Limit 5645 limits the rate of acceleration by determining the maximum step size to be added to the JK integrate value 5725 at adder 5720 by multiplying the positive loop average 5740 by the acceleration limit 5645 at multiplier 5750. The input difference step size is calculated at subtractor 5715 where the difference between the next JK integrate value calculated at adder 5710 and the current JK integrate value is calculated. The minimum of the two input values is selected by minimum input difference selector 5717 and the next JK integrate value is restored by adding back the current JK integrate value at adder 5720 which is then supplied as the input to JK integrate 5725. Use of the acceleration governor results in the desired logarithmic convergence response without over or undershoots of the noise floor that can distort the final output signal.

The JK integrate value 5725 can be a positive or negative value while the long duration noise floor value 5425 is typically a positive only value. The JK hold value 5745 is used as a positive bias value to convert the bipolar JK integrate value 5725 into a positive only value at adder 5735. The JK integrate register 5725 stores the results of each step computation, but is reset whenever a differential polarity change 5625 occurs, along with JK hold block 5745. JK hold block 5745 stores the current long duration noise floor 5425, and when combined by adder 5735 with the value of JK integrate register 5725, results in the positive loop average 5740, or long duration noise floor 5425.

Turning next to FIG. 57B, there is shown therein a graph illustrating the typical operation of the tracking adjusting filter in FIG. 57A. The three different types of response generated by the tracking adjusting filter 2427 are identified in the waveforms, i.e. delay response (integrator), converge (accelerating integrator), and slow response (low pass filter).

JK integrate register 5725 acts over positive and negative ranges in response to the positive loop differential 5620 and provides a symmetrical signal response. JK integrate register 5725 is reset to zero during transitions between attack and release of the noise-input signal in order to obtain the desired symmetrical response.

JK hold register 5745 contains a positive bias that when added to the JK integrate 5725 produces a positive only output value suitable for noise compensation. The JK hold register 5745 only changes during transitions between attack and release by the noise floor, causing the last long duration noise floor 5425 to be held as a bias signal until the next transition. The resulting long duration noise floor 5425 is stored in the positive loop average 5740 register.

Having described the logic by which the noise extractor 465 and its various elements are implemented, the process of operation for the noise extractor can be better appreciated by FIGS. 58 et seq. Referring first to FIG. 58, the overall operation of a generalized form of noise extractor function as shown at step 710 of FIG. 7, steps 1220, 1235, 1245 of FIG. 12, and in FIGS. 11,51–57B, may be better appreciated. The process starts at step 5800, after which the process advances to step 5805 where the environmental sensor processing is performed followed by step 5810 where the reference signal processing is performed. Steps 5805 and 5810 are equivalent to step 1220 in FIG. 12 and loop processor 1200 in FIG. 11. The process then advances to step 5815 where positive and negative loop comparisons are performed followed by step 5820 where the noise floor is determined and the process exits at step 5825. Step 5815 is equivalent to step 1235 in FIG. 12 and block 1205 in FIG. 11 and step 5820 is equivalent to step 1245 in FIG. 12 and noise processor 1210 in FIG. 11. An alternative processing flow may have one or more steps operating in parallel.

Referring next to FIGS. 59A,B, the processing of the environmental sensors step 5805 of FIG. 58 can be better understood. The process starts at step 5900, after which the process advances to step 5902 where a loop is begun with the number of iterations of the loop being defined by how many environmental sensors are processed. The number of environmental sensors can vary over a wide range, and is identified here as simply 1 to e. When the process loop begins at step 5904, an environmental sensor signal is acquired, the input adjuster gain value for that sensor is obtained and the sensor signal adjusted. The loop advances to step 5906, where the adjusted sensor output is saved for later use, after which the process loops back to step 5902. Loop 5902 is equivalent to input adjust blocks 5300A-e of FIG. 52A.

Once the appropriate number of loops have been completed at step 5902, the process advances to step 5908 where all the environment negative loops are processed. The number of environmental negative loops can vary over a wide range, and is identified here as simply 0 to f, zero being used if there are no negative loops. When the process loop begins at step 5910, bias values and primary and any secondary negative loop inputs appropriate for this negative loop are obtained and the negative loop gain value calculated. The process advances to step 5912 where the negative loop gain value is applied to the appropriate adjusted environment sensor output from loop 5902 or combiner output from loop 5924 to execute negative loop feedback. The process then advances to step 5914 where the results of step 5912 are saved, after which the process loops back to step 5908. Loop 5908 is equivalent to negative loop feedback control 5302A and negative loop feedback blocks 5305A-f of FIG. 52A.

Once the appropriate number of loops have been completed at step 5908, the process advances to step 5916 where signal conditioning and delay is applied. The number of signal conditioning and delay loops can vary over a wide range, and is identified here as simply 0 to k, zero being used if there are no signal conditioning and delay loops. When the process loop begins at step 5918, delay values and either the appropriate environment adjusted sensor output from loop 5902, the environmental feedback processed output from loop 5908, or combiner output from loop 5924 are obtained as input values. The process advances to step 5920 where the signal conditioning and any delay compensation is applied to the inputs. The process then advances to step 5922 where the results of step 5920 are saved, after which the process loops back to step 5916. Loop 5916 is equivalent to signal conditioning and delay blocks 5310A-k of FIG. 52A.

Once the appropriate number of loops have been completed at step 5916, the process advances to step 5923 of FIG. 59B where combining any of the previously computed output values into a single outputs is processed. The number of combiner loops can vary over a wide range, and is identified here as simply 0 to c, zero being used if there are no combiners. The process loop begins at step 5924 which is a loop to combine 2 to n of the previously computed output values to a single value. When the process loop begins at step 5926, the appropriate environment adjusted sensor output from loop 5902, environmental feedback processed output from loop 5908, or signal conditioned and delayed output from loop 5916 is obtained as an input value. The process advances to step 5928 where the input value from step 5926 is applied to the combiner algorithm, after which the process loops back to step 5924. Loop 5924 is equivalent to the combiner blocks 5325A-t of FIG. 52A.

Once the appropriate number of loops have been completed at step 5924, a test is performed at step 5929 to see if the combined output result is processed in this pass or saved and used in the next pass by loops 5908 and 5916. If the combined output is to be negative loop processed and signal conditioned and delayed in this pass, the process advances to step 5930 else the process loops back to step 5923. The decision to process in the current pass or wait for the next is determined by design. At step 5930, bias values and primary and any secondary negative loop inputs appropriate for this negative loop are obtained and the negative loop gain value calculated. The process advances to step 5932 where the negative loop gain value is applied to the combined output from loop 5924 to execute negative loop feedback. The process then advances to step 5934 where the results of step 5932 are saved, then to step 5936 where any signal conditioning and delay compensation is applied and saved in step 5938. The process then loops back to 5923 and exits at step 5940 once the appropriate number of loops have been completed at step 5923. Steps 5930, 5932, and 5936 are equivalent to blocks 5302A, 5305A-f, and 5310A-k of FIG. 52A.

Referring next to FIGS. 59C,D, the processing of the reference signals step 5810 of FIG. 58 can be better understood. The process starts at step 5950, after which the process advances to step 5952 where a loop is begun with the number of iterations of the loop being defined by how many channel references are processed. The number of channel references can vary over a wide range, and is identified here as simply 1 to j. When the process loop begins at step 5954, a channel reference signal is acquired, the input adjuster gain value for that reference obtained and the channel reference adjusted. The loop advances to step 5956, where the adjusted reference output is saved for later use, after which the process loops back to step 5952. Loop 5952 is equivalent to input adjust blocks 5300B-j of FIG. 52A.

Once the appropriate number of loops have been completed at step 5952, the process advances to step 5958 where all the reference negative loops are processed. The number of reference negative loops can vary over a wide range, and is identified here as simply 0 to g, zero being used if there are no negative loops. When the process loop begins at step 5960, bias values and primary and any secondary negative loop inputs appropriate for this negative loop are obtained and the negative loop gain value calculated. The process advances to step 5962 where the negative loop gain value is applied to the appropriate adjusted reference output from loop 5952 or combiner output from loop 5974 to execute negative loop feedback. The process then advances to step 5964 where the results of step 5962 are saved, after which the process loops back to step 5958. Loop 5958 is equivalent to negative loop feedback control 5302B and negative loop feedback blocks 5305B-g of FIG. 52A.

Once the appropriate number of loops have been completed at step 5958, the process advances to step 5966 where signal conditioning and delay is applied. The number of signal conditioning and delay loops can vary over a wide range, and is identified here as simply 0 to m, zero being used if there are no signal conditioning and delay loops. When the process loop begins at step 5968, delay values and either the appropriate channel reference adjusted output from loop 5952, reference feedback processed output from loop 5958 or combiner output from loop 5974 are obtained as input values. The process advances to step 5970 where the signal conditioning and any delay compensation are applied to the inputs. The process then advances to step 5972 where the results of step 5970 are saved, after which the process loops back to step 5966. Loop 5966 is equivalent to signal conditioning and delay blocks 5310C-m of FIG. 52A.

Once the appropriate number of loops have been completed at step 5966, the process advances to step 5973 of FIG. 59D where combining any of the previously computed output values into single outputs is processed. The number of combiner loops can vary over a wide range, and identified here as simply 0 to v, zero being used if there are no combiners. The process loop begins at step 5974 which is a loop to combine 2 to p of the previously computed output values to a single value. When the process loop begins at step 5976, the appropriate channel reference adjusted output from loop 5952, reference feedback processed output from loop 5958, or signal conditioned and delayed output from loop 5966 is obtained as an input value. The process advances to step 5978 where the input value from step 5976 is applied to the combiner algorithm, after which the process loops back to step 5974. Loop 5974 is equivalent to the combiner block 5325B of FIG. 52A.

Once the appropriate number of loops have been completed at step 5974, a test is performed at step 5929 to see if the combined output result is processed in this pass or saved and used in the next pass by loops 5958 and 5966. If the combined output is to be negative loop processed and signal conditioned and delayed in this pass, the process advances to step 5980 else the process loops back to step 5973. The decision to process in the current pass or wait for the next is determined by design. At step 5980, bias values and primary and any secondary negative loop inputs appropriate for this negative loop are obtained and the negative loop gain value calculated. The process advances to step 5982 where the negative loop gain value is applied to the combined output from loop 5974 to execute negative loop feedback. The process then advances to step 5984 where the results of step 5982 are saved, then to step 5986 where any signal conditioning and delay compensation is applied and saved in step 5988. The process then loops back to 5973 and exits at step 5990 once the appropriate number of loops have been completed at step 5973. Steps 5980, 5982, and 5986 are equivalent to blocks 5302B, 5305B-g, and 5310C-m of FIG. 52A.

Referring next to FIGS. 60A, the processing of the loop comparisons step 5815 of FIG. 58 can be better understood. The process starts at step 6000, after which the process advances to step 6004 where a loop is begun with the number of iterations of the loop being defined by how many serial linked positive and negative comparisons are to be processed. Serial linking allows later comparisons to use earlier comparisons processing typically signal processing such as lowpass filtering. The number of serial levels of comparison can vary over a wide range, and is identified here as simply 1 to I. When the process loop begins at step 6008, another loop is entered to process all of the negative loop comparisons at this level, the number of comparison identified here as 1 to n. This process loop advances to step 6012 to do the actual negative loop comparison after which the process loops back to step 6008. Once the appropriate number of loops have been completed at step 6008, the process advances to step 6016 where another loop is entered to process all of the positive loop comparisons at this level, the number of comparison identified here as 1 to p. This process loop advances to step 6020 to do the actual positive loop comparison after which the process loops back to step 6016. Once the appropriate number of loops have been completed at step 6016, the process loops back to step 6004. Once the appropriate number of loops have been completed at step 6004, the process exits at step 6024.

Referring to FIG. 60B, the process of implementing negative loop comparisons 6012 can be better understood. The process starts at step 6030, after which the process advances to step 6034, where signal conditioning is performed on the appropriate processed environment power estimator output, typically from loops 5902, 5908, 5916 or 5923 or a previously computed environment negative value estimate from a previous comparison level, to provide and save an environment negative value estimate for this negative comparison loop.

The process loop advances to step 6038 where signal conditioning is performed on the appropriate processed reference power estimator output, typically from loops 5952, 5958,5966 or 5973 or previously computed reference positive value estimate from a previous comparison level, to provide and save a reference positive value estimate for this negative comparison loop. The process advances to step 6042, where a check is made for a closed loop noise compensation configuration. If false, a leakage loop configuration has been selected, and the process advances to step 6046, where the environment negative value estimate is compared to the reference values, typically the same system reference power estimator or previously computed reference positive value used in step 6038, to generate a negative loop gain offset value (in a manner similar to previously described block 5345 of FIG. 53D), and the result saved for use by the negative loop feedback, after which the process exits at step 6050. If true, closed loop noise compensation is to be performed, and the process loop advances to step 6054, where Δ is computed as (reference positive value estimate−environment negative value estimate.) The process loop advances to step 6058 where the Δ values are compared to the reference values to generate a negative loop gain offset, that is saved for subsequent negative loop feedback use, after which the process exits at step 6050. Steps 6054 and 6058 can be performed in a manner similar to previously described blocks 5315 and 5345 of FIG. 53D.

Turning next to FIG. 60C, the processing of positive loop comparisons 6020 can be better understood. The process starts at step 6060, after which the process advances to step 6064 where signal conditioning is performed on the appropriate processed environment power estimator output, typically from loops 5902, 5908, 5916 or 5923 or a previously computed environment positive value estimate from a previous comparison level, to provide and save the environment positive value estimate for the current positive loop.

The process loop advances to step 6068 where signal conditioning is performed on the appropriate processed reference power estimator output, typically from loops 5952, 5958, 5966 or 5973 or previously computed reference value estimate from a previous comparison level, to provide a reference negative value estimate for the current positive loop. The process advances to step 6072 where a check is made for a closed loop noise compensation configuration. If false, the process exits at step 6076 and the environment positive value estimate from step 6064 is used later by noise processor 5820. If true, closed loop noise compensation is to be performed, and the process advances to step 6080, where Δ=(environment positive value estimate−reference negative value estimate) is computed. The process loop advances to step 6084, where a check is made for Δ>0 since typically only positive values are used to indicate noise levels. If true, the process exits at step 6076. If false, the process advances to step 6088, where Δ is set to 0 to indicate no noise, and the process exits at step 6076. Steps 6064, 6068, 6080, 6088 can be performed in a manner similar to previously described blocks 5310B, 5310D, 5350 and 5355 of FIG. 53A.

Referring next to FIG. 61A, the processing of the noise processor 5820, previously described in connection with FIGS. 52C, and 54A–F, can be better understood. The process starts at step 6100, after which the process advances to step 6102 where errors caused by the negative loop are removed. The process advances to step 6104 where the volume control gain offset is calculated for designs that do not include a compander and use a volume control. The process then advances to variable attack/release step 6106 where the noise floor is processed to provide the correct response to the environmental noise and then to sensitivity control step 6108 where the user can adjust the signal to noise ratio of the system. The process exits at step 6110. These four processing steps are equivalent to the four noise processing sections described in connection with FIG. 52C. Steps 6102 through 6108 may be executed in any other order than the one shown and not all steps are required for every design. For example, corrections step 6102 need not be implemented if there are no negative loops to process and step 6104 need not be implemented if the compander method of gain control is used.

Turning next to FIG. 61B, the processing of corrections 6102 can be better understood. The process starts at step 6112, after which the process advances to step 6114 where a loop is begun with the number of iterations of the loop being defined by how many positive loop outputs are to be processed. The number of positive loop outputs can vary over a wide range, and is identified here as simply 0 to p, zero being used if there are no positive loop outputs to correct. When the process loop begins at step 6116, the appropriate positive loop output and reference power estimate is obtained, the differential error eliminated in step 6118, and negative loop errors are corrected in step 6120. The process then advances to step 6122 where numeric conversions may be processed. In some cases, computation requirements can be minimized by converting the results into an alternative value such as a logarithmic value. The process then advances to step 6124 where the results of the previous steps can be decimated or signal processing performed to reduce computation requirements and increase loop stability typically by the use of lowpass filtering. The process advances to step 6126, where the results are saved for later use, and the process loops back to step 6114. Once the appropriate number of loops have been completed at step 6114, the process exits at step 6128. Not all processing steps are required for all designs. For example, the differential error may be insignificant so step 6118 is skipped, there may not be a negative loop so step 6120 is skipped, or the numeric conversion 6122 or decimation/signal processing 6124 may not be required.

Turning next to FIG. 61C, the volume control offset processing 6104 can be better understood. The process starts at step 6130, after which the process advances to step 6132 where a loop is begun with the number of iterations of the loop being defined by how many volume control offsets are to be processed. The number of volume control offsets to process can vary over a wide range, and is identified here as simply 0 to v, zero being used if there are no volume control offsets to process. When the process loop begins at step 6134, the appropriate positive loop outputs, positive loop corrected outputs from loop 6114, attack/release values from loop 6162, or sensitivity outputs from loop 6182 are obtained and then combined in step 6136. The process advances to step 6138 where the appropriate reference power estimate is obtained, and then to step 6140 where the power estimate and combined value are used to calculate a volume control gain offset. The process then advances to step 6142 where numeric conversions may be processed. In some cases, computation requirements can be minimized by converting the results into an alternative value such as a logarithmic value. The process then advances to step 6144 where the results of the previous steps can be decimated or signal processing performed to reduce computation requirements and increase loop stability typically by the use of lowpass filtering. The process advances to step 6146, where the results are saved for later use, and the process loops back to step 6132. Once the appropriate number of loops have been completed at step 6132, the process exits at step 6148. Not all processing steps are required for all designs. For example, the combiner 6136 is not required for single inputs or the numeric conversion 6142 or decimation/signal processing 6144 may not be required.

Turning next to FIG. 61D, the variable attack/release processing 6106 can be better understood. The process starts at step 6160, after which the process advances to step 6162 where a loop is begun with the number of iterations of the loop being defined by the number of variable attack/release processes. The number of variable attack/release processes can vary over a wide range, and is identified here as simply 0 to a, zero being used if there are no variable attack/release processes. When the process loop begins at step 6164, the appropriate positive loop outputs, positive loop corrected outputs from loop 6114, volume control offset values from loop 6132, or sensitivity outputs from loop 6182 are obtained and then combined in step 6165. The process advances to step 6166 where the appropriate user interface inputs are obtained to configure the desired variable attack/release behavior and then to step 6168 where the user interface inputs and combined value are applied to the variable attack/release processor. The process then advances to step 6170 where numeric conversions may be processed. In some cases, computation requirements can be minimized by converting the results into an alternative value such as a logarithmic value. The process then advances to step 6172 where the results of the previous steps can be decimated or signal processing performed to reduce computation requirements and increase loop stability typically by the use of lowpass filtering. The process advances to step 6174, where the results are saved for later use, and the process loops back to step 6162. Once the appropriate number of loops have been completed at step 6162, the process exits at step 6176. Not all processing steps are required for all designs. For example, the combiner 6136 is not required for single inputs or the numeric conversion 6142 or decimation/signal processing 6144 may not be required.

Turning next to FIG. 61E, the sensitivity control processing 6108 can be better understood. The process starts at step 6180, after which the process advances to step 6182 where a loop is begun with the number of iterations of the loop being defined by the number of sensitivity controls. The number of sensitivity controls can vary over a wide range, and is identified here as simply 0 to s, zero being used if there are no sensitivity controls. When the process loop begins at step 6184, the appropriate positive loop outputs, positive loop corrected outputs from loop 6114, volume control offset values from loop 6132, or variable attack/release outputs from loop 6162 are obtained and then combined in step 6186. The process advances to step 6188 where the appropriate user interface inputs are obtained to set the desired system signal to noise ratio and then to step 6190 where the user interface inputs and combined value are applied to the sensitivity control processor. The process then advances to step 6192 where numeric conversions may be processed. In some cases, computation requirements can be minimized by converting the results into an alternative value such as a logarithmic value. The process then advances to step 6194 where the results of the previous steps can be decimated or signal processing performed to reduce computation requirements and increase loop stability typically by the use of lowpass filtering. The process advances to step 6196, where the results are saved for later use, and the process loops back to step 6182. Once the appropriate number of loops have been completed at step 6182, the process exits at step 6198. Not all processing steps are required for all designs. For example, the combiner 6136 is not required for single inputs or the numeric conversion 6142 or decimation/signal processing 6144 may not be required.

FIG. 62 shows an exemplary embodiment of a two-stage acoustic loop balance processor 5360 which provides both coarse and fine environmental input adjust and is typically used in conjunction with a codec with a coarsely adjustable programmable input amplifier. Referring to FIG. 51, a calibration signal is supplied as a reference signal 4310 and speaker output 480 during a period when there is minimal environmental noise. Negative loops are disabled, and the reference and microphone power estimate signals are compared, typically by subtraction 6210. The microphone balance gain signal 5364 is adjusted up and down until the reference and microphone power estimate signals are approximately equal. If they remain equal for the proper closure time, as indicated by the closure counter 6240, the loop closure is complete, and the microphone fine adjust 5362 and microphone balance gain 5364 constants are set. No further changes are made to the outputs of the balancing processor.

The processor may make use of an active low-pass filter 6200, 6205, and 6215, whose corner frequency is decreased as the loop closure time increases to process the reference and microphone power difference 6210. This provides fast initial gain adjust, as well as accurate final gain adjustment.

The acoustic loop balance processor 5360 is initialized by the start loop closure 6255 signal, that loads the KL down counter 6200 with an initial value. The KL 6200 value is limit checked and limited if required by 6205 and supplied as the KL corner frequency coefficient to the low pass filter 6215. Difference 6210 as a function of slow reference power estimator 5340 and slow microphone power estimator 5335 is supplied as input to low pass filter step 6215. Update delay 6220 is a delay counter clocked by sample clock 2105 or a decimated clock frequency. With each clock enable, it resets itself, causing KL down counter 6200 to decrement and enables compare block 6235. The delay limits the reaction time of the balancing circuit, providing stable operation.

The output of filter 6215 is supplied to the >1.5 dB compare 6235. The >1.5 dB compare 6235 provides three outputs, equal (within +/−1.5 dB), greater than 1.5 dB, and less than 1.5 dB. The greater than 1.5 dB and less than 1.5 dB outputs cause increases and decreases in the codec gain counter 6250, producing microphone balance gain 5364. The A/D converters in many codecs contain a coarsely adjustable programmable input amplifier (in this example adjustable in 1.5 dB steps although any appropriate step size can be used) that can be used to scale the analog signal prior to conversion. While it is preferable to perform coarse adjustment of the microphone using this amplifier since it enables the maximum A/D resolution, best signal to noise ratio, and lowest component count and costs, alternate variations such as a digital amplifier/attenuator may also be used.

The equal output of compare 6235 clocks a closure counter 6240 that was initially set to zero by start loop closure 6255, and is also reset by the greater than 1.5 dB or less than 1.5 dB outputs of 6235. The output of the closure counter is provided to comparator 6245 which compares it to the calibration counter limit, and produces a loop closure done 6260 when the closure counter indicates that the balancing operation has remained constant for the desired amount of time (i.e. no resets by the <>1.5 dB outputs; only "=" outputs), and thus the calibration operation is complete.

The error to gain offset transform 6225, similar to previously described blocks 5205 and 5345, uses the slow reference power estimator 5340 and filter output 6215 to generate a fine adjust gain signal. At the time that loop closure 6260 is asserted, this signal is accepted by the register 6230 and becomes the microphone fine adjust signal 5362. It allows adjustment of less than +/−1.5 dB to the balance loop.

Turning next to FIG. 63, the loop balance process 1230 can be better understood. The acoustic loop balancing processor 5360, an example of which was shown in FIG. 62, represents an implementation of the flow diagram shown in FIG. 63.

The process starts at step 6300, after which the process advances to step 6305 where a loop is begun with the iteration of the loop being defined by how many channels are to be processed. The number of channels plus a final overall balance loop can vary over a wide range, and is identified here as simply 1 to c. When the process loop begins at step 6310, the negative and positive loops are disabled, the closure counter is initialized to zero, the balance gain is set to its maximum gain, and the calibration 420 source is enabled.

The process loop advances to step 6315 where a calculation of Δ=reference−microphone is made. The process loop advances to step 6320 where the Δ is processed through a variable Fc low pass filter. The process loop advances to step 6325 where a check is made of Δ>+tolerance. In FIG. 62, this tolerance was 1.5 dB. If true, the process loop advances to step 6330 where the balance gain is increased, and then advances to step 6335, where an optional delay for loop stability gain change settling time is performed. The process loop advances to step 6340 where the closure counter is reset, since the balance loop is not yet balanced. The process loop advances to step 6360, where a check is made for the counter>limit. If true, step 6365 is executed, causing the residual Δ error to be used as the microphone fine adjustment gain value, and the process loops back to step 6305.

If the check at step 6325 was false, the process loop advances to step 6345, where a check is made for Δ<+tolerance. If true the process loop advances to step 6350 where the balance gain is decreased. The process loop advances to step 6335, and repeats the prescribed steps.

If the check at step 6345 was false, the process loop advances to step 6355, where the closure counter is incremented. The process loop advances to step 6360. If false, the process loop advances to step 6315. Once the appropriate number of loops have been completed at step 6305, the process exits at step 6370.

The following methods enable proper dynamic range mapping of the partitioned signal processing system when volume control changes are made or noise compensation is performed. Prior-art companders and/or noise compensators can also use these methods. In prior art methods, when proper dynamic range mapping was initially achieved, subsequent volume control changes destroyed it resulting in undesirable dynamic range mapping.

In the simplest "set maximum and minimum" method, as shown in FIGS. 64 and 65, the user explicitly sets the maximum and minimum volumes to set system gain and compander kneepoints (and associated companding ratios) to accomplish dynamic range mapping.

FIG. 64 illustrates a configuration of the partitioned signal processing system for setting the maximum acoustic signal amplitude. First, User Interface 405 enters the "set maximum output level" setup mode via User Controls 310. User Interface 405 then enables Calibrator 420 which provides a maximum amplitude signal, typically a 0 dB white noise signal, to the volume control 445. The Volume Control is set to its maximum volume level by User Interface 405. The volume control signal is sent to the Output Signal Processor 475. The user adjusts output gain "G" to set the maximum desired acoustic sound pressure level (SPL) by means of the user interface 405 and User Controls 310, typically the Volume Up/Down controls. User Interface 405 exits from "set maximum output level" setup mode via User Controls 310 with the system gain set to "G" and upper kneepoint typically set to a predetermined value. In this and following examples, the upper kneepoint input signal level is the same as the output signal level, both levels being set to the maximum input signal level of the system although any other input/output levels may be used. Note that the set maximum output level procedure can be implemented on a per channel or band basis.

The configuration shown in FIG. 65 is used to set the minimum acoustic signal amplitude, typically at the user's threshold of hearing. First, User Interface 405 enters the "set minimum output level" setup mode via User Controls 310. User Interface 405 then enables Calibrator 420 which provides a maximum amplitude signal, typically a 0 dB white noise signal, to the volume control 445. The Output Signal Processor 475 output gain has previously been set to "G" from the "set maximum step". The user adjusts volume control 445 by means of the user interface 405, and User Controls 310, typically the Volume Up/Down controls, to the point where the desired minimum SPL sound may be detected. User Interface 405 exits from "set minimum output level" setup mode via User Controls 310 with the lower kneepoint being set. In this and following examples, the lower kneepoint input signal level is set to the minimum input signal level Oust above the noise floor) and the lower kneepoint output signal level is set to volume control indicated level from the "set minimum output level" routine. At the completion of these two set maximum/minimum steps, the dynamic range mapping has been set by the setting the compander kneepoints and associated companding ratio and system gain. Note that the set minimum output level procedure can be implemented on a per channel or band basis, such that the exemplary method described herein may be extended to any desired number of bands or channels.

Once the dynamic range mapping has been set, it is desirable to avoid altering the minimum output setting when subsequent volume control changes are made so that the softest sounds can always be heard. Reducing the volume control reduces the overall system gain which requires the output dynamic range of the signal to be reduced, since the minimum volume should not be changed. This requires the signal to have additional compression, in addition to lower volume control. The converse is true for increasing the maximum volume. As with the prior method, this method may be extend to any desired number of channels and bands of a system.

FIG. 66 illustrates how system gain or volume control changes can be accomplished without destroying the minimum level. User Controls 310, typically the volume up/down controls, are received by User Interface 405 which indicates to Transform Engine 410 the minimum output level and the desired volume level. Transform Engine 405 then "transforms" this information into both a volume control level provided to Volume Control 445, which modifies the overall system gain, and compander operating parameters, typically a modified lower kneepoint output signal level and associated higher companding ratio, provided to Compander 450. In this example, a 10 dB decrease in the volume control results in a 10 dB increase in compander compression so the minimum level remains the same. In this example, the Output Signal Processor output gain "G" was fixed during the set maximum step however the volume control changes may alternatively be implemented by changing output gain "G".

Input Signal Preprocessing 440 is also shown to provide input level matching for optimum compander operation.

The "set maximum and minimum" method is inappropriate for some users because they may not know how loud the maximum volume will need to be when it is noisy. The "set typical and minimum" method addresses this concern by allowing the user to set the typical maximum volume they wish to hear, while reserving adequate headroom to accommodate likely maximum volume levels acceptable for noisy environments. The methods described here for a single band or channel may be expanded to any desired arrangement of channels and bands.

FIG. 67 shows a "set typical maximum" level where the system gain headroom is provided by a volume control bias, in this example −20 dB. The method is the same as described in FIG. 64, "set maximum", except that User Interface 405 provides to Volume Control 445 a volume level with bias instead of the maximum volume level.

FIG. 68 shows a "set typical maximum" level where the system gain headroom is provided by an output gain bias, in this example −20 dB. The method is the same as described in FIG. 64, "set maximum", except that User Interface 405 provides to Output Signal Processor 475 an output gain value with bias.

The "set minimum" of the "set typical and minimum" method is performed identically to FIG. 65.

The "automatic" method provides the most user-friendly interface, since it appears to be a normal volume control. This method uses default values, typically decided by design and set at power on or corresponding to the last use settings, and intelligence to determine how the output dynamic range (user maximum and minimum output levels) should be altered. When the signal is relatively loud, if the user adjusts the volume, it is typically to alter the maximum output setting. If the signal is relatively quiet, it is usually to modify the user minimum output setting. As before, this method may be applied to any desired arrangement of multichannel and multiband systems.

FIG. 69 shows a typical design default setting example where the system gain output headroom is provided by a volume control bias. Default compander 450 and volume control 445 settings are set by User Interface 405 and Transform Engine 410. Output Signal Processor 475 output system gain G, is fixed by design. In this example, a 40 dB output dynamic range, with 80 dB maximum and 40 dB minimum SPL, and −20 dB volume control bias is shown. An 80 dB input dynamic range is also shown being provided to Input Signal Preprocessing 440 which results in a default compander setting of 2:1 compression with the upper kneepoint input and output signal levels set to 0 dB and the lower kneepoint input signal level set to −80 dB and output signal level set to −40 dB.

FIG. 70 shows an example of how the maximum output level can be automatically increased. If User Controls 310, typically a volume up/down control, indicates to User Interface 405 to increase the output volume, a test is performed to determine which settings to modify. This test typically compares the current input power level, provided by Compander 450, to a threshold level, typically provided by a Statistical Engine 415 or determined by design. If the input power level is greater than the threshold, an increase in the maximum output level is indicated by User Interface 405. Transform Engine 410 receives inputs from the User Interface which results in an increase in the Volume Control 445 level (increase in system gain) and a decrease in Compander 450 compression (lower companding ratio). Thus an automatic increase in the maximum output level, while maintaining the minimum output level, is accomplished with one user volume control.

FIG. 71 shows an example of how the maximum output level can be automatically decreased. If User Controls 310, typically a volume up/down control, indicates to User Interface 405 to decrease the output volume, a test is performed to determine which settings to modify. This test typically compares the current input power level, provided by Compander 450, to a threshold level, typically provided by a Statistical Engine 415 or determined by design. If the input power level is greater than the threshold, a decrease in the maximum output level is indicated by User Interface 405. Transform Engine 410 receives inputs from the User Interface which results in a decrease in the Volume Control 445 level (system gain) and a increase in Compander 450 compression (higher companding ratio). Thus an automatic decrease in the maximum output level, while maintaining the minimum output level, is accomplished with one user volume control.

FIG. 72 shows an example of how the minimum output level can be automatically increased. If User Controls 310, typically a volume up/down control, indicates to User Interface 405 to increase the output volume, a test is performed to determine which settings to modify. This test typically compares the current input power level, provided by Compander 450, to a threshold level, typically provided by a Statistical Engine 415 or determined by design. If the input power level is less than the threshold, an increase in the minimum output level is indicated by User Interface 405. Transform Engine 410 receives inputs from the User Interface which results in an increase in Compander 450 compression (higher companding ratio) and no modifications to the Volume Control 445 level (system gain). Thus an automatic increase in the minimum output level, while maintaining the maximum output level, is accomplished with one user volume control. Alternatively, an increase in the Volume Control 445 level may accompany the increase in compander minimum level to reduce the amount of compression and signal distortion.

FIG. 73 shows an example of how the minimum output level can be automatically decreased. If User Controls 310, typically a volume up/down control, indicates to User Interface 405 to decrease the output volume, a test is performed to determine which settings to modify. This test typically compares the current input power level, provided by Compander 450, to a threshold level, typically provided by a Statistical Engine 415 or determined by design. If the input power level is less than the threshold, a decrease in the minimum output level is indicated by User Interface 405. Transform Engine 410 receives inputs from the User Interface which results in a decrease in Compander 450 compression (lower companding ratio) and no modifications to the Volume Control 445 level (system gain). Thus an automatic decrease in the minimum output level, while maintaining the maximum output level, is accomplished with one user volume control.

FIG. 74 is an alternative example of the default settings shown in FIG. 69. It shows how the same acoustic output levels can be obtained by moving the system gain headroom from the volume control to the Output Signal Processor output gain "G". In this example, the Output Signal Processor output gain is reduced by 20 dB, while the volume control gain is set to maximum by the Transform Engine 410.

In FIGS. 70, 71, 72, and 73, Output Signal Processor 475 output gain may be used in addition to or instead of the Volume Control/Pre-mixer 445 adjustments.

The "noise compensation with compander" method shown in FIG. 75 shows how an increase in the noise floor determined by Noise Extractor 465 results in Transform Engine 410 to increase the amount of Compander 450 compression (higher companding ratio) so that the minimum output level is greater than the noise floor. Alternatively, the system gain, via Volume Control 445 level and Output Signal Processor 475 output gain, may be increased to help minimize the amount of compression, or may be increased once a predetermined maximum compression level is reached. User Controls 310 may indicate to User Interface 405 to increase or decrease the amount of Noise Sensitivity Control provided to Noise Extractor 465. This allows the user to manually adjust the minimum output level signal to noise ratio. The Noise Sensitivity Control may also be automatically adjusted by User Interface 405 as described by FIG. 78. As discussed previously, this method may be expanded to multichannel and multiband systems.

The "noise compensation without compander" method shown in FIG. 76 indicates how the partitioned signal processing system may be used to effect a change in output volume when a noise floor signal is determined by Noise Extractor 465, and Volume Control 445 is used without Compander 450. As before, this method may be readily expanded to multichannel and multiband systems.

In FIG. 76, the non-compander noise compensation compares the noise floor plus noise sensitivity level to the current system output level (system reference) and increases the system gain until the system output is greater than or equal to the noise floor plus noise sensitivity level.

This is accomplished by a Channel Reference Out 4310 signal from Output Signal Processor 475 and Noise Sensitivity Control signal from User Interface 405 (same as described in connection with FIG. 75) being supplied to Noise Extractor 465, that in turn generates a Noise Offset 5115 signal. The Transform Engine 410 uses the Noise Offset signal to determine how to vary the Output Signal Processor 475 output gain "G" while not modifying the Volume Control 445 level. This allows the normal volume control and noise compensation to be implemented in two different modules. Alternatively, the Volume Control and Output Signal Processor output gain may be operated in tandem or the Output Signal Processor output gain may be fixed and the volume increased via the volume control.

FIG. 77 indicates in a flow diagram form the manual methods discussed in FIGS. 64, 65, 67, 68 regarding setting maximum and minimum output levels. FIG. 78 indicates in a flow diagram form the manual method discussed in FIGS. 75, 76 regarding how to modify the noise sensitivity control. These flow diagrams show a typical method consistent with a User Interface as described in FIG. 6C.

Referring next to FIG. 77, the set-up command decoder step 660E and setup command execute step 660F shown in FIG. 6C may be better understood through the conceptual description of an exemplary implementation of the "set maximum" and "set minimum" commands may be implemented.

The process starts at step 7700, after which a check is made at step 7705 to determine if a set maximum command is to be executed. Here a user will adjust the maximum output level of the system. If true, step 7710 activates a calibration source 420, as shown in FIG. 64 and the User Interface enters "set maximum output level" setup mode so that check step 7705 will be true on subsequent passes through the set-up command decoder 660E and setup command execute 660F. The loop advances to step 7715 where a check is made for an increase volume (volume+) command. If true, step 7720 is executed, increasing the output signal processor 475 output gain, as shown in FIG. 64. If false, a check is made at step 7730 for a decrease volume (volume−) command. If true, step 7735 decreases the output signal processor 475 output gain, as shown in FIG. 64. If neither a volume+or volume−command is made, no change is made but the "set maximum output level" setup mode continues.

Next, the loop advances to step 7725 where a check is made as to whether to exit the set maximum command. If true, step 7740 causes the noise extractor 465 to perform a loop balance operation to obtain optimum noise compensation. Once this operation is complete, the loop advances to step 7745 that disables the calibration source 420 and the User Interface exits "set maximum output level" setup mode. The process then exits at step 7795. If step 7725 is false, the User Interface remains in "set maximum output level" setup mode and proceeds to step 7795.

Note that the "set maximum output level" setup mode may be executed many times, on a per channel and per band basis.

If the check made at step 7705 was false, the loop advances to a check at step 7750 to determine if a set minimum command is to be executed. Here a user will, typically, adjust the output level of the calibration source until it is just perceptible—which is typically the user's threshold of hearing. If true, step 7755 activates a calibration source 420, as shown in FIG. 64 and the User Interface enters "set minimum output level" setup mode so that check step 7750 will be true on subsequent passes through the set-up command decoder 660E and setup command execute 660F. The loop advances to a check at step 7760 for a volume+command. If true, the loop advances to step 7765, increasing the volume control & pre-mixer 445, as shown in FIG. 65 which effectively increases the calibration output level. If false, the loop advances to step 7780, where a check is made for a volume−command. If true, step 7785 is executed, decreasing the volume control & pre-mixer 445, as shown in FIG. 65, effectively decreasing the calibration output level. If neither a volume+ or volume−command is made, no change is made but the "set minimum output level" setup mode continues.

Next the loop advances to step 7770 where a check is made for exiting the set minimum command. If true, step 7775 is executed, disabling the calibration source 420, and the User Interface exits the "set minimum output level" setup mode. The process then exits at step 7795. If step 7770 is false, the User Interface remains in the "set minimum output level" setup mode and proceeds to step 7795.

Note that the "set minimum output level" setup mode may be executed on a per channel and per band basis as many times as required for multiband and multichannel implementations.

If the check at step 7750 was false, indicating that neither a set maximum or minimum level command was selected, step 7790 is executed to check if a sensitivity command is to be executed, as will be discussed in connection with FIG. 78. Step 7793 is then executed, causing other commands (see discussion at FIG. 6A, above) to be decoded and executed, and the process exits at step 7795.

The noise sensitivity control allows the signal to noise ratio of the desired output signal relative to the noise floor to be controlled. By increasing the sensitivity, the sound is given priority over the noise, and will be more easily heard over the noise level. By decreasing the sensitivity, the environmental noise, typically speech, is given priority so that conversations will not be overpowered by an increasing system output level. The noise sensitivity control is typically applied to all channels and bands in a system.

Referring to FIG. 78, the steps shown provide a conceptual description of how the setup sensitivity command may be implemented. The process starts at step 7800. A check is made at step 7805 for a sensitivity setup command. If true, a check is made at step 7810 as to whether pre-programmed sensitivity settings are to be used. This is useful for systems that have discrete sensitivity settings, for example "music priority", "conversation priority", or "noise compensation off" settings. If check step 7810 is true, then step 7840 is executed where typically user controls are used to directly select which pre-programmed setting to use in a "round robin" approach where a user control cycles through various settings. Step 7825 is then executed which applies the selected sensitivity setting to the system followed by exiting at step 7845.

If a user desires a continuum of settings, a user control, typically the volume control, may be used to increase or decrease the sensitivity level. This is the path selected when check step 7810 is false. If false, a check is made at 7815 for a volume+command. If true, step 7820 causes the sensitivity to be increased. Step 7825 is then executed causing the sensitivity settings to be applied before exiting at step 7845.

If the check at step 7815 was false, a check is made at step 7830 for a volume−command. If true, the sensitivity is decreased at step 7835, and applied at step 7825, before exiting at step 7845. If for some reason no increase or decrease in sensitivity was indicated, check step 7830 will fail and no change in the noise sensitivity control value will result.

Referring next to FIG. 79, there is shown therein in flow diagram form a Conceptual Intelligent Volume Control. In particular, FIG. 79 shows how the automatic method of FIGS. 70,71,72,73 (to set the minimum and maximum output levels) and FIGS. 75,76 (to set the noise sensitivity control level) may be implemented with operational command decoder 660C and operation command 660D shown in FIG. 6C.

The process starts at step 7900, after which a check is made at step 7905 for an increase/decrease volume control command. If false, step 7910 is executed to decode and execute any other commands, followed by the process exiting at step 7970. If the check at step 7905 is true, a check is made at step 7915 for a change sensitivity command. This is accomplished typically by comparing the channel or system reference level to the noise floor. If the reference is close to the noise floor then a change in the noise sensitivity control level is indicated and step 7915 will be true. If true, a check is made at step 7920, for a volume+command. If true, step 7925 increases the amount of noise sensitivity, as shown in FIG. 75, and the process exits at step 7970. If false, step 7930 decreases the amount of noise sensitivity, and the process exits at step 7970.

If the check at step 7915 was false, a check is made at step 7935 for a change in minimum output level. This is accomplished typically by comparing the current input power level, provided by Compander 450, to a threshold level, typically provided by a Statistical Engine 415 or determined by design as shown in FIGS. 72,73. If the input power level is less than the threshold, a modification of the minimum output level is detected and check step 7935 will be true. If true, a check is made at step 7940 for a volume+command. If true, step 7945 is executed, causing minimum output level to be increased, as discussed in FIG. 72, and the process exits at step 7970. If false, step 7950 is executed, causing the minimum output level to be decreased, as discussed in connection with FIG. 73, and the process exits at step 7970.

As noted above, the test at step 7935 typically compares the current input power level, provided by Compander 450, to a threshold level, typically provided by a Statistical Engine 415 or determined by design. In contrast to the above discussion, if the input power level is greater than the threshold, an increase in the maximum output level is indicated by User Interface 405.

If the check at step 7935 was false, then an increase/decrease maximum output level operation is to be performed. A check is made at step 7955 for a volume+ command. If true, step 7960 increases the volume control as discussed in FIG. 70, and the process exits at step 7970. If false, step 7965 decreases the volume control as discussed in FIG. 71, and the process exits at step 7970.

Having fully described a preferred embodiment of the invention and various alternatives, those skilled in the art will recognize, given the teachings herein, that numerous alternatives and equivalents exist which do not depart from the invention. It is therefore intended that the invention not be limited by the foregoing description, but only by the appended claims.

What is claimed is:

1. A segmented mapping converter comprising a plurality of first tier data inputs, a command enable input, a plurality of first tier segment transform processors each including a segment selection processor, responsive to an associated one of the first tier data inputs and the command enable input, which establishes an associated output set comprising a coefficient set and a value-of-a-variable set in accordance with the value of the associated first tier data input and the command enable input, and a transform processor, responsive to the output set, which establishes a corresponding first tier output value, first tier select or combine logic responsive to the plurality of first tier output values established by the plurality of first tier segment transform processors for establishing a first tier select/combine output signal, first test logic for examining the first tier select/combine output signal and, in response thereto, providing a data output or providing a first command enable signal for further calculation, a second tier segment transform processor including a segment selection processor, responsive to a second tier data input and the first command enable signal, which establishes an output set comprising a coefficient set and a value-of-a-variable set in accordance with the second data input and the first command enable signal, and a transform processor, responsive to the output set, which establishes a corresponding second output value, and second test logic for examining the second output value and, in response there, providing a data output or providing an enable signal for further calculation.

2. A segmented mapping converter comprising a plurality of first tier data inputs, a command enable input, a plurality of first tier segment transform processors each including a segment selection processor, responsive to an associated one of the first tier data inputs and the command enable input, which establishes an associated output set comprising a coefficient set and a value-of-a-variable set in accordance with the value of the associated first tier data input and the command enable input, and a transform processor, responsive to the output set, which establishes a corresponding first tier output value, first tier select or combine logic responsive to the plurality of first tier output values established by the plurality of first tier segment transform processors for establishing a first tier select/combine output signal, first test logic for examining the first tier select/combine output signal and, in response thereto, providing a data output or providing a first command enable signal for further calculation, a plurality of second tier data inputs, a plurality of second tier segment transform processors each including a segment selection processor, responsive to an associated one of the second tier data inputs and the first command enable signal, which establishes an associated output set comprising a coefficient set and a value-of-a-variable set in accordance with the value of the associated second tier data input and the first command enable signal, and a transform processor, responsive to the output set, which establishes a corresponding second tier output value, second tier select or combine logic responsive to the plurality of second tier output values established by the plurality of second tier segment transform processors for establishing a second tier select/combine output signal, and second test logic for examining the second tier select/combine output signal and, in response thereto, providing a data output or providing a second command enable signal for further calculation.

3. The segmented mapping converter of claim 2 further including a transform parameter input for providing segment boundary data, the select or combine logic also being responsive to the transform parameter input.

4. A segmented mapping converter comprising a plurality of first tier data inputs, a command enable input, a plurality of first tier segment transform processors each including a segment selection processor, responsive to an associated one of the first tier data inputs and the command enable input, which establishes an associated output set comprising a coefficient set and a value-of-a-variable set in accordance with the value of the associated first tier data input and the command enable input, and a transform processor, responsive to the output set, which establishes a corresponding first tier output value, and first tier select or combine logic responsive to the plurality of first tier output values established by the plurality of first tier segment transform processors for establishing a first tier select/combine output signal.

5. The segmented mapping converter of claim 4 further including a transform parameter input for providing segment boundary data, the select or combine logic also being responsive to the transform parameter input.

6. A segmented mapping converter comprising a plurality of first tier data inputs, a command enable input, a plurality of first tier segment transform processors each including a segment selection processor, responsive to an associated one of the first tier data inputs and the command enable input, which establishes an associated output set comprising a coefficient set and a value-of-a-variable set in accordance with the value of the associated first tier data input and the command enable input, and a transform processor, responsive to the output set, which establishes a corresponding first tier output value, first tier select or combine logic responsive to the plurality of first tier output values established by the plurality of first tier segment transform processors for establishing a first tier select/combine output signal, first test logic for examining the first tier select/combine output signal and, in response thereto, providing a data output or providing a first command enable signal for further calculation, a plurality of second tier data inputs, a plurality of second tier segment transform processors each including a segment selection processor, responsive to an associated one of the second tier data input and the first command enable signal, which establishes an associated output set comprising a coefficient set and a value-of-a-variable set in accordance with the value of the associated second tier data input and the first command enable signal, and a transform processor, responsive to the output set, which establishes a corresponding second tier output value, second tier select or combine logic responsive to the plurality of second tier output values established by the plurality of second tier segment transform processors for establishing a second tier select/combine output signal, and second test logic for examining the second tier select/combine output signal and, in response there, providing a data output or providing a second command enable signal for further calculation, a plurality of $n^{th}$ tier data inputs, a plurality of $n^{th}$ tier segment transform processors each including a segment selection processor, responsive to an associated one of the $n^{th}$ tier data input and the $n^{th}-1$ command enable signal, which establishes an associated output set comprising a coefficient set and a value-of-a-variable set in accordance with the value of the associated $n^{th}$ tier data input and the $n^{th}-1$ command enable signal, and a transform processor, responsive to the output set, which establishes a corresponding $n^{th}$ tier output value, and $n^{th}$ tier select or combine logic responsive to the plurality of $n^{th}$ tier output values established by the plurality of $n^{th}$ tier segment transform processors for establishing an $n^{th}$ tier select/combine output signal.

7. The segmented mapping converter of claim 6 further including a transform parameter input for providing segment boundary data, the select or combine logic also being responsive to the transform parameter input.

8. A method of calculating a segment transform comprising the steps of providing a plurality of first tier data inputs, providing a command enable input, providing a plurality of first tier segment transform processors each including a segment selection processor, the first tier segment transform processors being responsive to an associated one of the first tier data inputs and the command enable input for establishing an associated first tier output set comprising a coefficient set and a value-of-a-variable set in accordance with the value of the associated first tier data input and the command enable input, and processing a transform in accordance with each first tier output set, for establishing a corresponding first tier output value, selecting or combining the plurality of first tier output values for establishing a first tier select/combine output signal, examining the first tier select/combine output signal and, in response thereto, providing a data output or providing a first command enable signal for further calculation, providing a plurality of second tier data inputs, providing a plurality of second tier segment transform processors each including a segment selection processor, the second tier segment transform processors being responsive to an associated one of the second tier data inputs and the first command enable signal for establishing an associated second tier output set comprising a coefficient set and a value-of-a-variable set in accordance with the value of the associated second tier data input and the first command enable signal, and processing a transform in accordance with each second tier output set for establishing a corresponding second tier output value, selecting or combining the plurality of second tier output values for establishing a second tier select/combine output signal, and examining the second tier select/combine output signal and, in response thereto, providing a data output or providing a second command enable signal for further calculation.

9. A method of processing a segment transform comprising the steps of providing a plurality of first tier data inputs, providing a command enable input, processing a plurality of first tier segment transforms, responsive to an associated one of the first tier data inputs and the command enable input, for establishing an associated first tier output set comprising a coefficient set and a value-of-a-variable set in accordance with the value of the associated first tier data input and the command enable input, and processing an output transform, responsive to the first tier output set, for establishing a corresponding first tier output value, and selecting or combining the plurality of first tier output values established by the plurality of first tier segment transforms for establishing a first tier select/combine output signal.

10. The method of claim 9 further including the step of examining the first tier select/combine output signal and, in response thereto, providing a data output or providing a first command enable signal for further calculation.

11. The method of claim 10 further including the steps of providing a plurality of second tier data inputs, processing a plurality of second tier segment transforms, responsive to an associated one of the second tier data inputs and the first command enable signal, for establishing an associated second tier output set comprising a coefficient set and a value-of-a-variable set in accordance with the value of the associated second tier data input and the first command enable signal, and processing a second tier output transform in accordance with each second tier output set for establishing a corresponding second tier output value, and selecting or combining the plurality of second tier output values for establishing a second tier select/combine output signal.

12. The method of claim 11 further including the steps of repeating the examining, providing, processing and selecting or combining steps for a third through $n^{th}$ tiers, where n is a non-negative integer.

13. The method of claim 11 in which each tier is a loop.

14. The method of claim 13 wherein the output of each loop is examined to determine whether another loop is required.

15. The method of claim 14 wherein the last tier output value is used as the final output value if it is determined that another loop is not required.

16. The method of claim 9 in which the processing of the plurality of first tier segment transforms is a series of loops.

\* \* \* \* \*